(12) United States Patent
Bjorn

(10) Patent No.: US 9,247,402 B2
(45) Date of Patent: Jan. 26, 2016

(54) COMPENSATION OF SIMPLE FIBER OPTIC FARADAY EFFECT SENSORS

(71) Applicant: POWERSENSE A/S, Holte (DK)

(72) Inventor: Lars N. Bjorn, Bronshoj (DK)

(73) Assignee: POWERSENSE A/S, Holte (DK)

( * ) Notice: Subject to any disclaimer, the term of this patent is extended or adjusted under 35 U.S.C. 154(b) by 0 days.

(21) Appl. No.: 14/586,675

(22) Filed: Dec. 30, 2014

(65) Prior Publication Data

US 2015/0141064 A1 May 21, 2015

Related U.S. Application Data

(62) Division of application No. 12/610,104, filed on Oct. 30, 2009, now Pat. No. 8,949,054, which is a division of application No. 11/283,504, filed on Nov. 18, 2005, now Pat. No. 7,683,795.

(60) Provisional application No. 60/629,213, filed on Nov. 18, 2004.

(51) Int. Cl.
| | |
|---|---|
| *G08B 21/00* | (2006.01) |
| *H04W 4/14* | (2009.01) |
| *G01R 33/032* | (2006.01) |
| *G01R 15/24* | (2006.01) |
| *G01R 19/25* | (2006.01) |

(Continued)

(52) U.S. Cl.
CPC ............. *H04W 4/14* (2013.01); *G01R 15/246* (2013.01); *G01R 19/2513* (2013.01); *G01R 31/025* (2013.01); *G01R 33/0322* (2013.01); *H04L 67/12* (2013.01); *G01R 1/00* (2013.01)

(58) Field of Classification Search
CPC .................................. G01R 1/00; H04L 1/00
See application file for complete search history.

(56) References Cited

U.S. PATENT DOCUMENTS

| 3,411,069 A | 11/1968 | Kubler et al. |
| 3,486,112 A | 12/1969 | Bayer |

(Continued)

FOREIGN PATENT DOCUMENTS

| DE | 7522858 | 8/1977 |
| DE | 3431769 | 3/1986 |

(Continued)

OTHER PUBLICATIONS

International Search Report on corresponding PCT application (PCT/DK2005/00737) from International Searching Authority (EPO) dated Jun. 2, 2006.

*Primary Examiner* — Shirley Lu
(74) *Attorney, Agent, or Firm* — Klein, O'Neill & Singh, LLP

(57) ABSTRACT

A monitoring system for detecting earth faults in an electrical power supply grid providing a power signal includes a plurality of monitoring devices, each of the monitoring devices including a detector for detecting the level of harmonics in the power signal, wherein the level of harmonics is detected in a specific frequency range. Each of the monitoring devices further includes a memory for storing a harmonics reference value, a processor for comparing the detected level of harmonics with the reference level, and a communication device for transmitting an alarm if the detected level of harmonics is above the reference level for a specific period of time. Each of the detectors includes an optical sensor for detecting the harmonics by use of the Faraday effect.

8 Claims, 77 Drawing Sheets

(51) Int. Cl.
 *G01R 31/02* (2006.01)
 *H04L 29/08* (2006.01)
 *G01R 1/00* (2006.01)

(56) References Cited

U.S. PATENT DOCUMENTS

| | | |
|---|---|---|
| 3,559,184 A | 1/1971 | Rawlings et al. |
| 3,614,568 A | 10/1971 | Pesis et al. |
| 3,675,125 A | 7/1972 | Jaecklin |
| 3,980,949 A | 9/1976 | Feldtkeller |
| 4,540,937 A | 9/1985 | Asars |
| 4,683,421 A | 7/1987 | Miller et al. |
| 4,694,243 A | 9/1987 | Miller et al. |
| 4,797,607 A | 1/1989 | Dupraz |
| 4,894,608 A | 1/1990 | Ulmer, Jr. |
| 4,903,163 A | 2/1990 | Atwater et al. |
| 4,947,107 A | 8/1990 | Doerfler et al. |
| 4,999,571 A | 3/1991 | Ishiko et al. |
| 5,021,647 A | 6/1991 | Tatsuno et al. |
| 5,051,577 A | 9/1991 | Lutz et al. |
| 5,159,319 A | 10/1992 | Dunk et al. |
| 5,386,290 A | 1/1995 | Okada |
| 5,451,863 A | 9/1995 | Freeman |
| 5,486,754 A | 1/1996 | Cruden et al. |
| 5,495,384 A | 2/1996 | Wallis et al. |
| 5,552,979 A | 9/1996 | Gu et al. |
| 5,563,506 A | 10/1996 | Fielden et al. |
| 5,811,964 A | 9/1998 | Bosselmann et al. |
| 5,994,890 A | 11/1999 | Kajiwara et al. |
| 6,025,980 A | 2/2000 | Morron et al. |
| 6,043,648 A | 3/2000 | Menke et al. |
| 6,507,184 B1 | 1/2003 | Elston |
| 6,630,819 B2 | 10/2003 | Lanagan et al. |
| 6,756,781 B2 | 6/2004 | Duncan et al. |
| 6,774,639 B1 * | 8/2004 | Unsworth .............. 324/547 |
| 6,876,480 B2 | 4/2005 | Sahsashi et al. |
| 7,068,025 B2 | 6/2006 | Bjorn |
| 7,466,118 B2 | 12/2008 | Bjorn |
| 2002/0049567 A1 * | 4/2002 | Vataja ................... 702/188 |
| 2003/0204756 A1 | 10/2003 | Ransom et al. |
| 2003/0229423 A1 | 12/2003 | Andarawis et al. |
| 2005/0024234 A1 | 2/2005 | Brooksby et al. |
| 2005/0141682 A1 * | 6/2005 | Wells ................... 379/90.01 |
| 2005/0240681 A1 * | 10/2005 | Fujiwara et al. .......... 710/1 |
| 2005/0273183 A1 | 12/2005 | Curt et al. |
| 2008/0164864 A1 | 7/2008 | Bjorn |

FOREIGN PATENT DOCUMENTS

| | | |
|---|---|---|
| DE | 19633856 | 8/1997 |
| EP | 0596566 | 5/1994 |
| EP | 1249806 | 10/2002 |
| GB | 259978 | 9/1927 |
| GB | 2111271 | 6/1983 |
| JP | H04217811 | 8/1992 |
| JP | H04221775 | 8/1992 |
| JP | 10-124155 | 5/1998 |
| JP | H1198682 | 4/1999 |
| JP | 2004289377 | 10/2004 |

* cited by examiner

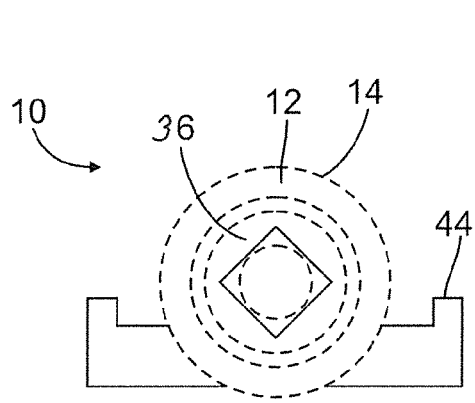
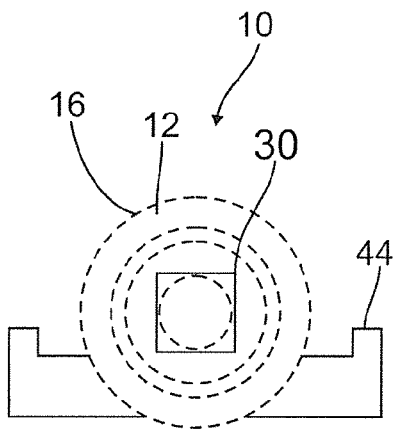
FIG. 4          FIG. 5
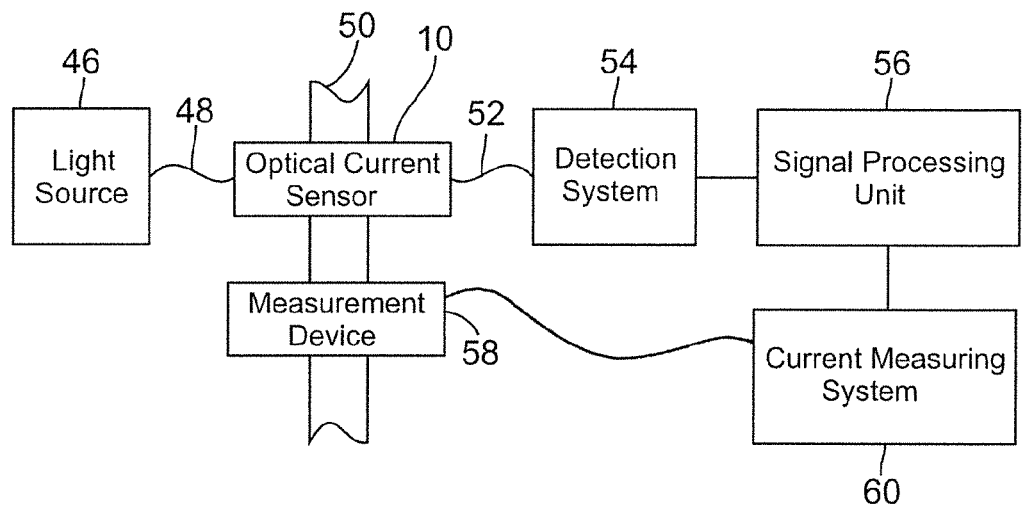
FIG. 6

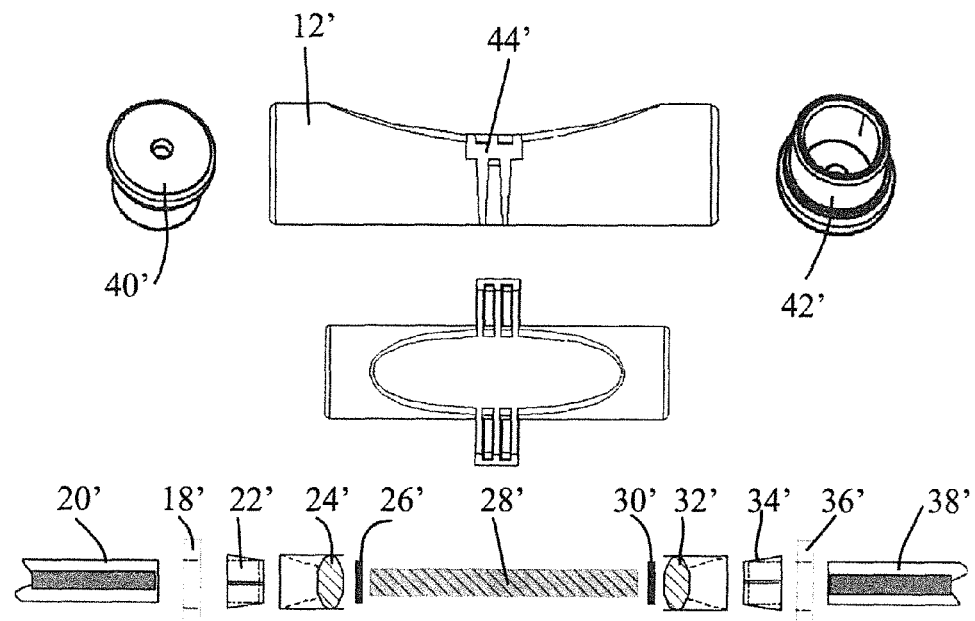
Fig 19
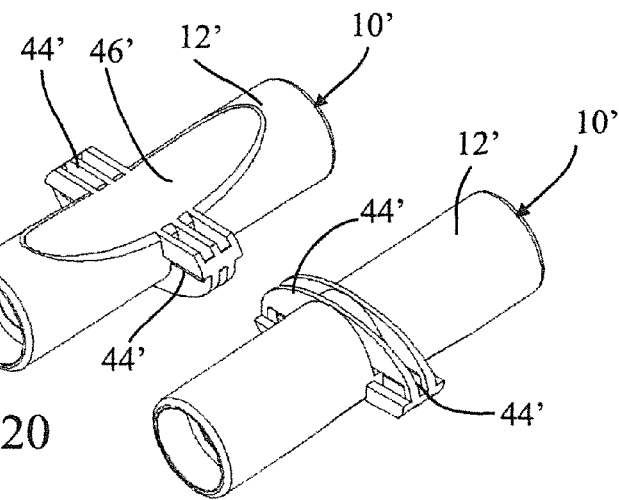
Fig. 20
Fig. 21

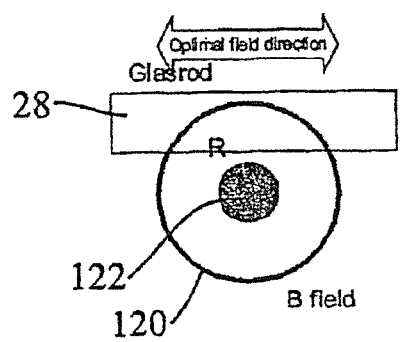
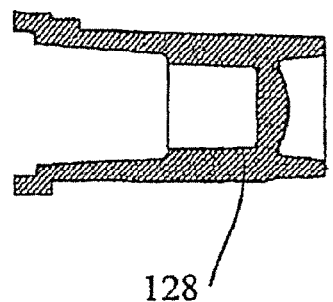
Fig. 25    Fig. 26
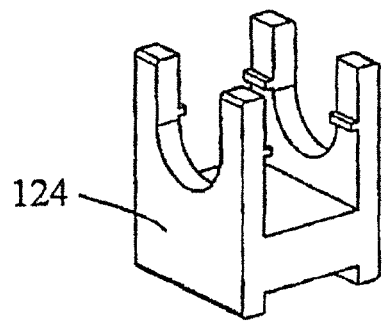
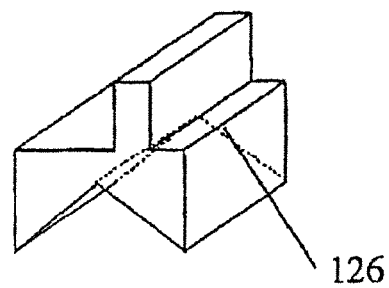
Fig. 27    Fig. 28

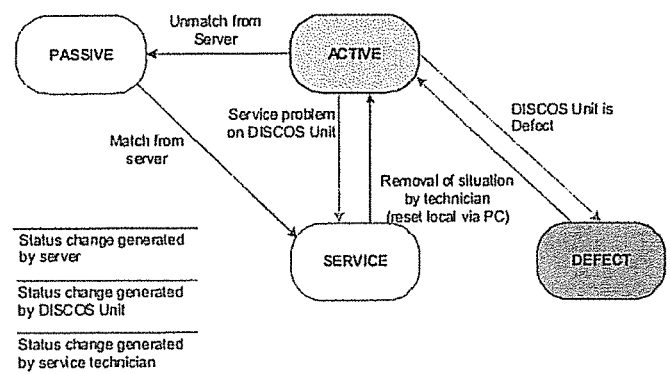
Figure 73
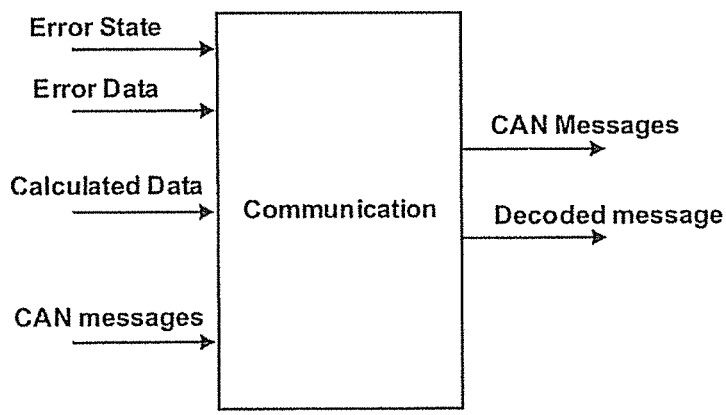
Figure 74
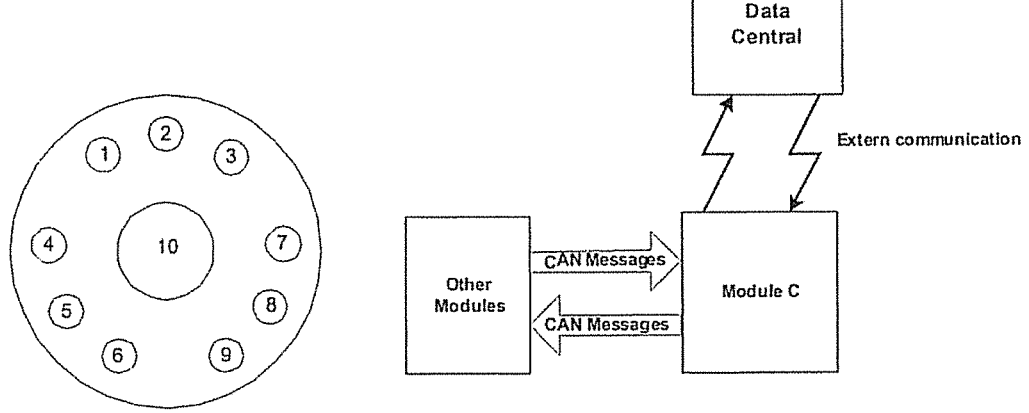
Figure 75
Figure 76

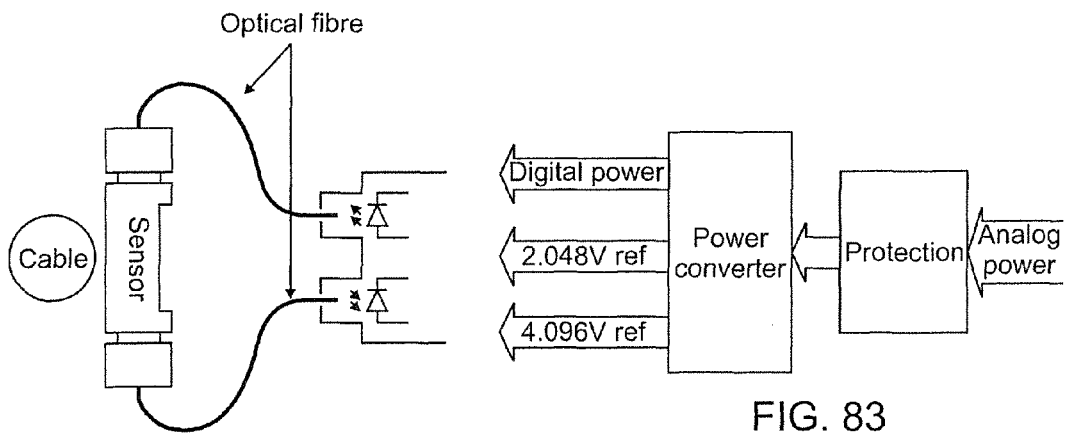
FIG. 82
FIG. 83
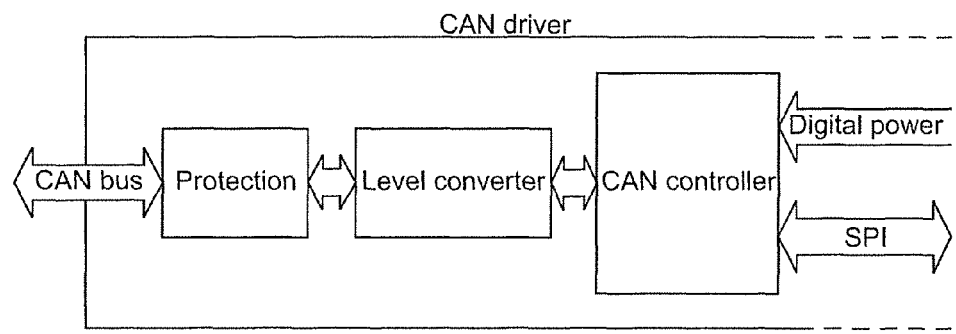
FIG. 84
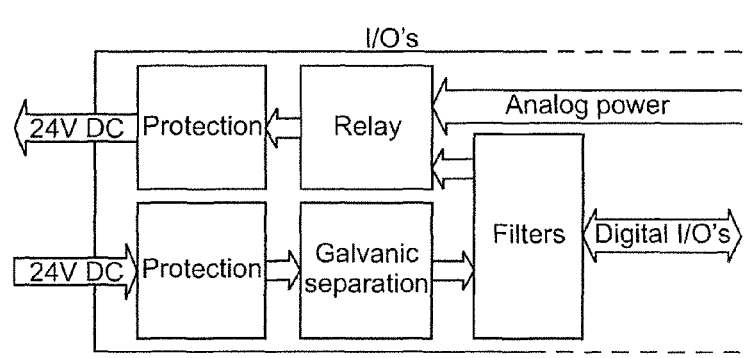
FIG. 85

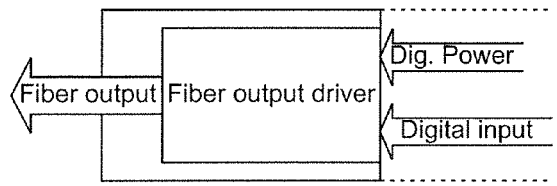
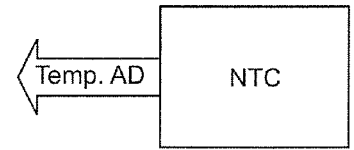
FIG. 86
FIG. 88
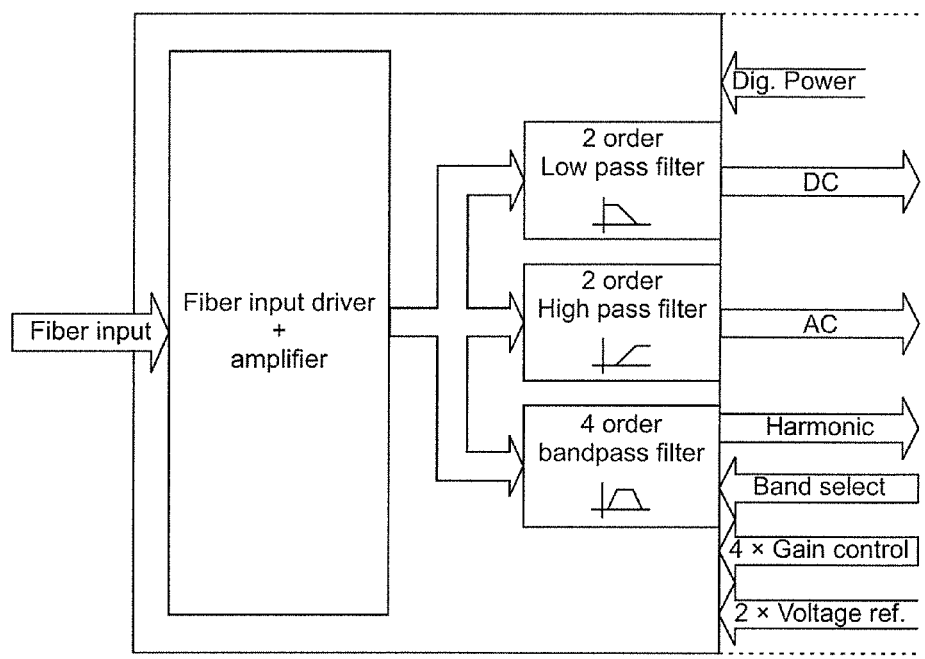
FIG. 87

COMPENSATION OF SIMPLE FIBER OPTIC FARADAY EFFECT SENSORS

CROSS-REFERENCE TO RELATED APPLICATION

This application is a divisional of application Ser. No. 12/610,104, filed Oct. 30, 2009, which is a divisional of U.S. patent application Ser. No. 11/283,504, filed Nov. 18, 2005, now U.S. Pat. No. 7,683,795, which claims the benefit, under 35 U.S.C.§119(e), of U.S. Provisional Application No. 60/629,213, filed Nov. 18, 2004. The disclosures of these prior applications are incorporated herein by reference.

BACKGROUND OF THE INVENTION

The invention relates to a Faraday optical current sensor with polarimetric detection. The present invention further relates to a method of calibrating a current sensor system including a Faraday optical current sensor.

The power industry has a need for monitoring transformer stations for power surges and measurement of large current pulses. For these purposes, a Faraday Effect current sensor has several advantages. A Faraday Effect current sensor may be constructed from dielectric materials, which is of grave importance when measuring at high currents in the presence of substantial electric magnetic interference. Faraday Effect current sensors may employ a coil of an optical fiber or a number of optical fibers, formed of a material exhibiting the Faraday Effect in response to a magnetic field generated by an electric current. A number of prior art patent publications describe Faraday optical current sensors, such as the US publications U.S. Pat. Nos. 4,894,608, 5,051,577, 5,486,754, 5,811,964, 6,043,648, all of which are hereby incorporated in the present specification by reference.

In a Faraday effect current sensor, the polarization plane of a polarized incident light undergoes a rotation, which is a function of the magnetic field created by the electric current to be measured.

The current to be measured can be determined by determining the angle of rotation of the polarization plane of the light on output of the optical sensor. When the light passes through a glass rod the light undergoes a rotation. The angle of rotation may be described by the formula:

$$\beta = V \times B \times d$$

Where $\beta$ is the angle of rotation, d is the length of the sensing element, V is the material constant of the glass rod named Verdets constant and B is the magnetic field described as a vector. The Verdet constant is both temperature and wavelength dependent.

In a Faraday Effect current sensor, a light source generates light, which is passed through a polarization filter or otherwise polarized prior to travelling through the magneto-optical sensitive material. The polarized incident light undergoes a rotation, which is a function of the magnetic field created by the electrical current to be measured. The current to be measured may be determined by metering the angle of rotation of the polarization plane of the light at the output of the Faraday optical current sensor.

The fiber optic current sensor including the light source and detector is sensitive to, among other things, optical noise in the detection circuit, electrical noise in light source, interference from magnetic fields from nearby inductors and systems, sensor mounting and setup, conductor shape and diameter, sensor production tolerances, temperature effect on Verdets constant, temperature effect on light source and detector, light source and detector degradation over the products lifetime The determination of the current to be measured is subject to a number of sources of error. Any system based on optics or electrical circuits are sensitive to noise and other signal degradations, such as optical noise or interference from electromagnetic sources. A system comprising a light source, a light detection unit and an optical conduit such as an optical fiber may suffer loss of sensitivity due to optical dampening caused by defects in material used to form an optical conduit or device such as lenses or optical fibers. Light sources and light detection circuitry may be exposed to electrical noise or interference from magnetic fields from nearby inductors or systems alternatively noise caused by fluctuations in the power supply. Also environmental conditions such as temperature have an effect on material properties such as Verdets constant and also an effect on the noise generated in the light source and in the light detection circuitry. Furthermore, all electrical components and light sources and light detection elements suffer degradation over time. All the factors mentioned above contribute to a reduced precision of the measurements performed by the system.

A calibration prior to commencing measurements and monitoring of a transformer station by using a Faraday optical current sensor is contemplated to give a more precise determination of the current in the electrical conductor. Furthermore, a precise measurement depends on having a stable light source outputting a constant amount of light, alternatively determination of the change of the intensity of the light from the light source as well as light intensity changes caused by temperature variations.

SUMMARY OF THE INVENTION

A system for monitoring a transformer station may be fitted with a data collection and data transmission unit for transmitting the collected data to one or more computers monitoring a number of transformer stations. These communication units may be constituted by wireless connections or fixed connections such as POTS/PSTN networks. The communication from the measurement system mounted in the individual transformer stations to a central computer may include information on average loads, current peaks, actual current for the high voltage current lines, energy direction, maximum currents, actual voltages, ambient temperature and time stamps for all the above-mentioned information. Furthermore, the measurement system may include an alert function for alerting an operator in a power supply company about situations where the peak current is above a given maximum threshold, alternatively below a minimum threshold, a situation where the voltage is above maximum threshold, alternatively below a minimum threshold or other information such as ambient temperatures being out of range, all of which indicate some failure or fault in the transformer station.

The communication unit further provides the opportunity of performing a remote configuration of the system, giving an operator the possibility to configure the system, e.g. defining levels for peak currents, voltage drop out levels, time out values and alerting options.

The system outlined above may also be employed in industries such as windmills or in power plants such as coal driven or nuclear plants and is not limited to applications in transformer stations.

The present invention also relates to a method of measuring high voltage current in electrical conductors, said method comprising:

providing a light source, said light source being an LED based light source, alternatively an incandescent light source, providing a first optical conduit being a first optical fiber, said first optical conduit conducting light emitted from said light source, providing an optical electric current measurement device comprising:

a housing defining a first open end and a second open end opposite said first open end, a first sealing means having an aperture, said first sealing means having an overall geometrical configuration corresponding to the overall geometrical configuration of said first open end of said housing, said first sealing means further comprising an aperture adapted for receiving said first optical fiber, a first fixture means for fixating said first optical fiber, a first optical lens having a reception part adapted for receiving said first fixture means for mounting said first optical fiber in optical continuation with said first optical lens, said first optical lens mounted in said housing, a first polarization filter mounted in said housing in optical continuation with said first optical lens, a glass rod received in and encapsulated within said housing in optical continuation with said first polarization filter, said glass rod being constructed from a material having magneto-optical properties, a second polarization filter mounted in said housing in optical continuation with said glass rod, a second optical lens mounted in said housing in optical continuation with said second polarization filter, said second optical lens adapted for receiving a second fixture means, a second fixture means for fixating a second optical fiber, said second fixture means received in said second optical lens, a second sealing means for sealing said second end of said housing, said second sealing means having an aperture for receiving a second optical fiber, said second sealing means mounted in said second end of said housing end, and a first and second lid adapted for fixation to said first and second end, respectively, of said housing, said first and second lid including an aperture for receiving said first and second optical fiber respectively, said optical electric current measurement device receiving said light from said first optical conduit, a second optical conduit being said second optical fiber, said second optical conduit receiving said light emitted from said optical electric current measurement device, providing a detection means for detecting said light emitted from said second optical conduit and converting said received light to an electrical signal, providing a processing means for processing said electrical signal from said detection means, providing a current measurement system for performing calibration measurements for said system, and providing a first communications means.

The calibration may be performed to eliminate signal degradations, e.g. caused by worn or damaged components, and may also compensate for interference from other sources emitting electrical fields, such as other electrical cables.

When the sensor is placed on a specific electrical cable of a plurality of electrical conductive cables, the system may perform a calibration so as to eliminate the influence from the remaining part of the plurality of electrical conductive cables and/or other electrical conductors.

The calibration is performed when the system is first installed, and is consequently able to compensate for device or component degradation.

The present invention further relates to a method of calibrating a system for measuring high voltage current in electrical conductors, the method comprising:

providing an electrical conductor carrying high voltage current, providing a light source, providing a first optical conduit defining a first and a second opposite end, said light source connected to said first end of said first optical conduit, said light source emitting light into said first optical conduit, providing a Faraday current measurement device defining a first and a second opposite end, said first end of said Faraday current measurement device connected to said second end of said first optical conduit, said Faraday current measurement device receiving said light from said first optical conduit, providing a second optical conduit, defining a first and a second opposite end, said first end connected to said second end of said Faraday current measurement device, providing an optical detection means for converting said light to an electrical signal, said optical detection means connected to said second end of said second optical conduit, providing a current measurement system performing a measurement of the current in said electrical conductor, performing said measurement of said electrical current in said electrical conductor, said system for measuring high voltage current in electrical conductors calculating a calibration constant, removing said current measurement system.

Preferably, the method of calibrating a system, further comprises:

said system for measuring high voltage current in electrical conductors periodically, alternatively aperiodically, recalculating said calibration constant by measuring the AC and DC components of said electrical signal, thus increasing measuring accuracy of the system significantly.

According to a particular aspect of the present invention, the method further comprises the steps of initially determining the DC component of said optical signal, then periodically determining the DC component of said optical signal, determining the actual AC component by multiplying the measured AC component with the ratio of said initially determined DC component and said periodically determinated DC component.

The method according to the present invention is preferably implemented using the Faraday current measurement device also according to the present invention.

The apparatus according to the present invention is a cost-effective, modular system for remote Supervision Control and Condition monitoring of medium voltage (MV) and low voltage (LV) power distribution networks. The system is here after named "the system"

The system is designed for installation in existing and new MV/LV stations.

The system also provides a platform for future applications. Examples are condition monitoring of power transformers and detailed power quality supervision.

Herein are described features of a system including the apparatus according to the present invention.

The system provides the control center operator with reliable information from the MV/LV stations, both under normal conditions and during outages.

MV and LV current measurements are made using compact optical sensors with non-conductive fiber cable connections to a current measuring module. This enables the use of the sensors in all types of stations and equipment; e.g. existing open-air stations as well as modern compact switchgear.

The system also features modules for LV voltage measurement, fuse supervision, battery charger control, battery condition monitor and GSM-communication with the control center.

In addition to this, other binary and analogue values in the station may be monitored; e.g. transformer temperature.

During normal operation the system calculates voltages, currents, active and reactive power in all bays and transmits them to the operator on request.

In case of a MV short circuit, the system calculates the short circuit current, the fault direction and the electrical distance to the fault. These values are relayed to the operator immediately for fast fault location.

The operator may also use the system for remote operation of controllable breakers/switches for fast fault isolation and power restoration.

Breaker positions are continually monitored and relayed back to the operator.

The system has been designed with focus on:

Versatility
- For use in new and existing MV and/or LV stations of different layout
- Systems can easily be customized to the specific application, thanks to the modular design
- Does not require any current or voltage measurement to be present in the station
- Has a broad range of supervision and control functions for fast fault localization, fast power restoration, data collection for planning purposes and optimal every-day operation
- Handles different MV grounding principles (arc-suppression coil, isolated neutral, resistance grounding)

Ease-of-Installation and Use
- Space requirements for system modules and sensors are small to allow installation in compact stations with modern compact switchgear
- System may be installed on ring main units (RMU) without interrupting of customers
- Safe and fast interconnection of modules using integrated terminal blocks
- Graphical parameter setting and calibration tool
- Provisions for remote parameter setting Reliability
- All modules and sensors are continually supervised and may issue a system alarm or a service request
- Time-out and re-transmission features
- Persistent loss of communication or severe system failures are detected using cyclic check-up calls
- Essential annunciations—e.g. short-circuit indications— are displayed locally too, on the module HMI/MMI, human or Man Machine interface.

No periodic inspection or re-calibration needed. Easy retrofit of serviceable components The current module range of the apparatus according to the present invention comprises the following modules:

Module A
Supervision and control module for MV line and transformer bays. Features:
- 3-phase optical measurement of MV and LV currents
- Circuit breaker (CB) control (make or break)
- CB feedback position Module B
Supervision module for transformer infeed to LV switchboards/networks. Features:
- 3 phase voltage supervision (LV)
- Charger control
- Back-up battery condition monitoring
- 2 multi-purpose analogue inputs
- 2 multi-purpose binary inputs
- 2 multi-purpose command relays Module C
Communication module. Features:
- 2-way operational communication with control centre using SMS
- GPRS communication for remote parameterization and data upload Time-out and re-transmission features The system has 3 interface levels as illustrated below: Control Center, System (inter-module) and Process interface, vide FIG. 79.

Control Center Interface
The daily communication between the Control Center and the system Modules is handled through standard SMS messages.

The data values are encoded into a flat 8 bit PDU formatted protocol. All data values for a complete bay are included in one SMS. The protocol includes error detection as well as flow control, e.g. Multiple retransmissions and acknowledging.

All communication is bridged to the Control Center via a separate module. In the present version GSM/GPRS is used as the communication media. In the future other communication types will be present.

System Interface
Internally the system Modules communicates via an industrial CAN network. Communication speed is 125 kbps.

All commands are encapsulated in a single CAN package except for SMS messages, which is transmitted as several CAN packages.

It is possible to address up to 126 modules for each communication bridge. Addresses are auto generated during installation.

Process Interface
The System is interfaced to the MV/LV field through an optical current sensor per line. The output from the optical current sensors is monitored in the module A.

The secondary voltage of the transformer is feeded into the System through the Module B. A low voltage presentation of the secondary voltage is distributed between the modules.

The voltage from the secondary side of the transformer is used in all calculations for both the primary and secondary side of the transformer.

The system Modules are connected together via a bus system (the system bus). The system bus carries the presentation of the secondary voltage as well as the CAN bus and the power supply.

The modularity of the modules combined with the system bus makes it possible to match nearly every transformer station installation or layout.

The System is developed to easily integrate to existing Control Center software. This makes it possible for the Control Center to get online measurements from MV/LV transformers.

The system enables the Control Center to present static, average and peak load from any single monitored bay. At the same time it is possible to operate installed switchgear or other auxiliary equipment in the transformer station.

The Modules is identified by a unique number, which consists of the mobile phone number, the transformer ID and the bay ID. The unique number ensures that all messages are passed correctly between the Control Center and the actual Module.

On top of the unique number a phone number lock is implemented in the system. This feature only accepts SMS messages to and from the Control System. The combination of the unique number and the phone number lock prevents unauthorized persons to operate the system.

The unique number of the system and the Control Center is synchronized during installation.

TABLE 1

Functional overview

| | MV line bay | Transformer & transformer bay | LV feeders/ fuseboard | Station level |
|---|---|---|---|---|
| Operational measurements | | | | |
| Voltage | + | + | | |
| Current | + | + | | |
| Active power | + | + | | |
| Reactive power | + | + | | |
| Daily peak load | | + | | |
| Additional measurements (examples) | | | | |
| Pressure, oil filled cables | + | | | |
| Transformer temperature | | + | | |
| SF$_6$-pressure, switchgear | + | + | | |
| Air temperature, humidity, etc. | | | | + |
| Commands and indications | | | | |
| Circuit breaker open/close command [1] | + | + | | |
| Breaker position | + | + | | |
| Indications and alarms | | | | |
| Short circuit indication, directional | + | | | |
| Short circuit indication, non-directional [2] | + | | | |
| Distance-to-fault, Ω | + | | | |
| Earth-fault indication | + | | | |
| Open-phase fault/fuse blown | + | + | +[3] | |
| Voltage out-of-range | | + | + | |
| High temperature | | + | + | |
| System faulty/schedule service | + | + | + | + |
| Extra indications and alarms (examples) | | | | |
| Station door open | + | | | |
| SF$_6$-pressure low, switchgear | + | | | |

[1] Currently, Module A is available with one command relay only
[2] For use in tie-breaker stations/stations without transformer, where no secondary voltages are present

EXAMPLE

In FIG. 80, a single-line diagram for a RMU, equipped with the system, is shown. In this case the MV line breakers have spring loaded trip mechanisms, similar to the type normally used in MV fuse-protected transformer bays. This minimizes the demand on the back-up battery. This is an option of e.g. the ABB SafeRing and ABB SafePlus 10 kV and in most modern MV switchgear. Trip of the spring mechanism is actuated via a trip coil.

The diagram is not an installation drawing. For simplicity, not all connections are shown. For specific connection diagrams etc., please refer to the relevant catalog sheets.

Earth fault detection in Petersen-coil/reactance grounded networks is normally done using wattmetric measuring principles. The reason for this is that the residual fault current in a Petersen-coil grounded network is very small, compared to the total capacitve earth fault current in the network, and orthogonal to the above mentioned current.

Wattmetric measuring schemes however, require both a voltage transformer and a current transformer. Therefore, the use of wattmetric earth fault indication is normally limited to the infeed point of the MV network of cost reasons The invention does not require the use of costly MV voltage measuring transformers—components with an inherent risk of causing a network fault in themselves.

Instead, the invention combines three facts:

1. At the occurrence of an earth fault in a Petersen-coil grounded network, a transient content of harmonics occurs in both MV voltages and MV currents. The transient is very short-lived (1-2 power system periods), and has a frequency in the range of hundreds to thousands of Hz, dependant on the network properties.
2. During an earth fault in a Peterson-coil grounded network, the level of harmonics in MV voltages and MV currents is significantly higher than during non-faulted operation, due to the network's response to the asymmetrical earth fault condition
3. The change in harmonics level only occur 'upstream' the MV feeder, i.e. between the feeder infeed point and the fault location. The change in harmonics level is not significant 'downstream' the MV feeder.

The system is contemplated to detect the absolute content and relative increase in harmonic currents using a fibre optic current sensors. Detection is done in two frequency ranges; one for MV networks with mainly underground cables, one for networks with mainly overhead lines.

By comparing these values to user settable alarm limits, the system may be able to detect an earth-fault condition 'downstream' the feeder from the system measuring point. The system may also be able to pinpoint the faulted phase.

The harmonic content of the currents of a non-faulted feeder varies slowly over time due to changes in load size and type. To avoid false alarming when leves increase, the harmonics reference level may be automatically adapted to the actual load condition.

The present invention provides a monitoring system for detecting earth faults in an electrical power supply grid comprising, a plurality of monitoring devices mounted in a number of monitoring locations, the each of monitoring devices including a detector for detecting level of harmonics in the electrical power, the level of harmonics detected in a specific frequency range, the monitoring devices further including a memory device for storing a harmonics reference value, the monitoring devices still further including a processor for comparing the level of harmonics with the reference level, the monitoring device including a communication device for transmitting an alarm provided the level of harmonics is above the reference level for a specific period of time.

The monitoring system comprises a paralaty of monitoring devices distributed at a number of monitoring locations throughout the electrical power supply grid. The monitoring devices enclose a detector for detecting a level of harmonics in the electrical power distributed in the electrical power supply grid. In a preferred embodiment of the present invention, the detector is an optical detector as described elsewhere in the present specification. The optical sensor relies on the Faraday effect as also described elsewhere.

The level of harmonics are detected in a specific frequency range or in the alternative in several frequency ranges. By comparing the level of harmonics at any given time to a reference level or threshold level it may be determined if an earth fault have occurred in the electrical power grid. The time wherein the level of harmonics is above the reference or threshold value may be as short as one or two cycles of the electrical power in the electrical power supply grid. The frequency of the electrical power supply grid in Europe be eg. 50 Hz and in the US 60 Hz, but other frequencies may occur as well as variations in the frequency in the electrical power in the electrical power supply grid thereby varying the specific period of time accordingly, which may be compensated by software in the monitoring device.

The monitoring device may calculate or determine the absolute content of harmocs in the electrical power supplied in the electrical power supply grid, alternatively or supplementary the monitoring device may determine the relative increase in harmonics in the electrical power supplied in the electrical power supply grid.

Advantageously, the monitoring system may further include a system, wherein the monitoring device further includes software to continuously or periodically adapt the reference value to variations in harmonics caused by varying load conditions of the electrical power supply grid.

Variations in the harmonics in the electrical power may occur and the monitoring system may then adapt the reference value in order to avoid alarms caused by variations in the harmonics not caused by earth faults.

In one embodiment of the present invention, the system, wherein a multitude of monitoring devices, are located at each of the monitoring locations for monitoring a multitude of phases in a multi-phase electrical power supply system.

The multitude of monitoring devices may eg. be used for monitoring multiple phases of a transformer station having eg. 3 phases.

In some embodiments of the present invention a multitude of monitoring devices may be located at each of the monitoring locations for monitoring a multitude of phases in a multi-phase electrical power supply system. In a particular embodiment of the present invention, the system may comprise a system, wherein the system further comprises a server receiving the alarms, the server including information relating to the monitoring locations, the server determining direction of fault from a monitoring location based on the alarm and the information relating to the monitoring locations.

The server may determine the direction of fault by comparing the information stored regarding the location of the monitoring device raising the alarm as the earth fault will cause a fault to be detected downstream of the feeder feeding the electrical power to the electrical power supply grid.

In certain embodiments of the system according to the present invention the monitoring locations may be transformer stations, the transformer stations including electrical power input cables electrically connected to a transformer for transforming electrical power in the electrical power input cables from a first voltage level to a second voltage level being lower than the first voltage level, in the alternative, the monitoring locations are branch points where a line of the electrical power supply grid branch.

In the system according to the present invention the detectors may be positioned at the primary side of the transformer and/or the secondary side of the transformer.

The present invention still further provides a method for detecting earth faults in an electrical power supply grid, the method comprising: providing a detection device detecting harmonics level in a current flowing in an electrical power supply cable, the detection device including a communication unit for communicating with an external unit, providing a reference value for the harmonics level, comparing the detected harmonics level to the reference value, provided the detected harmonics level is higher than the reference value transmitting an alarm signal via the communication unit.

The detection device may be a device as described elsewhere in the specification as an optical device using the Faraday effect to determine electrical current in conductors. The detection device may use the information collected by the optical detector to calculate or determine the level of harmonics in an electrical power supply cable.

A reference value is provided or calculated at certain times so that the detection device may determine whether or not the level of harmonics at a given time or in a given time period is above the reference value and if so the detection device may transmit an alarm to eg. a central server or monitoring station or master unit monitoring the power supply of an electrical power supply grid.

The detection and comparison may be performed a specific number of times in each period.

Advantageously, the level of harmonics are determined by a method, wherein the harmonics are determined over a first period of time and a second period of time, the first period of time being longer than the second period of time. In one embodiment, the first period of time is less than 1 second and the second period of time is greater than 1 minute, such as the first period of time being 10 to 800 milliseconds and the second period of time being 1 to 20 minutes, such as the first period of time being 50 to 500 milliseconds and the second period of time being 5 to 15 minutes, such as the first period of time being 100 milliseconds and the second period of time being 5 minutes.

Furthermore, the alarm may be transmitted provided a ratio of the harmonics level in the first period and the harmonics level in the second period is above the reference value.

In yet another aspect of the present invention a method of communication between a master unit and a plurality of monitoring units monitoring an electrical power supply grid, the master unit comprising a communication unit connected to a wired or wireless network for communicating with the plurality of monitoring units, each of the monitoring units comprising a transmitter and receiver having a wired or wireless connection to the network for transmitting a receiving data messages to and from the master unit, each of the monitoring units comprising a memory unit for storing one message, the method comprising: the master unit transmitting a message to a specific monitoring unit or a multitude of monitoring unit or all of the monitoring units, the specific monitoring unit or the multitude of monitoring units or all of the monitoring units receiving the message, provided the memory unit is empty the monitoring unit storing the received message in the alternative provided a previously received message is stored in the memory unit the memory unit discarding the received message. When a message is sent from a master unit to one or more of the monitoring units a reply from a monitoring unit or a number of monitoring units is considered as acknowledgement of receipt of the message and the method thereby reduces the amount of messages sent between the monitoring units and the master unit.

The monitoring units may also transmit messages to the master unit, such messages may include e.g. information relating to present state etc. or in particular alarms. If an error or fault occurs at a location, one or more monitoring stations may send an alarm to a master unit, e.g. being a computer placed at an electrical power supply company monitoring station.

For pay-load communication between the system and a control centre system/a central server, a purpose-designed protocol is used. This protocol holds several advantages:

Only one message format is needed for all message types (alarms, indications, measurands, commands and settings)

All relevant information may be represented in one telegram (e.g. SMS message) only A high level of security is ensured, The protocol may easily be implemented on e.g. a standard laptop Changes in protocol due to new features in the system may easily be implemented due to the versatile format As the method according to the present invention does not provide for the monitoring unit to store more than one message, i.e. the monitoring unit does not include a message queue, the master unit or the unit transmitting the message, is required to monitor whether or not a response the transmitted message is received.

When the monitoring unit takes reception of a message and no other message is stored in the memory unit, the message is stored in the memory unit and the monitoring unit thereafter processes the message and prepared a response, which response is transmitted to the transmitting unit, i.e. the master unit. If the monitoring unit receives a message while having a message stored in the memory unit or the monitoring unit has not marked the message as "processed", the received message is discarded.

Therefore, the method may include master unit monitoring if a response to the transmitted message is received with in a specific period of time. The method additionally provides that provided no response is received within the specific period of time the master unit retransmits the message.

The master unit may also keep a record of how many times a specific message has been transmitted, eg. in order to limit the number of times a specific message is transmitted to one or more monitoring units, whereafter the master unit may raise an alarm to eg. an operator or elsewhere in the system, that a certain or number of monitoring units are not responding to messages and also provide identification of such monitoring units.

The response sent by the monitoring unit may comprise voltage levels and/or phase information and/or fault status and/or settings and/or indications measured or determined by the monitoring station. Alternative, the message may include raw data collected by the monitoring unit.

Transmission of messages may be sent through a network being a GSM network, a 3G network, WLAN network, a PSTN or any other communications network. The use of existing networks include advantages of security in transmission etc.

The transmission of messages may utilise known formats such as a short-message-service format or any text format or in the alternative in any binary format.

Measurement of voltages, active and reactive power, short-circuit direction, distance to fault and other electrical parameters in a MV network, requires information on the 3 phase MV voltage, as well as the current and the relative phase angle between those.

Traditionally, voltage measurement is carried out using a number of voltage (or potential) transformers. The purpose of the transformers are:

Separation of the potentially dangerous MV and the measuring circuits

Giving a wide working range for different primary voltages

Giving a normalised output (e.g. 110 VAC) to the measuring circuits.

The use of traditional MV voltage measuring transformers have some serious drawbacks—apart from the costs:

Space. In many types of MV switchgear, voltage (and current) cannot be installed—or can only be installed at the factory Connectivity. In modern, hermetically closed MV switchgear cubicles, no connection to the MV conductors is possible—or may only be installed at the factory Voltage transformers, being connected directly or via fuses to the MV network, are components with an inherent risk of causing a network fault in themselves.

According to the present invention a system for monitoring and/or determining conditions at a first side of a transformer by measuring currents at a second side of the transformer is provided. Voltages at the first side being higher than voltages at the second side. The system according to the present invention comprises:

an optical unit including an optical transmitter and an optical receiver connected by an optical conduit comprising a sensor for sensing electrical fields, the sensor being positioned at a cable at the second side of the transformer, a memory unit for storing transformer related information, such as transformer ratio and/or transformer vector group and/or transformer load, a processor unit for determining currents in the cable based on optical power transmission from the optical transmitter through the optical guide and received at the optical receiver.

The present invention does not require the use of costly MV voltage measuring transformers. Instead, the invention combines three facts:

1. Access to the voltages on the LV side of the MV/LV power transformer is relatively easy. Connection may—taking appropriate measures—even be done during operation, i.e. on energized conductors. This is virtually impossible at MV level.
2. There exists a well defined relationship between the MV/LV power transformers nominal primary and secondary voltages, both with respect to amplitude and electrical angle displacement. This relationship is defined by the transformer ratio and transformer vector group, as noted from the transformer data sheet.
3. There exists a well defined relationship between the power transformer load and the displacement of the above mentioned relationship between primary and secondary voltages. This relationship is defined by the transformer short-circuit and no-load impedances, and the transformer load current and angle, relative to the voltage.

The present invention uses the existing MV/LV power transformer in the station as a measuring transformer. In this way, all drawbacks of traditional MV voltage measuring transformers may be avoided.

By taking the transformer ratio, transformer vector group and transformer load into account, the system can calculate an almost exact replica of the relevant MV voltages.

In this way, MV voltages, MV active and reactive power, MV short-circuit direction, MV distance to fault and other electrical parameters in the MV network may be calculated, only using a LV voltage measurement. The MV earth fault location is based on current-measuring principles only and does not need a MV voltages measurement either.

If the transformer is out of service—or no transformer exists in the supervised station—no reference voltages are present. The same problem arises if a feeder fails the instant it is energized—or if a grounded feeder is energized by mistake. In these cases, directional decision and distance to fault calculation is not possible.

To ensure a short-circuit indication in these cases, the system automatically switches to non-directional indication if one or more LV voltages are below a set limit for more than a set period. In this way, non-directional short-circuit indications are still available, enabling faster fault location.

When all 3 voltages return to normal (i.e. values above set limit) for more than the set time, the system switches back to directional indication.

Advantageously, the processor may further calculate voltage conditions on the first side of the transformer based on the optical power transmission and the transformer related information. Additionally, the system may further comprise an output unit for outputting data representing the current and/or the voltage conditions at the first side of the transformer.

The different aspects, features, objects and/or advantages identified above may all be combined.

BRIEF DESCRIPTION OF THE DRAWINGS

The present invention is now to be further described with reference to the drawings in which:

FIG. 4 is a schematic view of an end of a Faraday optical current sensor, FIG. 5 is a schematic view of an end of a Faraday optical current sensor, FIG. 6 is a schematic block diagram of a system for measuring electric current comprising a Faraday optical current sensor, FIGS. 20 and 21 are schematic illustrations of a sensor housing according to the present invention, FIG. 25 is a schematic view of a electrical cable, the B-field emitted therefrom and a glass rod, FIG. 26 is a schematic cut-through view of a FIG. 27 is a schematic view of a wire clip, FIG. 28 is a schematic view of a distance piece.

FIG. 73 is a diagram illustrating possible states and possible transitions between the states of the module, FIG. 74 is a block diagram similar to the block diagrams of FIGS. 53 and 54 illustrating error inputs and additional outputs, FIG. 75 is a diagram of an MMI interface (Man-Machine Interface), FIG. 76 is a diagram of a bridge between a data central and modules of the system, FIG. 82 is a diagram illustrating the FFES, FIG. 83 is a block-diagrammatic view of the power supply, FIG. 84 is a block-diagrammatic view of the CAN driver, FIG. 85 is a block-diagrammatic view of the of the I/O block, FIG. 86 is a block-diagrammatic view of the fiber output driver, FIG. 87 is a block-diagrammatic view of the fiber input, FIG. 88 is a block-diagrammatic view of the temperature sensor.

DETAILED DESCRIPTION OF THE INVENTION

Figure 1:
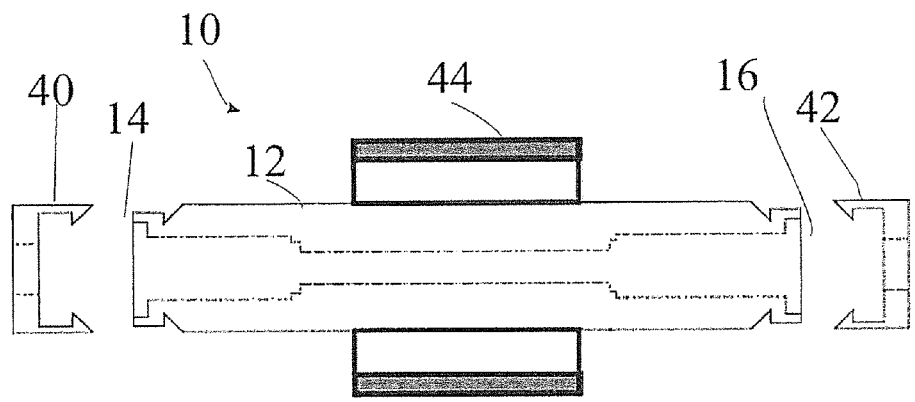
FIG. 1 is a schematic cross-sectional view of a Faraday optical current sensor.
Figure 2:
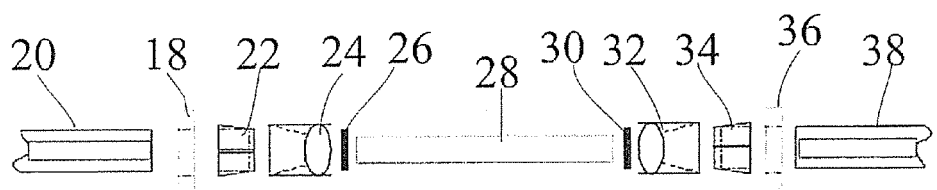
FIG. 2 is a zoomed schematic cross-sectional view of a Faraday optical current sensor, FIG. 3 illustrated a groove in the housing of a Faraday optical current sensor.

FIG. 1 is a schematic cross sectional view of a Faraday optical current sensor 10, and FIG. 2 is a zoomed schematic cross sectional view of the Faraday optical current sensor 10 of FIG. 1. The Faraday optical current sensor 10 comprises an oblong housing 12 defining a first and an opposite second end; designated 14 and 16 respectively. At the first end 14 of the housing 12 a first sealing 18 is mounted, the first sealing 18 having an aperture for receiving a first optical fiber 20. A first fiber fixture 22 mounted in the housing 12. The first fiber fixture 22 having a aperture for receiving an optical fiber 20. An optical lens 24 having a receiving section for receiving the optical fiber 20 and the fiber fixture 22. A first polarization filter 26 mounted in optical continuation with the optical lens 24. A glass rod 28 in optical continuation with the first polarization filter 26. At the opposite end of the glass rod 28 a second polarization filter 30 is mounted in optical continuation therewith. A second optical lens 32 is mounted in optical continuation with the second polarization filter 30. The second optical lens 32 including a receiving section for receiving a second fiber fixture 34. A second sealing 36 having an aperture for receiving a second optical fiber 38.

Two optical fibers 20, 38 are inserted through the first and second sealings 18,36 into the first and second fiber fixtures 22,34, respectively. The optical fibers 20, 38 are mechanically fixated to the housing 12 by means of two sensor lids 40.42, respectively. The sensor lids 40.42 fixate the fibers 20, 38 and seals the Faraday optical current sensor 10.

The material used to mould the sensor lids 56,58 is preferably a plastic material able to withstand temperature ranges from −40 to 150° C. and have an electrical isolating property. The material is preferably non-permeable to light in the 400 to 1000 nm range. Materials with the above mentioned properties may be a plastic materials such as Ultem or Peek.

The housing 12 may further comprise a set of wings 44 for the mounting of the Faraday optical current sensor 10 to an electrical conductor by plastic strips or other fastening means.

Figure 3:
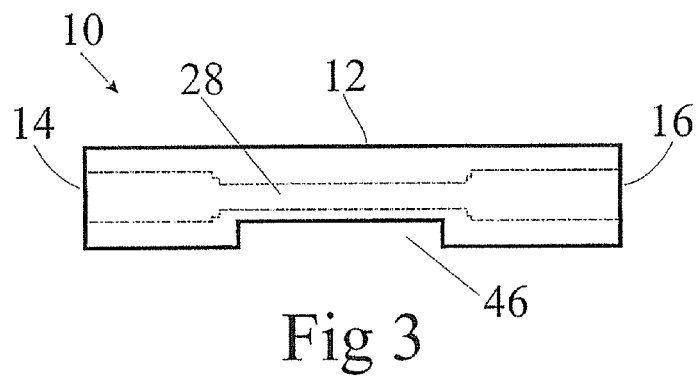

FIG. 3 is a schematic side view of a faraday optical current sensor 10 illustrating a groove 46 in the housing 12 extending parallel with the glass rod 28. The groove 46 may have a planar bottom wall or alternatively a rounded bottom wall for improving the fixation of the Faraday optical current sensor 10 to an electrical conductor. The groove 46 is incorporated in the housing in order to bring the glass rod 28 as close to the electrical conductor as possible and have the further advantage of fixating the Faraday optical current sensor 10 at a 90-degree angle with respect to the electrical conductor. The width of the groove 46 may be arbitrary but preferably have the same or shorter length than the length of the glass rod 28. The fixation wings 44 may be incorporated in a geometrical expansion of the groove 46.

FIG. 4 is a schematic view of one end 14 of the Faraday optical current sensor 10. The Figure illustrates the first polarization filter 26 mounted in the housing 12.

FIG. 5 is a schematic view of the opposite end of the Faraday optical current sensor 10 illustrated in FIG. 4. The Figure further illustrates the second polarization filter 30 mounted in the housing 12 rotated 45° with respect to the first polarization filter 26. The geometrical configuration of the polarization filters are illustrated as square, alternatively, the filters may have any geometrical configuration as long as the polarization planes of the two polarization filters are rotated 45°, respectively.

A prototype version of the Faraday optical current sensor 10 having the following mechanical dimensions has been constructed. The overall length of the housing 12 is 65 mm and the diameter 12.6 mm. The opening for receiving the fiber is 7.5 mm. The wings 44 have an overall size of 11.6 mm×40 mm from end to end. The groove has a length of 45 mm. The glass rod has a length of 35 mm and a diameter of 4 mm. The polarization filters are square, with each of the sides being 5.3 mm.

FIG. 6 is a schematic view of a system for measuring electric current in a conductor by utilising the Faraday effect in a magneto-optical transducer. The system comprises a light source 46. The light source may be a light bulb or an LED based light source. The light emitted from the light source 46 is guided through a first optical conductor 48, such as an optical fiber. The optical conductor 48 is connected to a Faraday optical current sensor 10 comprising two polarization filters 26, 30 and a magneto-optical material. The polarization filters 26, 30 are rotated 45° respectively. The Faraday optical current sensor 10 is mounted on an electrical conductor 50 wherein a high voltage current flows, such as 10 kV. The output end of the Faraday optical current sensor 10 is connected to a second optical conductor 52, such as an optical fiber. The second optical conductor 52 is connected to a detection system 54, which converts the analogue optical signal to a digital signal. The digital signal from the detection system 54 is provided to a signal-processing unit 56, which performs a number of calculations on the data. A measurement device 58 is mounted on the electrical conductor 50 for calibration purposes. The measurement device 58 is connected to a current measurement system 60 providing additional data to the signal-processing unit 56.

The signal-processing unit 56 compares, stores and performs calculations on the data from the detection system 54 and the data from the current measurement system 60.

Calibration of the system requires the signal processing unit 56 to compare data from the detection system 54 and the current measurement system 60, the signal processing unit then stores these data. At the end of the calibration the stored data from each of the devices are summed up. The summed up data from the current measurement system 60 is divided with the summed up data from the detection system 54. The result of this division is used as a calibration value, the calibration value is stored in the signal processing unit 56. The current measurement system 60 and the measurement device 58 may be dismounted from the set-up.

The set-up illustrated in FIG. 6 having a light source 46, and Faraday optical current sensor 10 and an optical detection system 54 are sensitive to electrical noise in the light source 46, optical noise in the detection unit 54 and interference from magnetic fields from nearby inductors and systems. The mounting and the set-up of the sensor 10 as well as the shape and the diameter of the conductor to be measured have an influence on the measurements performed by the system. The system may be used in a variety of locations around the world where temperature variations may occur often. The temperature may affect the operation of the light source 46 and the detector circuit in the detection system 54. Furthermore, the light source 46 and the detection system 54 as well as other components in the system may suffer to degradation over operation and product lifetime. A precise measurement depends on a stabile light source and determining the compensation factors for the implemented system as well as recording changes in light source output, long term variations of the detection system and variation in temperature of the surrounding environment.

Figure 7:
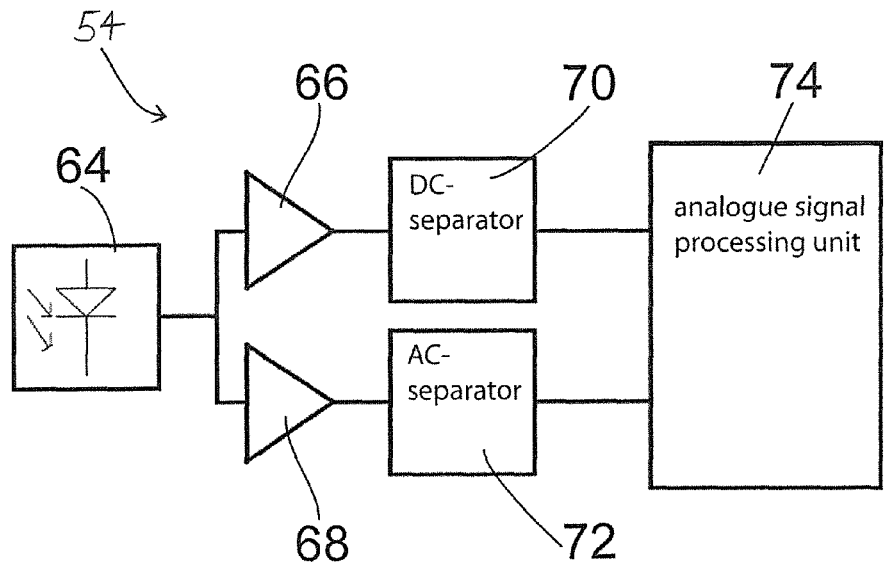
FIG. 7 is a schematic view of the detection system that is a part of the system illustrated in FIG. 6.

FIG. 7 is a schematic view of the detection system 54 of the current measurement system. The detection system comprises a light sensitive component 64 that converts the light received by the detection system 54 from the second optical conductor 52. The light sensitive component 64 converts the light to an electrical signal. The electrical signal comprises an AC and a DC component, the signal is divided in two and provided to two amplifiers 66, 68 and the amplified signal from the amplifier 66 is supplied to a DC separator 70 separating the DC component from the amplified signal. The amplified signal from the amplifier 68 is supplied to an AC separator 72 separating the AC component from the amplified signal. The analogue signal processing unit 74 converts the DC separated signal and the AC separated signal from analogue signals to digital signals. The DC signal is compared to a stored DC signal value measured during calibration of the system. The percentage change from the calibrated DC component is multiplied to the AC component. The signal from an optic Faraday effect sensor comprises a DC and an AC component. The AC component arises when a time-varying magnetic field is applied to Faraday optical current sensor 10. The DC component arises if a DC or a non-magnetic field is applied to the Faraday optical current sensor 10, if the AC signal includes a DC component, long-term variations of the detection system and variations in temperature of the surroundings.

Figure 8:
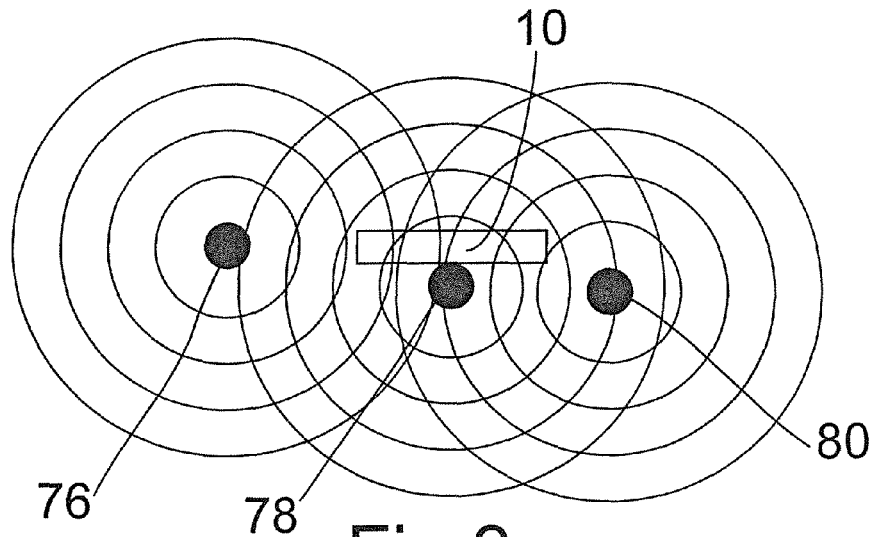
FIG. 8 is a schematic cross-sectional view of a measurement set-up with three electrical conductors and one Faraday optical current sensor

FIG. 8 is a schematic, cross sectional view of a set-up with three electrical conductors 76, 78, 80, each being a high voltage conductor. The concentric circles around each of the conductors represent the electromagnetic field radiated therefrom, illustrating that measurements on electromagnetic fields emitted from one conductor 78 by a sensor 10 may be influenced by fields radiated from other electrical conductors 76, 80. The calibration process is performed in order to eliminate the interference from neighbouring conductors and other electromagnetic fields in the surroundings influencing the sensor 10. These other magnetic fields may originate from electrical equipment within a transformer station in which the sensor is mounted, or fields radiated from the electrical conductor on which the sensor is mounted being reflected from the interior of the transformer station, alternatively reflected electromagnetic fields emitted from neighbouring electrical conductors.

Figure 9:
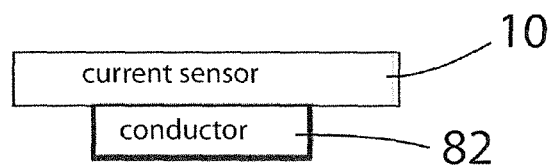
FIG. 9 illustrates a measurement set-up with a rectangular conductor.

FIG. 9 illustrates a set-up with a Faraday optical current sensor 10 mounted on a rectangular conductor 82.

Figure 10:
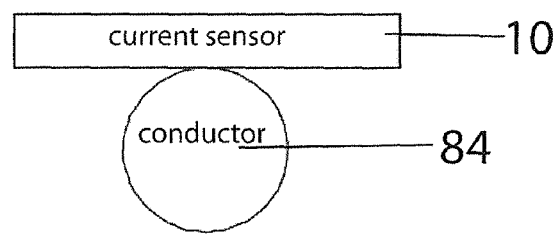
FIG. 10 illustrates a measurement set-up with a circular conductor.

FIG. 10 illustrates a Faraday optical current sensor 10 mounted directly to a circular conductor 84.

Figure 11:
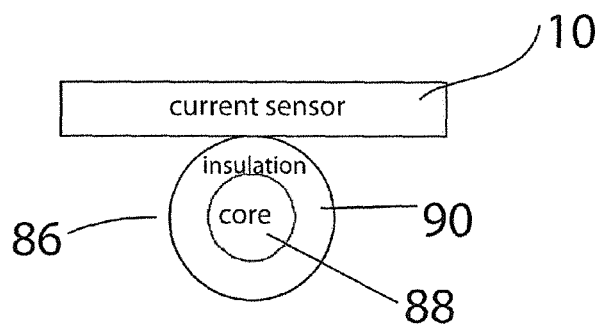
FIG. 11 illustrates a measurement set-up with a circular conductor with an insulating layer.

FIG. 11 is a schematic cross sectional view of a Faraday optical current sensor 10 mounted on a circular conductor 86 having a conductive core 88 and an insulator layer 90 arranged surrounding the perimeter of the electrically conductive core 88. The Faraday optical current sensor 10 is a point measurement sensor, and the shape of the B-field and the distance between the inductor are parameters to be considered. The on-site calibration of the sensor system compensates for the B-field shaped variations and the distance from the inductor, as well as static electromagnetic fields present, originating from other sources.

The amplitude of the DC component where no magnetic field is applied to the Faraday optical current sensor 10 depends on the intensity of the light emitted from the light source, the resistance through the optic system and the detector circuit. The AC and DC components of the signal have a linear correlation where no DC magnetic field is applied to the optic Faraday effect current sensor.

Figure 12:
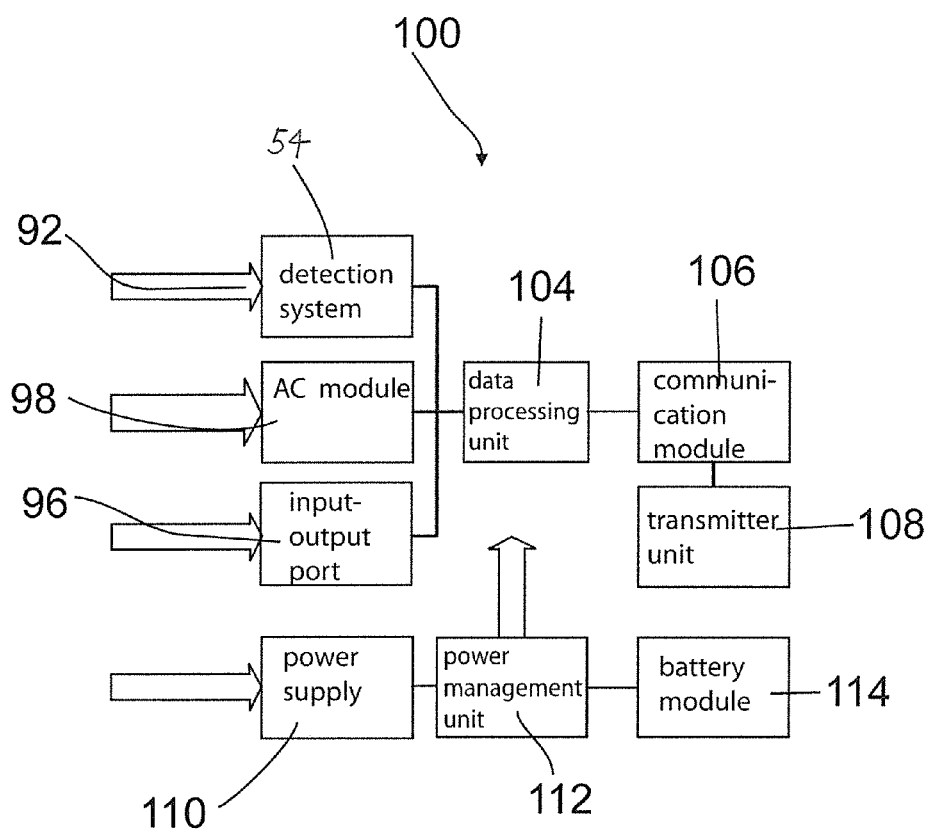
FIG. 12 is a schematic block diagram of a prototype implementation of the detection system and processing unit of the system illustrated in FIG. 6, FIGS. 13 to 18 are schematically views of a prototype version of the present invention, FIG. 19 schematically illustrates the components of the sensor.

FIG. 12 is a schematic block diagram of a prototype module 100 for implementation of the detection system 54 and signal-processing unit 56 of FIG. 6. The module 100 includes the sensor inputs 92 inputting the signal from the Faraday optic current sensor 10 to the detection system 54 illustrated in detail in FIG. 7. A number of optocouplers corresponding to the number of low voltage drop lines are used to determine the voltage on the voltage drop lines, these voltages being in the range of 400 volts AC. The module further includes a user interface input-output port 96 in the prototype implementation, the input-output 96 in the prototype version is an RS-232 serial communications port. The input-output port 96 is connected to a user interface module 106, used in the set-up and initial calibration of the system.

The data from the detection system 54 and the 400V AC module 98 are sent to a signal and data processing unit 104, which performs a phase matching for determining the phase angle between the current and the voltage. In a prototype implementation of the measurement system, the signal and data processing unit have been implemented as an embedded dual processor application. The system functionality is split into a measurement part and a communication part. The measurement part handles the scanning of 6 current channels, the scanning of 3 voltage channels and the calculations on the collected data.

The module further comprises a communication module 106 for communicating the data collected by the data processing unit of the processor unit 104. As the system may be installed in a remote location and used for automatic surveillance of the operation of a transformer station, the system may be connected to a central data collection site collecting data from a number of transformer stations for the safe operation of an electrical distribution network. The communication module 106 may be constituted by a module adapted for converting the data from the data processing unit 104 to a communication protocols such as GSM and/or ISDN and/or other communication or media, alternatively a data communication protocol, such as TCP/IP. The module further includes a transmitter unit 108, which, in case of the communications module being a GSM module is an antenna, alternatively a local area network port or the like. The module 100 further includes a power supply 110 supplying the module with electrical power. The power is supplied to a power management unit 112 dividing the power as system power and for charging a battery module 114 for the safe operation of the module 100 is case of power failure.

In the prototype implementation of the module 100, the protocol for communication the status of the transformer station is described in detail below in a number of tables.

FIGS. 13 to 18 are schematic block diagrams of a prototype version according to the present invention. All components are described by name and product number in the illustrations, and are considered to be self-explanatory when taking in to account the descriptions above.

Figure 13:
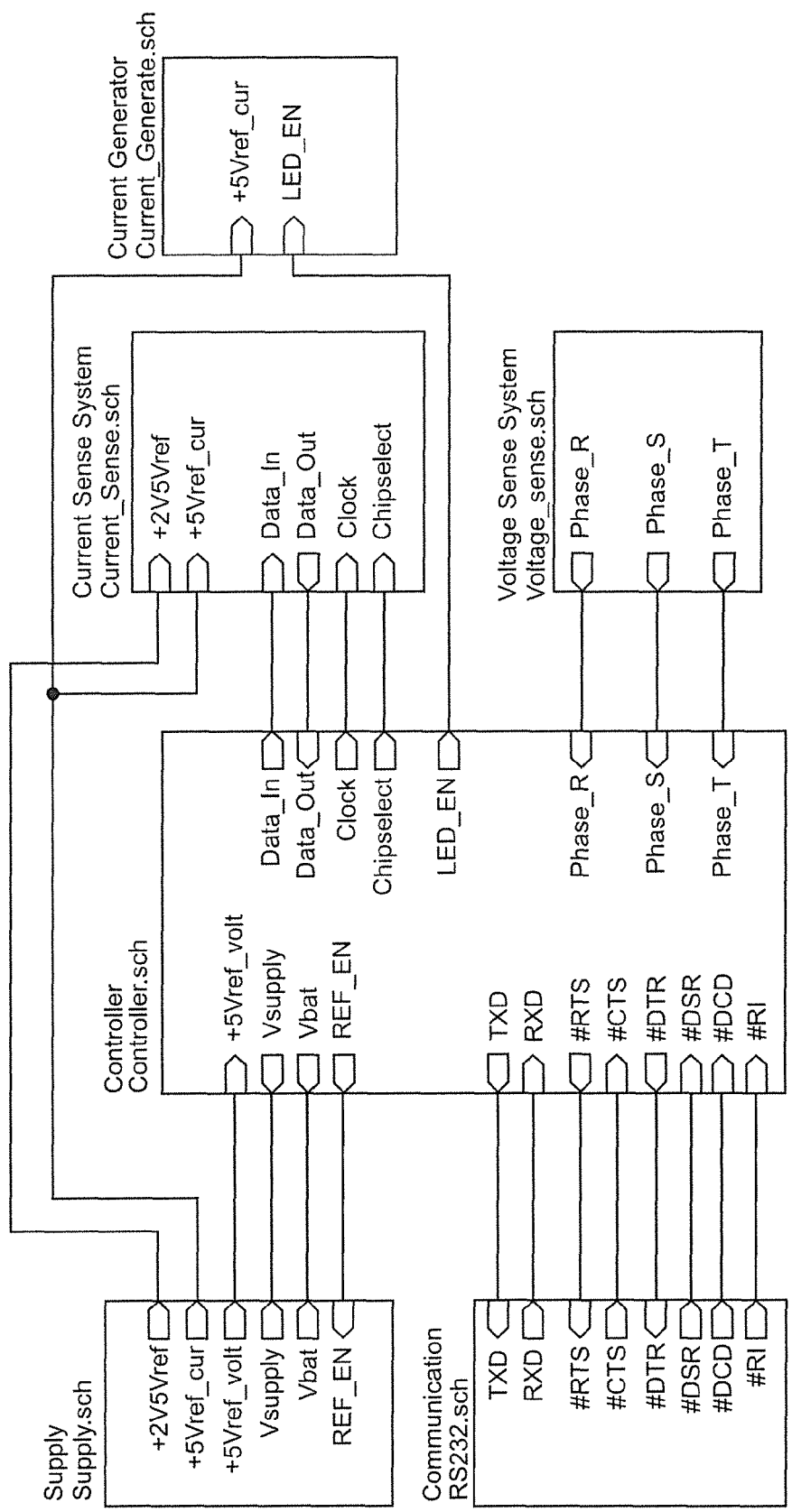

FIG. 13 is a schematic block diagram of a prototype version of a 10 kVSS system according to the present invention.

Figure 14A:
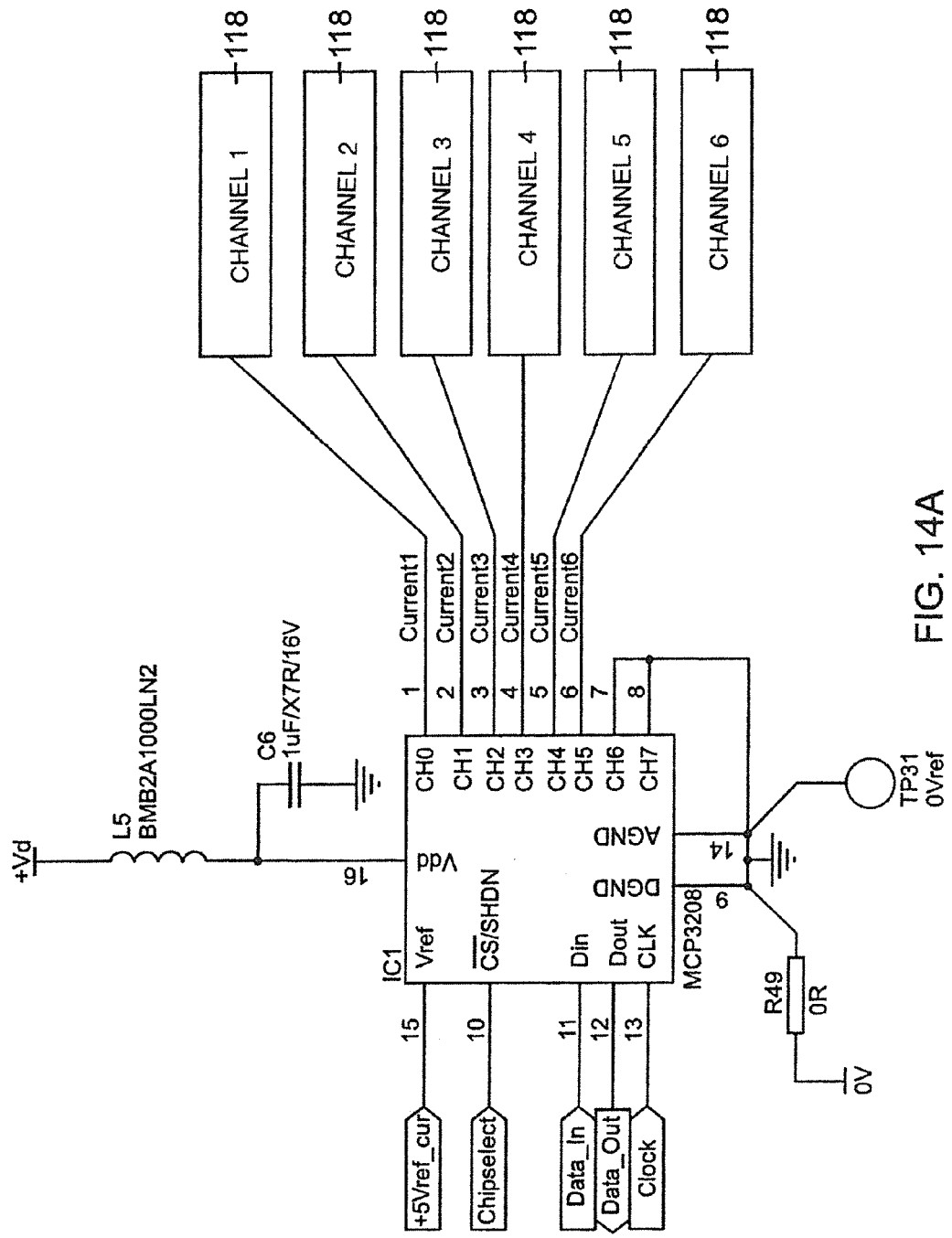
Figure 14B:
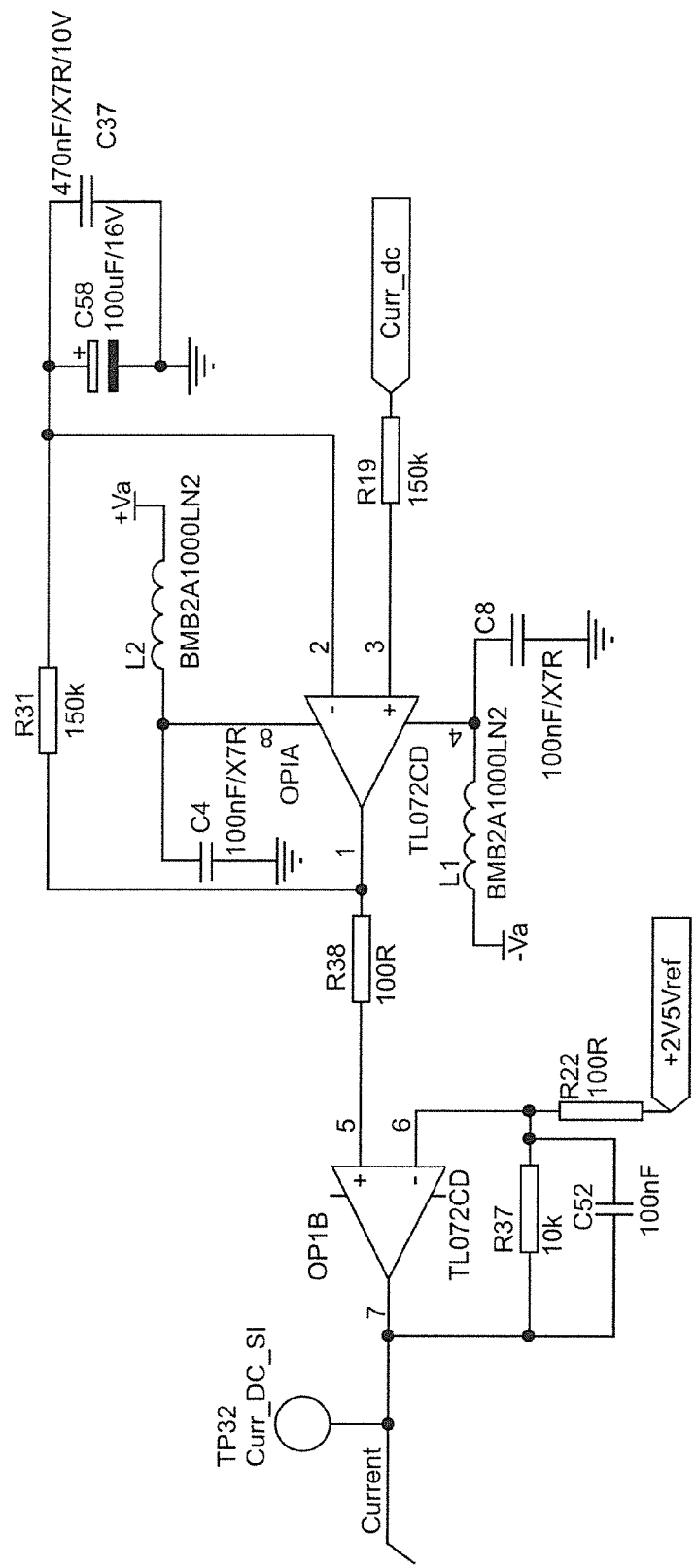

FIG. 14 A is a schematic block diagram of a DC current sensor. In the prototype version the DC sensor has 6 channels 118, each channel being supplied with a signal from a sensor circuit illustrated in detail in FIG. 14 B.

Figure 15A:
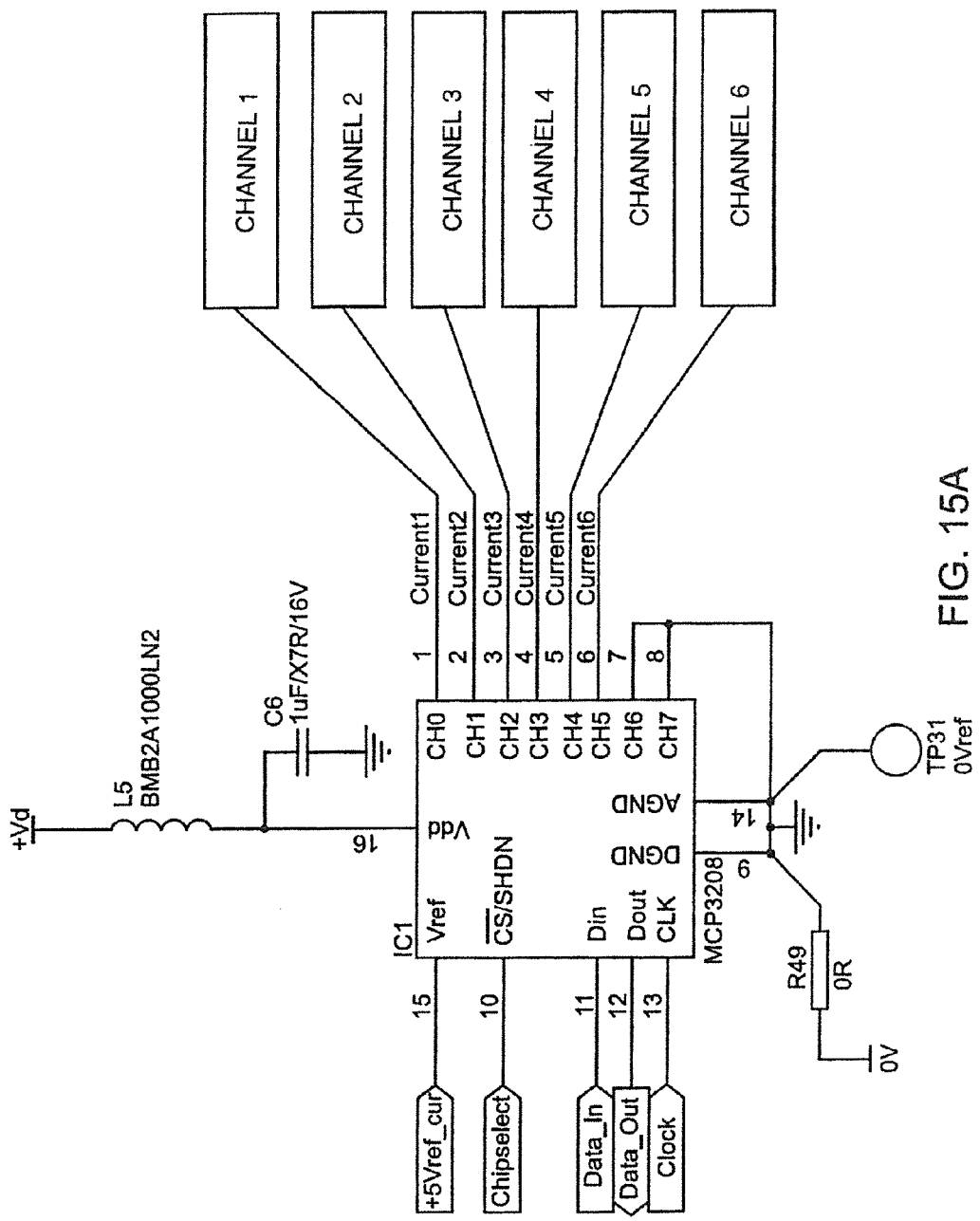
Figure 15B:
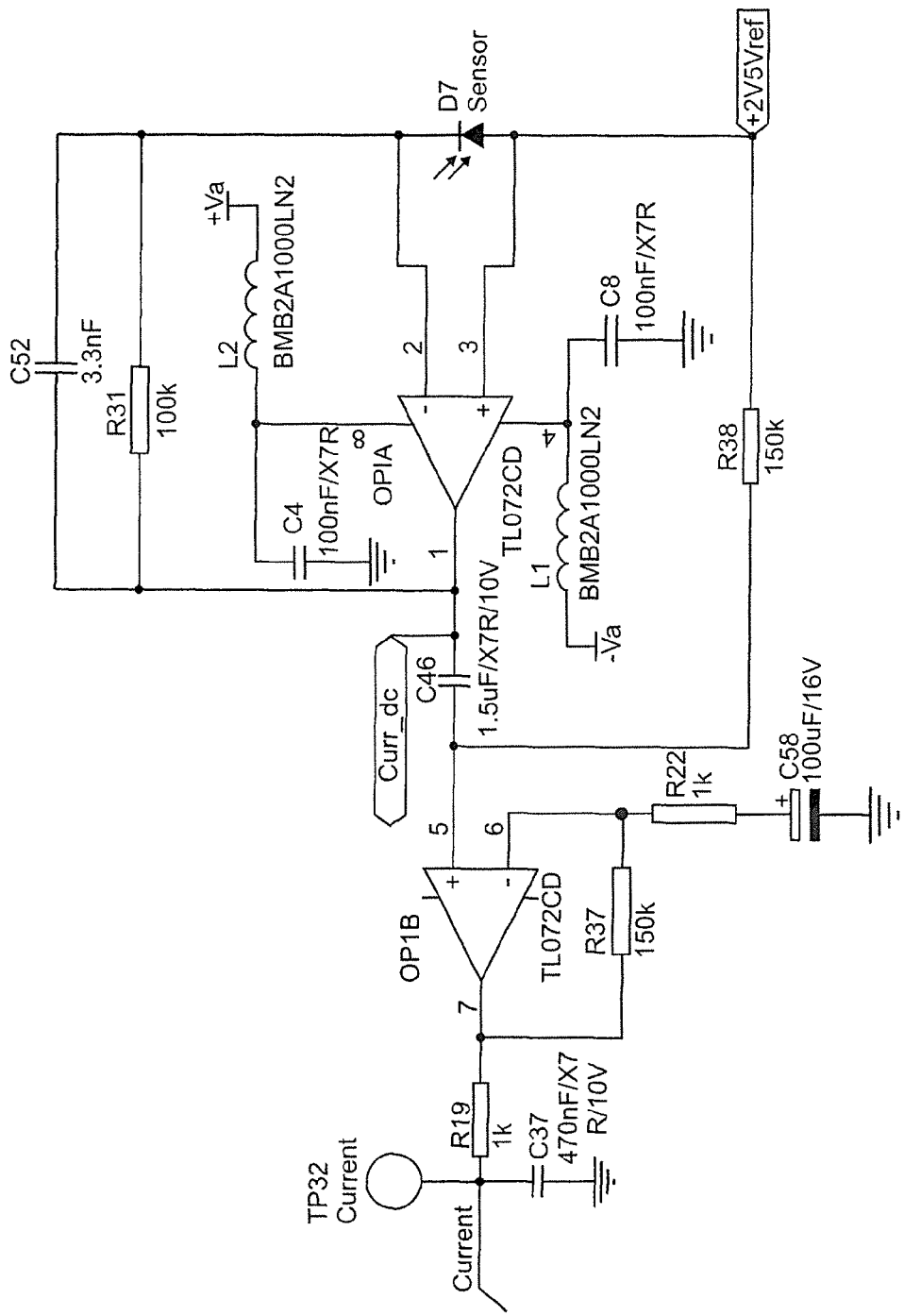

FIG. 15A is a schematic block diagram of a current sensor. In the prototype version the sensor has 6 channels, each channel being supplied with a signal from a sensor circuit illustrated in detail in FIG. 15 B.

Figure 16:
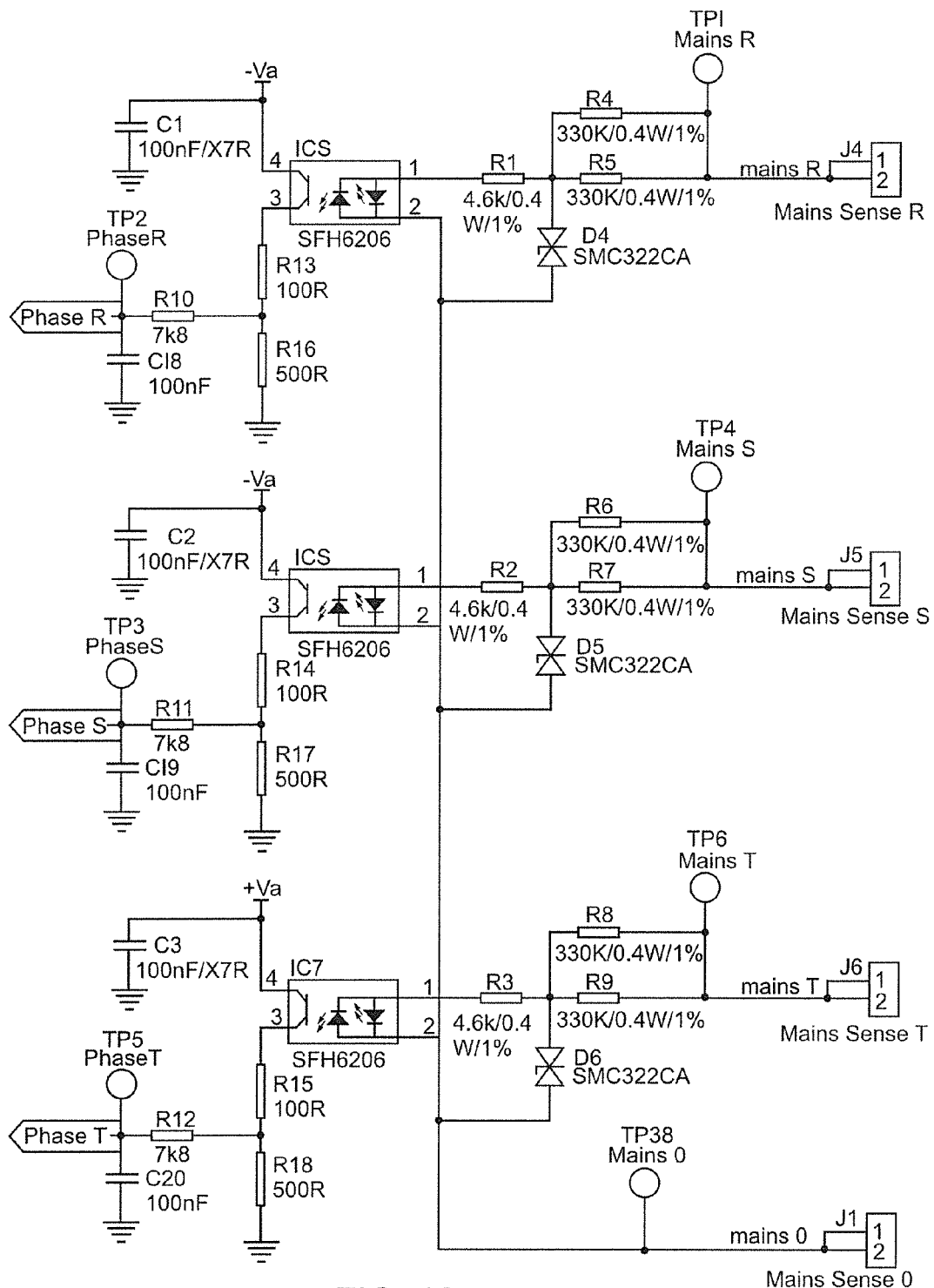

FIG. 16 is a schematic block diagram of a voltage sensor circuit.

Figure 17A:
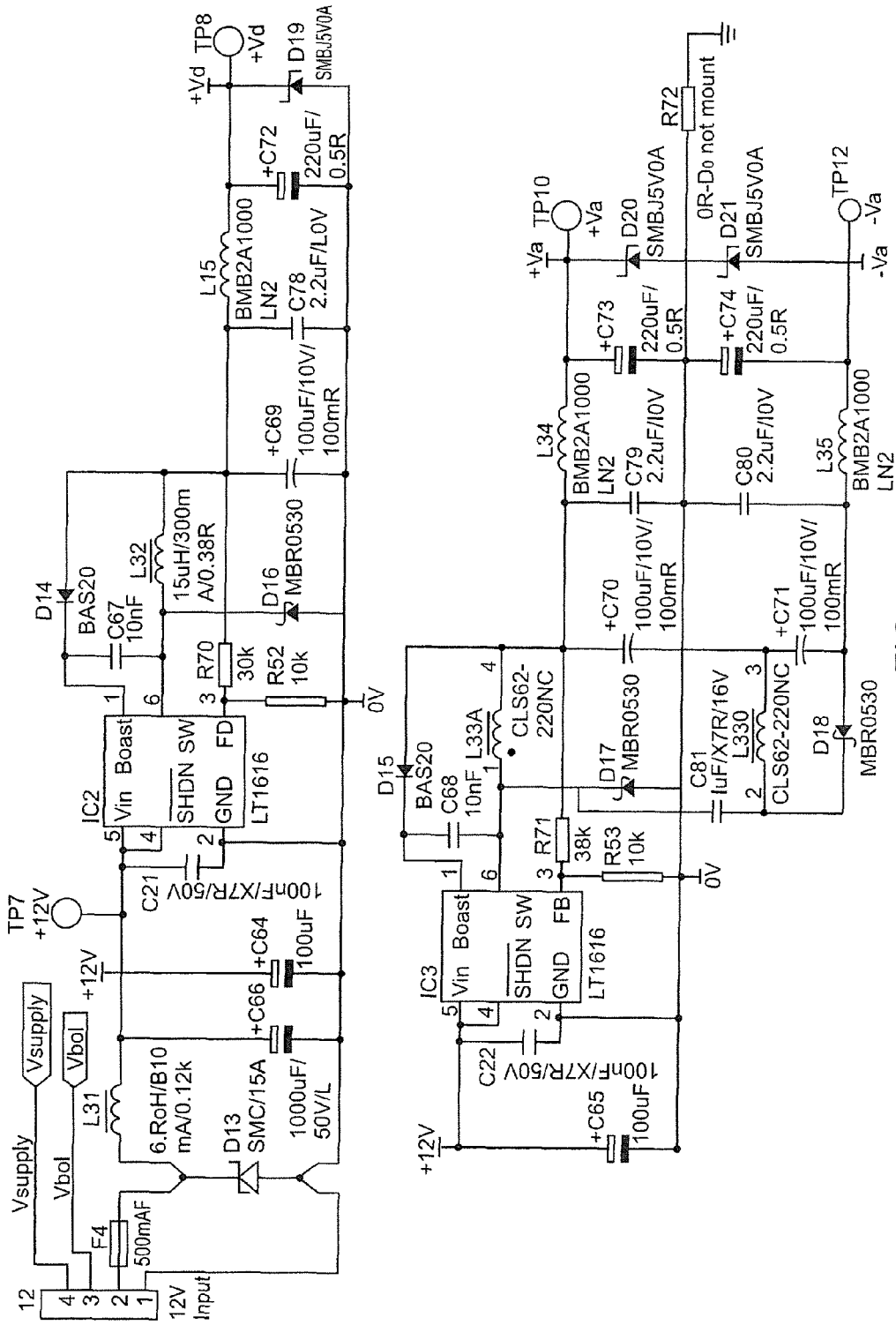

FIG. 17A is a schematic block diagram illustrating a power management circuit.

Figure 17B:
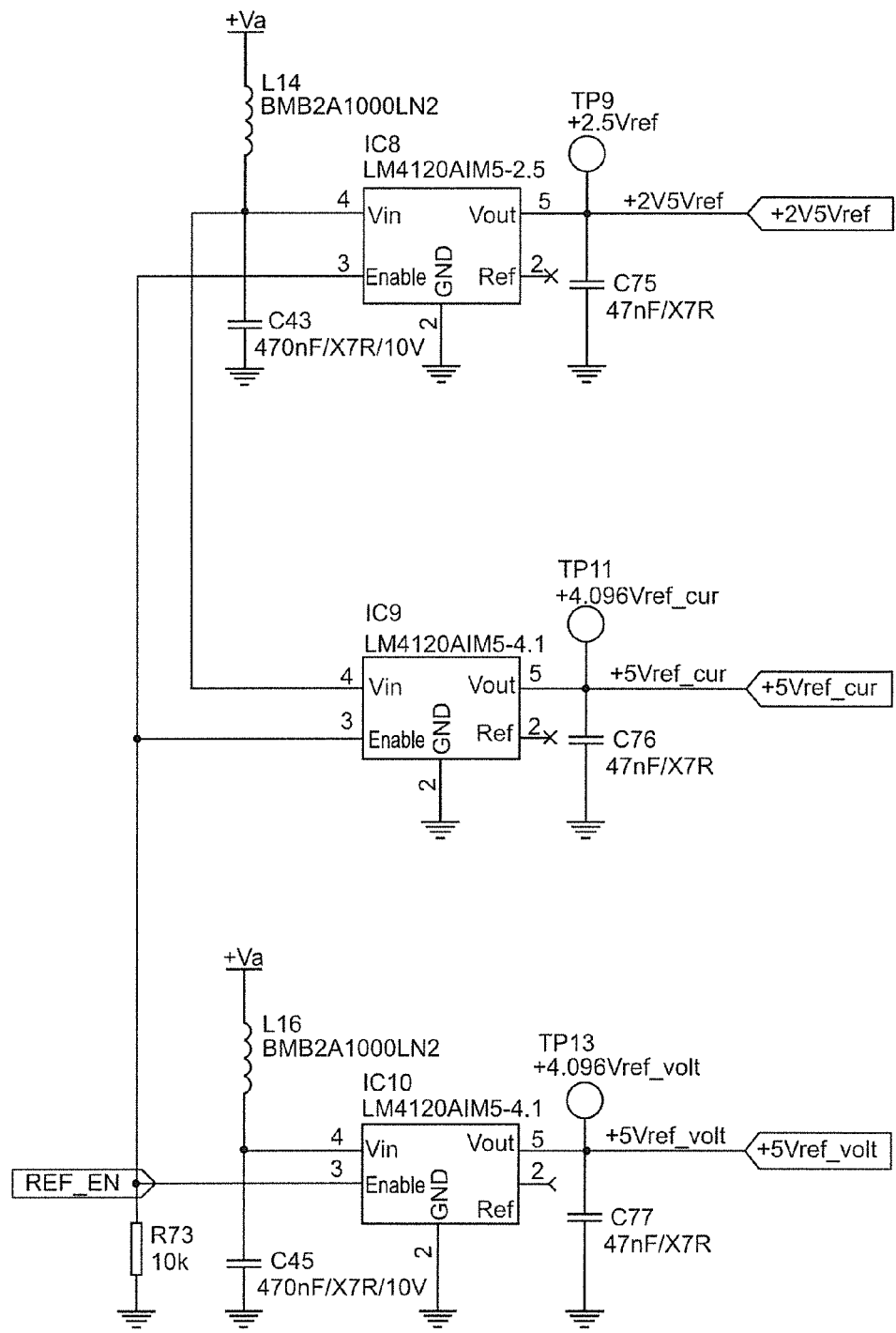

FIG. 17 B is a schematic block diagram illustrating a power management circuit co-operating with the power management circuit illustrated in FIG. 17 A.

Figure 18:
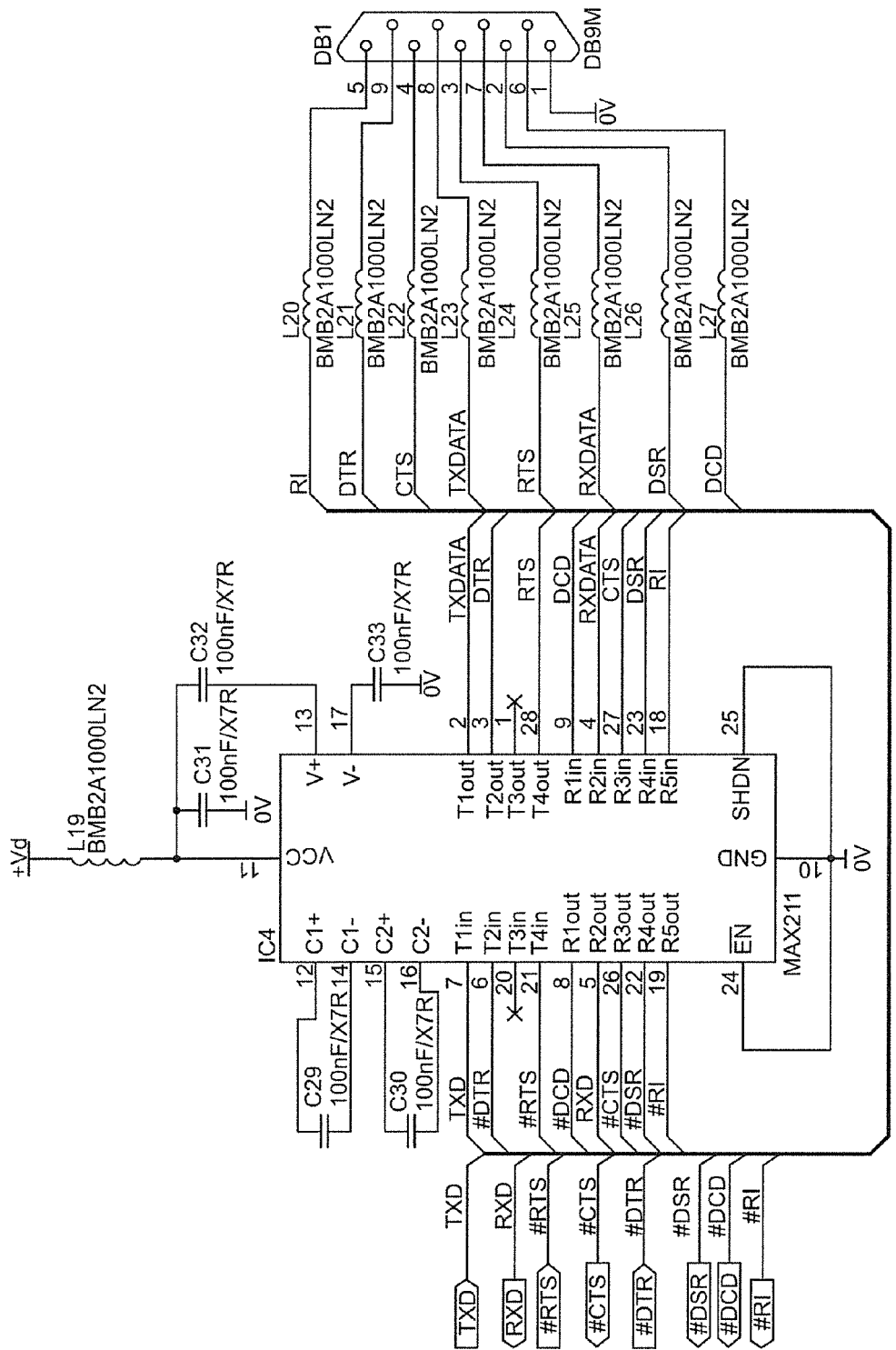
Figure 22:
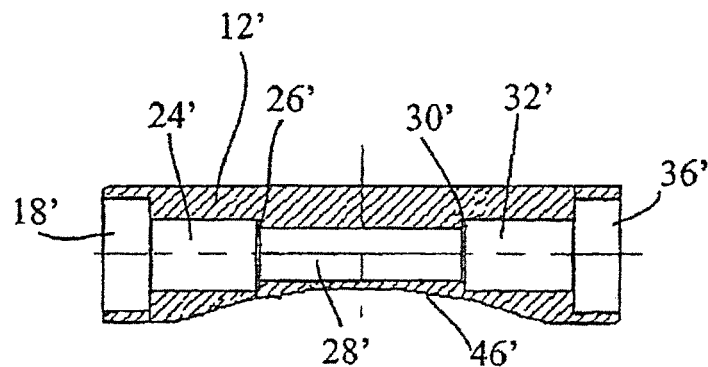
FIG. 22 is a schematic illustration of a cut-through sensor according to the present invention.

FIG. 18 is a schematic block diagram of an RS-232 communications port and the signals relating thereto.

In the following another embodiment of the present invention is discussed. Parts reoccurring in this embodiment and where discussed in relation to the drawings 1 through 18 will have similar reference numerals.

FIG. 19 is an illustration similar to that of FIGS. 1, 2 and 3.

FIGS. 20 and 21 illustrate a second embodiment of a sensor 10' according to the present invention. The sensor housing 12' is the main element in the sensor 10'. It handles the mounting on the cable and fixture of the optics. The housing 12' is designed so it is possible for welding. The plastic is designed to withstand temperatures from −40° C. to 250° C. and have an isolating effect for electricity and heat. The sensor 10' is in the presently preferred embodiment made from PEEK without glass reinforcement. PEEK grades offer chemical and hydrolysis resistance similar to PPS, but may operate at higher temperatures. Un-reinforced compression moulded PEEK offers a high degree of wear resistance.

PEEK may be used continuously up to 480° F. (250° C.) and in hot water or steam without permanent loss in physical properties. PEEK carries a V-O flammability rating and exhibits very low smoke and toxic gas emission when exposed to flames.

The sensor wing 44' is used to mounting the device onto an electrical cable. It is formed so that strips up to 5 mm may be used to fasten the device to a cable. The strips are preferably made of Teflon so that they may withstand wide temperature ranges and tough environmental influences. The sensor wing 44' is integrated in the sensor housing 12' and is designed for moulding.

On the surface of the sensor 10' facing the cable, the sensor 10' has an area 46' with where the diameter is smaller compared to the rest of the sensor 10'. This area 46' enables a location of the faraday rotator close to the cable and fixes the sensor 10' 90° degrees relative to the cable.

A short distance between the conductor and sensor 10' is important because the intensity of the magnetic field decreases approximately by one divided with the distance from the cable.

The faraday light rotator 28' is mounted in the housing 12'. The tolerance is kept tight therefor the glass rod 28' is mounted with a light press fit.

The Polaroid filters 26' and 30' are mounted in the housing 12' in optical continuation with the glass rod 28'. The filters 26' and 30' are turned 45° degrees with respect to each other. This is done to obtain the largest signal bandwidth.

It is also possible to glue the filters 26' and 30' onto the glass rod 28', this should gain 4-5% more light through the optical matrix. Due to different temperature gradients in glass, glue and filters, the filters fell of in stress tests. It was also less cost efficient in production. However, it is envisioned that is possible to find materials to allow this embodiment to function properly and at a reasonable cost.

In the presently preferred embodiment, a small lowering has been design in the sensor housing 12' to fix the Polaroid filters 26' and 30'. The filters 26' and 30' may move according to temperature changes and has still have a reasonable optical construction. The filters 26' and 30' are fixed in the square and the lens.

The Polaroid filter is used for viewing the angle turn of the light. The Polaroid filter is made of plastics and is only 0.2 mm thick. The Polaroid filter is of such a material that is holds it strength within a temperature range of −40° C.-80° C. The filter is linear polarized and made by a punching tool in production. The filter may be steamed directly onto the glass rod.

The lenses 24' and 32' are mounted in the housing 12' in optical continuation with the filters 26' and 30', respectively. The lenses 24' and 32' holds the Polaroid filters 26' and 30' in the squares. The lenses 24', 32' are mounted with a small press fit, and is therefore fixed in the optical matrix.

The optic fiber is placed into the fiber fixture 128, illustrated in FIG. 26. When the fiber fixture is clicked into the optical lens system, the fiber end is positioned in the focal point. When fiber fixture is placed in the optical lens, it tightens around the fiber takes care of mechanical stress.

Silicon sealings 18' and 36' are placed at opposite ends of the housing 12'. The sealing plugs 18' and 36' are used for sealing the sensor 10' thereby protecting it against dust, steam, water and other deteriorating influences. The sealing also functions as a tightening of the optic fibers, not illustrated here.

The function of the sealing is to secure the optical part of the sensor 10', primarily against water and dust. When the lid is pressed onto the sensor housing 12' the sealing is pressed against the fiber to handle mechanical stress. The sealing is designed to hold its strength within a temperature range of −40° C.-120° C. It has a good resistant to chemicals and ozone.

Figure 23:
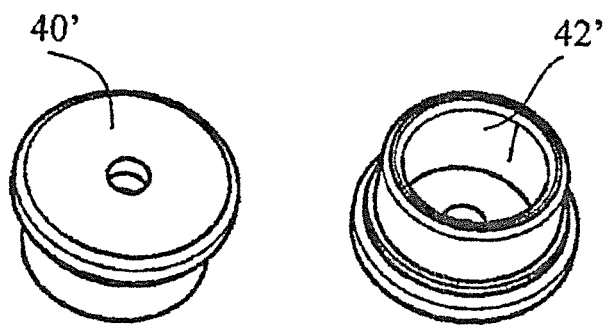
FIG. 23 is a schematic view of two sensor lids.
Figure 24:
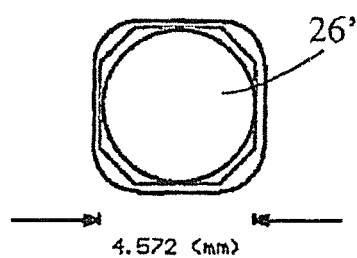
FIG. 24 is a schematic view of an optical filter.

In FIGS. 19 and 23, two sensor lids, 40' and 42' are illustrated. The sensor lids 40', 42' may be fastened to the housing 12'. The sensor lids are easily clicked onto the housing 12'.

Each of the sensor lids is used to fixture of the fiber and sealing of the sensor 10'. The lids 40', 42' are constructed and designed so it is possible for plastic welding.

The lids are today made from PEEK without glass reinforcement, which is preferably the same material as the housing 12'. The sensor lid 40', 42' is designed with a cone, which enables a one time fixable with the sensor housing.

The sensor lid has a round and short bottom, so when it is mounted in the sensor housing 12' with the sealing, is squeezes the sealing around the fiber and closes the sensor 10' so that it is protected against dirt and other pollutants.

The optic fiber transports the light from the light emitter to the sensor 10' and from the sensor 10' on to a light detector.

In the presently preferred embodiment of the present invention, the optical fiber is a full duplex fiber with Kevlar reinforcement for strain relief. The optic fiber matches for visible red light in the region 400-700 nm. It has a core diameter of 1 mm and an overall diameter for 2.2 mm. The operating temperature range is from −25 degrees to +100 degrees continuously and up to 120 degrees shortly. The cutting and polish of the fiber ends are important for the system. The fiber is polished according to a 9 my standard in 3 polishing rounds. This polish grain size is the optimum according to price and light damping. At the sensor housing 12' end of the fiber, the fiber is sealed with silicon so that no humidity may enter the fiber and creeping distance inside the fiber can not occur.

The function of the glass rod is the light rotator, and is the "motor" in the sensor 10'. It is constructed of a BK7 material with a low Verdet constant of 0.023 min/G-cm by a wavelength of 620 nm. It is polished at the ends according to S:D: 40:60 and the material is strain relieved in production after moulding. The material has been selected due to a low change of Verdet constant regarding temperature, low but sufficient Verdets constants for signal and low cost.

The width of the glass rod has been selected from the optimum with of the lens. The angle between the magnetic field and the light beam can be describes as a cosine function. If the magnetic field is 90 degrees in front of the light, no rotation effect occurs. The length of the glass rod is linear to the signal output. The B-field 120 on a round conductor 122 is illustrated in FIG. 25.

The rotating effect of the field decreases due to higher angle between the light and magnetic field. The damping of the light in the system is also crucial for a good signal. When the light is bend by the lens it is not perfectly linear to the optimal direction, therefore the longer glass rod the less light passes through. The length of the glass rod has been decided from tests to se an optimum between the magnetic field effect and damping of light.

In FIG. 27 a fiber distance clip 124 is illustrated. The function of the fiber distance clip 124 is to fix the fiber at a distance from the high voltage cable. The clip 124 is designed to press and hold the fiber, and fix the fiber to the cable with the panduit Teflon strip.

The distance between the fiber and the cable is needed for thermal and electrical isolation reasons. The optical fiber as it is today, is only capable to withstand peak temperatures of approximately 120 degrees. Since the electrical cable may reach temperatures up to 250 degrees, there must be a thermal isolating distance. The fiber is also separated from the cable to avoid a humidity bridge and a possible creeping distance. The fiber distance clip 124 is moulded in Peek, the same material as used for the sensor housing 12'.

A sensor clip is illustrated in FIG. 28. The clip 126 creates a higher thermal resistance between the cable and sensor 10'. So if the sensor 10' the mounted directly on a wire, the clip 126 is press fitted onto the sensor wing 44'. This clip 126 makes it possible with a cable temperature of 300 degrees, not having above 120 degrees inside the sensor 10'.

Figure 29:
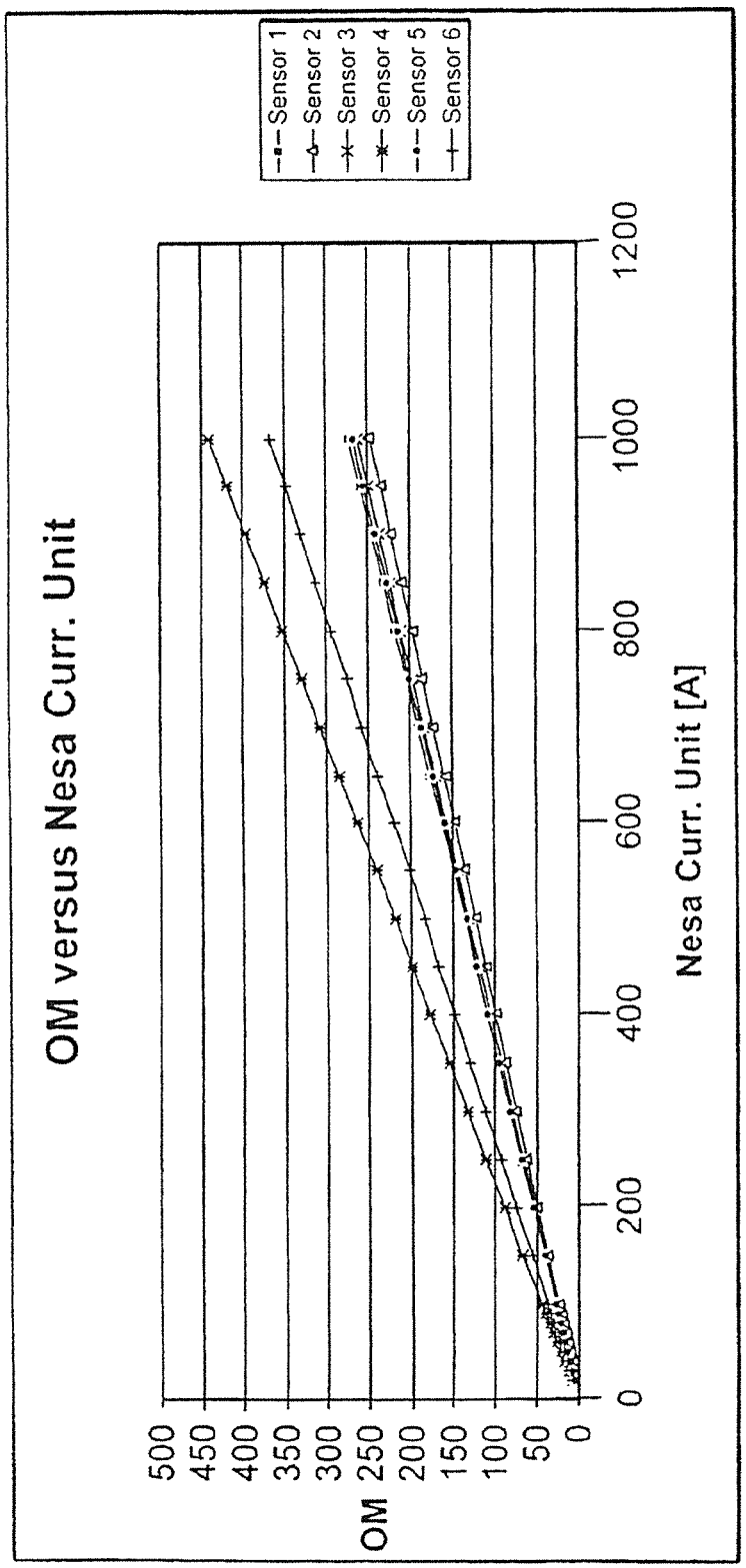
FIG. 29 is a graph illustrating the relation between current and optical magnitude.
Figure 30:
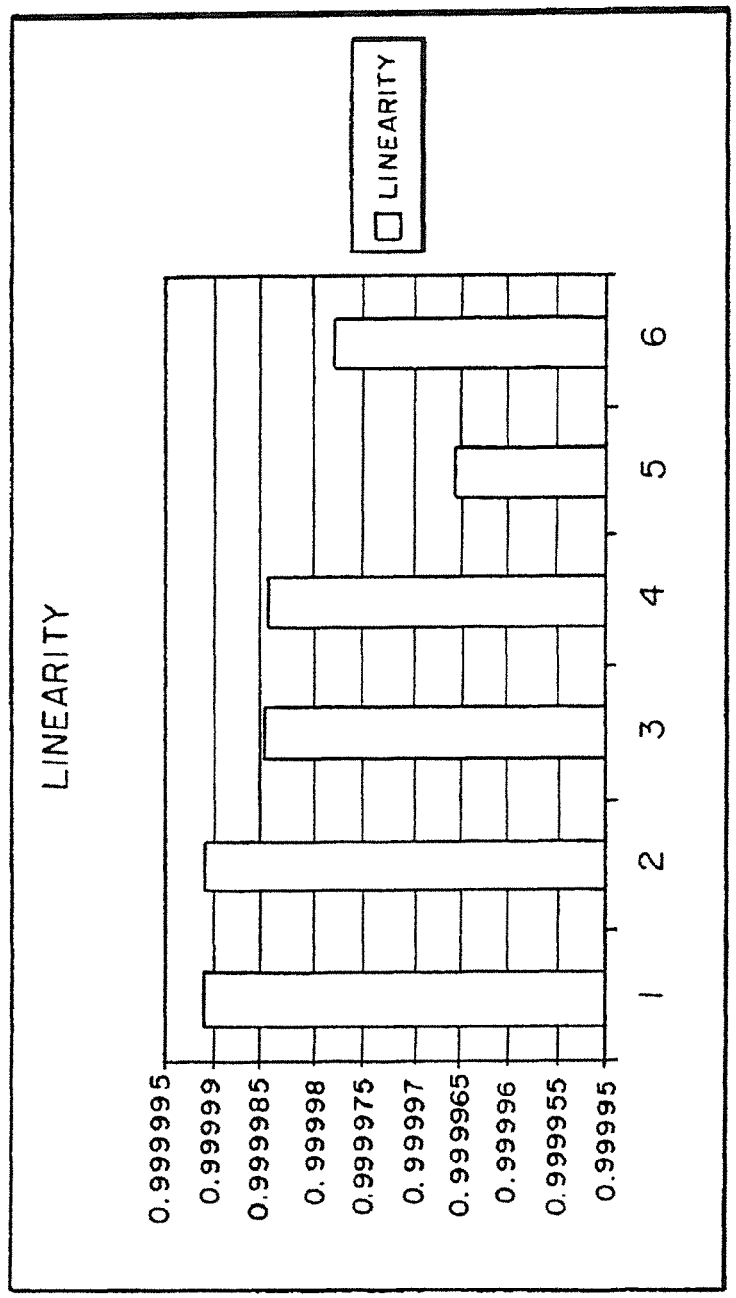
FIG. 30 is a graph illustrating the degree of linearity of six sensors.

FIGS. 29 and 30 illustrate test results obtained during tests involving six sensors according to the present invention. The graphs show that the sensors exhibit linear properties as a function of current in an electrical conductor.

FIG. 30 illustrates the degree of linearity of the six sensors.

Figure 31:
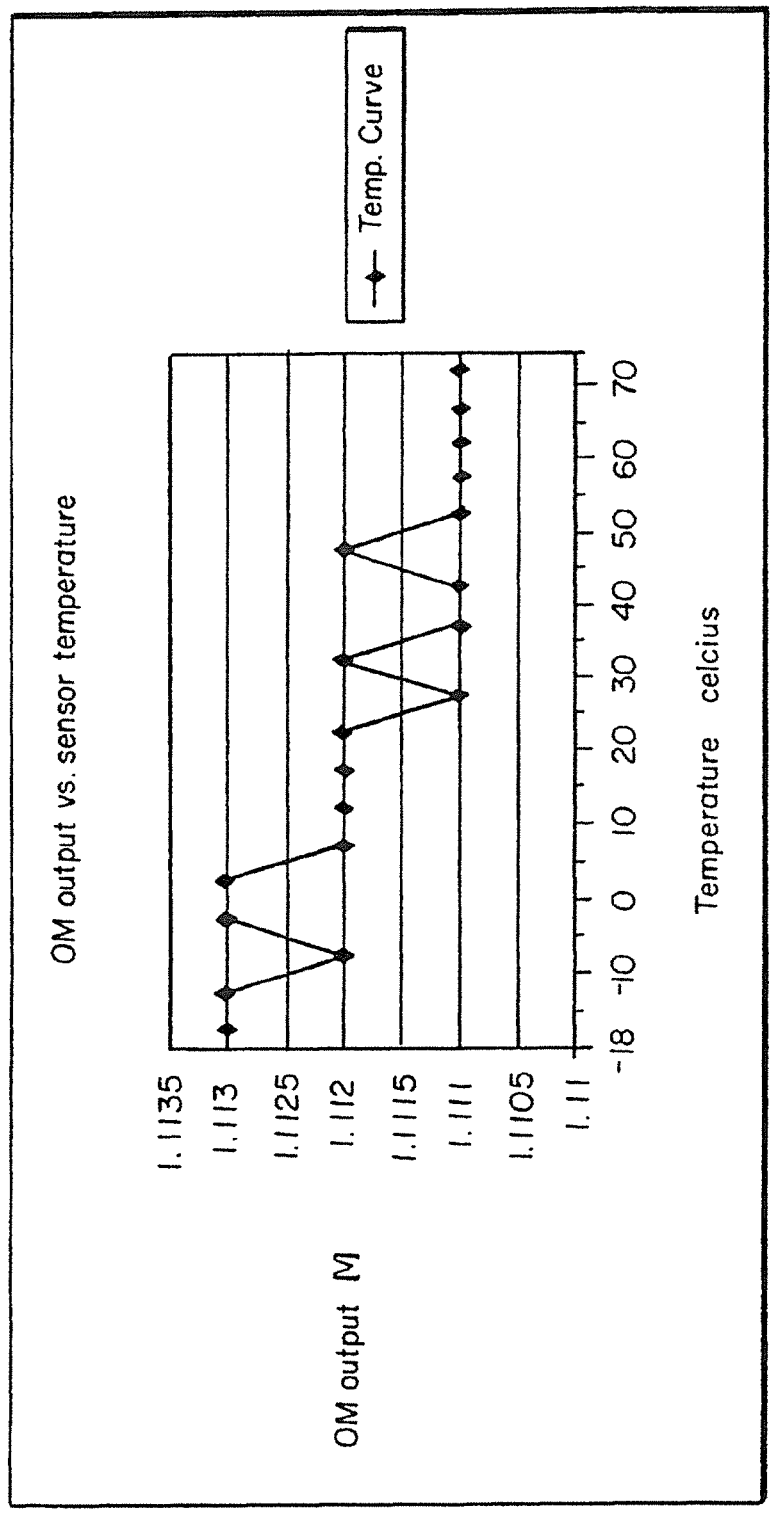
FIG. 31 is a graph illustrating the relation between temperature of a sensor and the optical magnitude.

FIG. 31 is a graph illustrating the output signal of a sensor as a function of the temperature in the surrounding environment and the sensor.

Theoretical background of the invention.

When a simple fiber optic Faraday Effect sensor is mounted on a conductor for example in a transformer station or on an installation cable, the output optic signal is sensitive for interference from magnetic fields from nearby systems, conductor shape, sensor placement and distance to conductor. The output optic signal is also sensitive to system mounting and set-up.

The object of this invention is to achieve an accurate device for measuring an electric current by the Faraday Effect, by compensating on-site for interference from magnetic fields from nearby inductors, conductor shape, distance from measuring device to conductor, and also mounting and setup.

This object is achieved by comparing data measured by the fiber optic system with a third party current measurement system during set-up of the system on-site.

The B-field measured by the fiber optic system is named $B_{measured}$. The actual current is determined according to the equation:

$$I_{actual} = |\overline{K}_{calib} * \overline{B}_{measured}| \, [A]$$

Where $K_{Calib} = \Sigma^n{}_0 (I_{Measured\ on\ third\ party\ system}) / \Sigma^n{}_0 (B_{Measured\ on\ optic\ system})$ This calibration method compromises for linear magnetic field interference from nearby inductors, and the conversion factor between the B-field and current. It also compromises for production tolerances, conductor shape, conductor diameter and background noise, all when mounted in the active application.

After the calibration, the third party system is removed, and the fiber optic current measurement system is a stand-alone measurement system.

In the addition to use the sensor at all, it is crucial to be calibrated on-site. A third party measurement device is used to measure the electrical current. This device can be a current coil or other current measurement devices that is calibrated, and for which the surrounding field can be ignored or at least measurements are not influenced by surrounding fields. The signal or data from the third party current measurement device is computed in a third party measurement system and send to the signal-processing unit.

The signal-processing unit compares the data from the two devices and store the data. After a certain period, the calibration is stopped and the stored data from each device is summed up. The summed up data from the third party current measurement system is divided with the summed up data from the optic sensor. This value is used as a calibration value and is stored in the signal-processing unit. The third party measurement system and device can be dismounted. The optic system has now an accurate calibration value for the application it is mounted on.

In a set-up with 3 conductors the magnetic field from nearby conductors may affect the measurement. On a conductor a fiber optic Faraday Effect sensor is mounted. The magnetic fields from all 3 conductors affect the sensor. The B-field measured by a sensor x is:

$$\overline{B}_{sum\_sensor\_x} = \overline{B}_{L1} + \overline{B}_{L2} + \overline{B}_{L3}$$

During calibration $\overline{B}_{sum\_sensor\_x}$ is compared with the data from the third part measurement device. From this calibration the calibration constant $\overline{K}_{Calib}$ is determined. This constant contains the contribution from all 3 phases, means that the constant only is valid for a linear B-field.

The B-field is relatively known for a circular conductor, but the B-field is not known for a rectangular conductor. The fiber optic Faraday Effect sensor creates only a point measurement, this means that the shape of the B-field and distance from the inductor is a crucial parameter. The on-site calibrations of the sensor compensates for the different B-field shape and distance from the inductor.

The signal from an optic Faraday Effect current sensor consist of an ac and dc component. The ac component exists when the time varying magnetic field is applied to the sensor. The DC component exists if a DC or a non-magnetic field is applied to the sensor.

The object of this invention is to achieve an accurate device for measuring an electric current in AC system, by the Faraday Effect, by electrically measuring the AC and DC component, to compensate via software for degradation of system optics over time. This compensation is bound in the compensation described above.

The size of the DC component, when no magnetic field is applied to the sensor depends on the output of the light exposed from the light source, the "light resistance" through the optic system, and the detector circuit. There is a linear coherence between the ac- and dc-component of the signal, assuming that there is no DC magnetic field applied to the sensor, no long term variations of the detection system and no variation in the temperature of the surrounding environment.

The compensated optical signal, $U_{ac\_actual}$, is determined by:

$$U_{ac\_actual} = (U_{dc\_calib} / U_{dc\_actual}) U_{ac\_measured}$$

Where:

$U_{ac\_actual}$ is the compensated optic ac signal, $U_{dc\_actual}$ is the actual measured dc component, $U_{dc\_calib}$ is the dc signal measured when system was calibrated, $U_{ac\_measured}$ is the actual measured optic ac signal.

The equation above show how to compensate for changes in the dc component due to optic changes, temperature, change of performance for light source, change of performance for detector, change of optical resistance in sensor due to lifetime.

The following is a description of a prototype version of the present invention.

In a prototype version of the present invention a system measuring the actual current in and out of the transformer station plus the 400V voltage, reports the measured values via SMS messages over a GSM-modem.

The measured values could be: Actual current (averaged over the last second) for all channels, peak current or energy with direction and timestamp for all channels, 400 V status with timestamp for last dropout, system condition.

Values are send to a service technician, alternatively to a server, on request and when alarm limits is exceeded.

More or less complex calculations may be implemented, as well as sampling rates, number of current channels etc may vary. The basic building blocks is the current calculation, the calibration and the correction according to the DC signal.

A prototype version of the present invention includes a processor system with embedded software or firmware. The main task for the firmware of the system may be divided into a number of tasks: Measurement and linearisation of current flow, calculation of current direction and/or electrical power direction, correction according to DC signal and communication with server or service personal.

In the prototype version of the present invention six current channels and three voltage channels are feed into the processor system comprising the firmware through an optocoupler and an AD-converter. The phase between the current and the voltage is used to determine the direction of the current or power.

Each current channel of the system is principally constructed from an amplifier and filter part followed by an AD-converter. When the signal has passed the AD-converter the firmware performs of all the post-processing of the signal.

Each current channel is divided into two signals: The AC current signal and the DC component, both of which are feed through the AD converter. The optical current signal ($U_{AC}$) is used to calculate the actual current. The DC component of the optical current signal is used to calculate the degeneration factor.

The DC Signal ($U_{DC}$) from the optical sensor combined with the DC component is used to calculate the degeneration factor, and from that, the actual calibration constant ($K_{Calib}$).

$$U_{RMS} = \Sigma |U_{AC} - V_{REF}|$$

$$I_{RMS} = K_{Calib} \times U_{RMS}$$

The DC component of the signal is removed and the RMS value is calculated as the integral of the numerical value. The value is multiplied by the calibration constant ($K_{Calib}$) and the result is the current flowing in the actual channel.

In the present specification examples 50 Hz, however other frequencies may be used, e.g. 60 Hz The calculation is done for every 50 Hz period. The post-processing of the result is done by the communication part of the system.

Detection, or determination, of the electrical current or power direction is done through measuring the phase angle between the current and the voltage for the actual channel.

The phase angle depends on the type of load and the direction of the current or power. The type of load for the actual transformer station is chosen during calibration. If the phase difference, during an inductor load, is between −90° and +90° the current or power direction is positive.

The current phase is grasped from the optical sensors on the 10 kV line. The voltage phase is captured from the 400V line, due to the fact that the 10 kV voltage is not monitored.

In the present context 10 kV is an example of a medium voltage level and 400V is an example of a low voltage. The system according to the present invention measures both medium voltages and low voltages, i.e. at two sides of a transformer transforming medium voltages into low voltages.

The voltage phase is delayed through the transformation from 10 kV to 400V. Therefore the phase is modified with 30° times the numerical index of the transformer vector group.

The firmware in the system compensates for the degeneration of the system by looking on the DC component of the signal. This is done through correction of the initial calibration constant with the degeneration factor.

In a presently preferred embodiment of the present invention, the following equations are used:

$$U_{AC,DC} = \Sigma U_{AC} - V_{REF}$$

$$U_{DC,AVR} = (\Sigma U_{DC})/n, \text{ where } U_{DC} \text{ is summed up from 0 to } n \text{ samples.}$$

$$K_{Calib} = (K_{Calib,Init} \times U_{DC,Init}) / (U_{DC} - U_{AC,DC})$$

The DC component of the measured AC value is subtracted from the measured DC signal to remove the DC component of the current flowing in the inductor.

Both $U_{DC}$ and $U_{AC}$ are sampled over a long period (e.g. one minute).

Besides using the calibration constant calculating the actual current, it also used as an indication of the overall system condition. The monitoring of this is done in the communication part.

After calculation of the actual currents and directions the measuring system takes care of the system specific calculations. These will vary from one implementation to another.

Module A Description

Figure 32:
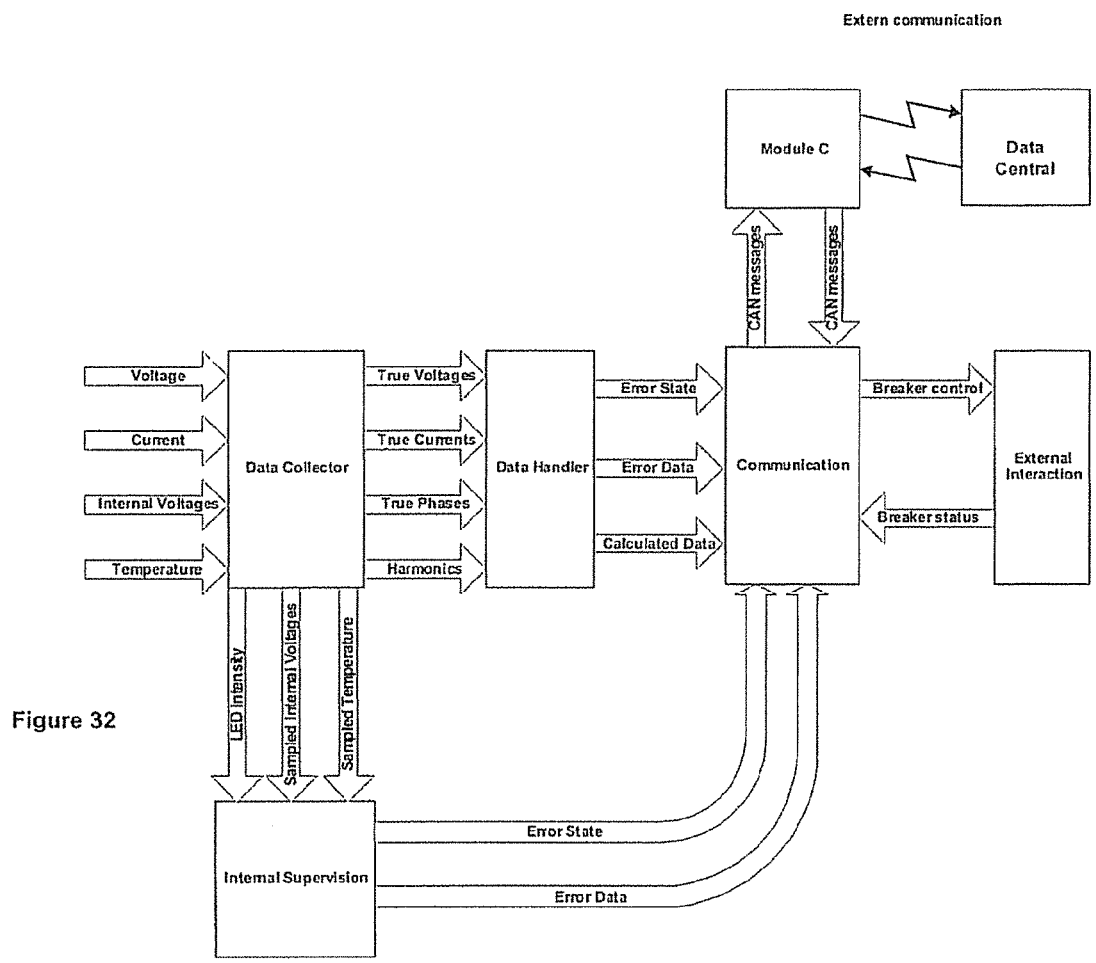
FIG. 32 is a block diagram illustrating the structure of a module A of the apparatus according to the present invention.

Module A has a modular structure as displayed in FIG. 32

Data Collection

Description

Figure 33:
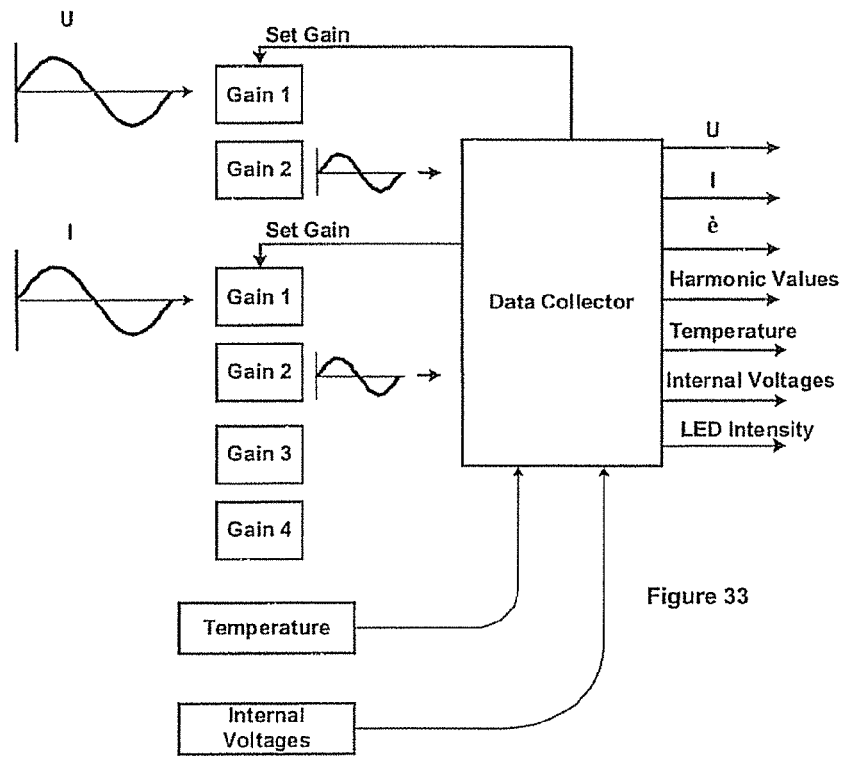
FIG. 33 is a block diagram illustrating the function of the module A, also shown in FIG. 32.

The data collection is done by sampling the input provided by the hardware. Each input channel is sampled 32 times during a 20 ms period. In embodiments utilising a frequency different from 50 Hz other power frequency periods apply. This applies throughout the present specification. The data is saved in a structured way that allows further handling of the data. Reference is made to FIG. 33.

| Input: | Method | Output: |
| --- | --- | --- |
| Three voltage lines. Three Current lines. Internal voltages Temperature. | | Three Calibrated Voltage values. Three Calibrated Current values. Three phase differences Harmonic values Internal Voltage values Temperature values |

Method:

Data Collection

The module has an internal timer that ensures that sampling is done on each of the three voltage and three current lines exactly 32 times per 20 ms period. Each sample is stored for later use. This results in 192 samples with 625 nanoseconds between two samples on the same line.

Figure 34:
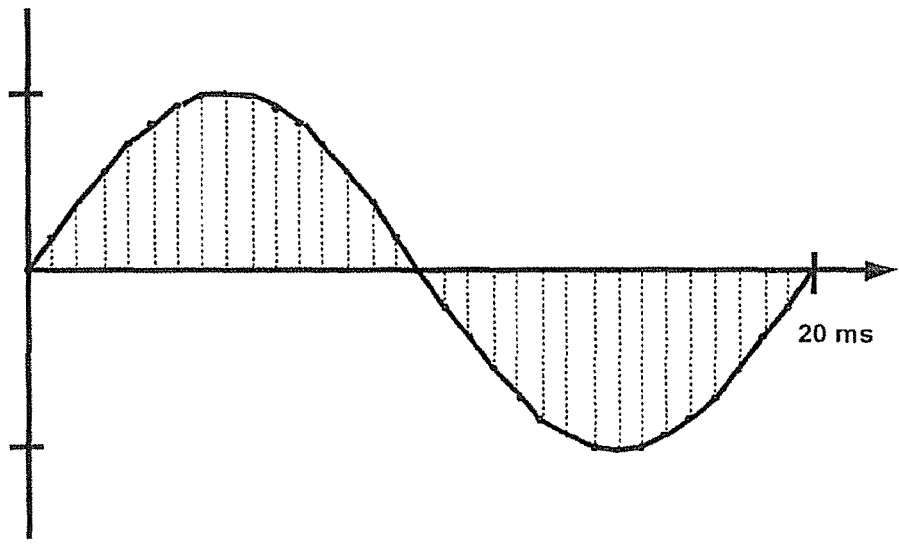
FIG. 34 is a graph representing the theoretical data collection.

Each sample value is compared to the predefined zero reference, and if the sample value is below the reference, the sample number of the previous sample is stored. The two following samples of that line are compared to the reference, and if one of them is not below the zero reference, the sample number and the detection are reset. This is done to prevent detection of "false" zero crossings due to hardware distortion. FIG. 34 is a graphical representation of the theoretical data collected from one of the six lines.

When a full 20 ms period has passed, the voltages (U), currents (I) and phase differences (Θ) are calculated based on the collected data. The formulas are described below:

The various constants used in the calculations are described in detail in the following sections.

Figure 35:
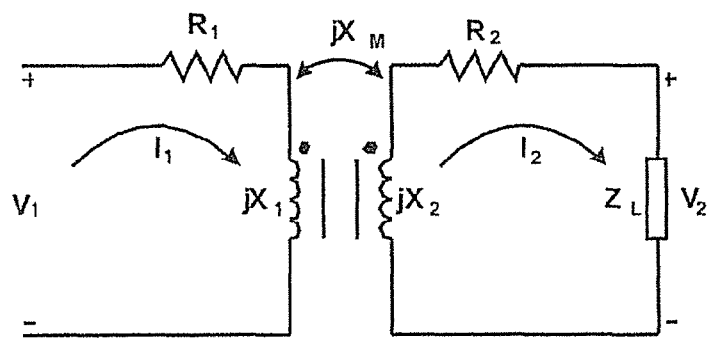
FIG. 35 is a diagram illustrating a transformer and the transformation of voltages and currents by the transformer.

Voltage Calculations:

Both high and low voltage calculations are based on the measurements made on the low voltage side of the transformer ($V_2$ in FIG. 35). The following chain of formulas describes the steps taken in calculating the Line-to-Neutral and Line-to-Line voltages on both sides of the transformer.

The small x in the formulas denotes a certain line (A, B or C).

Figure 36:
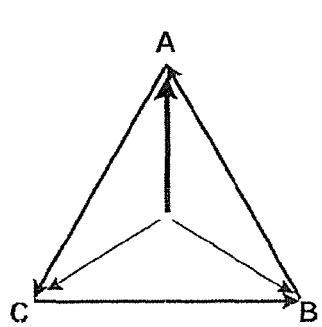
FIG. 36 is Line-to-Neutral voltage diagram.

Line-to-Neutral Calculations on the Low Voltage Side:

The bold line in FIG. 36 shows the Line-to-Neutral voltage for line A.

The value $U_{x\ calc}$ is the raw average of the sampled values $$U_{x\ calc} = \frac{\left(\sum_{i=0}^{32} U_x Sample_i\right)}{32}$$

The Line-to-Neutral voltage is calculated as $$UL_{x\ L-N} = U_{x\ calc} \cdot K_{Calibration} \cdot K_{Gain}$$

$K_{Calibration}$ is a calibration factor found for each line during calibration (See Calibration section)

$K_{Gain}$ is a factor defined by the current gain selection of the hardware (See Gain section)

Figure 37:
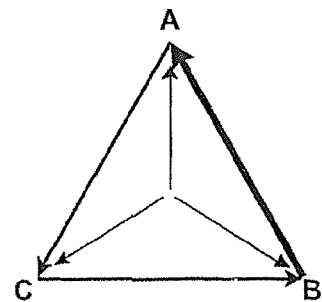
FIG. 37 is Line-to-Line voltage diagram.

Line-to-Line Calculations on the Low Voltage Side:

The bold line in FIG. 37 shows the Line-to-Line voltage between line A and B

The following formula is used to calculate the Line-to-Line voltage $$UL_{xL-L} = \sqrt{UL_{(x+1)L-N}^2 + UL_{xL-N}^2 - 2 \cdot UL_{(x+1)L-N} \cdot UL_{xL-N} \cdot \cos(120°)}$$

Line-to-Neutral Calculations on the High Voltage Side:

$$UH_{x\ L-N} = UL_{xL-N} \cdot K_{Transformer} \cdot I_{x-0.4\ kV} \cdot K_{TrafImp}$$

$K_{Transformer}$ is the conversion factor from the transformer used when converting from 10 kV to 0.4 kV $I_{x-0.4\ kV}$ is the current running on the low voltage side of the transformer for the specific line $K_{TrafImp}$ is the transformer impedance ($Z_L$ in FIG. 35)

Line-to-Line Calculations on the High Voltage Side:

The Line-to-Line calculations on the high voltage side are done in the same manner as on the low voltage side.

The following formula is used to calculate the Line-to-Line voltage $$UH_{xL-L} = \sqrt{UH_{(x+1)L-N}^2 + UH_{xL-N}^2 - 2 \cdot UH_{(x+1)L-N} \cdot UH_{xL-N} \cdot \cos(120°)}$$

Current:

The current is measured on either the high voltage or low voltage side. The formulas used for the calculations are the same for both sides.

Figure 38:
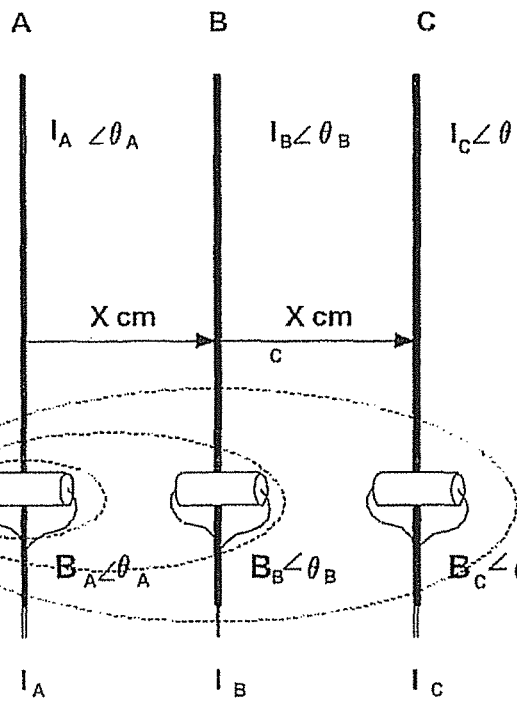
FIG. 38 is a schematic view illustrating the current measurement in three conductors.

FIG. 38 illustrates the measurement of current $I_A$, $I_B$ and $I_C$ on the three lines A, B and C.

The formulas used are $$I_A \angle \theta_A = (x_A, y_A)$$

$$I_B \angle \theta_B = (x_B, y_B)$$

$$I_C \angle \theta_C = (x_C, y_C)$$

For line A the following formulas are used $$x_A = K_{AA} * (B_A * \cos\theta_{BA})^{A_1} + K_{AB} * (B_B * \cos\theta_{BB})^{B_1} + K_{AC} * (B_C * \cos\theta_{BC})^{C_1}$$

$$y_A = K_{AA} * (B_A * \sin\theta_{BA})^{D_1} + K_{AB} * (B_B * \sin\theta_{BB})^{E_1} + K_{AC} * (B_C * \sin\theta_{BC})^{F_1}$$

For each line this gives the current calculation:

$$|I_x| = \sqrt{x_x^2 + y_x^2}$$

$K_{AA}$, $K_{AB}$ and $K_{AC}$ are calibration constants calculated during calibration. (See Calibration section)

Figure 39:
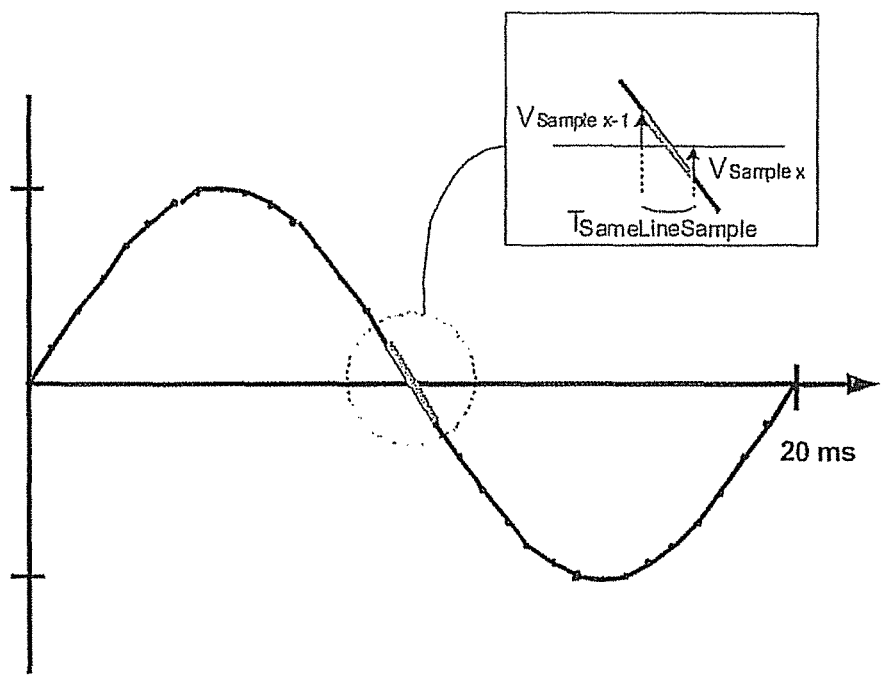
FIG. 39 is a graph illustrating the interpolation in the serial crossing.

Phase Difference ($\Theta$):

The calculation of the time a line crosses the zero reference is based on the sample number of the last sample that was not below the zero reference as well as a linear interpolation between the value of the sample just before and just after the crossing. FIG. 39 shows the interpolation as a bold line.

The gradient of the interpolated line is used to calculate the exact time of the zero crossing.

The gradient is calculated as follows:

$$\text{Gradient} = \frac{V_{samplex-1} - V_{samplex}}{T_{SameLineSample}}$$

$V_{sample\ x-1}$ is value of sample before crossing $V_{sample\ x}$ is value of sample after crossing $T_{SameLineSample}$ is the time between two samples on the same line, which equals 625 nanoseconds.

The time from the last sample that was above the reference line to the time the interpolated line crossed the line is calculated as follows:

$$\text{Time} = \frac{V_{samplex-1}}{\text{Gradient}}$$

Having calculated the exact time of the zero reference crossing of each voltage and current line, it is now possible to calculate the phase difference between the current and voltage lines.

Figure 40:
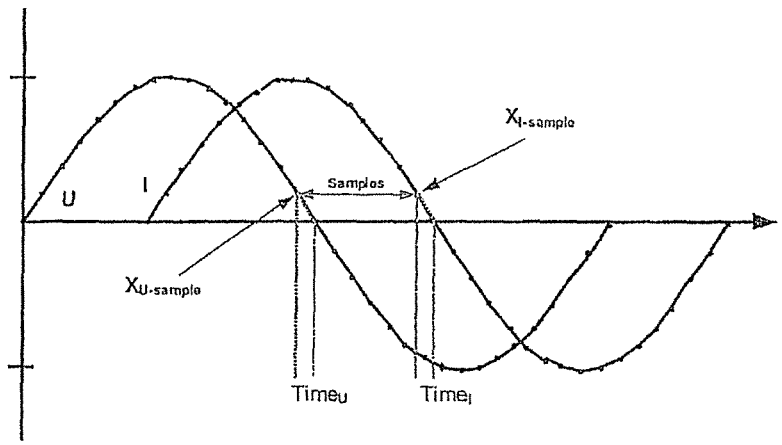
FIG. 40 is a voltage and current diagram.

FIG. 40 shows the phase difference ($\Theta$) for one set of voltage and current measurements.

The following formulas are used:

$$\Theta_{samples} = (X_{I-sample} - X_{U-sample}) \cdot T_{sample}$$

$X_{U-sample}$ is the sample number of the voltage sample just before crossing the reference line.

$X_{I-sample}$ is the sample number of the current sample just before crossing the reference line.

$T_{sample}$ is the time between two samples, which equals $$\frac{20\ ms}{192\ samples}$$

The interpolation difference is calculated as $$\Theta_{Interpolation} = (\text{Time}_I - \text{Time}_U)$$

This gives us the total phase difference measured for Line-to-Neutral for the low voltage.

$$\Theta_{MeasL-N} = \Theta_{samples} + \Theta_{interpolation} + \Theta_{Calibration} + \Theta_{3phEffect}$$

$\Theta_{Calibration}$ is the phase distortion caused by the module and is found when calibrating.

$\Theta_{3phEffect}$ is the effect caused by the induction performed by the two other current lines.

Using the Line-to-Neutral phase difference it is possible to calculate the Line-to-Line low voltage phase difference $$\Theta_{MeasL-L} = \Theta_{MeasL-N} + \Theta_\Delta$$

$\Theta_\Delta$ is the phase difference caused by the conversion from line measurements to phase measurements.

When the phase difference is used in calculations concerning the high voltage side of the transformer two additional factors have to be taken into account.

$\Theta_{Trafo}$ is the phase movement or displacement caused by the transformer station when converting from high voltage to low voltage. This value is determined by the numerical of the transformer vector group, which may be taken from the transformer data sheet.

$\Theta_{TrafoLoad}$ is the phase distortion in the low voltage Line-to-Line measurements caused by the internal impedance and the current load on the low voltage side of the transformer. This distortion is the difference between the voltage angle image on the low voltage side and the voltage angle image on the high voltage side. The distortion has to be taken into account because the module only measures voltages on the low voltage side.

Figure 41:
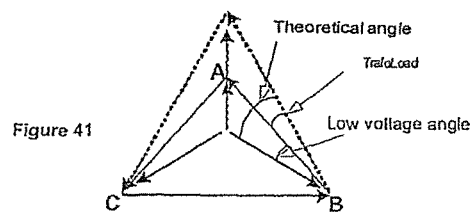
FIG. 41 is a Line-to-Line voltage diagram.

FIG. 41 shows the voltage distortion of line A. The dotted lines are the high voltage side voltages and the full drawn lines are low voltage side voltages.

Using the actual angle of the Line-to-Line voltage on the low voltage side and subtracting this from the theoretical angle for a line measurement to phase measurement conversion, $\Theta_{TrafoLoad}$ is calculated $$\Theta_{TrafoLoad} = \Theta_\Delta - \text{ArcCos}\left(\frac{UL_{x+1L-N}^2 + UL_{xL-L}^2 - UL_{xL-N}^2}{2 \cdot UL_{x+1L-N} \cdot UL_{xL-L}}\right)$$

This yields the true phase difference between a high voltage Line-to-Neutral voltage and the current as $$\Theta_{HL-N} = \Theta_{MeasL-N} + \Theta_{Trafo}$$

and the true phase difference between a high voltage Line-to-Line voltage and the current as $$\Theta_{HL-L} = \Theta_{MeasL-L} + \Theta_{Trafo} - \Theta_{TrafoLoad}$$

Calibration

During the setup of the module, the module must be calibrated to ensure correct measurements.

The operator does this by using a PC based calibration program. A calibration device must be attached to perform this calibration.

During the calibration the PC collects the measured voltage, current and phase difference provided by the module as well as the calibration device.

After collecting sufficient data, the PC calculates calibration factors for voltage and current measurement as well as a phase displacement constant.

Figure 42:
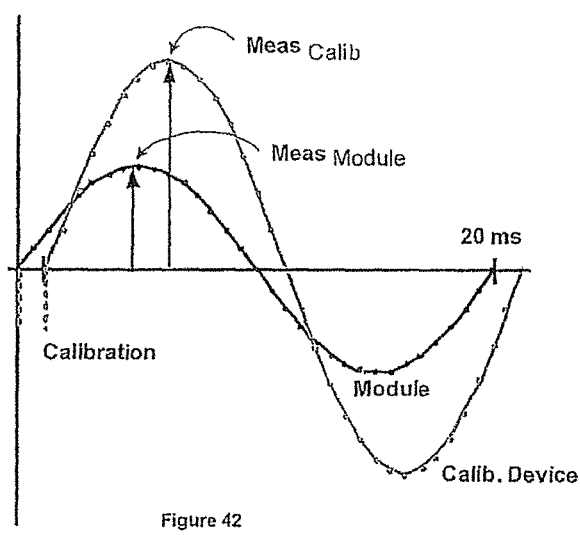
FIG. 42 is a calibration data graph.

FIG. 42 displays the calibration data

Voltage Calibration:

The voltage factors are calculated using following formulas:

$$K_{Calibration} = \frac{Meas_{Calib}}{Meas_{Module}}$$

Figure 43:
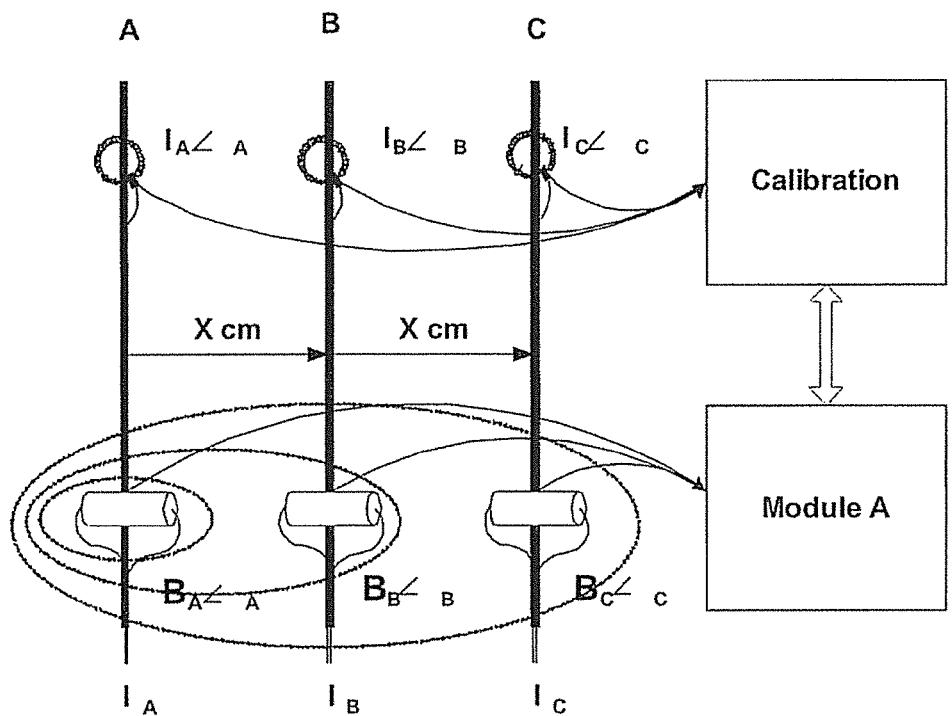
FIG. 43 is a schematic view of the current measurement in three conductors and the associated calibration of module A.

Current Calibration:

The current calibration is more complicated than the voltage calibration due to the fact that all three sensors measure the magnetic fields made by the cables as shown in FIG. 43 below.

To determine the effect each cable's magnetic field has on the other cable measurements, the following matrix equation has to be solved for all three lines. The below example shows the equation for line A $$I_A \angle \theta_A = (x_A, y_A) \quad |I_x| = \sqrt{x_x^2 + y_x^2}$$

$$I_B \angle \theta_B = (x_B, y_B)$$

$$I_C \angle \theta_C = (x_C, y_C)$$

$$x_A = K_{AA} * \overbrace{(B_A * \cos \theta_{BA})}^{A_1} + K_{AB} * \overbrace{(B_B * \cos \theta_{BB})}^{B_1} + K_{AC} * \overbrace{(B_C * \cos \theta_{BC})}^{C_1}$$

$$y_A = K_{AA} * \overbrace{(B_A * \sin \theta_{BA})}^{D_1} + K_{AB} * \overbrace{(B_B * \sin \theta_{BB})}^{E_1} + K_{AC} * \overbrace{(B_C * \sin \theta_{BC})}^{F_1}$$

$$\begin{aligned} x_A &= A_1 \quad B_1 \quad C_1 \quad K_{AA} \\ x_B &= A_1 \quad B_1 \quad C_1 * K_{AB} \\ x_C &= A_1 \quad B_1 \quad C_1 \quad K_{AC} \\ y_A &= D_1 \quad E_1 \quad F_1 \quad K_{AA} \\ y_B &= D_1 \quad E_1 \quad F_1 * K_{AB} \\ y_C &= D_1 \quad E_1 \quad F_1 \quad K_{AC} \end{aligned}$$

In order to calculate $K_{AA}$, $K_{AB}$ and $K_{AC}$ the module has to perform three measurements with varying current levels.

The values $A_1$, $B_1$ and $C_1$ are calculated based on the measurements made by the sensors and the values $I_A \angle \Theta_A = (x_A, y_A)$, $I_B \angle \Theta_B = (x_B, y_B)$ and $I_C \angle \Theta_C = (x_C, y_C)$ are calculated based on the measurements made by the calibration equipment.

When these values are calculated, the matrix equation is solved to reveal the constants.

These steps are also performed for line B and line C to give the constants related to those lines.

Phase Calibration:

The module phase displacement constant is calculated as $$\Theta_{Calibration} = \Theta_{CaliDevice} - \Theta_{Module})$$

The calculated factors and constants are saved to the module and during all future measurements the module uses the factors and constants to adjust the measurements.

Age Compensation of LEDs

The module uses light emitting diodes (LEDs) combined with the deflection of light caused by a magnetic field to measure the current in power cables.

Over time the light emitted by the LEDs is reduced in intensity due to aging.

Figure 44:
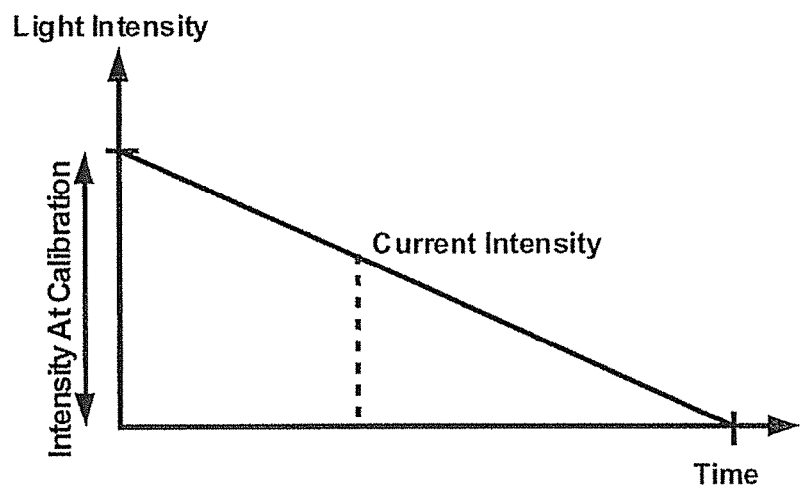
FIG. 44 is a diagram illustrating the light intensity as a function of time and depending on the current intensity.

FIG. 44 shows this reduction.

The measurements made by the module change proportional to the change of the intensity, causing the measurements to become invalid.

To counter this effect the module stores the light intensity of each LED when it was calibrated.

The LED compensation factor is constantly calculated as $$K_{LED} = \frac{IntensityAtCalibration}{CurrentIntensity}$$

The LED intensity is also used for internal supervision (See Internal Supervision section)

Gain Adjustment

In order to allow measurement of a large range of currents and voltages without loosing precision, the module uses a gain mechanism. This mechanism contains four gain levels for current measurement and two gain levels for voltage measurement. The module operates in the high gain area during normal measurements, allowing it to measure the largest range of currents and voltages, but when a possible error is detected the module performs an online evaluation of the collected data and adjusts the gain levels accordingly. This ensures the highest possible precision when performing error calculations.

The general formulas used for the adjustment are as follows:

Adjust gain to a lower level if:

$$\frac{MeasuredValueAtGainX}{TotalRangeOfGainX} < PredefinedPercentage$$

Adjust gain to a higher level if:

$$\frac{MeasuredValueAtGainX}{TotalRangeOfGainX} > PredefinedPercentage$$

Preferably two thresholds are defined in a low and a high predefined percentage.

The constant $K_{gain}$ that is used in the voltage and current calculations depends on the currently selected gain.

Data Analysis

Description

Figure 45:
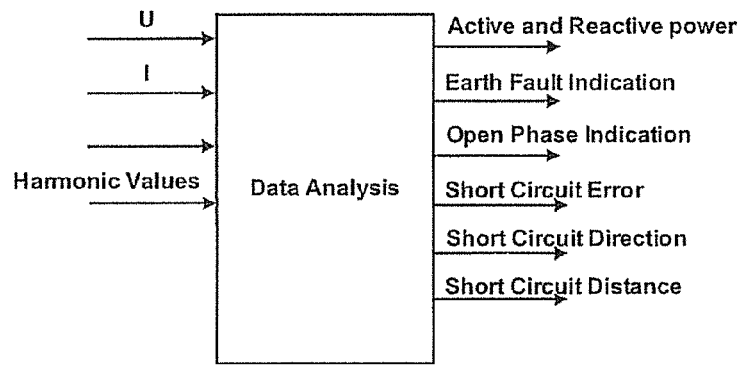
FIG. 45 is a block diagram illustrating the analysis operations of the module.

The data analysis is based on the collected data. The module performs various calculations on the collected data to determine if an error state has occurred in the monitored power network, which should be reported to the Data Central. Reference is made to FIG. 45.

In the present context the term error is used to cover both errors and faults.

| Input: | Method | Output: |
|---|---|---|
| Three voltage values. | | Active and Reactive power |
| Three Current values. | | Earth Fault indication |
| Three phase differences | | Open Phase Fault indication |
| Three harmonic values. | | Short Circuit Error |
| | | Short Circuit direction and distance |

Method:

The input values are used to perform various calculations. The following list describes each performed calculation.

Active and Reactive Power

The module is capable of calculating the active and reactive power present in the monitored power cables.

The calculation of Active (P) and Reactive (Q) power for each line is identical and is performed in real time using the formulas:

$$P_x = U_x \cdot I_x \cdot \cos(\Theta_x)$$

$$Q_x = U_x \cdot I_x \cdot \sin(\Theta_x)$$

The formula used to calculate the total power differs depending on whether the module is monitoring a high voltage or low voltage side of a transformer station. This is due to the fact that the module always measures the voltage on the low voltage side of the transformer.

On the high voltage side the following formula is used to calculate the overall power.

$$P = \frac{(P_A + P_B + P_C)}{\sqrt{3}}$$

$$Q = \frac{(Q_A + Q_B + Q_C)}{\sqrt{3}}$$

In a low voltage system the formulas below are used.

$$P = (P_A + P_B + P_C)$$

$$Q = (Q_A + Q_B + Q_C)$$

In a module monitoring the high voltage side, the calculated power is only send to the Data Central, if the Data Central has specifically requested it.

In a low voltage system, the daily peak power averaged over 15 minutes is saved once every day and is stored for 8 days.

Earth Fault Detection in Petersen Coil/Resonance Grounded MV Networks

The module uses the amount of harmonic currents to detect if an Earth Fault (EF) has occurred.

The module uses three operator-defined values to detect an EF.

$EF_{ref}$ is the reference value used to determine which detection method should be used.

$EF_{factor}$ is a factor used to detect an EF when the averaged amount of harmonic currents is above $EF_{ref}$.

$EF_{const}$ is a constant used to detect an EF when the averaged amount of harmonic currents is below $EF_{ref}$ The EF detection is based on a long and a short average of the harmonic values. The module constantly calculates a 10 minutes average ($H_{10min}$) and a 100 ms average ($H_{100ms}$).

The methods used to detect an EF depends on $H_{10min}$ and $EF_{ref}$ and are described below Method 1 ($H_{10min} > EF_{ref}$)

An error is detected if the fraction $$\frac{H_{100ms}}{H_{10min}}$$

is larger than $EF_{factor}$ and the error, i.e. Earth fault alarm, is sent to the Data Central. $H_{10min}$ is then stored and is not updated until the fraction $$\frac{H_{100ms}}{H_{10min}}$$

again goes below $EF_{factor}$

When this happens the module resets the EF alarm and is able to detect EFs again.

Figure 46:
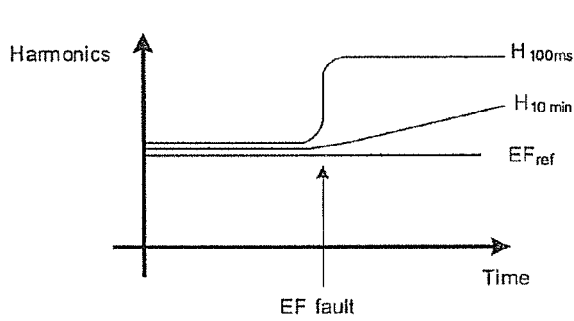
FIG. 46 is a graph illustrating the principal of detection of an error.

FIG. 46 shows the detection of an error using method 1

Method 2 ($H_{10min} \leq EF_{ref}$)

An error is detected if $H_{100ms}$ becomes larger than $EF_{const}$ and the error is send to the Data Central.

Figure 47:
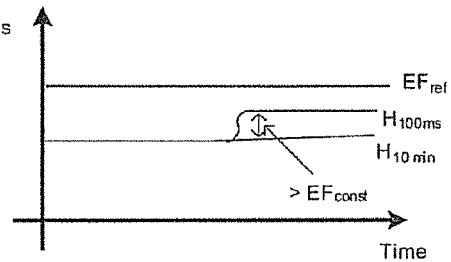
FIG. 47 is a graph similar to the graph of FIG. 46 illustrating a different detection principal.

The EF is reset when $H_{100ms}$ becomes smaller that $EF_{const}$ or $H_{10min}$ becomes larger than $EF_{ref}$ FIG. 47 shows the detection of an error using method 2

Earth Fault Detection—Isolated and Resistance Grounded MV Networks

The sensors and module is also suitable for detecting earth faults in MV networks with isolated and resistance grounded neutral.

Earth fault detection in these networks is based on the presence and magnitude of the zero sequence current flowing in a line or a transformer bay. The zero sequence current is derived from the 3 phase currents vectors by scalar summation:

$$\overline{I}_0 = (\overline{I}_A + \overline{I}_B + \overline{I}_C)/3 \ [A]$$

In a non-faulted network, the zero sequence current is close to zero, the only source being the natural asymmetry in the network. In case of a ground fault, the zero sequence current rises several levels in magnitude.

In networks with isolated neutral, the zero sequence current is equivalent to the total capacitive ground fault current. In networks with resistance grounded neutrals, the zero sequence current is in the same magnitude or larger, dependant on grounding resistor selection.

Depending on the power system protection practice, ground faults in these network types are either left uncleared, following manual location, or tripped automatically after no less than approx. 100 ms. This is fully within the capability of the system.

Figure 48:
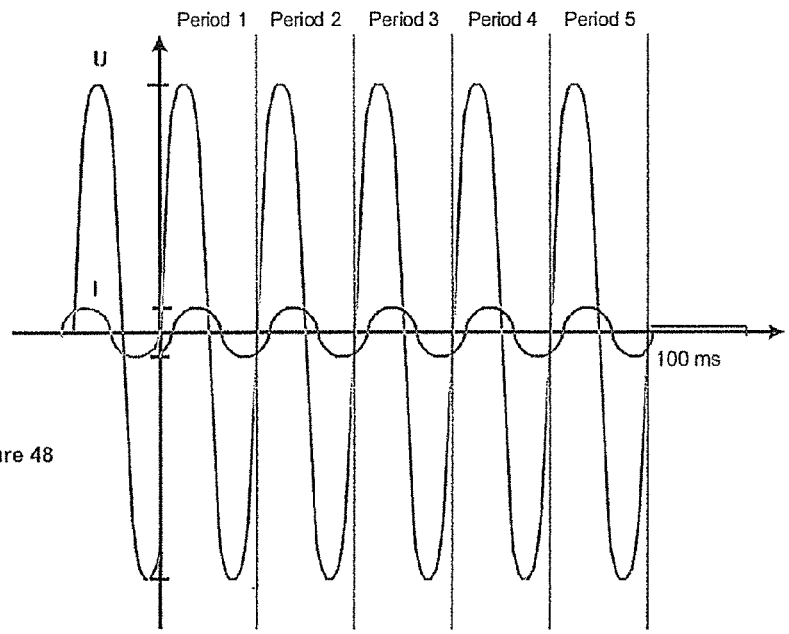
FIG. 48 is a current and voltage diagram.

By comparing the magnitude and duration of the zero sequence current to user settable limits, the system will respond to an earth fault by issuing an earth fault alarm.
Short Circuit Detection The module constantly monitors the power network for a Short Circuit Error (SCE). The module has three operator-defined current levels ($I_{SC-X}$) that denotes the minimum current level present when a SCE has occurred on each line When a SCE occurs, the module has approximately 100 ms or 5 power system periods to detect the error and measure the data needed to calculate the error direction and distance. FIG. 48 shows the current and voltage behaviour during a SCE. It is important to notice that the voltage is reduced during a SCE and if the voltage is reduced too much, the module cannot detect the time of the voltage crossing the zero reference. When this is the case, the last detected zero crossing time is extrapolated using an ideal 20 ms period.

The module performs the following actions during the 5 SCE periods:

The first full period of the SCE duration is used by the module to detect an error. An error is defined as $I_x > I_{SC-X}$.

The second full period of the SCE duration is used to measure the approximate current present in the short circuit error. This approximate value is used to determine which gain level the module will use to measure the error.

The third full period of the SCE is discarded because the module uses this period to set the correct gain levels for all current lines.

The fourth and fifth periods of the SCE are measured with the highest possible resolution due to the gain shift made in the previous period. The measured data is stored for further calculations regarding the error direction and distance.

After the fifth period of the SCE the module evaluates the measured data. The measurements from the fourth and fifth periods are averaged to improve the accuracy.

The averaged current for each line is compared to the $I_{SC-X}$ value and if the averaged current is above the value, an error has occurred on the line.

When the direction and distance of the error has been calculated, the Peak Current, Error direction and Error distance for each line is sent to the Data Central.
Direction of Short Circuit Error The direction of the short circuit error on each line is calculated based on the averaged phase difference between the current and the voltage during the error ($\Theta_{avg}$). The operator determines a constant ($K_{MTA}$) that defines which phase differences give a forward indication signal and which phase differences give a indication backward signal.

The phase difference used varies depending on whether the error is a two-phase or three-phase error.

Figure 49:
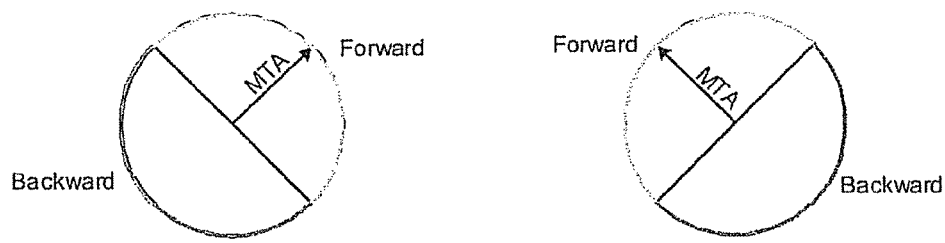
FIG. 49 is a view illustrating the forward and backward indications.

FIG. 49 illustrates the forward and backward indications depending on the MTA. Forward indication area is the half-circle area centered around the MTA vector. The backward or reverse indication is the half-circle area opposite the MTA vector.

Forward direction is defined as $\Theta_{avg} <= MTA +/- 90°$
Backward direction is defined as $-\Theta_{avg} = MTA +/- 90°$
Distance to Short Circuit Error The distance to the short circuit error or fault location is calculated using the averaged voltage, current and phase difference collected during the error. The calculation depends on the error type. The distance is determined as the electrical distance to fault, which is defined as reactance or inductance.

If the error is a two-phase error, the following formulas are used

If error is between phase 1 and 2

$$L_A = \frac{\sin(\Theta_A) \cdot U_A}{2 \cdot (2 \cdot \pi \cdot f) \cdot I_{1A}}$$

If error is between phase 2 and 3

$$L_B = \frac{\sin(\Theta_B) \cdot U_B}{2 \cdot (2 \cdot \pi \cdot f) \cdot I_B}$$

If error is between phase 3 and 1

$$L_C = \frac{\sin(\Theta_C) \cdot U_C}{2 \cdot (2 \cdot \pi \cdot f) \cdot I_C}$$

The influence of a possible arc resistance and the temperature dependency of the inductor resistance is eliminated by using the reactance or inductance to fault rather than the resistance to fault.

Figure 50:
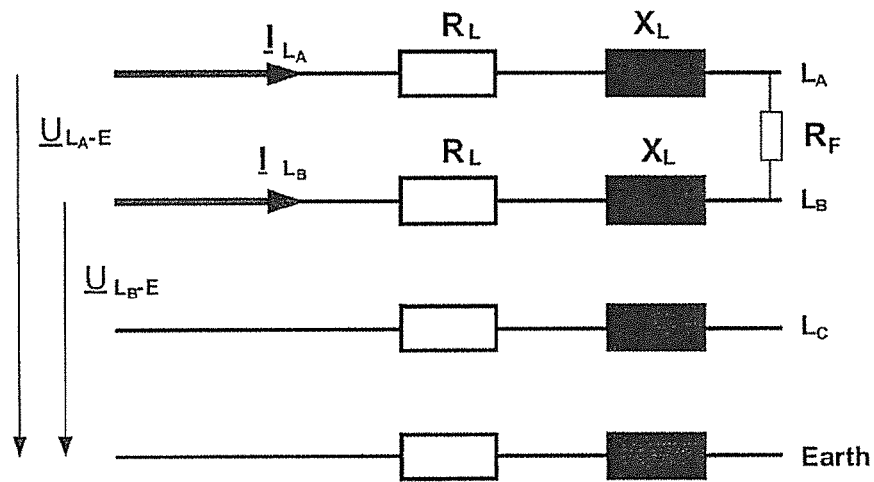
FIG. 50 is a schematic view illustrating an error between two phases.

FIG. 50 shows an error between phase A and B.

If the error is a three-phase error, the following formula is used $$L_{Total} = \frac{2}{\sqrt{3}} \cdot \frac{(L_A + L_B + L_C)}{3}$$

Figure 51:
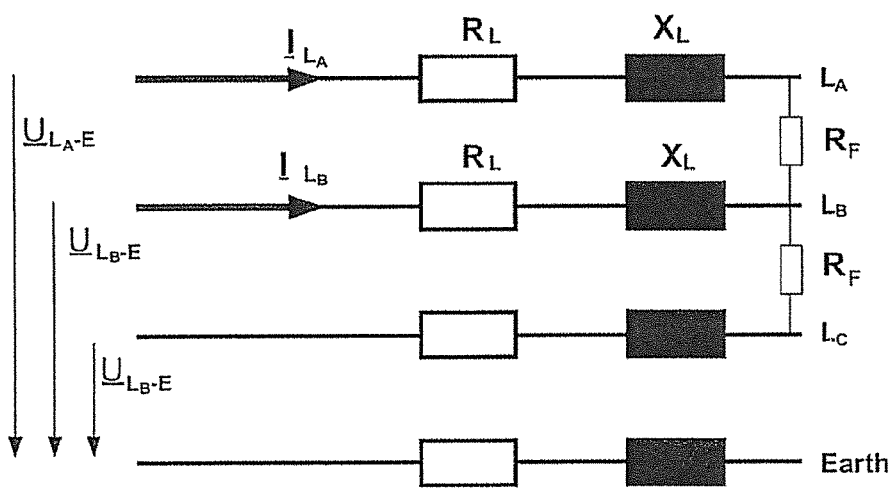
FIG. 51 is a diagram illustrating an error between three phases.

FIG. 51 shows an error between all three phases.

Figure 131:
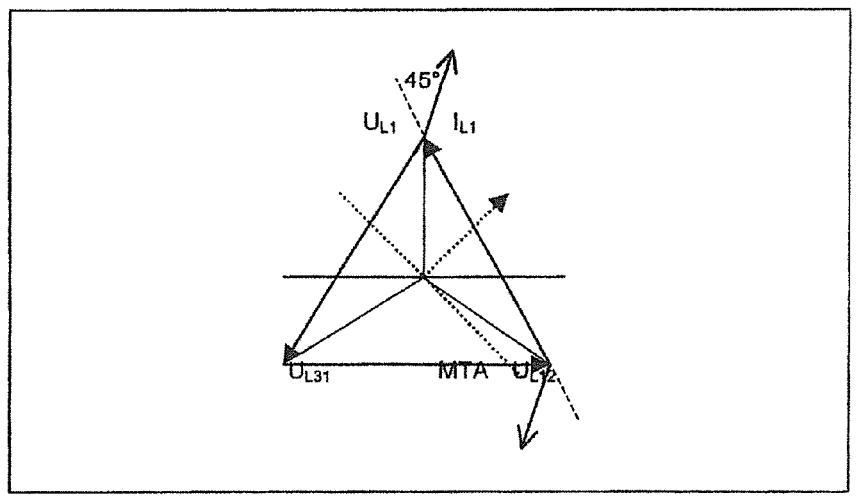
FIG. 131 is a schematic Voltage and current phasors; remote 2-phase short-circuit, L1-L2
Figure 132:
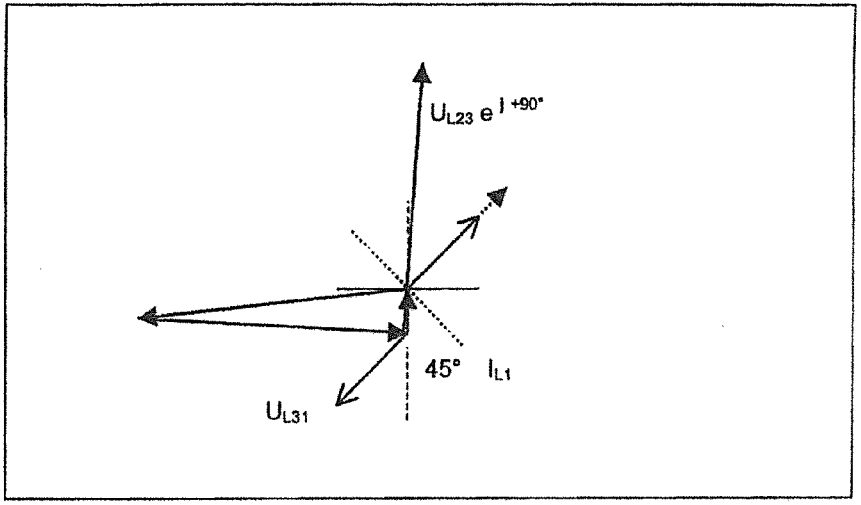
FIG. 132 is a schematic Voltage and current phasors; close-up 2-phase short-circuit, L1-L2.

A presently preferred embodiment of the detection of fault direction is described below.
Determining Fault Direction The fault direction (i.e. the power flow direction) is determined by regarding the angle between a reference voltage and the MV fault current flowing through the bay. During a short-circuit, the angle between voltage and current phasors is mainly determined by the line reactance ($X_{line}$) and line resistance ($R_{line}$) between the DISCOS station and the fault location; see illustration FIG. 131, illustrating MV voltage and current phasors during MV short-circuit; single line diagram.

The Maximum Torque Angle (MTA) determines the relative angle at which the directional indication has its greatest sensitivity and may be calculated as:

$$MTA = \text{Arctan}(X_{line}/R_{line})$$

If the relative angle is MTA ±90°, a 'F' (forwards) indication is issued for the faulted phase(-s). If the relative angle is ÷MTA ±90°, a 'B' (reverse/backwards) indication is issued for the faulted phase(-s).

Exact calculations of MTA are not called for, changeover angles being MTA ±90°. For MV cable and overhead line networks, typical values for MTA are 25°-45° and 35°-55°, respectively.

The 'broad' directional characteristic allows phase shifts up to ±90° without impairing the directional decision. Therefore, errors introduced using voltage memory on close-up faults are not critical.

Using LV Voltages Instead of MV Voltages

Theoretically, the MV voltages should be used as reference voltages. This is not convenient in a distribution network where voltage transformers normally only are found at the infeed station.

In stations with MV/LV power transformer(-s), the system uses the transformer secondary voltages as reference voltages instead. The voltage vectors are corrected for the transformer vector group and transformer ratio.

Selection of reference voltage and vector group correction depends on fault type as described below.

3-Phase Short-Circuits

If all 3 phase currents in a line bay exceed the short circuit pick-up value, a 3-phase short-circuit condition is detected.

Since the fault is symmetrical, the voltage and current systems may be regarded as symmetrical, too. Therefore, $U_{L1,\ 0.4\ kV}$ may be used as reference voltage instead of $U_{L1,\ 10\ kV}$, etc.

The MV voltage phase angle $Arg(U_{L1,\ 10\ kV})$ is calculated from the LV voltage phase angle $Arg(U_{L1,\ 0.4\ kV})$, turned through v ×30°, where 'v' is the vector group of the transformer, i.e. '5' for a Dyn5 transformer.

Examples:
For a Dyn 5 transformer, LV voltage phase angles are turned through +150° (positive sequence, counter-clockwise)
For a Dyn 11 transformer, LV voltage phase angles are turned through +330° (positive sequence, counter-clockwise)

Directional decision is carried out by phase-wise comparison of the following voltages and current phasors:

TABLE 2

| Phase | Fault loop | MV reference voltage phase angle | LV reference voltage phase angle | MV current phase angle |
| --- | --- | --- | --- | --- |
| L1 | L1-N | $Arg(U_{L1,\ 10\ kV})$ | $Arg(U_{L1,\ 0.4\ kV}) + 150°$ | $Arg(I_{L1,\ 10\ kV})$ |
| L2 | L2-N | $Arg(U_{L2,\ 10\ kV})$ | $Arg(U_{L2,\ 0.4\ kV}) + 150°$ | $Arg(I_{L2,\ 10\ kV})$ |
| L3 | L3-N | $Arg(U_{L3,\ 10\ kV})$ | $Arg(U_{L3,\ 0.4\ kV}) + 150°$ | $Arg(I_{L3,\ 10\ kV})$ |

TABLE 3

| Phase | Fault loop | MV reference voltage phase angle | LV reference voltage phase angle | MV current phase angle |
| --- | --- | --- | --- | --- |
| L1 | L1-N | $Arg(U_{L1,\ 10\ kV})$ | $Arg(U_{L1,\ 0.4\ kV}) + 330°$ | $Arg(I_{L1,\ 10\ kV})$ |
| L2 | L2-N | $Arg(U_{L2,\ 10\ kV})$ | $Arg(U_{L2,\ 0.4\ kV}) + 330°$ | $Arg(I_{L2,\ 10\ kV})$ |
| L3 | L3-N | $Arg(U_{L3,\ 10\ kV})$ | $Arg(U_{L3,\ 0.4\ kV}) + 330°$ | $Arg(I_{L3,\ 10\ kV})$ |

The relative angles between reference voltage and current $Arg(Z_L)$ are then calculated phase-wise.

Examples:
Dyn 5 transformer; phase L1:
$Arg\ (Z_{L1}) = Arg(U_{L1,\ 10\ kV}) - Arg(I_{L1,\ 10\ kV}) = Arg(U_{L1,\ 0.4\ kV}) + 150° - Arg(I_{L1,\ 10\ kV})$ Dyn 11 transformer; phase L1:
$Arg\ (Z_{L1}) = Arg(U_{L1,\ 10\ kV}) - Arg(I_{L1,\ 10\ kV}) = Arg(U_{L1,\ 0.4\ kV}) + 330° - Arg(I_{L1,\ 10\ kV})$ Relative angles are then compared to MTA:
If $Arg\ (Z_{Lx})$ lies in the range MTA ±90°, a 'F' (forwards) indication is issued for phase x
If $Arg\ (Z_{Lx})$ lies in the range ÷MTA ±90°, a 'B' (reverse/backwards) indication is issued for phase x For 3 phase short-circuits, fault location is normally the same for all 3 phases. Consequently, indication will normally be 'FFF' or 'BBB'.

Voltage drop due to transformer load during the fault is disregarded.

2-phase Short-circuits and Double Earth Faults ('Cross-country' Faults)

If 2 phase currents in a line bay exceed the short circuit pick-up value, a 2-phase short-circuit condition is detected. If only 1 phase current exceeds the pick-up value, a 'cross-country' fault condition is assumed.

For remote faults, the relative angles between MV voltage (bold arrowheads) and current phasors (open arrowheads) are illustrated in FIG. 131.

Figure 133:
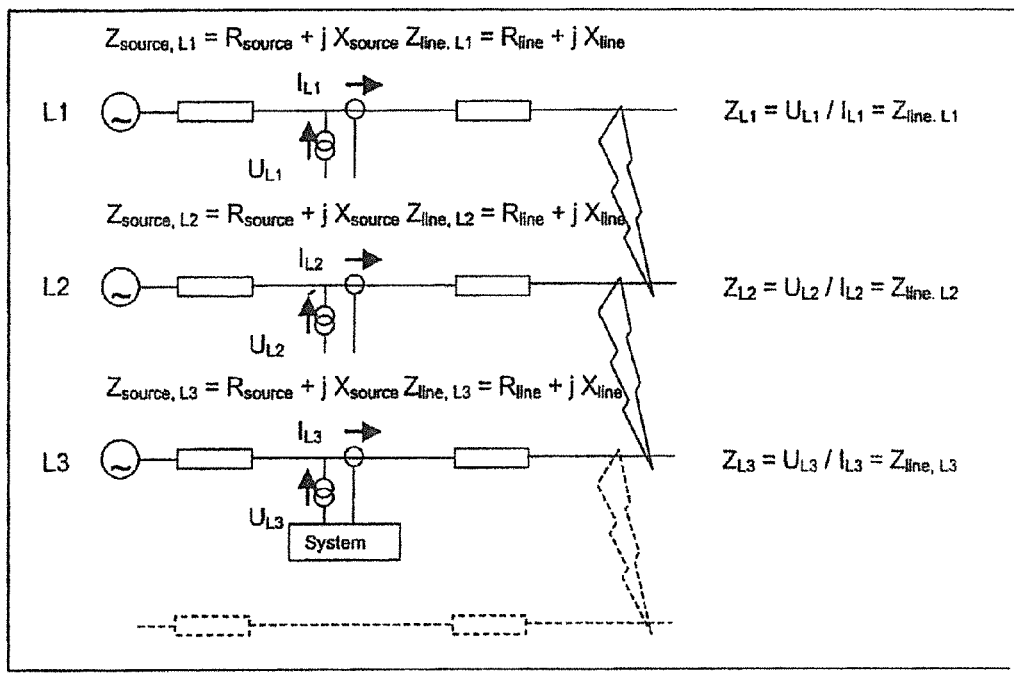

For close-up faults, i.e. faults close to the DISCOS station, the residual MV line voltage between the faulted phases may be zero or close to zero; e.g. $U_{L12,\ 10\ kV}$ during an L1-L2 fault. The relative angles between MV voltage and current phasors are illustrated in FIG. 133.

To ensure correct directional decision regardless of fault location, one of the 'healthy' MV line voltages must be used for polarization; e.g. $U_{L23,\ 10\ kV}$ during an L1-L2 fault. This method is also known as 'cross-polarization'.

The reference voltage is orthogonal to the faulted voltage. This is corrected as follows:

$U_{L23\ 10\ kV}$ is lagging $U_{L12\ 10\ kV}$ with 90°.
Therefore, $U_{L23\ 10\ kV}$ is turned through +90°.
$U_{L31\ 10\ kV}$ is lagging $U_{L23\ 10\ kV}$ with 90°.
Therefore, $U_{L23\ 10\ kV}$ is turned through +90°.
$U_{L12\ 10\ kV}$ is lagging $U_{L31\ 10\ kV}$ with 90°.
Therefore, $U_{L23\ 10\ kV}$ is turned through +90°.

Instead of MV line voltages, the similar LV phase voltage is used. Examples:
For a Dyn 5 transformer, $U_{L1\ 0.4\ kV}$ is similar with $U_{L12,\ 10\ kV}$.
Therefore, LV voltage phase angles replace MV voltage angles directly.
For a Dyn 11 transformer, ÷$U_{L1\ 0.4\ kV}$ is similar with $U_{L12,\ 10\ kV}$.
Therefore, LV voltage phase angles are turned through +180° to replace MV voltage angles Directional decision is carried out by phase-wise comparison of the following voltages and current phasors.

Fault loops and selection of reference voltage; 2-phase short-circuit, Dyn5 transformer:

TABLE 4

| Phase | Fault loop | MV reference voltage phase angle | LV reference voltage phase angle | MV current phase angle |
| --- | --- | --- | --- | --- |
| L1 | L1-L2 | $Arg(U_{L23,\ 10\ kV}) + 90°$ | $Arg(U_{L2,\ 0.4\ kV}) + 90°$ | $Arg(I_{L1,\ 10\ kV})$ |
| L2 | L2-L3 | $Arg(U_{L31,\ 10\ kV}) + 90°$ | $Arg(U_{L3,\ 0.4\ kV}) + 90°$ | $Arg(I_{L2,\ 10\ kV})$ |
| L3 | L3-L1 | $Arg(U_{L12,\ 10\ kV}) + 90°$ | $Arg(U_{L1,\ 0.4\ kV}) + 90°$ | $Arg(I_{L3,\ 10\ kV})$ |

Fault loops and selection of reference voltage; 2-phase short-circuit, Dyn11 transformer:

TABLE 5

| Phase | Fault loop | MV reference voltage phase angle | LV reference voltage phase angle | MV current phase angle |
|---|---|---|---|---|
| L1 | L1-L2 | $\text{Arg}(U_{L23,\,10\,kV}) + 90°$ | $\div\text{Arg}(U_{L2,\,0.4\,kV}) + 90°$ | $\text{Arg}(I_{L1,\,10\,kV})$ |
| L2 | L2-L3 | $\text{Arg}(U_{L31,\,10\,kV}) + 90°$ | $\div\text{Arg}(U_{L3,\,0.4\,kV}) + 90°$ | $\text{Arg}(I_{L2,\,10\,kV})$ |
| L3 | L3-L1 | $\text{Arg}(U_{L12,\,10\,kV}) + 90°$ | $\div\text{Arg}(U_{L1,\,0.4\,kV}) + 90°$ | $\text{Arg}(I_{L3,\,10\,kV})$ |

The relative angles between reference voltage and current, $\text{Arg}(Z_{Lx})$, are then calculated phase-wise.

Dyn 5 transformer; phase L1, L2 and L3:

$\text{Arg}(Z_{L1}) = \text{Arg}(U_{L23,\,10\,kV}) + 90° - \text{Arg}(I_{L1,\,10\,kV}) = \text{Arg}(U_{L2,\,0.4\,kV}) + 90° - \text{Arg}(I_{L1,\,10\,kV})$ $\text{Arg}(Z_{L2}) = \text{Arg}(U_{L31,\,10\,kV}) + 90° - \text{Arg}(I_{L2,\,10\,kV}) = \text{Arg}(U_{L3,\,0.4\,kV}) + 90° - \text{Arg}(I_{L2,\,10\,kV})$ $\text{Arg}(Z_{L3}) = \text{Arg}(U_{L12,\,10\,kV}) + 90° - \text{Arg}(I_{L3,\,10\,kV}) = \text{Arg}(U_{L1,\,0.4\,kV}) + 90° - \text{Arg}(I_{L3,\,10\,kV})$ Dyn 11 transformer; phase L1, L2 and L3:

$\text{Arg}(Z_{L1}) = \text{Arg}(U_{L23,\,10\,kV}) + 90° - \text{Arg}(I_{L2,\,10\,kV}) = \div\text{Arg}(U_{L2,\,0.4\,kV}) + 90° - \text{Arg}(I_{L1,\,10\,kV})$ $\text{Arg}(Z_{L2}) = \text{Arg}(U_{L31,\,10\,kV}) + 90° - \text{Arg}(I_{L2,\,10\,kV}) = \div\text{Arg}(U_{L3,\,0.4\,kV}) + 90° - \text{Arg}(I_{L2,\,10}\,kV)$ $\text{Arg}(Z_{L3}) = \text{Arg}(U_{L12,\,10\,kV}) + 90° - \text{Arg}(I_{L3,\,10\,kV}) = \div\text{Arg}(U_{L1,\,0.4\,kV}) + 90° - \text{Arg}(I_{L3,\,10}\,kV)$ Relative angle is then compared to MTA:

If $\text{Arg}(Z_{Lx})$ lies in the range MTA ±90°, a 'F' (forwards) indication is issued for phase x If $\text{Arg}(Z_{Lx})$ lies in the range ÷MTA ±90°, a 'B' (reverse/backwards) indication is issued for phase x The distance to the fault determines the degree of voltage collapse. If voltage collapse is not complete, cross-polarization may turn $\text{Arg}(Z_{Lx})$ through up to ±30°. Thanks to the 'broad' directional characteristic directional decision is not impaired, however.

For a 'true' 2 phase short-circuit (same fault location), indications will show same direction for faulted phases; i.e. 'FF-', 'F-F', '-FF', 'BB-', 'B-B' or '-BB'.

For a 'cross-country fault' (different fault locations), indications may show same or opposite direction for faulted phases—in accordance with the power flow direction of each phase.

Electrical Distance to Fault

Based on the measured voltages and currents, module A can establish the electrical distance to fault.

Distance to fault calculation is only triggered during 2- and 3-phase faults. For earth faults and 'cross-country' faults, distance to fault is not calculated since the measurement is influenced by the earth current return path.

3-phase Short-circuits

Figure 134:
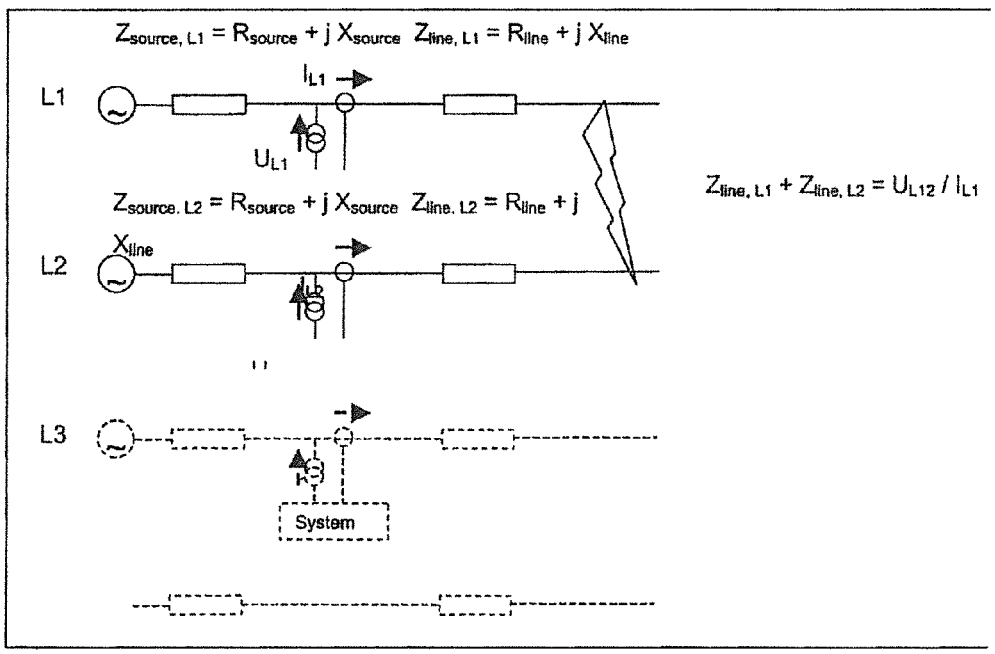
FIGS. 133 and 134 are schematic views of fault loops.

For 3-phase short-circuits, the following fault loop is considered, see FIG. 134:

As shown in FIG. 134, the apparent impedance from the system measuring point to the fault location, $Z_{Lx}$, may be calculated from the respective MV voltage $U_{Lx}$ and current $I_{Lx}$.

Since the fault is symmetrical, the voltage and current systems may be regarded as symmetrical, too. Therefore, $U_{L1,\,0.4\,kV}$ may be used as voltage instead of $U_{L1,\,10\,kV}$, etc.

The MV voltage $U_{L1,\,10\,kV}$ is substituted with the LV voltage $U_{L1,\,0.4\,kV}$, multiplied by n. 'n' is the transformer ratio between primary phase voltage and secondary phase voltage.

The apparent impedance is then calculated from the following voltages and current phasors.

Fault loops and selection of voltage and current phasors; 3-phase short-circuit:

TABLE 6

| Phase | Fault loop | MV voltage | LV voltage | MV current |
|---|---|---|---|---|
| L1 | L1-(N) | $U_{L1,\,10\,kV}$ | $U_{L1,\,0.4\,kV} \times n$ | $I_{L1,\,10\,kV}$ |
| L2 | L2-(N) | $U_{L2,\,10\,kV}$ | $U_{L2,\,0.4\,kV} \times n$ | $I_{L2,\,10\,kV}$ |
| L3 | L3-(N) | $U_{L3,\,10\,kV}$ | $U_{L3,\,0.4\,kV} \times n$ | $I_{L3,\,10\,kV}$ |

The impedance to fault location is calculated as the mean value:

$$Z_{mean} = (U_{L1,0.4\,kV} \times n / I_{L1,10\,kV} + U_{L2,0.4\,kV} \times n / I_{L2,10\,kV} + U_{L3,0.4\,kV} \times n / I_{L3,10\,kV}) / 3$$

Impedance Z (and resistance R) is not suitable for measuring an electrical distance, since both quantities vary with grounding system and earth return resistance, conductor resistance (temperature dependant) and arc resistance on fault location.

On the other hand, the reactance X only depends on conductor geometry in fault loop. Since this is constant, the apparent reactance is ideal as a measure of the electrical distance to fault, in Ohms:

$$X_{mean} = Im(Z_{mean}) = Im[(U_{L1,0.4\,kV}/I_{L1,10\,kV} + U_{L2,0.4\,kV}/I_{L2,10\,kV} + U_{L3,0.4\,kV}/I_{L3,10\,kV}) \times n/3]$$

2-phase Short-circuits

For 2-phase short-circuits, the following fault loop is considered (example shows L1-L2 fault).

MV voltage and current phasors during MV 2-phase short-circuit, see FIG. 135:

As shown above, the apparent impedance from the system measuring poing to the fault location, $Z_{Lx}$, may be calculated from the respective MV voltage $U_{Lxy}$ and current $I_{Lx}$.

Instead of MV line voltages, the similar LV phase voltage is used. Examples:

For a Dyn 5 transformer, $U_{L1\,0.4\,kV}$ is similar with $U_{L12,\,10\,kV}$.

Therefore, the LV phase voltage multiplied with the transformer ratio 'n' and √3, replaces the MV line voltage For a Dyn 11 transformer, $\div U_{L1\,0.4\,kV}$ is similar with $U_{L12,\,10\,kV}$.

Therefore, the LV phase voltage multiplied with the transformer ratio 'n' and √3 and turned through +180°, replaces the MV line voltage Apparent impedances are then calculated phase-wise from the following voltages and current phasors.

Fault loops and selection of voltage and current phasors; 2-phase short-circuit, Dyn5 trf.:

TABLE 7

| Phase | Fault loop | MV voltage | LV voltage | MV current |
|---|---|---|---|---|
| L1 | L1-L2 | $U_{L12,\,10\,kV}$ | $U_{L1,\,0.4\,kV} \times n \times \sqrt{3}$ | $I_{L1,\,10\,kV}$ |
| L2 | L2-L3 | $U_{L23,\,10\,kV}$ | $U_{L2,\,0.4\,kV} \times n \times \sqrt{3}$ | $I_{L2,\,10\,kV}$ |
| L3 | L3-L1 | $U_{L31,\,10\,kV}$ | $U_{L3,\,0.4\,kV} \times n \times \sqrt{3}$ | $I_{L3,\,10\,kV}$ |

Fault loops and selection of voltage and current phasors; 2-phase short-circuit, Dyn11 trf.:

TABLE 8

| Phase | Fault loop | MV voltage | LV voltage | MV current |
|---|---|---|---|---|
| L1 | L1-L2 | $U_{L12,\,10\,kV}$ | $\div U_{L1,\,0.4\,kV} \times n \times \sqrt{3}$ | $I_{L1,\,10\,kV}$ |
| L2 | L2-L3 | $U_{L23,\,10\,kV}$ | $\div U_{L2,\,0.4\,kV} \times n \times \sqrt{3}$ | $I_{L2,\,10\,kV}$ |
| L3 | L3-L1 | $U_{L31,\,10\,kV}$ | $\div U_{L3,\,0.4\,kV} \times n \times \sqrt{3}$ | $I_{L3,\,10kV}$ |

The impedance to fault location is calculated as below (example shows L1-L2 fault, Dyn5 trf.):

$$Z_{L1}=Z_{L2}=(U_{L1,0.4\,kV}\times n\times\sqrt{3}/I_{L1,10\,kV})\times 0.5$$

The factor 0.5 corrects for the loop impedance being twice the impedance to fault location. For reasons stated earlier, the apparent reactance is used as a measure of the electrical distance to fault, in Ohms:

$$X=Im(Z_{L1})=Im[(U_{L1,0.4\,kV}\times n\times\sqrt{3}/I_{L1,10\,kV})\times 0.5]$$

Converting Electrical Distance to Physical Distance

The distance to fault calculated by module A is the electrical distance in Ohms. Converting electrical distance to physical distance requires information about the specific reactance (Ω/km) and actual length (km) of all MV lines between the system measuring point and fault location.

Line data is normally available at server level, e.g. in the company's ERP system.

External Interaction

Description

The module has a number of external inputs and outputs (I/Os) that can be used to control the surrounding environment. These I/O's have no predefined functions and can thus be used for any general purposes.

| Input: | Method | Output: |
|---|---|---|
| Two binary inputs Output Control 2 analog inputs | | Two Binary Outputs Input State 2 analog outputs |

Method:
Input Surveillance

The module monitors the two binary inputs constantly.

If a change in either of the inputs is detected, the module sends a message to the Data Central.

The state of both inputs are also displayed on the module's Man-Machine-Interface (see Communication section)

Output Control

The module provides the Data Central with the option to change the output state. This is done by sending a message to the module. When the module receives the message from the Data Central, it changes the output accordingly.

The state of both outputs are also displayed on the module's Man-Machine-Interface (see Communication section)

Analog Inputs

The module monitors the two analog constantly, a 4-20 mA input and a 0-5V input. Levels for alarms can be set and the actual value can be given on request.

Open Phase Detection

The module is capable of detecting Open Phase faults in the monitored power network.

An Open Phase fault is detected by using the following calculations:

$$I_{min}=\text{Min}(I_A,I_B,I_C)$$

$$I_{max}=\text{Max}(I_A,I_B,I_C)$$

$$I_{avrg}=\frac{I_A+I_B+I_C}{3}$$

If the fraction $$\frac{I_{min}}{I_{max}}$$

is less than an operator-defined value and $I_{avrg}$ is higher than an operator-specified value and none of the measured voltages are below the earlier defined "No Voltage" threshold, the module assumes an Open Phase error has occurred.

This causes the module to send an alarm message to the Data Central.

Figure 52:
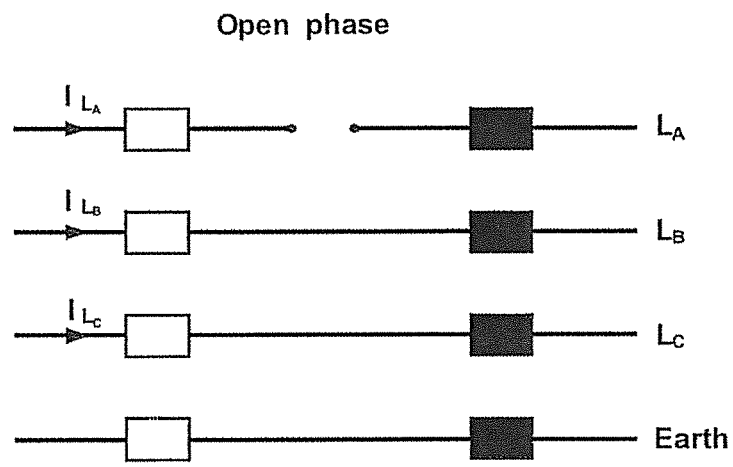
FIG. 52 is a diagram illustrating an open phase error.

FIG. 52 shows an Open Phase error for line A.

External Interaction

Figure 53:
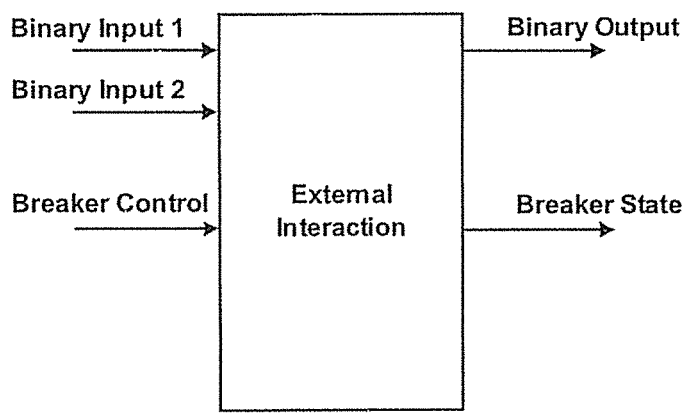
FIG. 53 is a block diagram illustrating inputs and outputs of the module.
Figure 54:
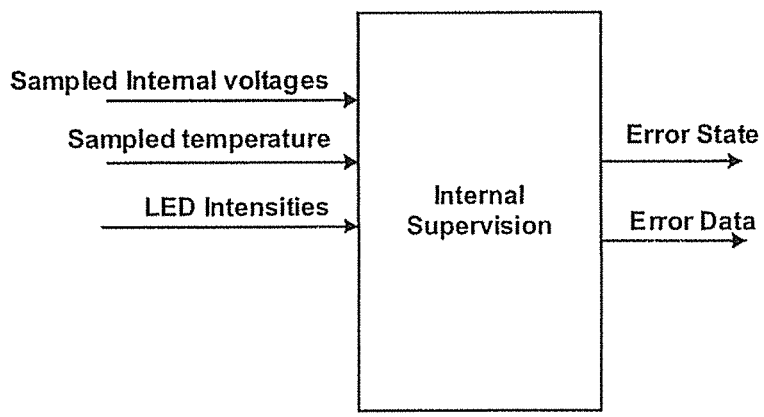
FIG. 54 is a block diagram similar to the block diagram of FIG. 53 illustrating additional input and error outputs.

Description:

The module has a number of external inputs and outputs (I/Os) that can be used to control the surrounding environment. These I/Os are currently mapped to the transform stations breaker circuit, but can be used for many other purposes. Reference is made to FIG. 53.

| Input: | Method | Output: |
|---|---|---|
| Two binary inputs Breaker Control | | One Binary Output Breaker State |

Method:
Breaker Surveillance

The module monitors the breaker circuit constantly. The current configuration causes the first input to be high, if the breaker is closed and the second output to be high, if the breaker is open.

If a change in breaker state is detected, the module sends a message to the Data Central.

The current breaker state is also displayed on the module's Man-Machine-Interface (see Communication section)

Breaker Control

The module provides the Data Central with the option to open the breaker. This is done by sending a message to the module. When the module receives the break signal, it sets the binary output to high.

The binary output is held high until the module detects the breaker to be open or the module has tried to open the breaker for 20 seconds or another user defined time period. If either of the two things occurs, the module sends a message back to the Data Central with the current breaker state.

When the module is trying to change the breaker state, it is displayed on the Man-Machine-Interface (see Communication section).

Internal Supervision

Description

The module has a self service feature that ensures continuously correct behaviour and in case of defects, detects these and acts intelligently according to the severity of the defect.

The status of the module is displayed on the Man-Machine-Interface and is at the same time communicated to the Data Central. (See communication section). Reference is made to FIG. 52.

| Input: | Method | Output: |
|---|---|---|
| Sampled Internal voltages Sampled temperature LED Intensities | | Error State Error Data |

Method:
Internal Voltages

The sampled internal voltages are checked against a set of operator-defined values. If the voltages fall below the value an alarm event is triggered.

The alarm is cancelled when the voltage is significantly higher than the low voltage trigger.

Figure 55:
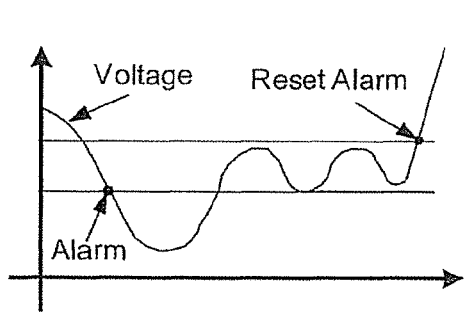
FIG. 55 is a diagram illustrating a trigger function of the module.

FIG. 55 shows this behaviour.

Module Temperature

The sampled temperature is treated a bit differently than the voltages. The operator defines a temperature "band" that is accepted If the band is breached the alarm will trigger, and the alarm is reset when the temperature is significantly inside the band again.

Figure 56:
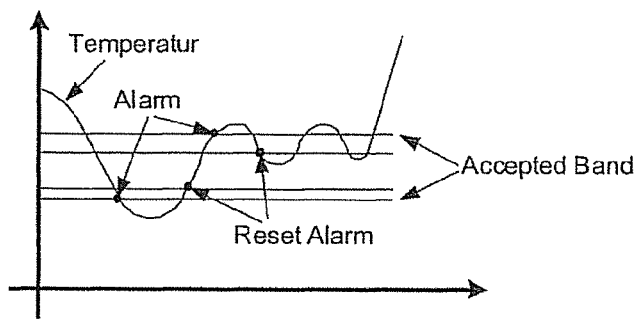
FIG. 56 is a further diagram illustrating acceptable and unacceptable variations.

FIG. 56 shows this behaviour.

Light Emitting Diode Supervision

The LEDs' light intensities are monitored and compared to two operator-defined values called $LED_{Service}$ and $LED_{Defect}$.

If one of the LED intensities falls below $LED_{Service}$ the system enters the "Service" state and informs the Data Central.

If one of the LED intensities falls below $LED_{Defect}$ the system enters the "Defect" state and informs the Data Central.

Software Supervision

Different actions in the module's software can cause error events. Some of these errors are non-critical and may happen once in a while. Statistics on these errors are collected and if they happen to frequently or if a critical error occurs, a message is sent to the Data Central and the module's state is updated.

Module States

The module's state is changed by errors and by normal product operation. The module's state determines how the module functions. There are four states.

Passive
Service
Active
Defect

Figure 57:
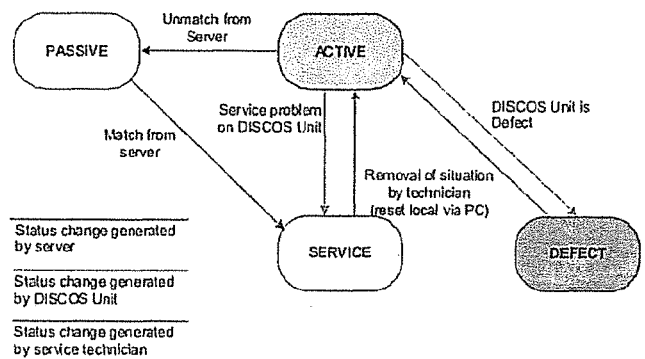
FIG. 57 is a diagram illustrating possible states and possible transitions between the states of the module.

FIG. 57 shows the states and the possible transitions between the states.

The Defect state is entered when an error is preventing normal operation. Only a service technician can change from Defect state to Active state.

The Service state is entered when a threshold of non-critical errors has been reached. When in service state, all measurements are done as normal, but the state indicates that manual service is necessary to fix the problem before it becomes critical. A service technician changes the module from Service state to Active state.

The Active state is the normal state when module is installed, calibrated and running normal. Changes from the active state are caused by errors or by a technician.

The Passive state is the state a non-calibrated module starts in. It indicates the module needs calibration. The module's state changes to Active when it is calibrated.

The system state and the alarms closely cooperate with the Man-Machine-Interface. (See communication section)

Communication

Description

Figure 58:
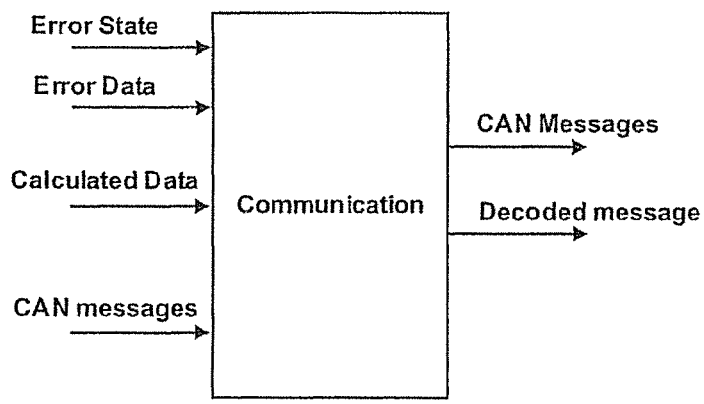
FIG. 58 is a block diagram similar to the block diagrams of FIGS. 53 and 54 illustrating error inputs and additional outputs.

The module's communication contains two functions:
1) A Man-Machine Interface (MMI) consisting of 10 LEDs. These LEDs are used to make the module's current state visible to on-site operators.
2) The module is connected to a CAN bus. This permits the module to communicate with the other modules on the CAN bus and the PC when the module is being calibrated. Reference is made to FIG. 58.

| Input: | Method | Output: |
|---|---|---|
| Error State | | CAN Messages |
| Error Data | | Decoded message |
| Calculated Data | | |
| CAN Messages | | |

Method:

Man-machine Interface

Figure 59:
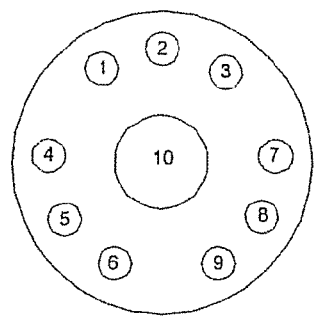
FIG. 59 is a diagram of an MMI interface (Man-Machine Interface)

The module's Man-Machine Interface (MMI) displays the current state of the unit. The MMI looks like FIG. 59

The MMI contains 10 LEDs that have the following functions:

1-3)

These LEDs are green, yellow and red and they represent the unit's state. Respectively they represent "Unit OK", "Service Needed" and "Unit Defect"

4)

The fourth LED shows that an error, i.e. a short circuit, with direction forward has occurred.

5)

The fifth LED shows that an error, i.e. a short circuit, with direction backward has occurred

6)

The sixth LED shows that an earth error has occurred.

7-9)

These three LEDs respectively represent "Breaker Open", "Breaker Closed" and "Breaker opening" or "Breaker tripped by Module".

10)

The tenth LED is larger than the others and flashes when the system is being calibrated by the PC calibration software. It also flashes when the unit is sending or receiving external GSM communication. The LED also functions as a push button and resets the system if held down for 5 seconds.

CAN Communication

All modules in the system are interconnected via an industrial type CAN bus. This bus is used when the operator wishes to calibrate the units.

Prior to the module calibration, a PC with the calibration software is connected to the CAN bus.

When the software is started, it communicates with all modules on the CAN bus and provides each module with a unique ID number. This ID number is used in all future messages to and from the specific module.

The CAN bus is also used when an A-Module wishes to operate the power network breaker or tripping.

The operation requires power supplied via the system bus and to minimize the power usage during breaking, or tripping, only one A-module is allowed to operate the breaker at any given time.

This is ensured by means of a "breaker token". The token is held by the B-Module during ordinary operation, and when an A-Module wishes to operate the breaker it requests the token. If the B-Module has the token, it gives the token to the requesting A-Module. The A-Module returns the token to the B-Module when the break is performed.

Finally the CAN bus is used by the module to communicate with Module C. All information that should be sent to the Data Central is sent as messages on the CAN bus to Module C.

All messages send from the Data Central are received by Module C and forwarded to the correct module by using the CAN bus. These CAN messages are decoded and the module performs the action requested by the Data Central.

The Data Central can request the current module measurements, it can request the breaker state and it can request a change of the breaker state.

Module B Description

Figure 60:
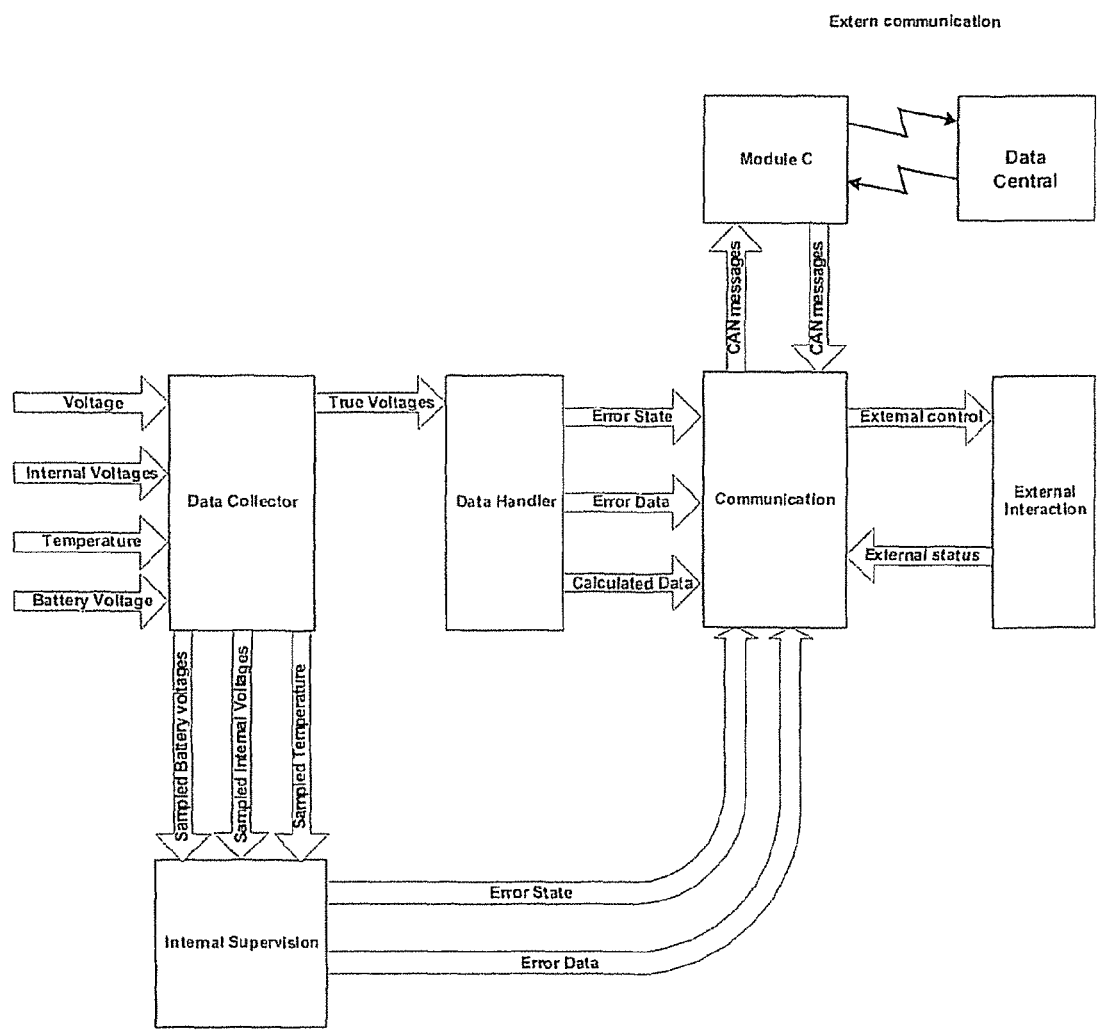
FIG. 60 is a block diagram illustrating the structure of a module B of the apparatus according to the present invention.

Module B has a modular structure as displayed in FIG. 60

Data Collection

Description

Figure 61:
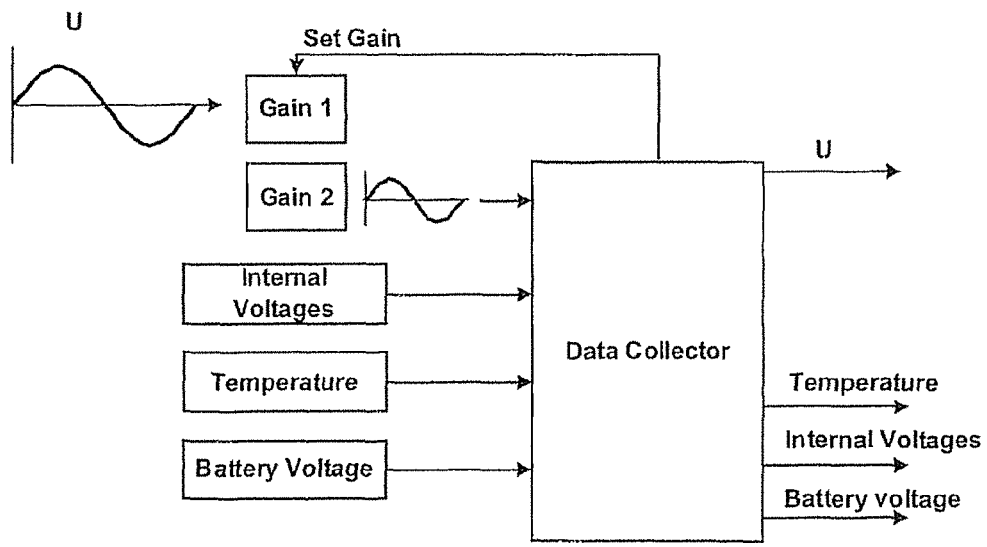
FIG. 61 is a block diagram illustrating the function of the module B, also shown in FIG. 32.

The data collection is done by sampling the input provided by the hardware. Each input channel is sampled 32 times during a 20 ms period. The data is saved in a structured way that allows further handling of the data. Reference is made to FIG. 61.

| Input: | Method | Output: |
|---|---|---|
| Three voltage lines | | Three Calibrated Voltage values |
| Internal voltages | | Internal Voltage values |
| Temperature | | Temperature values |
| Battery voltage | | Battery voltage values |

Method:
Data Collection

The module has an internal timer that ensures that sampling is done on each of the three voltage lines exactly 32 times per 20 ms period. Each sample is stored for later use. This results in 96 samples with 625 nanoseconds between two samples on the same line.

Figure 62:
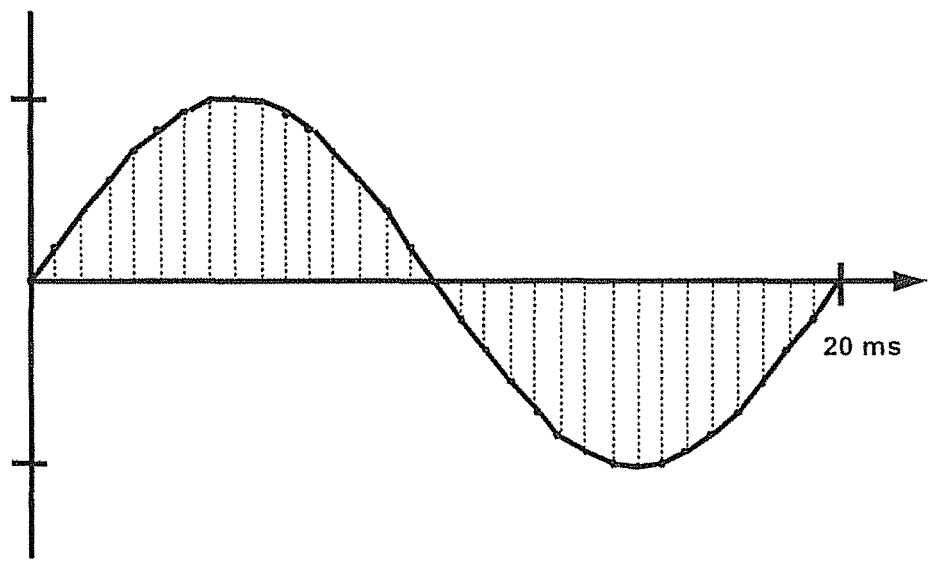
FIG. 62 is a graph representing the theoretical data collection.

Each sample value is compared to the predefined zero reference, and if the sample value is below the reference, the sample number of the previous sample is stored. The two following samples of that line are compared to the reference, and if one of them is not below the zero reference, the sample number and the detection are reset. This is done to prevent detection of "false" zero crossings due to hardware distortion. FIG. 62 is a graphical representation of the theoretical data collected from one of the three lines.

Figure 63:
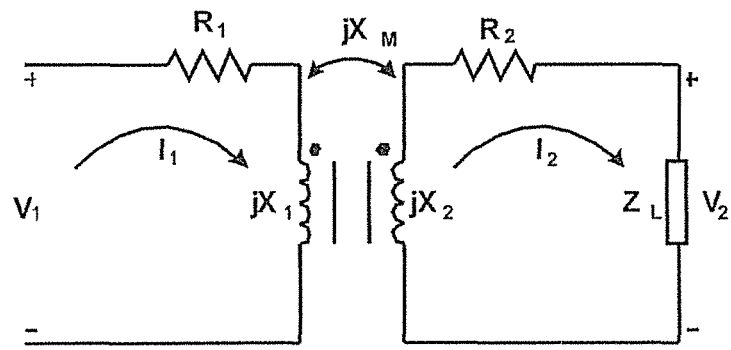
FIG. 63 is a diagram illustrating a transformer and the transformation of voltages and currents by the transformer.

When a full 20 ms period has passed, the true voltages (U) are calculated based on the collected data. The formulas are described below:

The various constants used in the calculations are described in detail in the following sections. Reference is made to FIG. 63.

Module B is only interested in the voltage on the low voltage side of the transformer ($V_2$ on FIG. 63) and the following chain of formulas describes the steps taken in calculating the Line-to-Neutral and Line-to-Line voltages. The small x in the formulas denotes a certain line (A, B or C).

Figure 64:
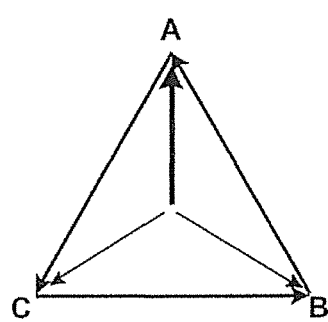
FIG. 64 is Line-to-Neutral voltage diagram.

Line-to-Neutral Calculations:

The bold line in FIG. 64 shows the Line-to-Neutral voltage for line A

The value $U_{x\ calc}$ is the raw average of the sampled values $$U_{x\ calc} = \frac{\left(\sum_{i=0}^{32} U_x Sample_i\right)}{32}$$

The Line-to-Neutral voltage is calculated as $$UL_{xL-N} = U_{x\ calc} \cdot K_{Calibration} \cdot K_{Gain}$$

$K_{Calibration}$ is a calibration factor found for each line during calibration (See Calibration section)

$K_{Gain}$ is a factor defined by the current gain selection of the hardware (See Gain section)

Figure 65:
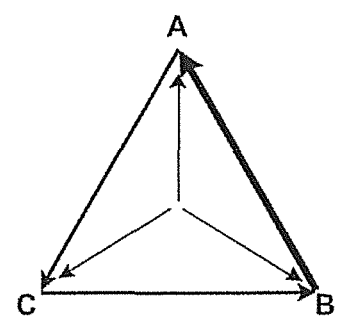
FIG. 65 is Line-to-Line voltage diagram.

Line-to-Line Calculations:

The bold line in FIG. 65 shows the Line-to-Line voltage between line A and B

The following formula is used to calculate the Line-to-Line voltage $$UL_{xL-L} = \sqrt{UL_{(x+1)L-N}^2 + UL_{xL-N}^2 - 2 \cdot UL_{(x+1)L-N} \cdot UL_{xL-N} \cdot \cos(120°)}$$

Calibration

During the setup of the module, the module must be calibrated to ensure correct measurements.

The operator does this by using a PC based calibration program. A calibration device must be attached to perform this calibration.

During the calibration the PC collects the measured voltage, current and phase difference provided by the module as well as the calibration device.

After collecting sufficient data, the PC calculates calibration factors for the voltage.

Figure 66:
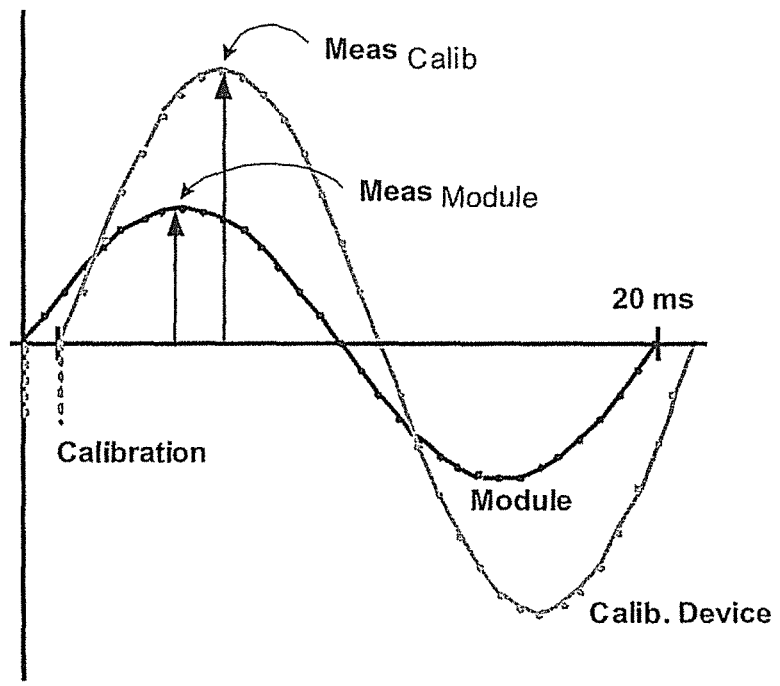
FIG. 66 is a voltage and current diagram.

FIG. 66 displays the calibration data.

Voltage Calibration:

The voltage factors are calculated using following formulas:

$$K_{Calibration} = \frac{Meas_{Calib}}{Meas_{Module}}$$

Gain Adjustment

In order to allow measurement of a large range of voltages without loosing precision, the module uses a gain mechanism. This mechanism contains two gain levels for voltage measurement. The module performs an online evaluation of the collected data and adjusts the gain levels accordingly. This ensures the highest possible precision at all times.

The general formulas used for the adjustment are as follows:

Adjust gain to a lower level if:

$$\frac{MeasuredValueAtGainX}{TotalRangeOfGainX} < PredefinedPercentage$$

Adjust gain to a higher level if:

$$\frac{MeasuredValueAtGainX}{TotalRangeOfGainX} > PredefinedPercentage$$

The constant $K_{gain}$ that is used in the voltage calculations depends on the currently selected gain.

Preferably two thresholds are defined a low and a high predefined percentage.

Data Analysis
Description

Figure 67:
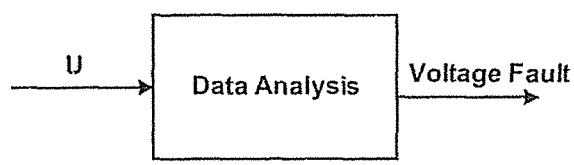
FIG. 67 is a block diagram illustrating the data analysis function of the module.

The data analysis is based on the collected data. The module performs voltage supervision on the collected data to determine if an error state has occurred in the monitored power network, which should be reported to the Data Central. Reference is made to FIG. 67.

| Input: | Method | Output: |
|---|---|---|
| Three voltage values. | | Voltage fault |

Method:

The voltages are used to determine if a voltage fault has occurred.

Voltage Supervision

If the module is monitoring the low voltage side of the transformer, it is constantly supervising the voltage level. If the voltage level exceeds certain operator-specified limits, the module sends an alarm message to the Data Central.

The following three limits are currently implemented:
High Voltage:
If the measured voltage level exceeds this value for a given period of time, the module sends a "High voltage" alarm to the Data Central.
Low Voltage:
If the measured voltage level falls below this value for a given period of time, the module sends a "Low voltage" alarm to the Data Central.
No Voltage:
If the measured voltage level falls below this value for a given period of time, the module sends a "No voltage" alarm to the Data Central.

The alarm for no voltage may be inhibited if a user settable, minimum current, flows in one or more phases of a MV ???1 in the electrical power station. The purpose is to restrict the alarming to local losses of supply only, e.g. to due to tripped MV transformer protection.

Figure 68:
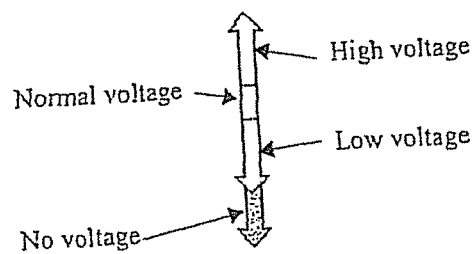
FIG. 68 is a diagram illustrating alarm levels.
Figure 69:
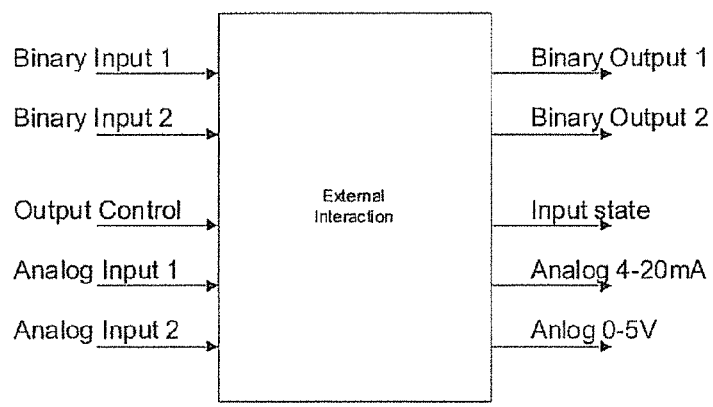
FIG. 69 is a block diagram illustrating inputs and outputs of the module.

FIG. 68 shows the alarm levels.

External Interaction
Description
The module has a number of external inputs and outputs (I/Os) that can be used to control the surrounding environment. These I/O's have no predefined functions and can thus be used for any general purposes.

| Input: | Method | Output: |
|---|---|---|
| Two binary inputs | | Two Binary Outputs |
| Output Control | | Input State |
| 2 analog inputs | | 2 analog outputs |

Figure 70:
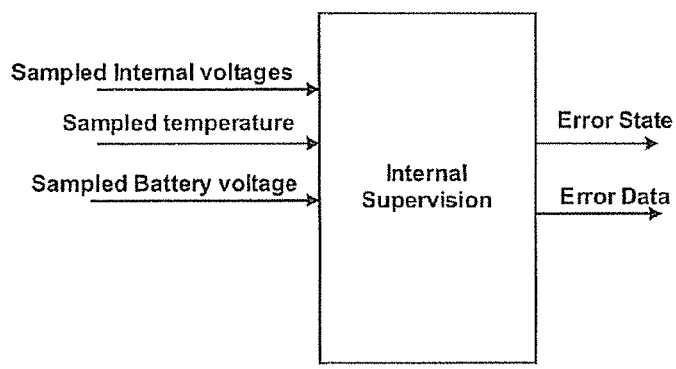
FIG. 70 is a block diagram similar to the block diagram of FIG. 53 illustrating additional input and error outputs.

Method:
Input Surveillance
The module monitors the two binary inputs constantly.
If a change in either of the inputs is detected, the module sends a message to the Data Central.
The state of both inputs are also displayed on the module's Man-Machine-Interface (see Communication section)
Output Control
The module provides the Data Central with the option to change the output state. This is done by sending a message to the module. When the module receives the message from the Data Central, it changes the output accordingly.
The state of both outputs are also displayed on the module's Man-Machine-Interface (see Communication section)
Analog Inputs
The module monitors the two analog constantly, a 4-20 mA input and a 0-5V input. Levels for alarms can be set and the actual value can be given on request.
Internal Supervision
Description
The module has a self service feature that ensures continuously correct behaviour and in case of defects, detects these and acts intelligently according to the severity of the defect.
The status of the module is displayed on the Man-Machine-Interface and is at the same time communicated to the Data Central. (See communication section). Reference is made to FIG. 70.

| Input: | Method | Output: |
|---|---|---|
| Sampled Internal voltages | | Error State |
| Sampled temperature | | Error Data |
| Sampled Battery voltages | | |

Figure 71:
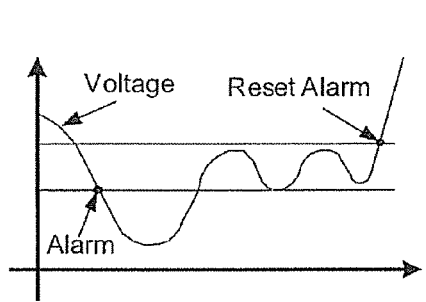
FIG. 71 is a diagram illustrating a trigger function of the module.
Figure 72:
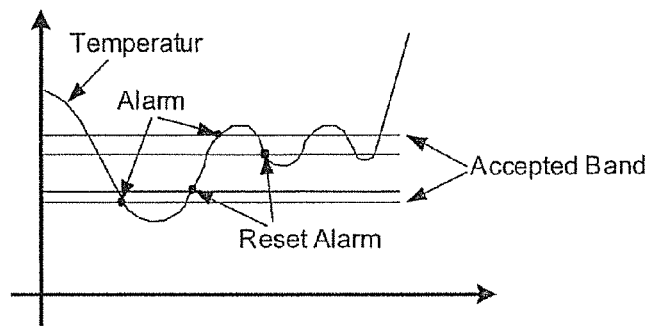
FIG. 72 is a further diagram illustrating acceptable and unacceptable variations.

Method:
Internal Voltages
The sampled internal voltages are checked against a set of operator-defined values. If the voltages fall below the value an alarm event is triggered.
The alarm is cancelled when the voltage is significantly higher than the low voltage trigger.
FIG. 71 shows this behaviour.
Module Temperature
The sampled temperature is treated a bit differently than the voltages. The operator defines a temperature "band" that is accepted.
If the band is breached the alarm will trigger, and the alarm is reset when the temperature is significantly inside the band again.
FIG. 72 shows this behaviour.
Battery Voltage
The module is battery backed at all time and controls the charging of this battery from main supply with a relay. A check is done on this battery at predefined periods (once every week). The check disables the charger and main supply for a short time, and monitors the battery discharging. If the battery discharges too fast, the battery is considered defect.
This changes the modules state to Service and the module sends a message informing the Data Central.
Software Supervision
Different actions in the module's software can cause error events. Some of these errors are non-critical and may happen once in a while. Statistics on these errors are collected and if they happen to frequently or if a critical error occurs, a message is sent to the Data Central and the module's state is updated.
Module States
The module's state is changed by errors and by normal product operation. The module's state determines how the module functions. There are four states.
Passive
Service
Active
Defect
FIG. 73 shows the states and the possible transitions between the states.
The Defect state is entered when an error is preventing normal operation. Only a service technician can change from Defect state to Active state.
The Service state is entered when a threshold of non-critical errors has been reached. When in service state, all measurements are done as normal, but the state indicates that manual service is necessary to fix the problem before it becomes critical. A service technician changes the module from Service state to Active state.
The Active state is the normal state when module is installed, calibrated and running normal. Changes from the active state are caused by errors or by a technician.
The Passive state is the state a non-calibrated module starts in. It indicates the module needs calibration. The module's state changes to Active when it is calibrated.
The system state closely cooperates with the Man-Machine-Interface. (See communication section)
Communication
Description
The module's communication contains two functions:
1) A Man-Machine Interface (MMI) consisting of 10 LEDs. These LEDs are used to make the module's current state visible to on-site operators.
2) The module is connected to a CAN bus. This permits the module to communicate with the other modules on the CAN bus and the PC when the module is being calibrated. Reference is made to FIG. 74.

| Input: | Method | Output: |
|---|---|---|
| Error State | | CAN Messages |
| Error Data | | Decoded message |
| Calculated Data | | |
| CAN Messages | | |

Method:

Man-Machine Interface

The module's Man-Machine Interface (MMI) displays the current state of the unit. The MMI looks like FIG. 75

The MMI contains 10 LEDs that have the following functions:

1-3)

These LEDs are green, yellow and red and they represent the unit's state. Respectively they represent "Unit OK", "Service Needed" and "Unit Defect"

4)

The fourth LED shows the state of Binary Output 1. If the output is high, the LED is on.

5)

The fifth LED is not currently used.

6)

The sixth LED shows the state of Binary Input 1. If the input is high, the LED is on.

7)

The seventh LED shows the state of Binary Output 2. If the output is high, the LED is on.

8)

The eighth LED is not currently used.

9)

The ninth LED shows the state of Binary Input 2. If the input is high, the LED is on.

10)

The tenth LED is larger that the others and flashes when the system is being calibrated by the PC calibration software. It also flashes when the unit is sending or receiving external GSM communication. The LED also functions as a button and resets the system if held down for 5 seconds.

CAN Communication

All modules in the system are interconnected via an industrial type CAN bus. This bus is used when the operator wishes to calibrated the units.

Prior to the module calibration, a PC with the calibration software is connected to the CAN bus.

When the software is started, it communicates with all modules on the CAN bus and provides each module with a unique ID number. This ID number is used in all future messages to and from the specific module.

The CAN bus is also used when an A-Module wishes to operate the power network breaker.

The operation requires power and to minimize the power usage during breaking, only one A-module is allowed to operate the breaker at any given time.

This is ensured by means of a "breaker token". The token is held by the B-Module during ordinary operation, and when an A-Module wishes to operate the breaker it requests the token. If the B-Module has the token, it gives the token to the requesting A-Module. The A-Module returns the token to the B-Module when the break is performed.

Finally the CAN bus is used by the module to communicate with Module C. All information that should be sent to the Data Central is sent as messages on the CAN bus to Module C.

All messages send from the Data Central are received by Module C and forwarded to the correct module by using the CAN bus. These CAN messages are decoded and the module performs the action requested by the Data Central.

The Data Central can request the current module measurements, it can request the breaker state and it can request a change of the breaker state.

Module C Description

Module C functions as a bridge between the Data Central and the other modules in the system.

This is shown in FIG. 76.

Communication

Description

The module functions as a bridge between the other modules and the Data Central. This bridging consists of two functions 1) Reception and encoding of messages received on the CAN bus from other modules and sending of these to the Data Central.

Figure 77:
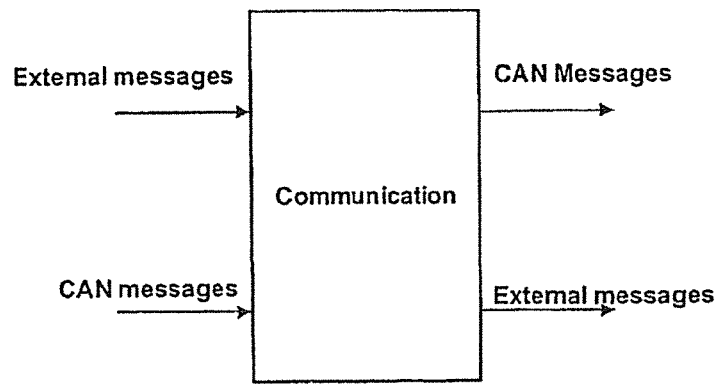
FIG. 77 is a block diagram similar to the block diagrams of FIGS. 53 and 54 illustrating error inputs and additional outputs.

2) Reception and decoding of messages from the Data Central and forwarding of these messages to the other modules via the CAN bus. Reference is made to FIG. 77.

| Input: | Method | Output: |
|---|---|---|
| CAN Messages | | External Messages |
| External Messages | | CAN messages |

Method:

Sending of External Messages

The module is connected to other modules of type A and B via the CAN bus. These other modules send CAN messages to the C-module when they wish to communicate with the Data Central.

Because the data to the Data Central often consists of more information that can be contained in one CAN message, the C-module handles the gathering of CAN messages and sends the information when all data is received.

The message can be sent to the Data Central using any of a number of communication standards including SMS and GPRS.

Reception of External Messages

The Data Central sends messages to the C-module using any of a number of communication standards including SMS and GPRS.

Upon receiving the message the module decodes it and divides it into a number of CAN messages.

These CAN messages are sent to the appropriate A- or B-Type module on the CAN bus.

The message can be sent to the Data Central using any of a number of communication standards including SMS, GPRS.

Man-Machine-Interface

Figure 78:
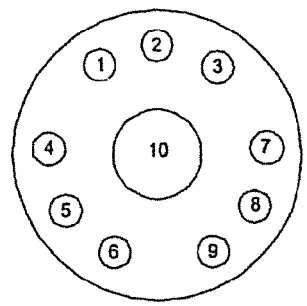
FIG. 78 is a diagram of an MMI interface (Man-Machine Interface)
Figure 79:
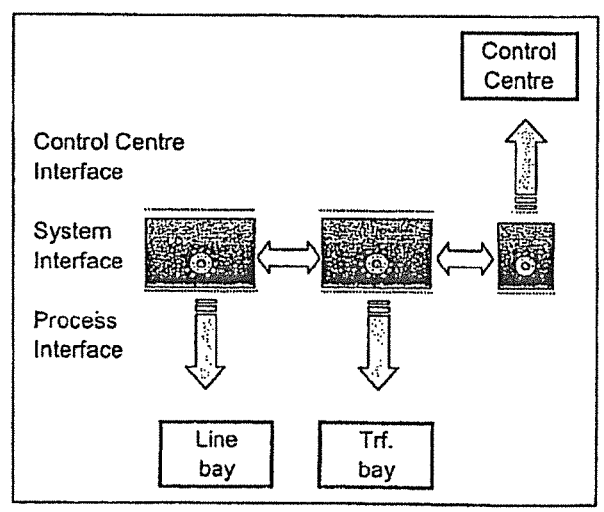
FIG. 79 is a diagram illustrating the interface between a control centre, system intermodule and process interface.
Figure 80:
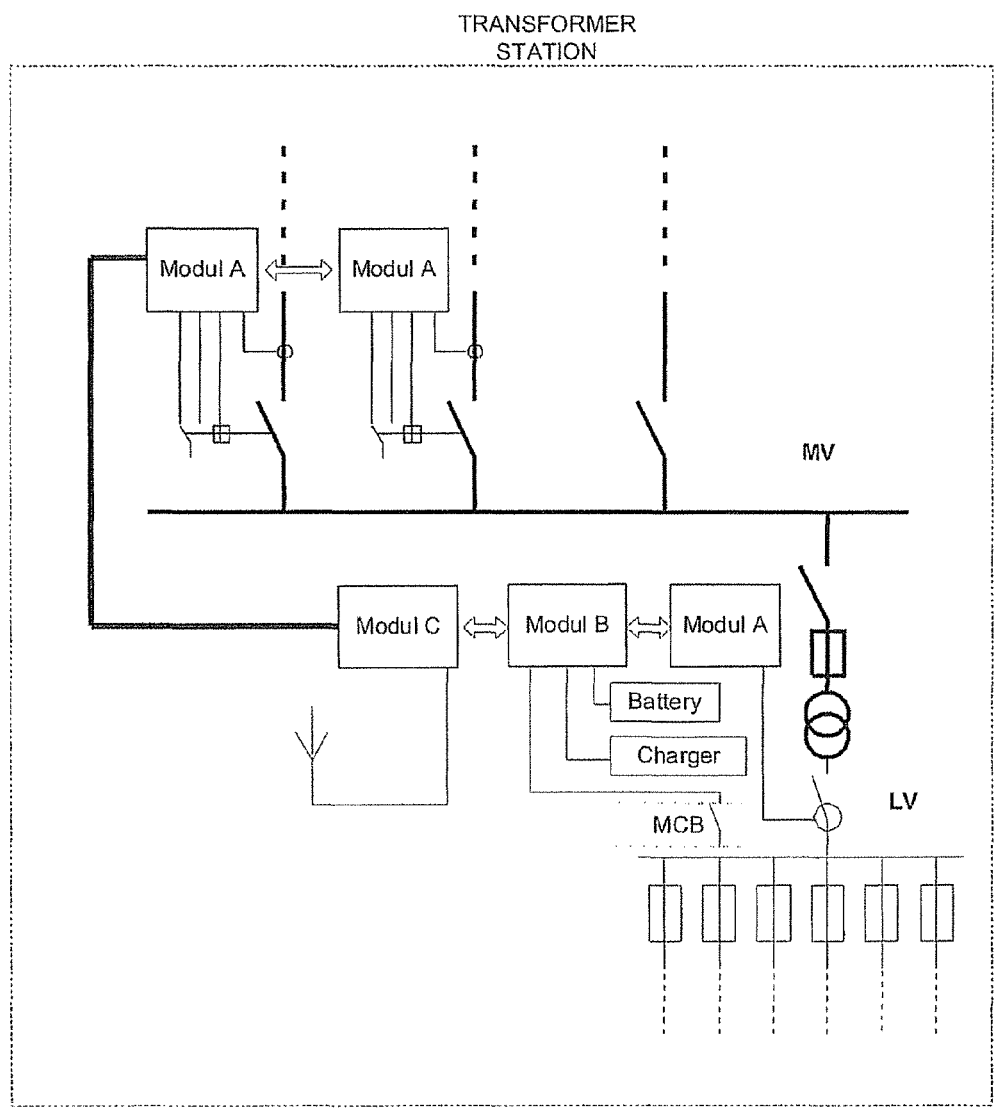
FIG. 80 is a block-diagrammatic view of a transformer station.

The module's Man-Machine Interface (MMI) displays the current state of the unit. The MMI looks like FIG. 78

The MMI contains 10 LEDs that have the following functions:

1-3)

These LEDs are green, yellow and red and they represent the unit's state. Respectively they represent "Unit OK", "Service Needed" and "Unit Defect"

4-6)

These three LEDs are not currently used.

7)

The seventh LED flashes when external messages are sent or received.

8-9)

These two LEDs are not currently used.

10)

The tenth LED functions as a button and resets the system if held down for 5 seconds.

The following describes a hardware implementation for the apparatus according to the present invention, hereafter referred to as Module A. The document describe the different demands for the signals connected to the device.

The document is split into the following sections.

General demands for the module.

Specified demands for each in/output.

Figure 81:
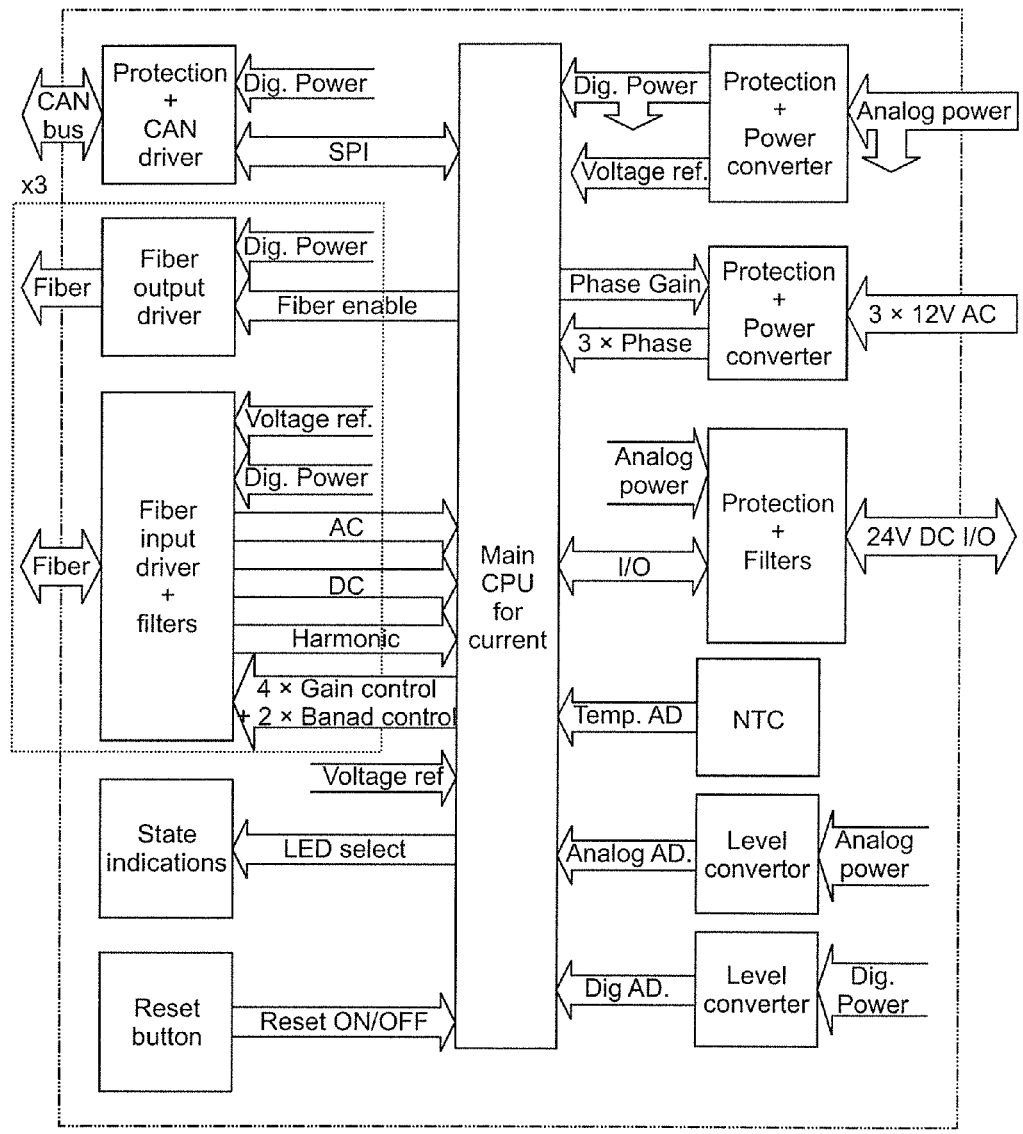
FIG. 81 is a block-diagrammatic view of module A.

The module A shown in FIG. 81 is used for measuring the current, in 3 MV phases at the same time. Each measurement can be done by using a Fiberoptic Faraday Effect Sensor. In this document this sensor will be referred to as a FFES.

The module has the following inputs and outputs:

3× light outputs. Wavelength eq. 620 nm.

3× light inputs. Wavelength eq. 620 nm.

A 24V DC output for handling a external relay.

2× 24V DC input. For external relay status

CAN bus used for transmitting and receiving data between units.

3× 12V AC input (R, S, T).

1 analog power (24V DC).

The module is supplied from an analog power. This power line is a 24V DC power connected to all units connected to the system.

To communicate between the different modules, a CAN bus is used.

A replicate of the phase voltage A, B and C is connected to the system via a 3× 12V AC system. The phase voltage is used to measure the angle and an RMS calculation. These signals are created by the Master referred to as module B. In case of cable failures, the system is able to connect or disconnect and MV breaker. This is done be a 24V DC output voltage signal. To detect the current state of the external relay, two 24V DC inputs are available.

To measure the current in an AC power line, an FFES shown in FIG. 82 is used. This sensor uses light to indicate the magnitude of the current running through the cable. For this a light output and input is available. The light used must have a wavelength of 620 nm.

The supply block shown in FIG. 83 is a unit supplying the module with digital power, and 2 voltage references.

These references are designed to be precise and not affected significant by changed in temperature. The voltages that are used are 2.048V and 4.096V.

Internally in the system the modules communicate via an industrial CAN network. Communication speed is 125 kbps. All commands are encapsulated in a single CAN package except for SMS messages, which are transmitted as several CAN packages. The uC in module B uses a can controller and a can driver to perform the communication. The CAN driver shown in FIG. 84 is used for converting data from a SPI bus to a CAN bus.

To protect the CAN buses I/O's, a protection circuits is placed on its outputs. This protection circuit protects the module against incorrect wire connections, ESD and over current.

A level converter is be used to convert logic level signals to CAN bus signals.

To convert a SPI protocol to a CAN protocol, a CAN controller is used.

The I/O block is used for connect to external signals.

To enable or disable an external relay, an 24V DC output is available. This output is able to deliver 12 A DC. To detect the current state of the breaker two 24V DC inputs are available.

Output:

A 24V DC power lines that can be turned on and off.

Input:

Two 24V DC digital inputs.

All I/O are protected against ESD and over current.

All internal I/O's, has 1. order low pass filters to remove high frequencies.

To turn on and off a 24V DC output, a relay is used. This is done to ensure that the 24V DC output is physically disconnected from the analog power line. The 24V DC inputs are galvanic divided to secure the electronics. The I/O block is connected to the analog power lines to deliver the 24V DC signals.

Each module has 3 fiber modules, each with the same specifications. The fiber I/O's are connected to the FFES via 2 optical fibers. The transmitter diode has a constant light output. When the light is sent through the FFES, the magnitude on its output will be depending on the current running through the cable. A constant current has to be sent through the output diode to make an offset larger than zero. When the current in the cable variable, the light through the FFES variable proportional.

The fiber output is used for sending light through the FFES as shown in FIG. 86. The light must have constant light output. This means that the current through the light diode must be constant.

The light received from the sensor shown in FIG. 87 is used for detecting the magnitude of the current. It works as an detector diode, with higher amount of light equals higher forward voltage.

To supply the diode and filters, digital power is available.

To change the gain on the amplifiers, 4 gain control inputs are used. The amplifiers must also have a 2.048V DC and a 4.096V DC reference.

The signal created by the photodiode detector is sent through filters before they can be used.

To measure the efficiency in the transmission diodes and sensor, the DC voltage level is measured. The DC voltage level is compared with the voltage level measured when the system was calibrated, it is possible to control the ageing of the product. The cutoff frequency for the filter is 0.5 Hz.

To measure the current and the phase without the dc component a 10 Hz high pass filter is used.

To detect the amount of harmonic in the signal, a bandpass filter must be used. The passband must have 2 different areas to work in. The first may be frequencies from 200 Hz to 750 Hz for ground cables The second may be from 600 Hz to 1600 Hz for overhead lines. To change the area 2 inputs must be available.

To calculate the phase difference between the current and the voltage on a power cable, the 3 phases R, S and T must be measured.

A protection circuit are placed at the 12V AC inputs, to protect against over currents and ESD. Next a level converter must be present. It converts the 12V AC signals to voltages that the main CPU can measure.

A filter must be inserted to remove noise higher than 50 Hz, before the main CPU can measure the phases. The filters are 3×1. order low pass filters with a 3 db cutoff frequency at 500 Hz.

To measure the internal temperature in the module, a NTC resistor shown in FIG. 88 must be present. It is used to detect if the internal temperature is to high. If this is the case, a fatal error could happen, and the system could perhaps turn off.

Figure 89:
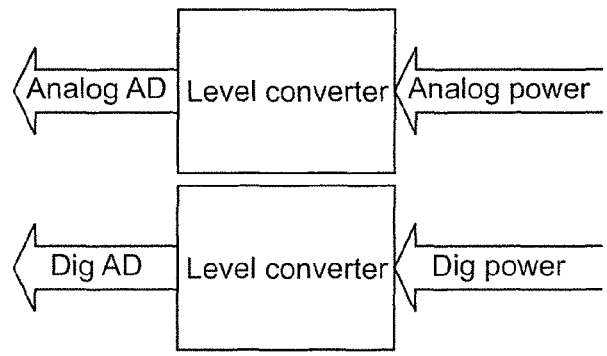
FIG. 89 is a block-diagrammatic view of a level converter.

To detect if the analog and the digital voltages are correct, the main CPU are measuring the level of these signals. Before measuring them, they have to be converted to a signal level as shown in FIG. 89.

The module must have some indications on its current state. These indications only show the most vital information. This information is:

External supply state.

Unit state.

Communication.

3× short circuit direction.

To reset the indications on the diodes, a reset button must be present. You may not be able to touch this button by a mistake.

The main CPU is the "brain" in the module. It is handling all the digital and analog I/O's, and is doing all calculations.

Figure 90:
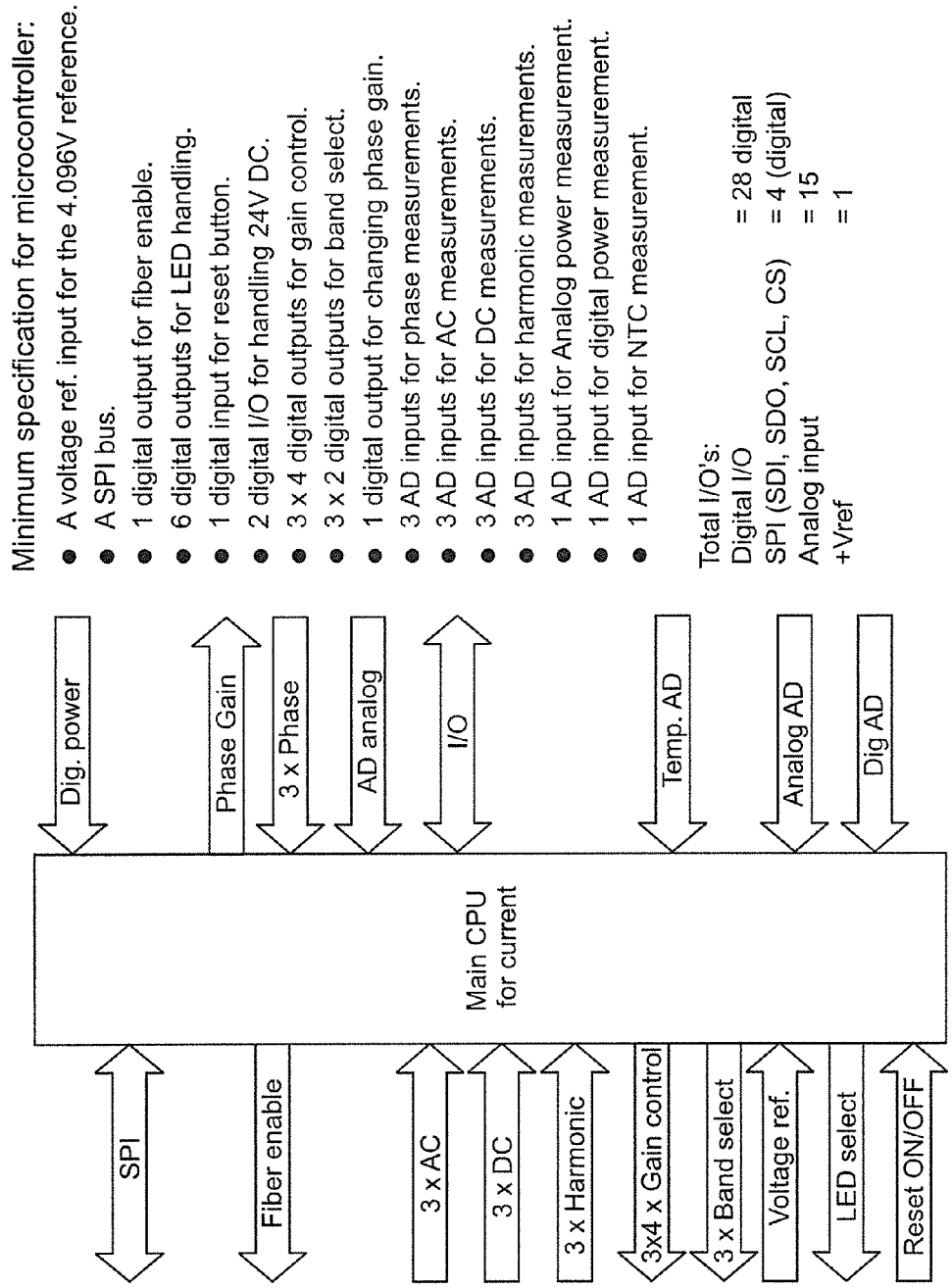
FIG. 90 is a diagram illustrating the main processor.

It is determined in advance, that a micro controller from microchip will be used. A PIC18 device is selected because of there high speed and large memory. To determine how many pins are needed, we have to see how many inputs and outputs it needs, vide FIG. 90.

This document describes the general demands for the Master, hereafter referred to as Module B. It describes the different demands for the signals connected to the device.

The document is split into the following sections.

General demands for the module.

Specified demands for each internal module.

Figure 91:
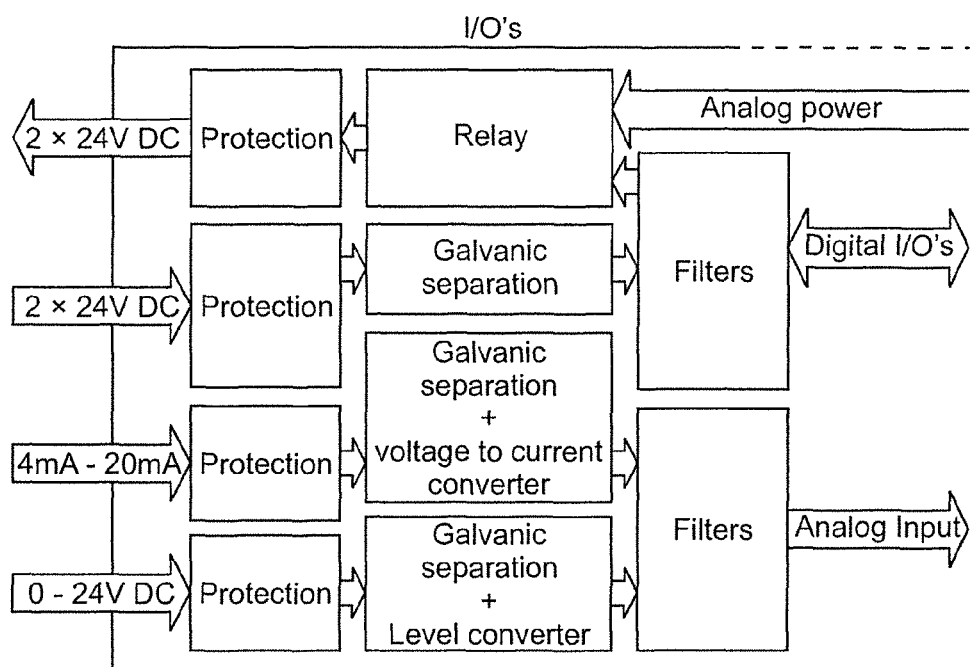
FIG. 91 is a schematic and block-diagrammatic view of the module B.

The Module B shown in FIG. 91 is the link between the internal modules and external modules.

The module is supplying the other units with the correct powers. The analog power is a 24V DC voltage. This power is delivered from an external battery, and delivered to the other modules. The Module B is also supplying the rest of the system with tree 12V AC power lines. These are used for measuring related to the 230V AC power lines.

The Module B has some I/O channels. These channels are used for handling external in- and out coming signals.

The analog power, 3×12V AC and the CAN bus are used in all the modules connected to the system. This means that these output terminals must be multiplied by 2, so no terminals are used twice (e.g. Two wires in one terminal).

Figure 92:
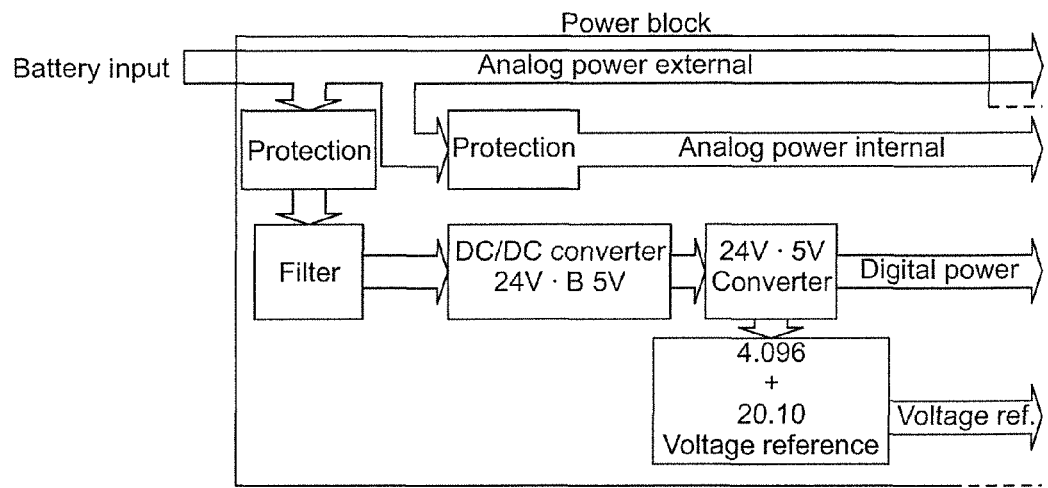
FIG. 92 is a block-diagrammatic view of the power supply.

The power block shown in FIG. 92 is working as a power supply. It is delivering the power to the rest of the system. The power block is connected to an external battery which is constantly recharged. This is done to make the supply as smooth as possible.

The battery voltage is sent through a protection circuit. This circuit must have a fuse to protect against over current. It also has a protection circuit that removes spikes. The output from this protection circuit is used by the power demanding modules in the Master.

To supply the external modules, the battery voltage is sent directly to an output, where external units can be supplied from.

To supply the low power modules in the Module B, the battery voltage is send through another protection circuit and a filter. This is done to protect the system and remove noise.

The internal modules are powered by a digital power. To create the power line a voltage level converting must be done. The output from the filter is converted to a lower voltage level. This must be done by a DC/DC switch mode converter, to minimize the heat output, produced by converting. To make the digital voltage more smooth, a linear regulator must be added to the converter.

Another voltage reference must be used when measuring AC signals. This references are used for detecting zero passage. This is selected to the half of the 4.096V references which is 2.048V.

Figure 93:
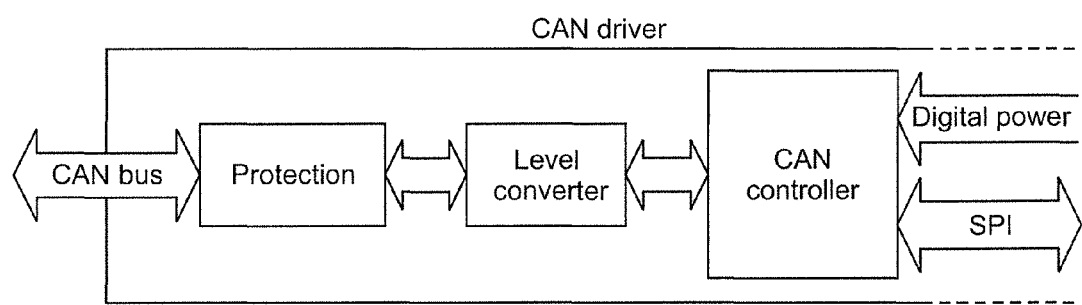
FIG. 93 is a block-diagrammatic view of the can driver.

Internally in the system the modules communicate via an industrial CAN network. Communication speed is 125 kbps. All commands are encapsulated in a single CAN package except for SMS messages, which are transmitted as several CAN packages. The uC in module B uses a can controller and a can driver to perform the communication. The CAN driver shown in FIG. 93 is used for converting data from an SPI bus to a CAN bus.

To protect the CAN buses I/O's, a protection circuits are placed on its outputs. This protection circuit protects the module against incorrect wire connections, ESD and over current.

A level converter is used to convert logic level signals to CAN bus signals.

To convert an SPI protocol to a CAN protocol, a CAN controller is used.

Figure 94:
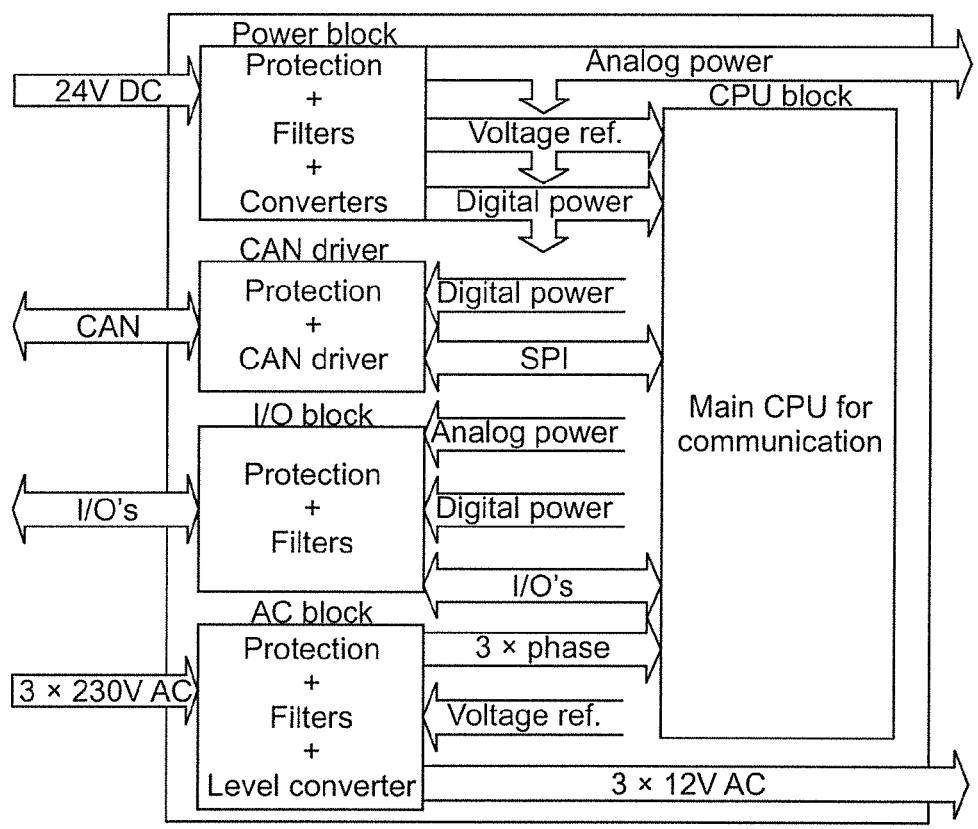
FIG. 94 is a block-diagrammatic view of the of the I/O block.

The I/O block shown in FIG. 94 is used for connection to external signals.

To ensure that the temperature can be measured in different ways, 2 analog inputs must be available. A 4-20 mA input and a 0-5V DC input.

To shutdown the battery an output must be available.

To enable the battery charger an output must be available.

To ensure necessary used of 24V DC I/O's, another 24V DC digital input must be added, including 2×24V DC outputs, that can be switched on and off.

This adds up to the following inputs and outputs:

Output:
  2×24V DC power lines, that can be turned on and off by 2 relays.

Input:
  2×24V DC digital inputs.
  4-20 mA analog input.
  0-5 V DC analog input.

All external I/O are protected against ESD and over current.

All internal digital and analog inputs, have 1. order low pass filters to remove high frequencies. 5 digital I/O's and 2 analog inputs are available on the microcontroller that is used.

To turn on and off a 24V DC output, a relay must be used. This is done to ensure that the 24V DC output is physically disconnected from the analog power line.

The 24V DC inputs must be galvanic separated to secure the electronics,

To measure a temperature, 2 analog inputs are available.

The first is a 4-20 mA input. This input is galvanic separated from the internal electronics. It also needs a current to voltage conversion.

The second one is a 0-5V DC input. This is also galvanically separated to the internal electronics.

Figure 95:
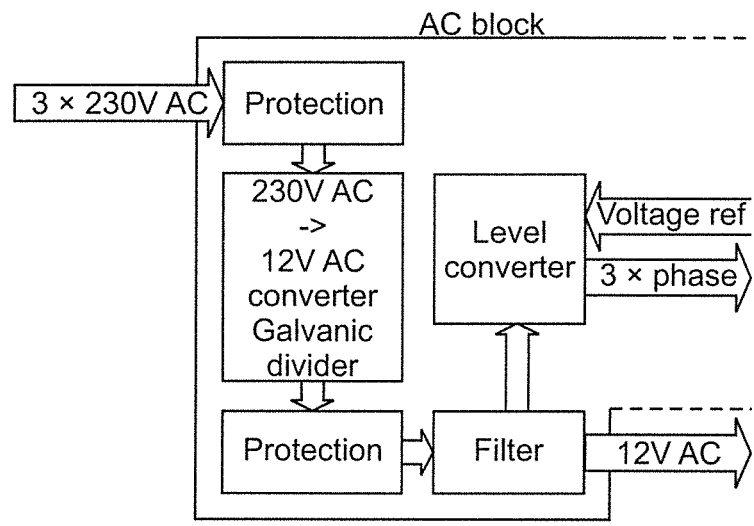
FIG. 95 is a block-diagrammatic view of the AC power measurement block.

The AC block shown in FIG. 95 is creating the 12V AC signal used for measurements and calculations in other modules. It also creates an AC signal that the module B can use for magnitude measurements.

The 3×230V AC power lines, are only used for measurement, and not used for supplying any modules. The A, B and C lines are all connected to a protection module, to prevent short circuiting the 230V AC power lines. It is also removing potential spikes that occurs.

The 230V AC power lines, are converted to 12V AC lines before they are used. This is also a galvanic divider.

Next the 12V AC signals are put through another protection circuit. This circuit protects against over current, if any of the 12V AC lines are short circuited.

Next the 12V AC power lines are put through a 1. order low pass filter, with a 3 db cutoff frequency at 500 Hz. The output from this filter is used by the other modules in the system.

The main CPU is handling all the digital and analog I/O's for the module B.

Figure 96:
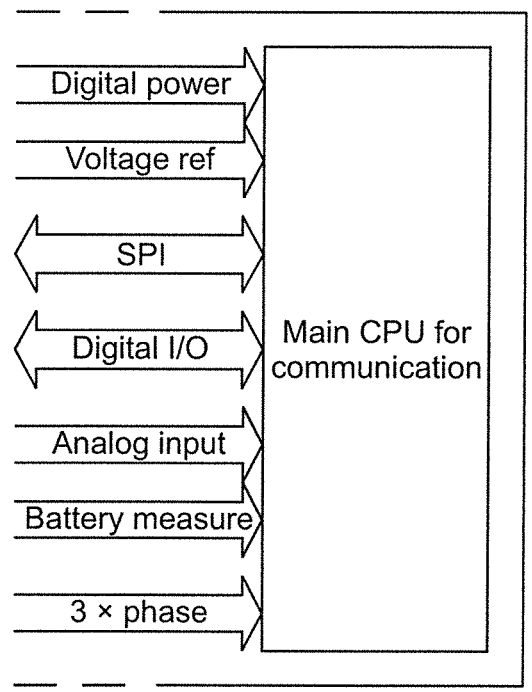
FIG. 96 is a block-diagrammatic for the uC.
Figure 97:
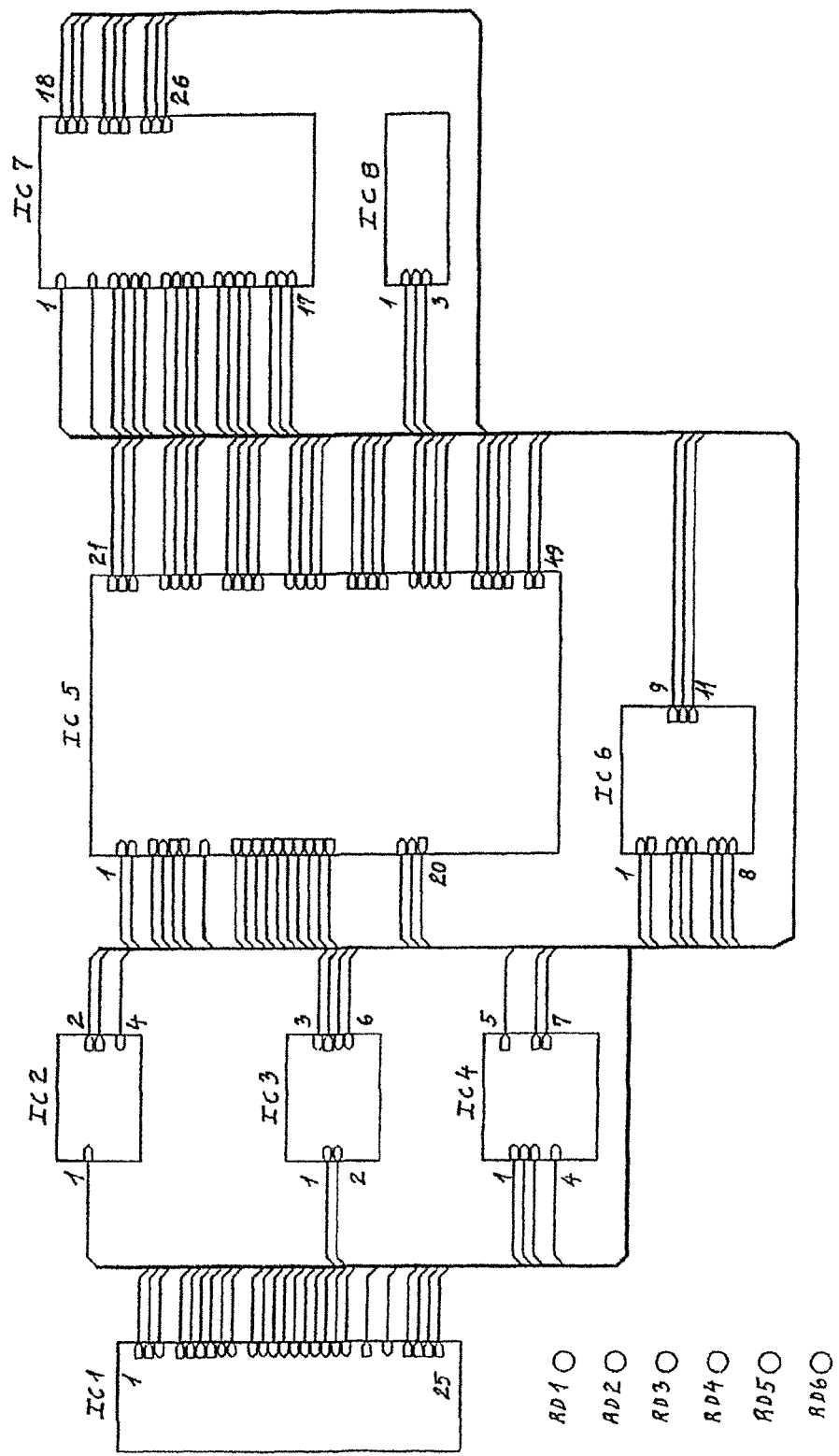
FIG. 97 is a block-diagrammatic overview of Module A.
Figure 98:
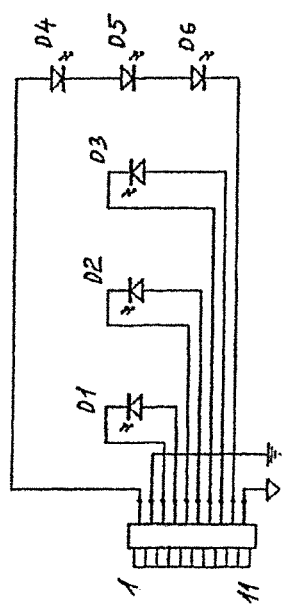
FIG. 98 is a block-diagrammatic overview of Module A diode section.
Figure 99:
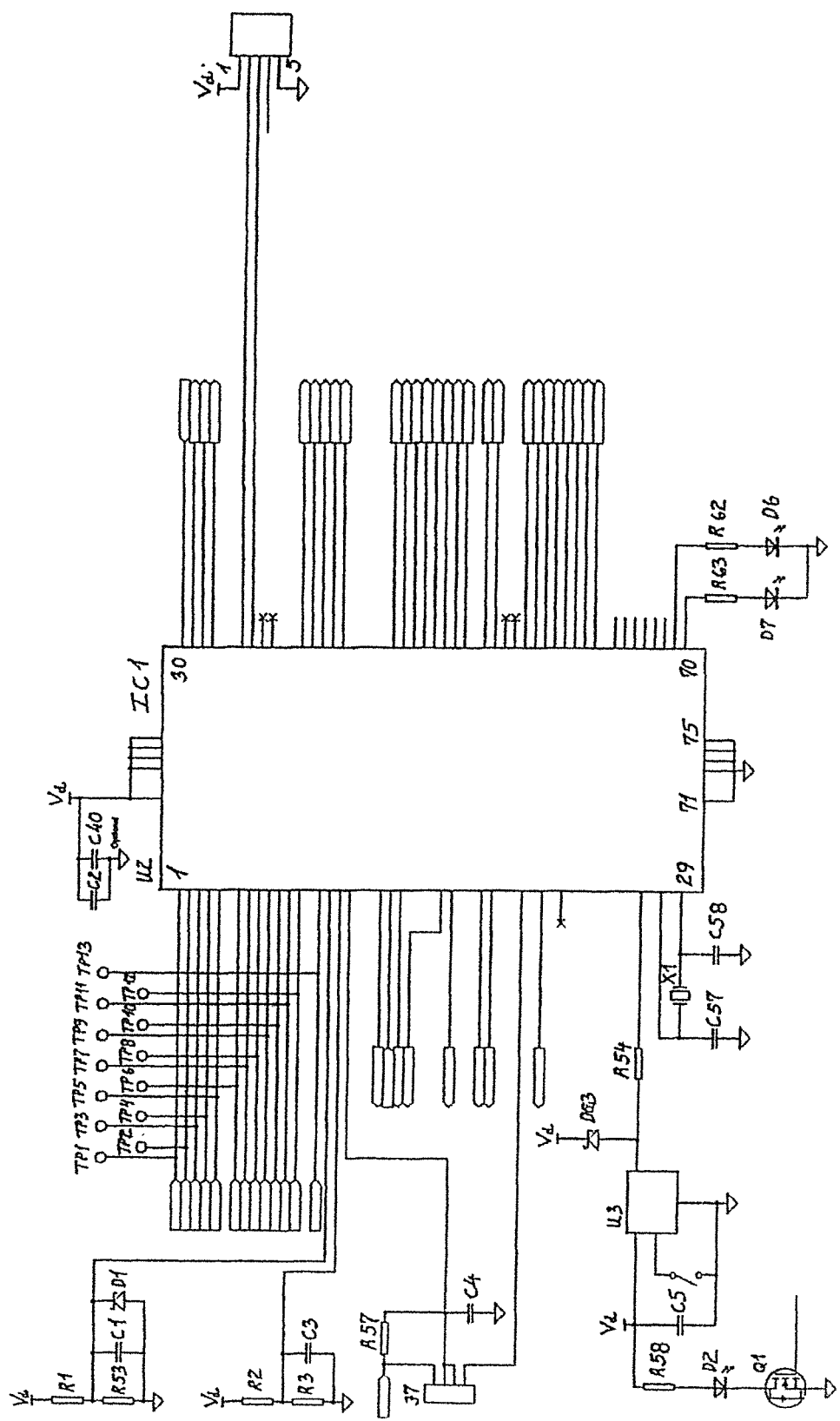
FIG. 99 is a block-diagrammatic overview of Module A micro controller section.
Figure 100:
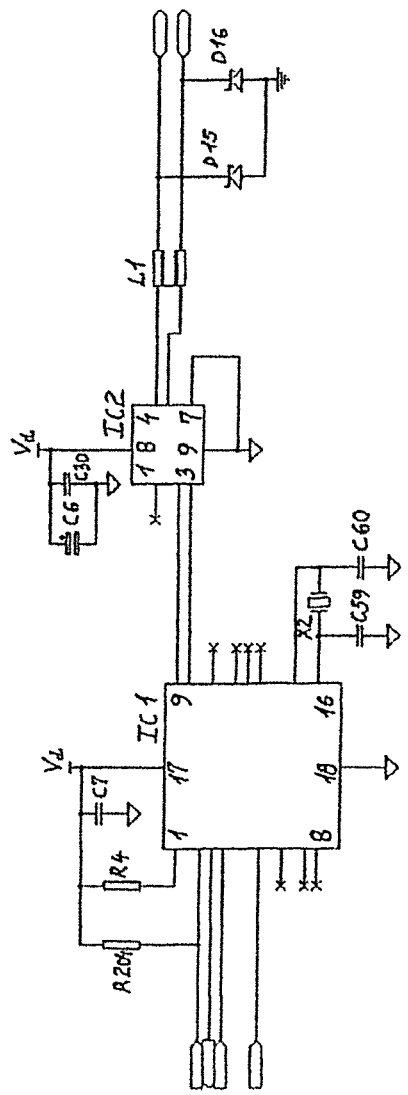
FIG. 100 is a block-diagrammatic overview of Module A CAN communication section.
Figure 101:
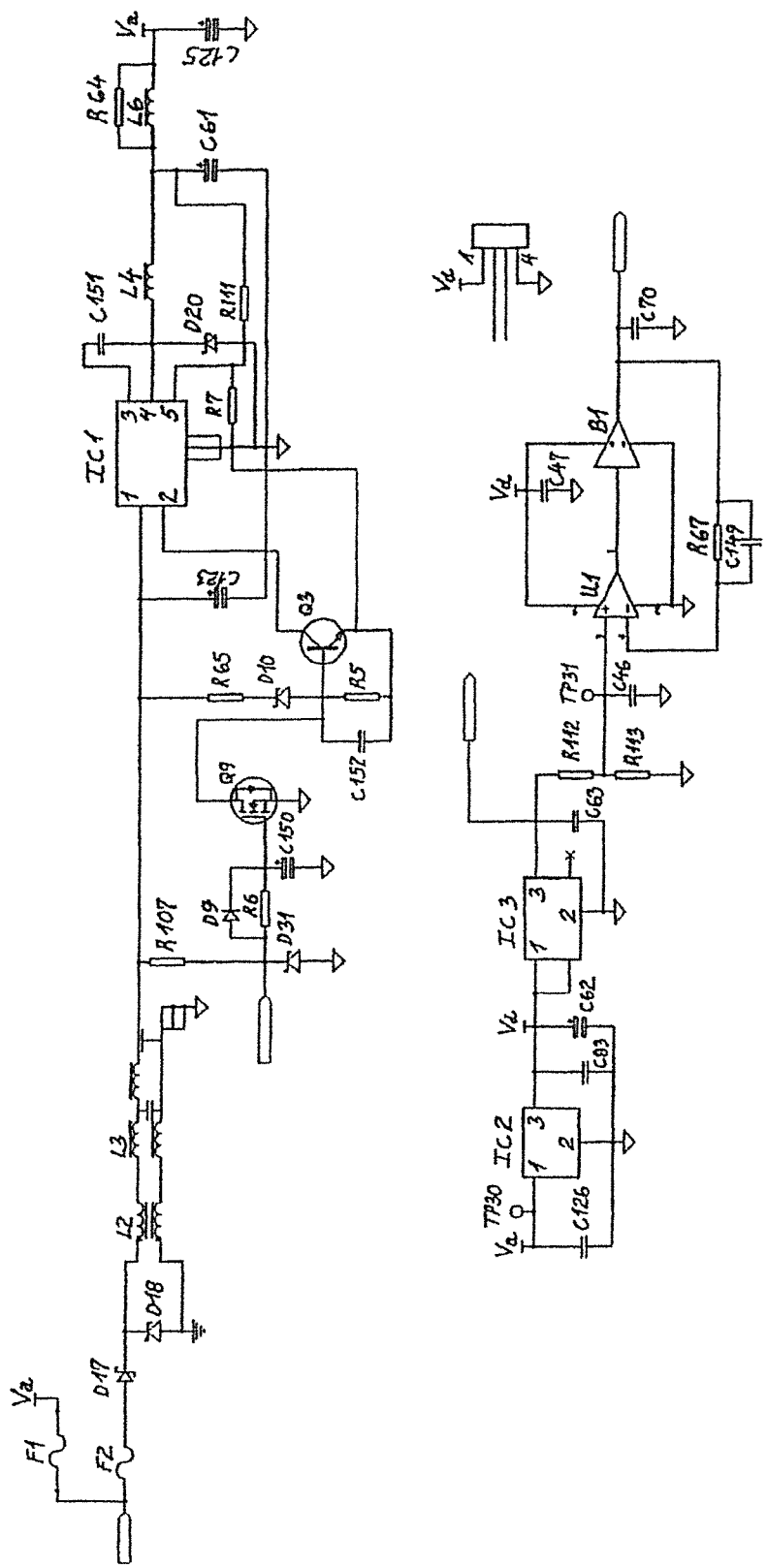
FIG. 101 is a block-diagrammatic overview of Module A power supply section.
Figure 102:
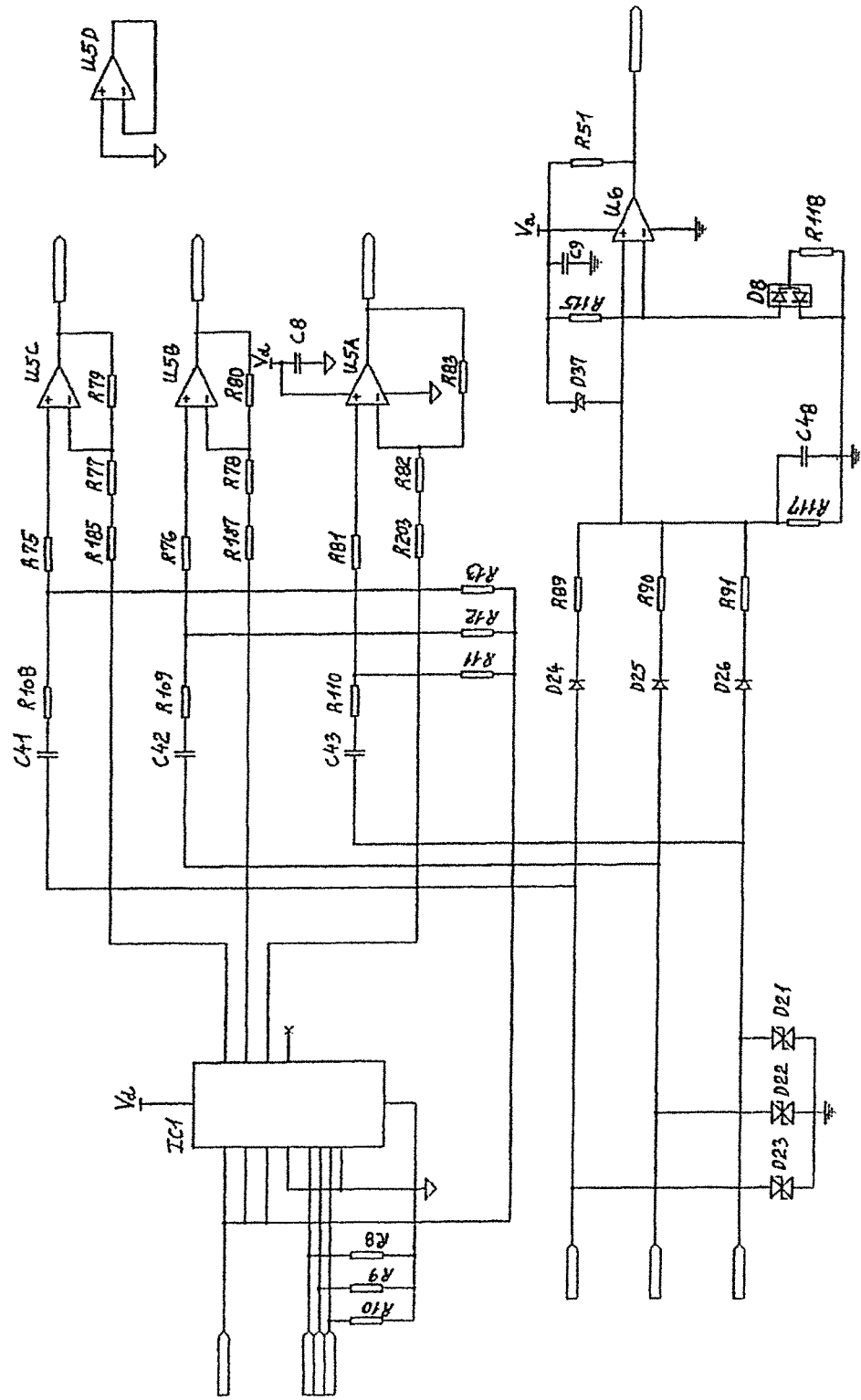
FIG. 102 is a block-diagrammatic overview of Module A voltage input section.
Figure 103:
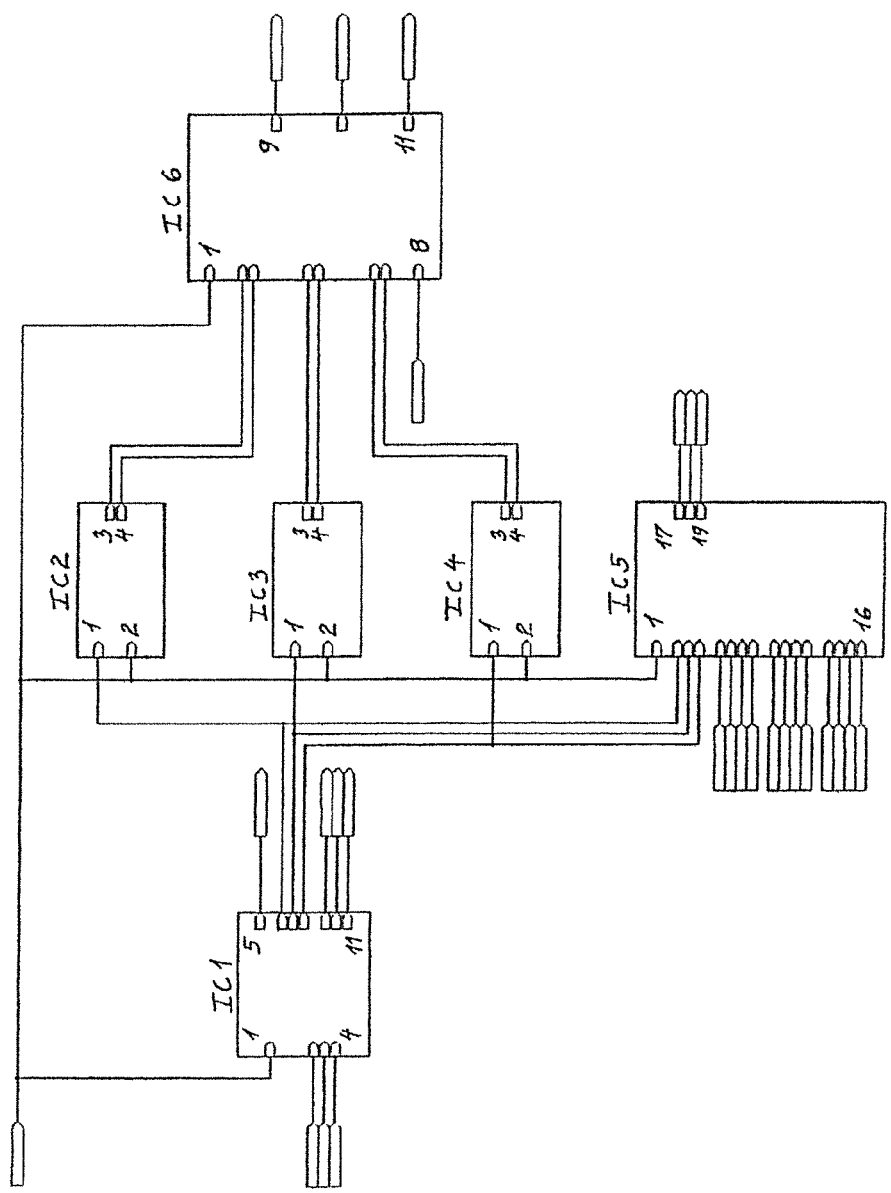
FIG. 103 is a block-diagrammatic overview of Module A current signal overview.
Figure 104:
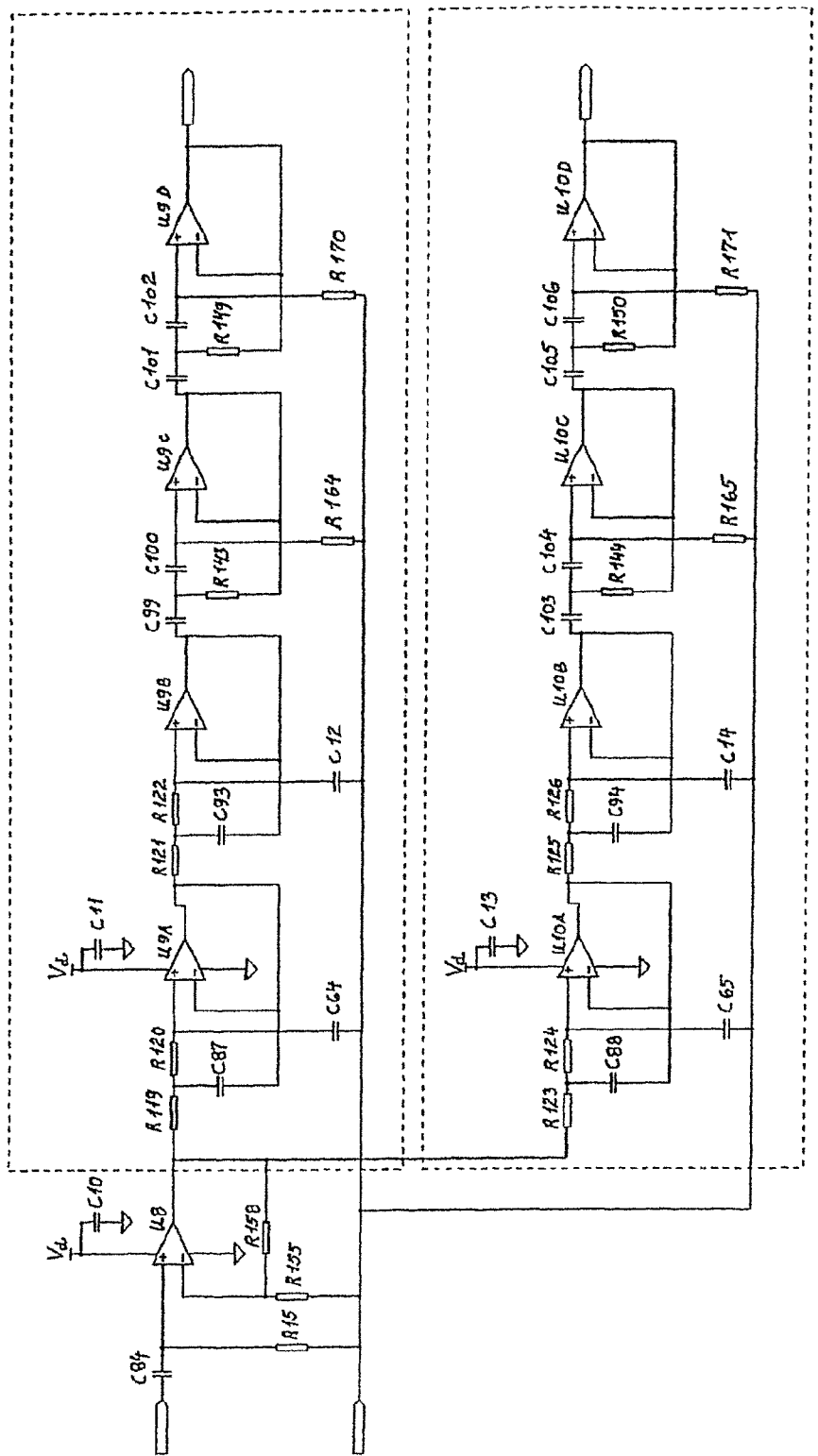
FIG. 104 is a block-diagrammatic overview of Module A Harmonic filter Line 1.
Figure 105:
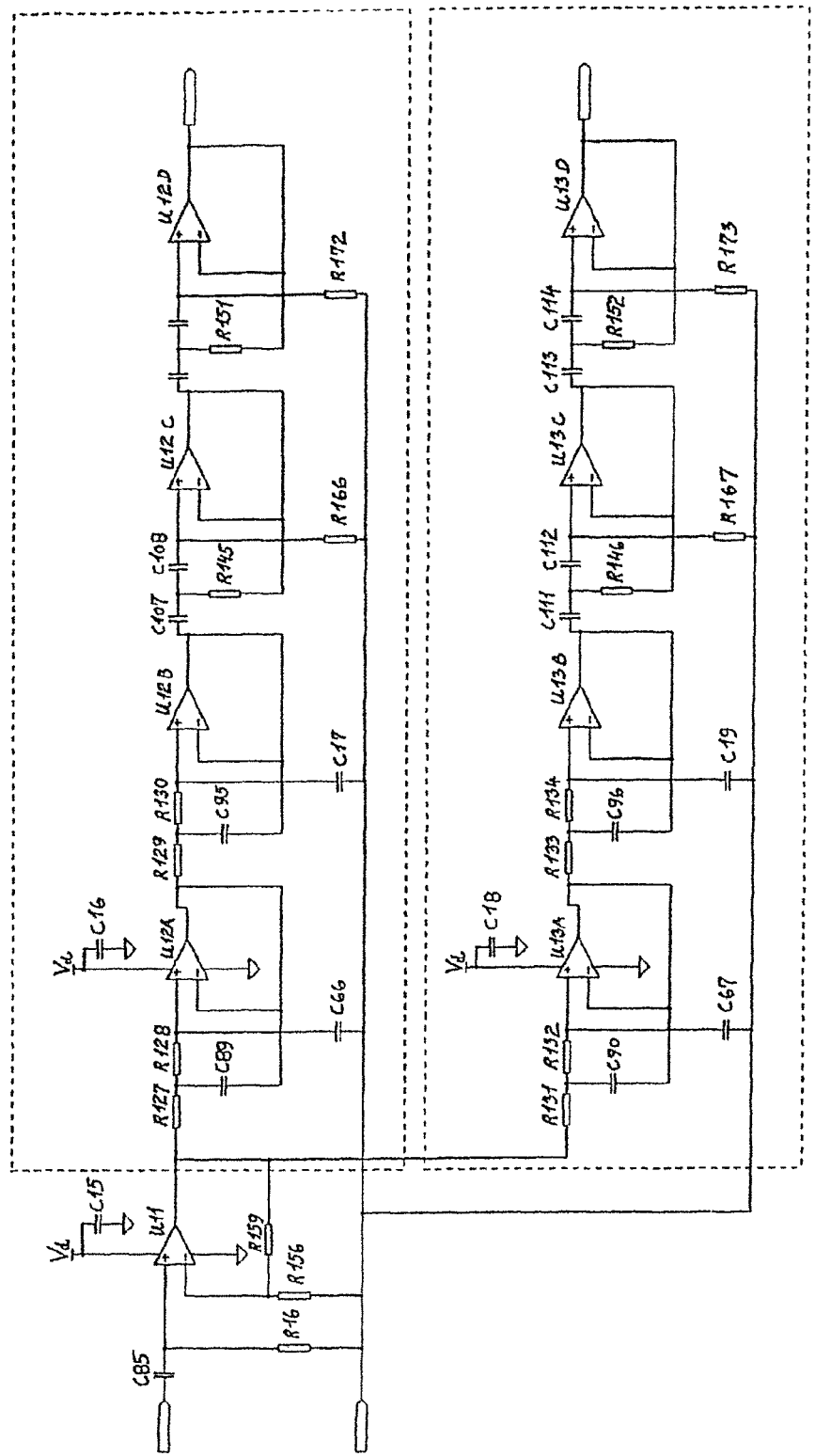
FIG. 105 is a block-diagrammatic overview of Module A filter Line 2.
Figure 106:
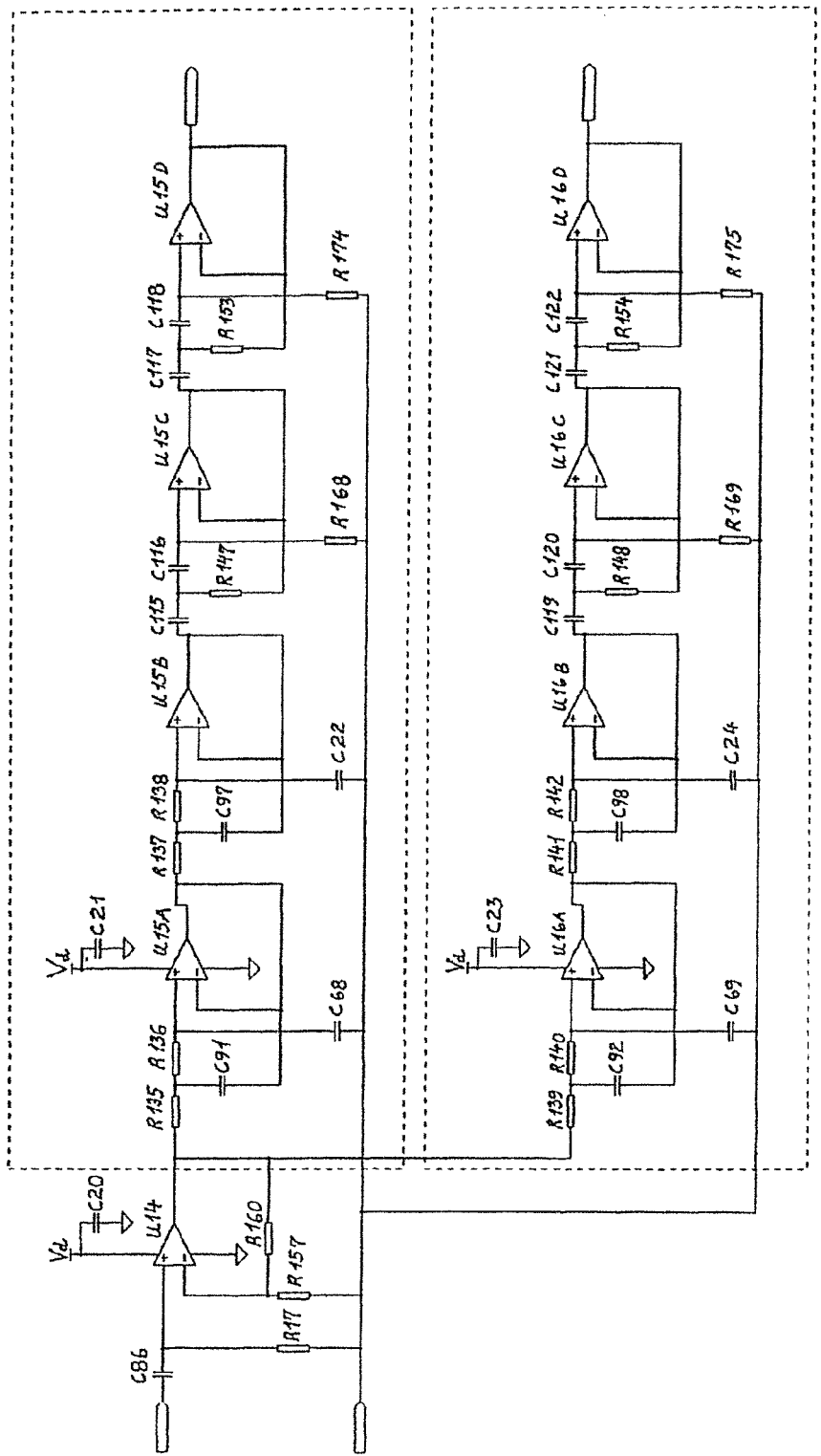
FIG. 106 is a block-diagrammatic overview of Module A harmonic filter Line 3.
Figure 107:
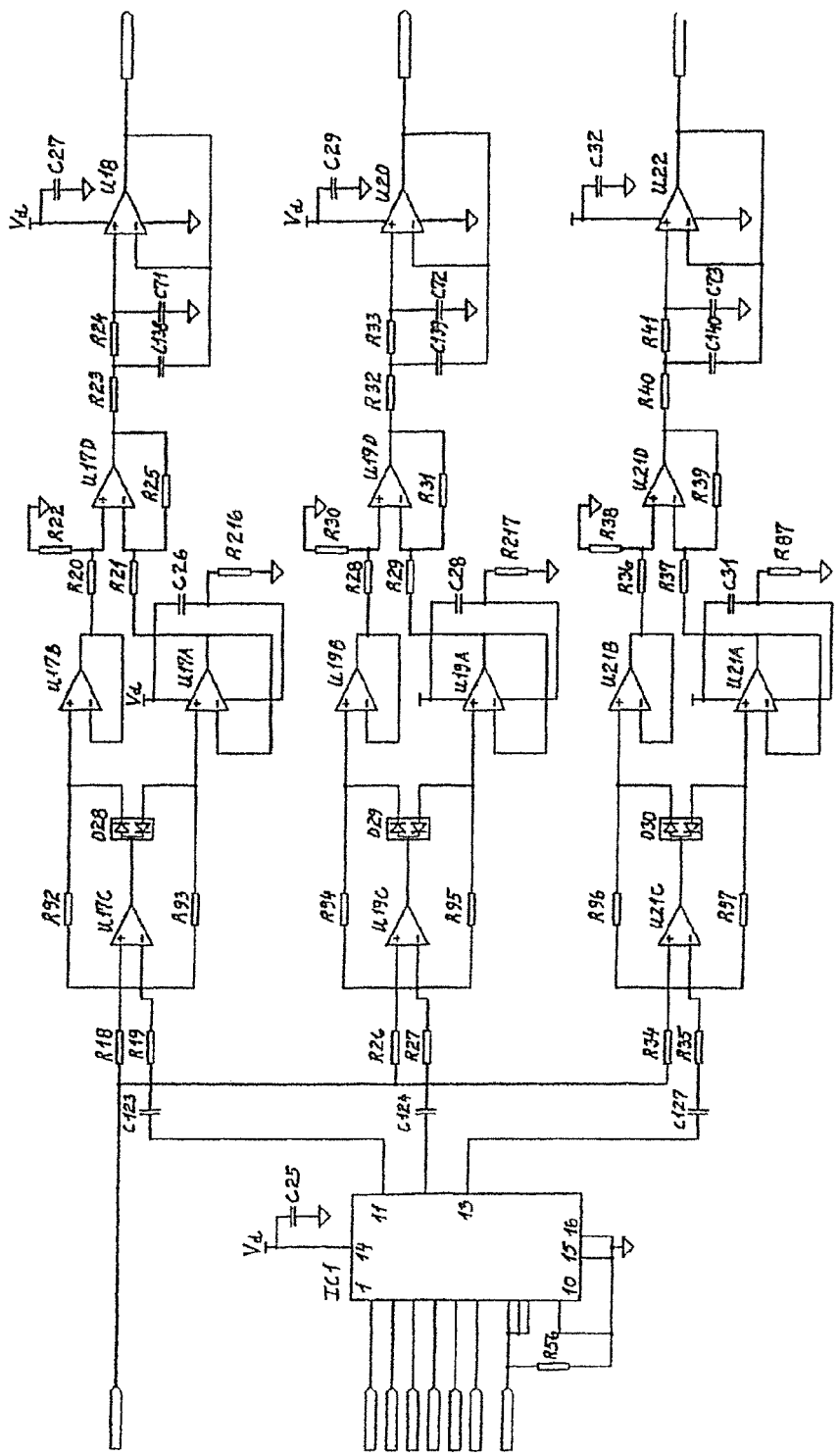
FIG. 107 is a block-diagrammatic overview of Module A harmonic signal rectifier.
Figure 108:
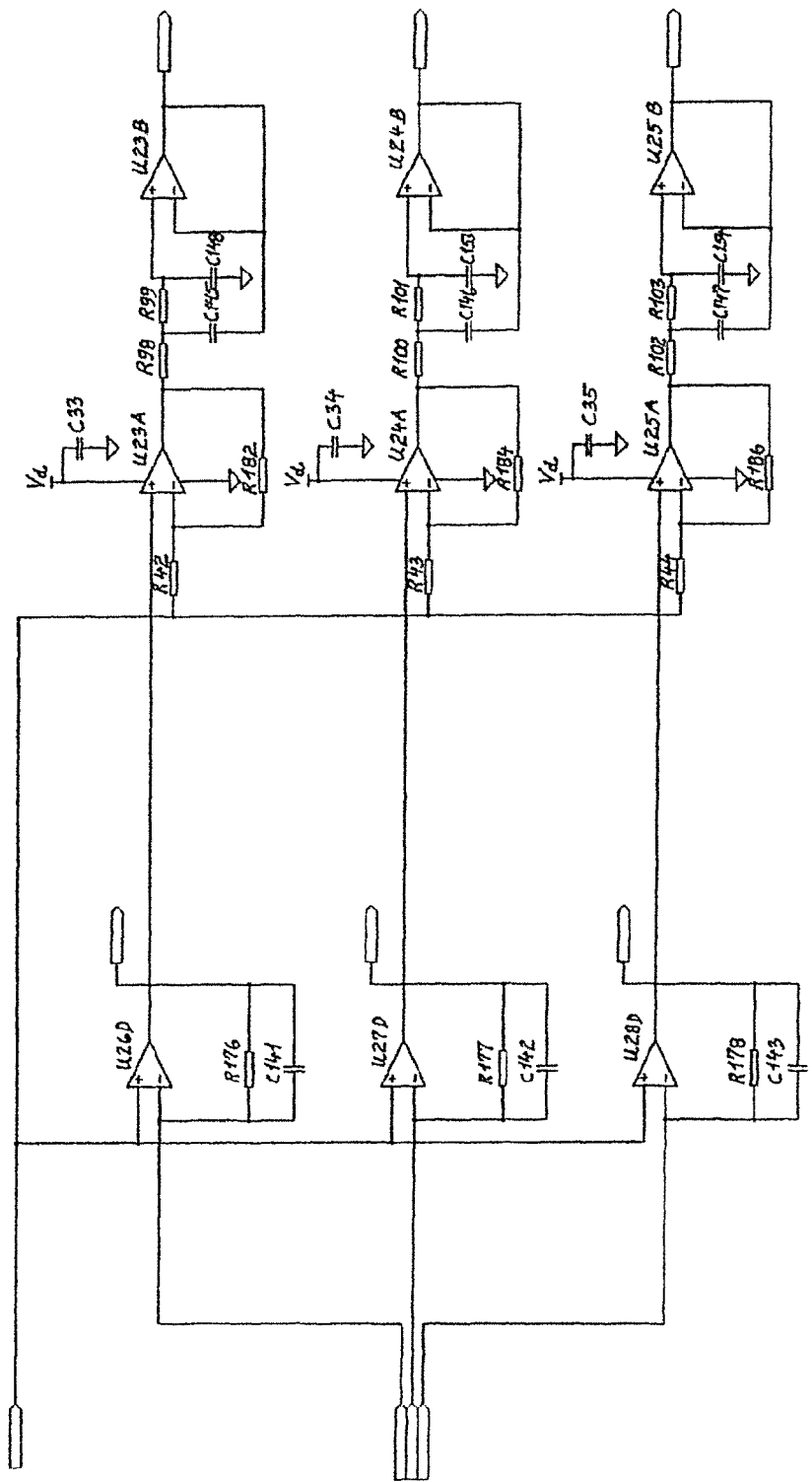
FIG. 108 is a block-diagrammatic overview of Module A dc filter.
Figure 109:
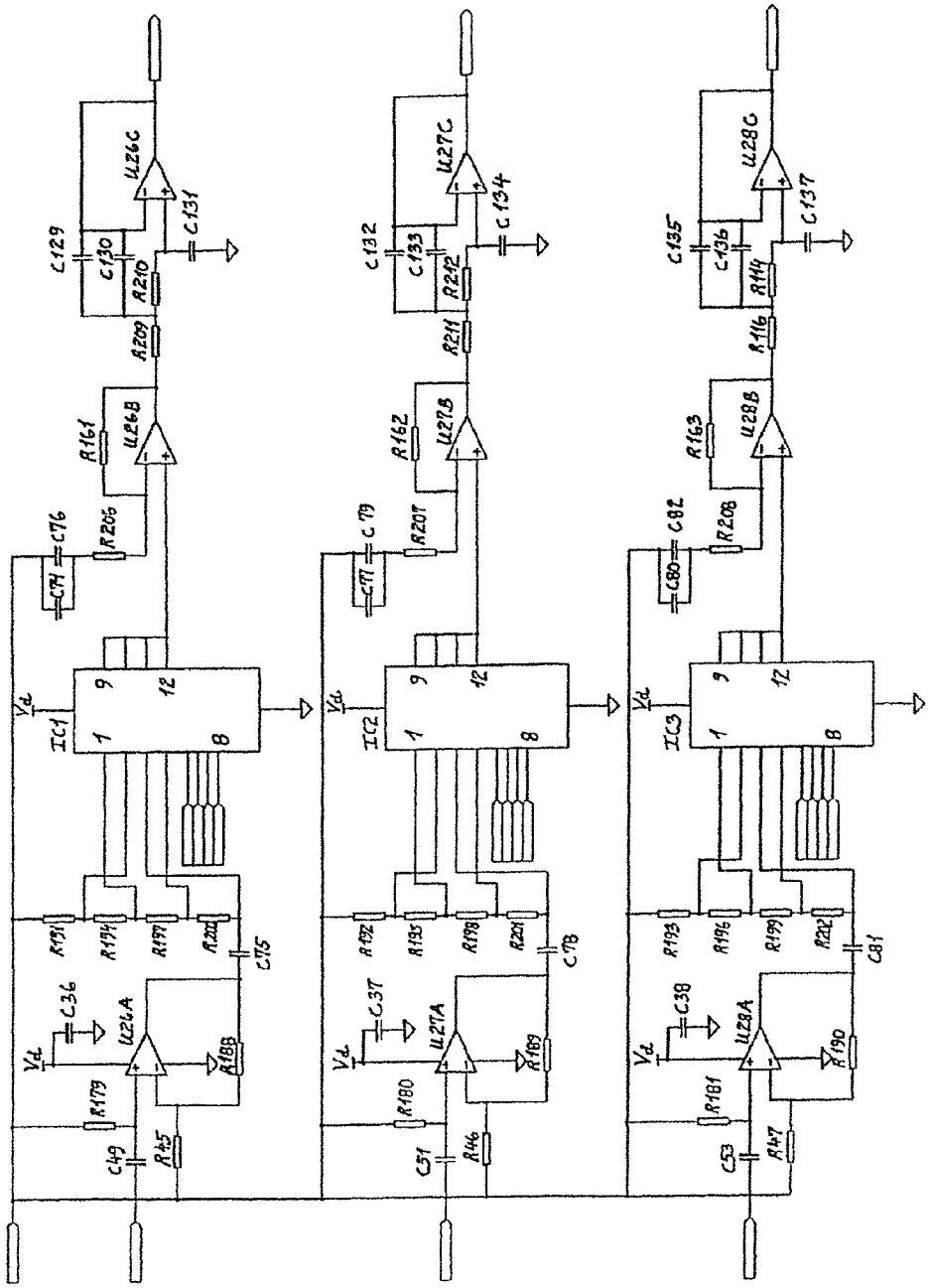
FIG. 109 is a block-diagrammatic overview of Module A ac-signal gain.
Figure 110:
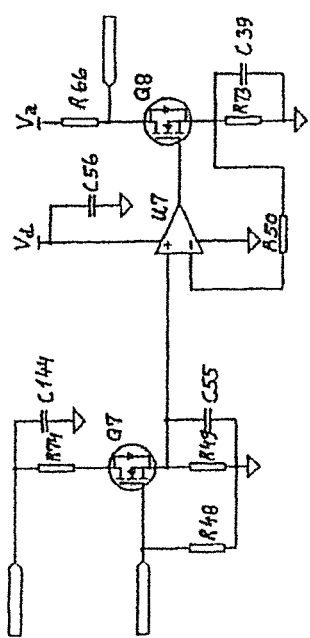
FIG. 110 is a block-diagrammatic overview of Module A diode current control.
Figure 111:
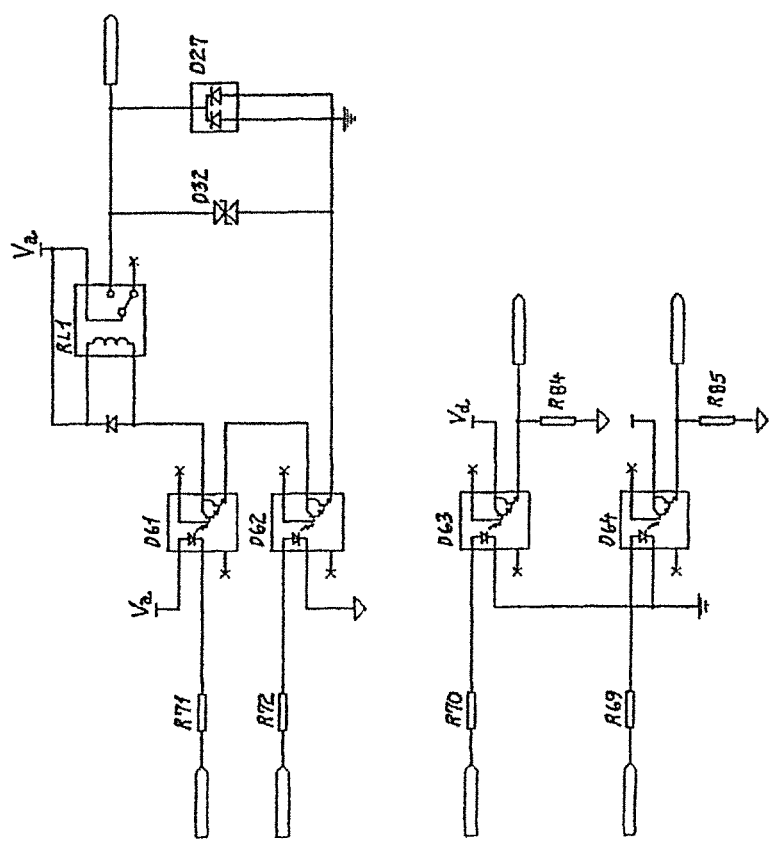
FIG. 111 is a block-diagrammatic overview of Module A relay I/O control.
Figure 112:
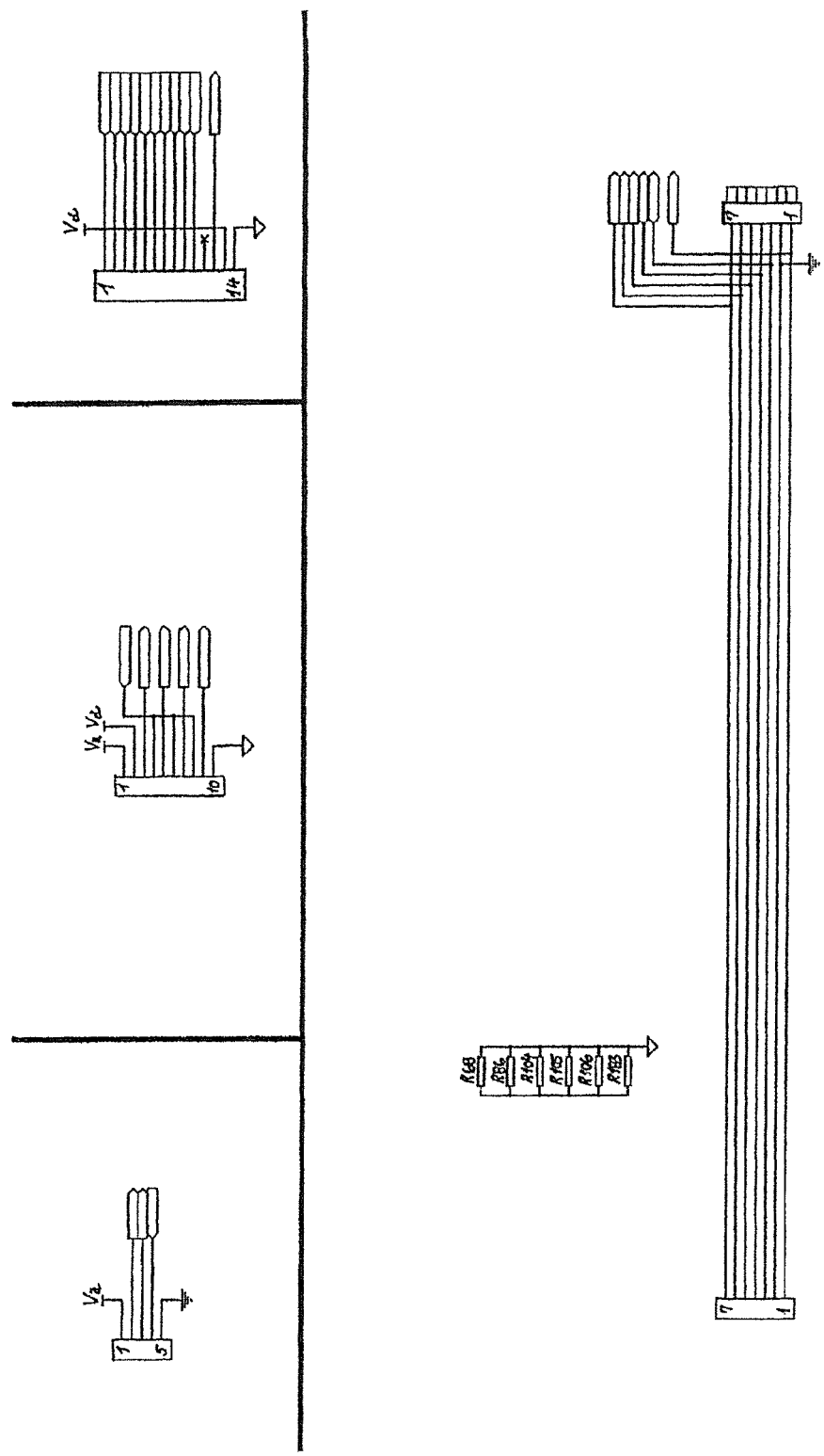
FIG. 112 is a block-diagrammatic overview of Module A connector overview.
Figure 113:
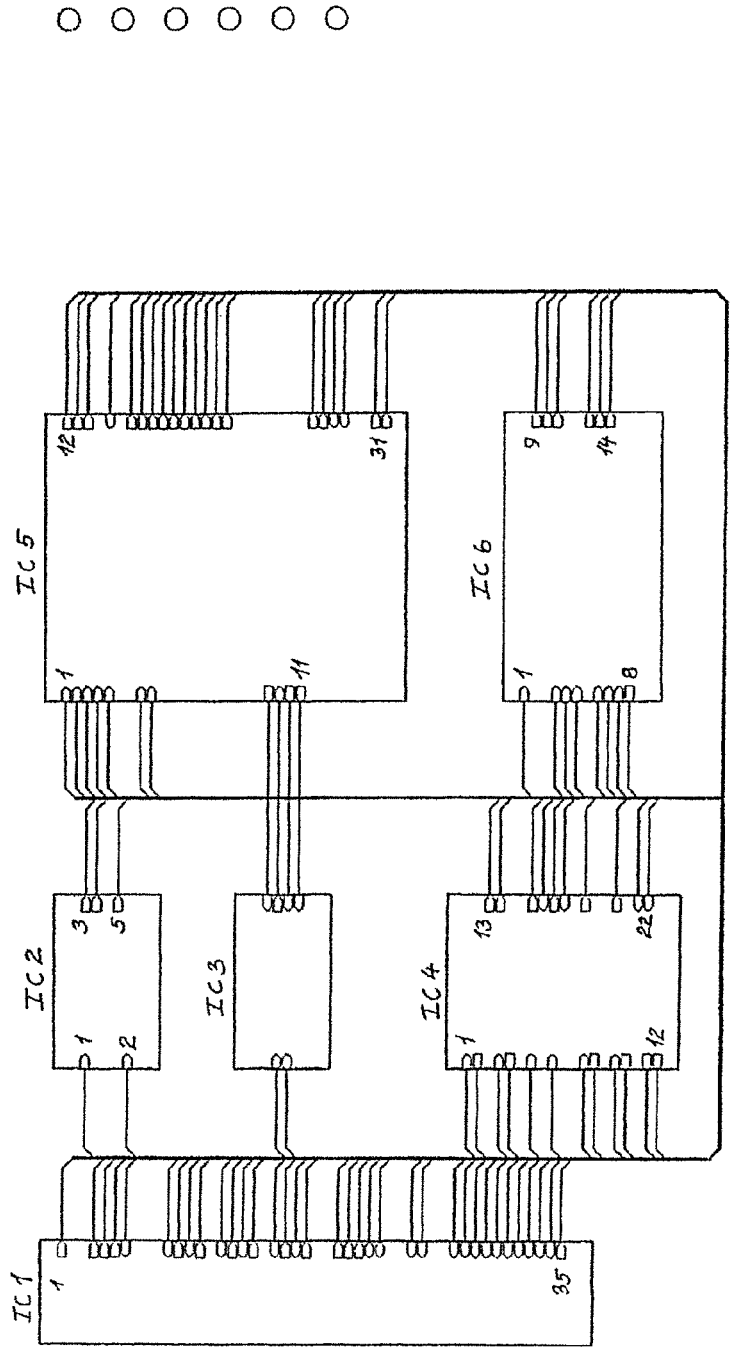
FIG. 113 is a block-diagrammatic overview of Module B.
Figure 114:
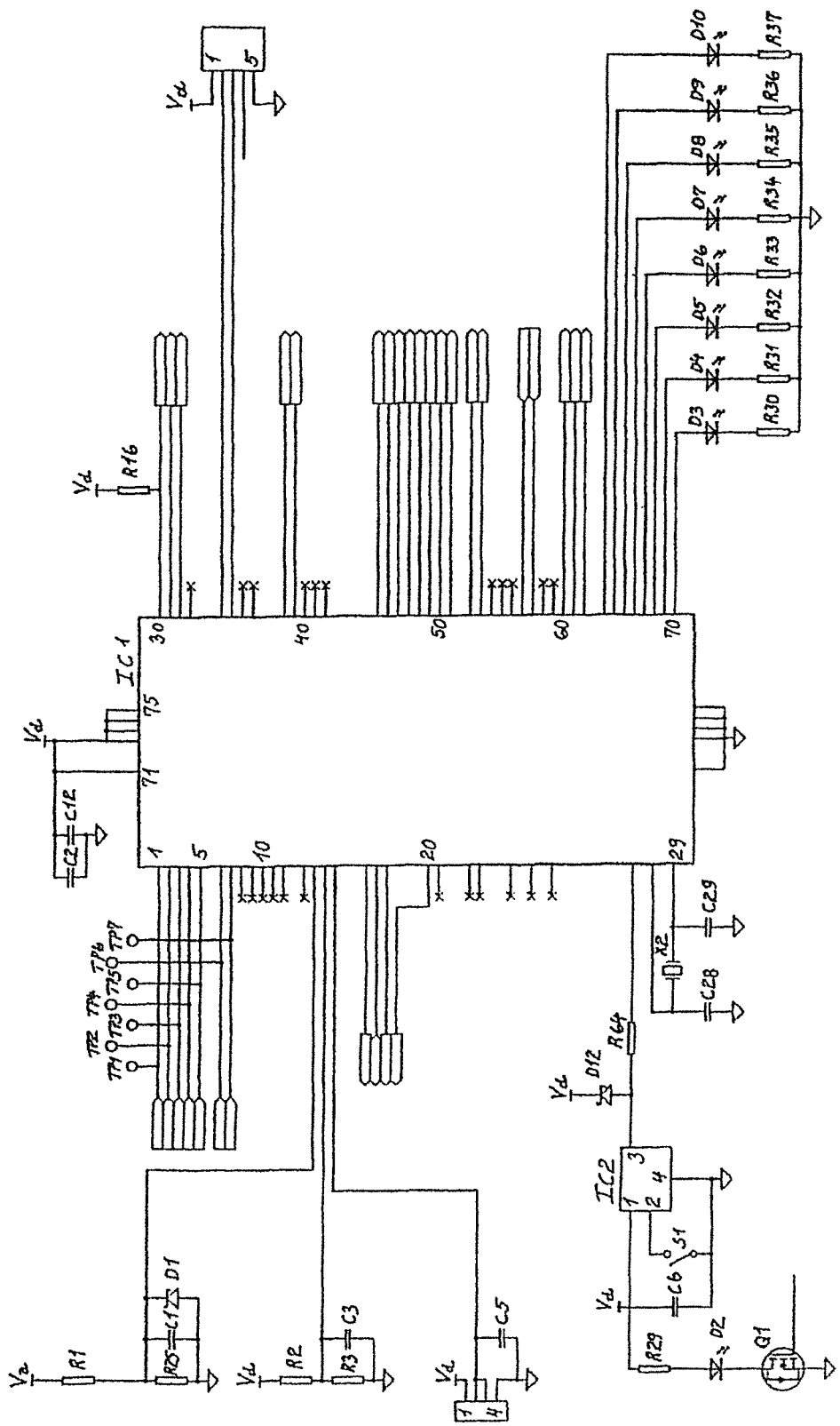
FIG. 114 is a block-diagrammatic overview of Module B micro controller section.
Figure 115:
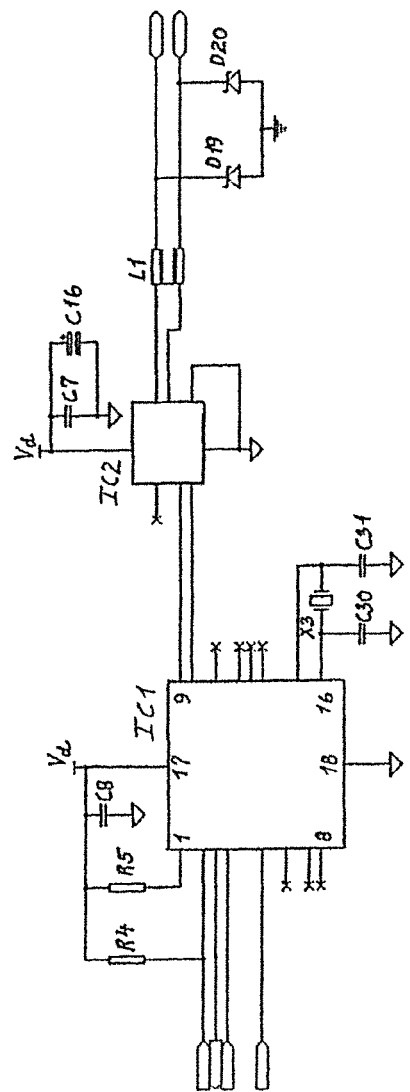
FIG. 115 is a block-diagrammatic overview of Module B CAN communication section.
Figure 116:
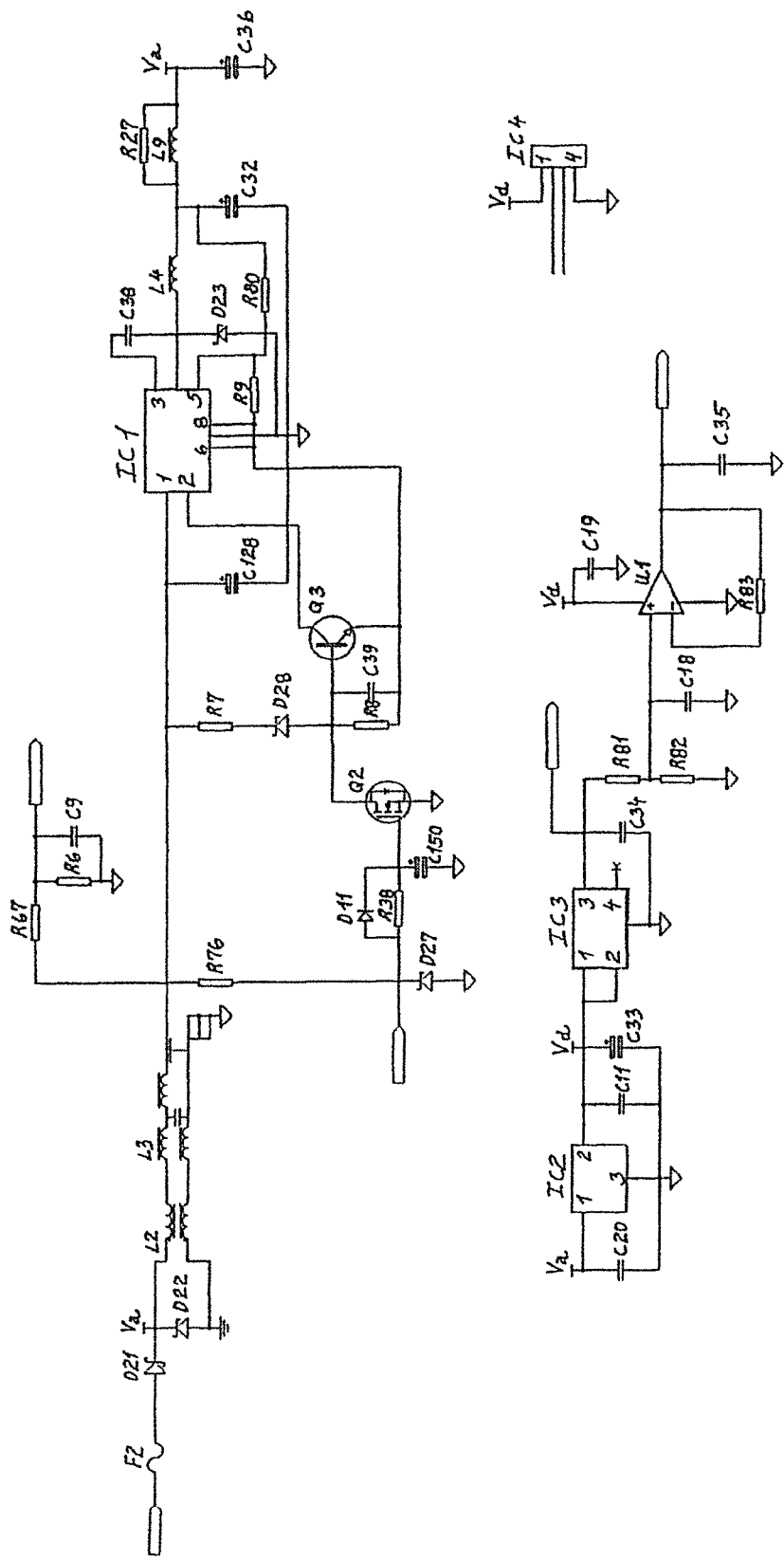
FIG. 116 is a block-diagrammatic overview of Module B power supply.
Figure 117:
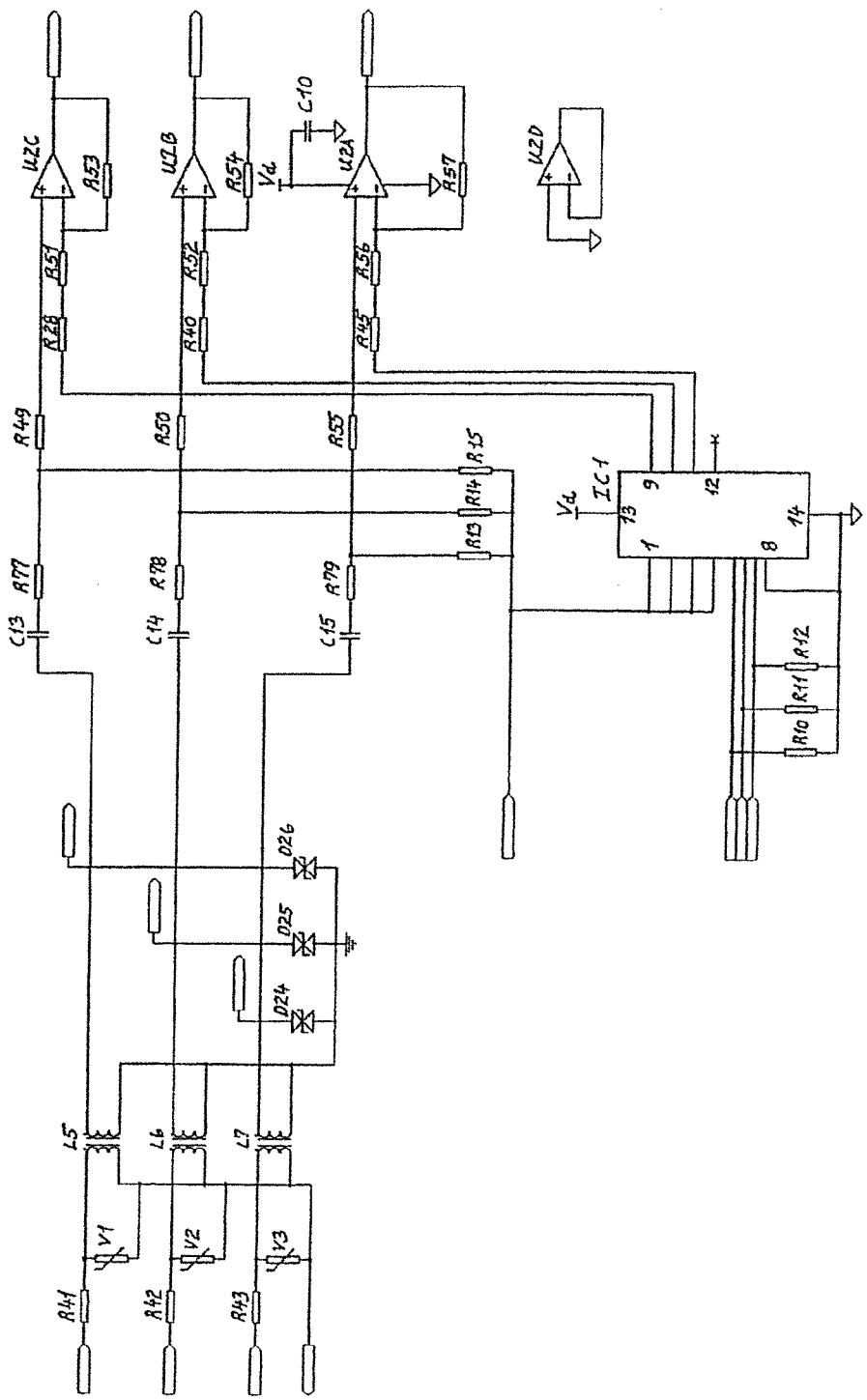
FIG. 117 is a block-diagrammatic overview of Module B voltage input.
Figure 118:
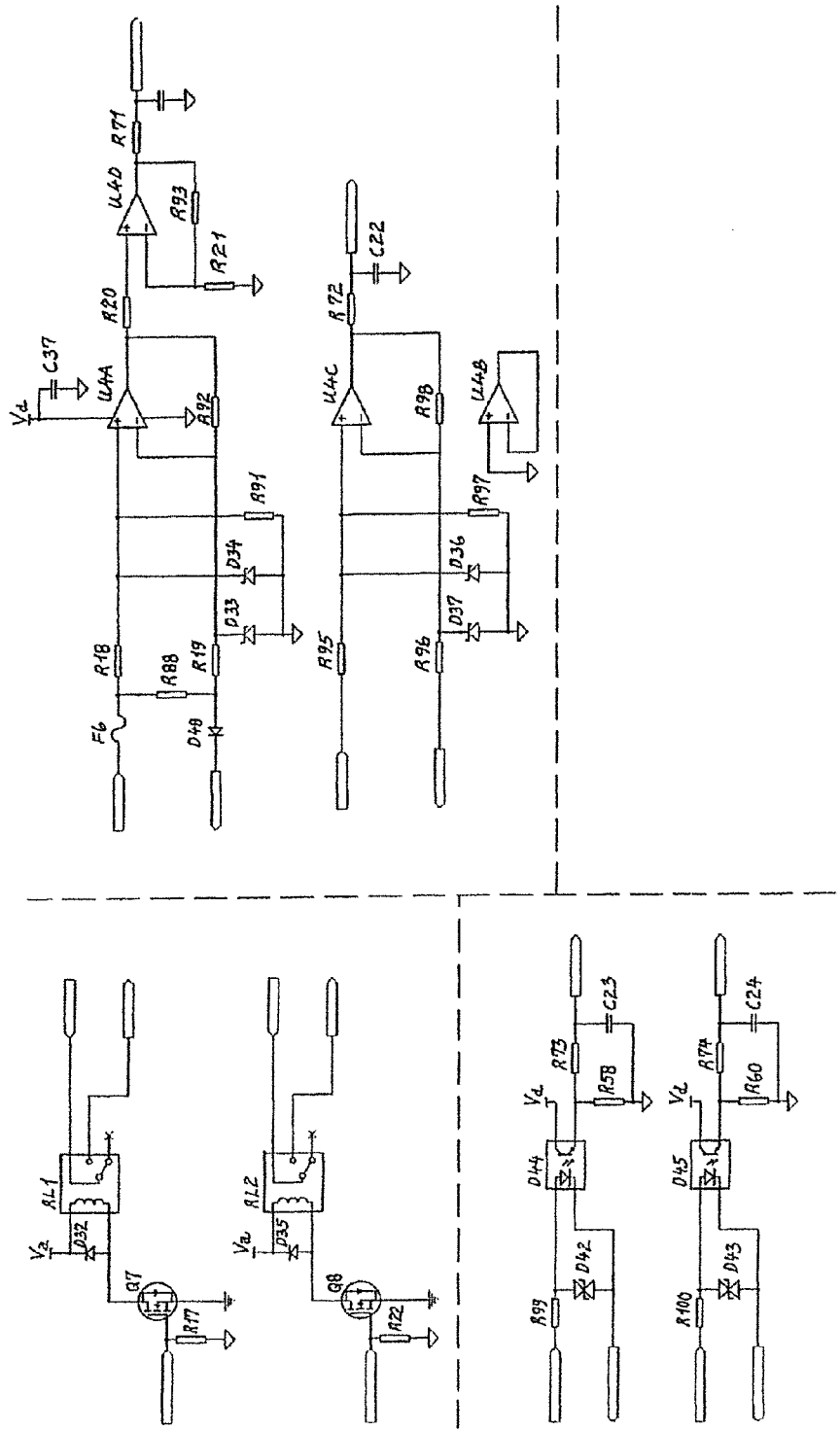
FIG. 118 is a block-diagrammatic overview of Module B I/O section.
Figure 119:
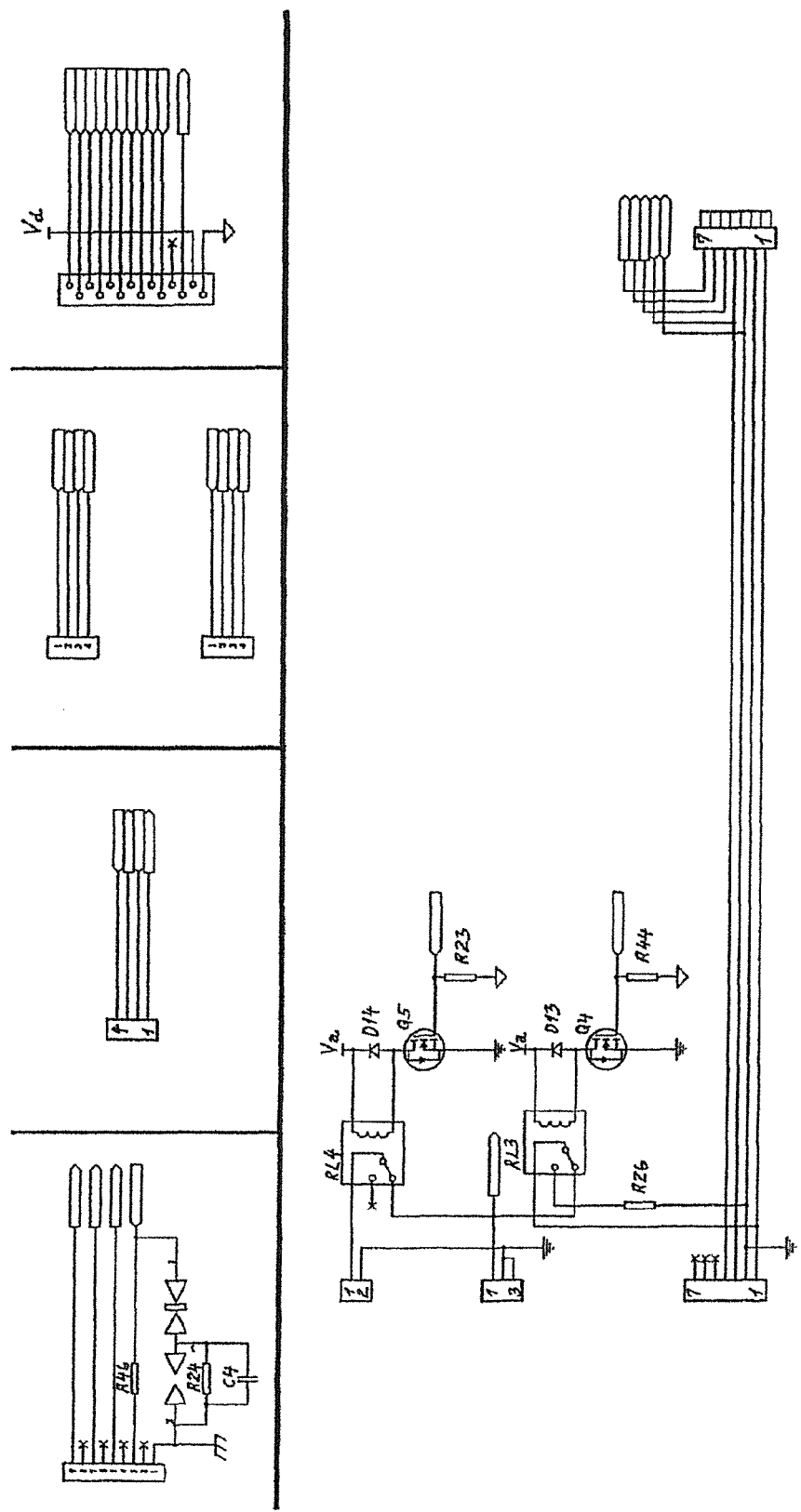
FIG. 119 is a block-diagrammatic overview of Module B connector section.
Figure 120:
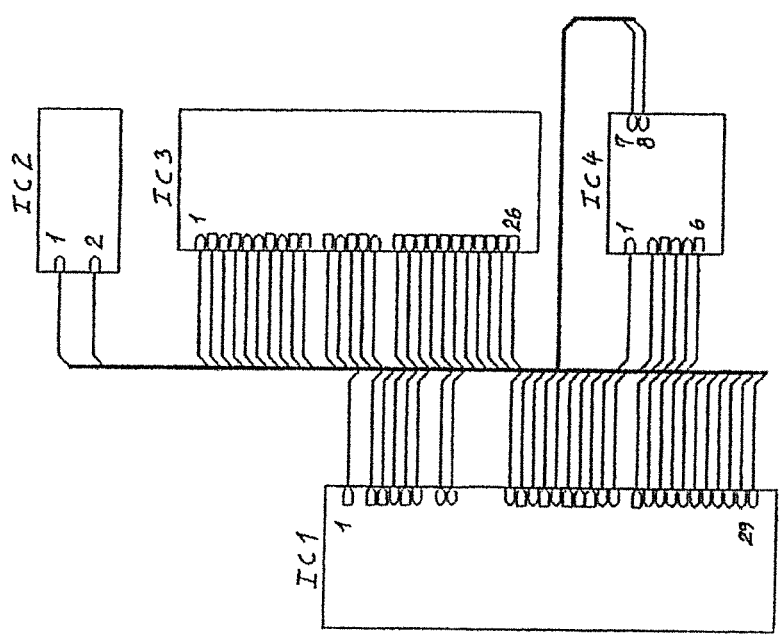
FIG. 120 is a block-diagrammatic overview of GSM module.
Figure 121:
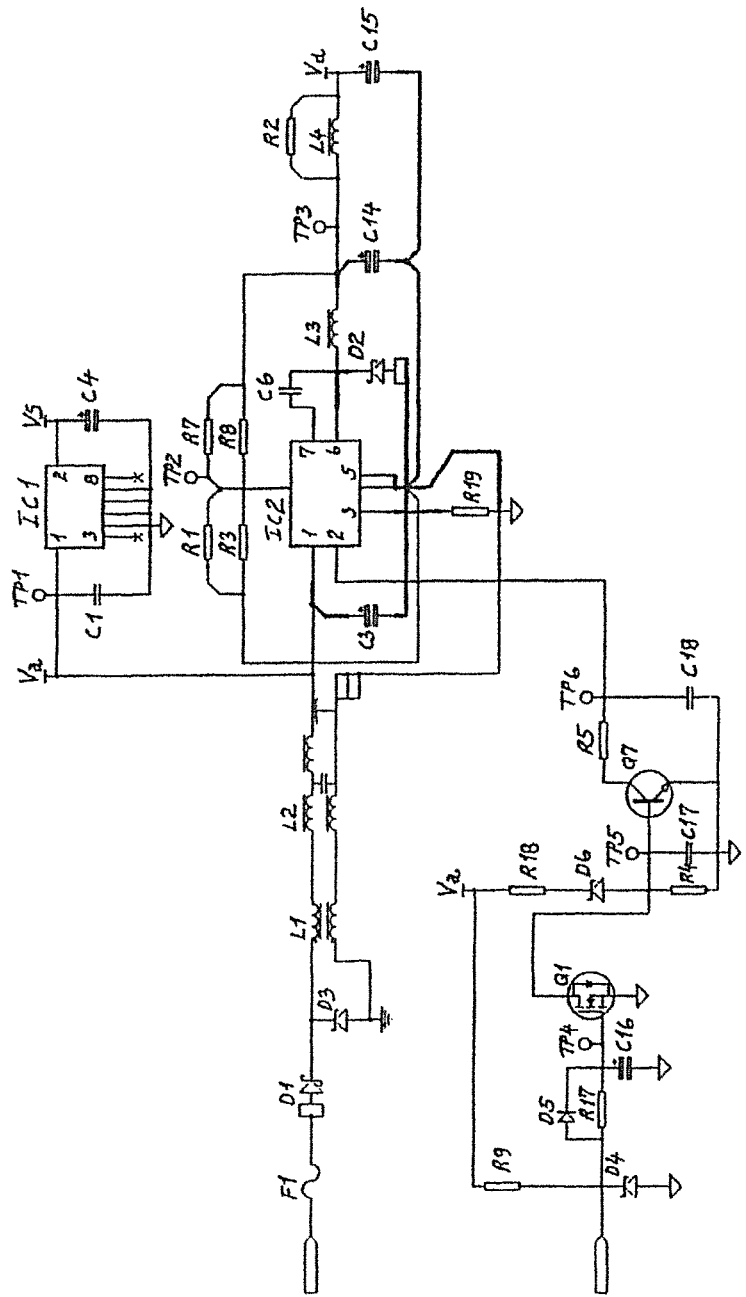
FIG. 121 is a block-diagrammatic overview of Module C power supply.
Figure 122:
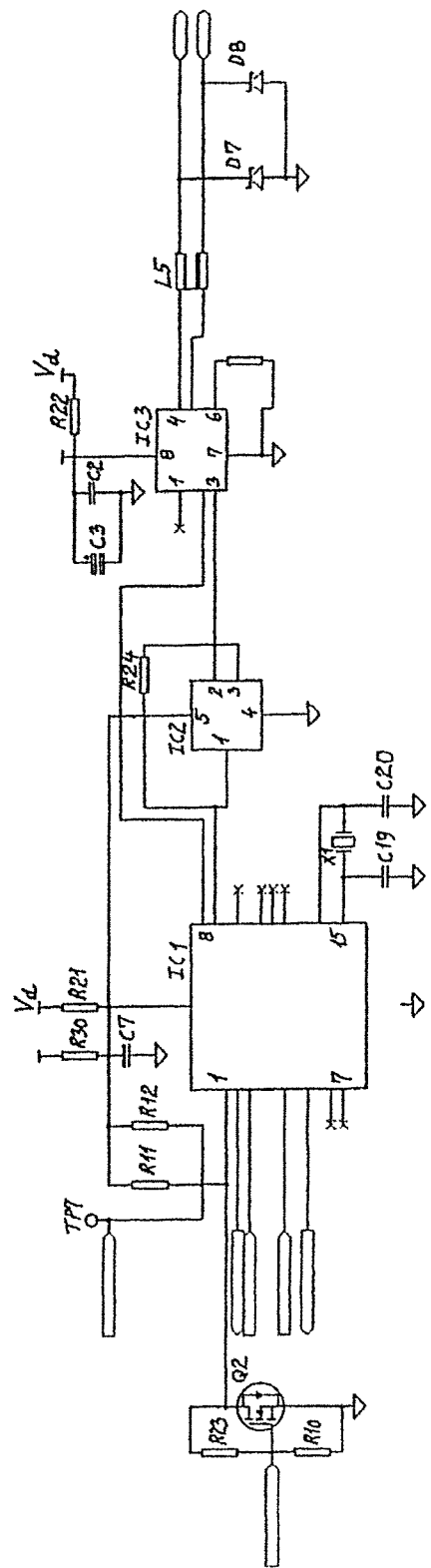
FIG. 122 is a block-diagrammatic overview of Module C Can module.
Figure 123:
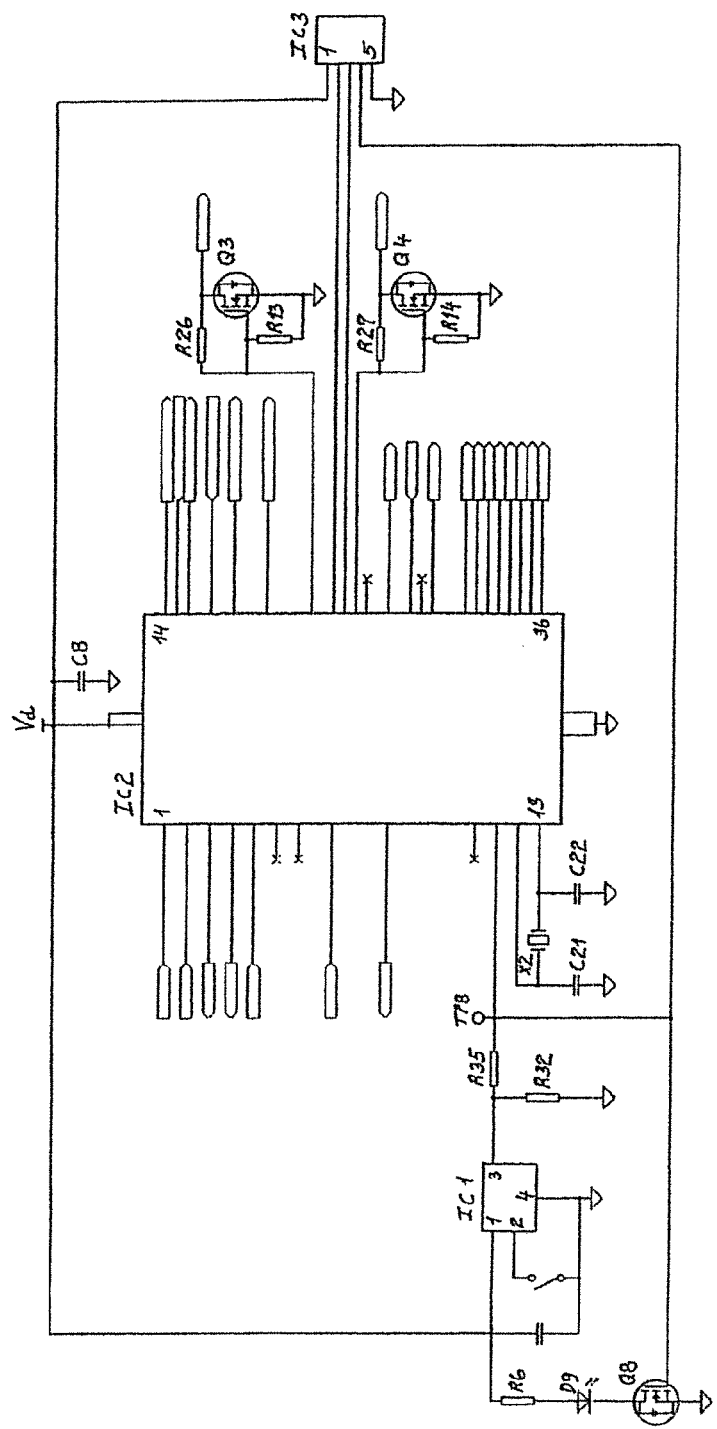
FIG. 123 is a block-diagrammatic overview of Module C micro controller module.
Figure 125:
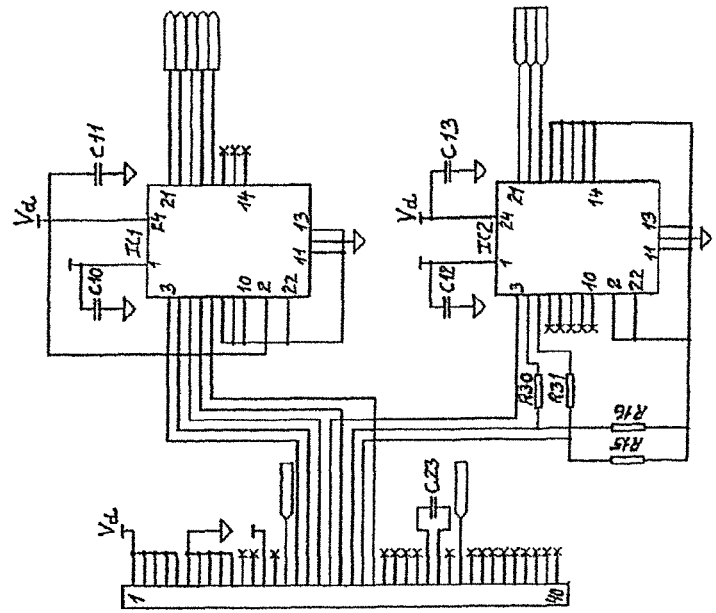
FIG. 125 is a block-diagrammatic overview of Module C interface 2.
Figure 124:
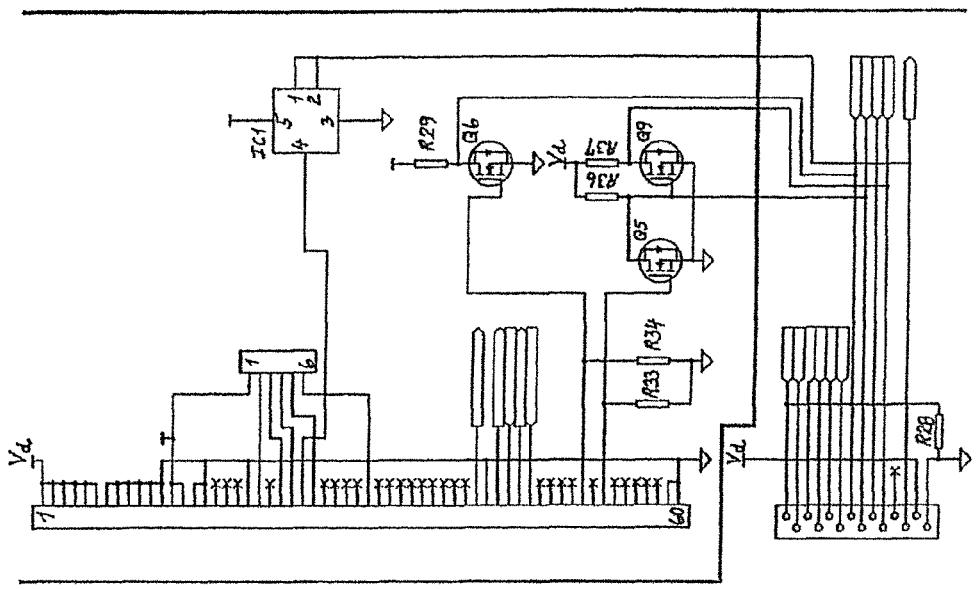
FIG. 124 is a block-diagrammatic overview of Module C GSM interface 1.
Figure 124:
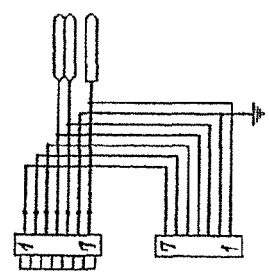

It is determined in advance that a micro controller from microchip will be used. A PIC18 device is selected because of their high speed and large memory, vide FIG. 96.

The objective of the following is to define the network protocol for the communication between the different modules of the DISCOS project including communication with a server system.

FIGS. 97 to 125 are schematic block-diagrammatic views of implementations of modules as described elsewhere.

FIGS. 126 to 129 are schematic views of subjects discussed in relation to a communications protocol found below.

Network Survey

The DISCOS system communicates with the server system through a protocol converter (The Communication Unit). The communication medium between the server system and the DISCOS system is transparent, why a new communication medium easily can be implemented exchanging the Communication Unit. Internally the DISCOS system communicates via a CAN network.

Figure 126:
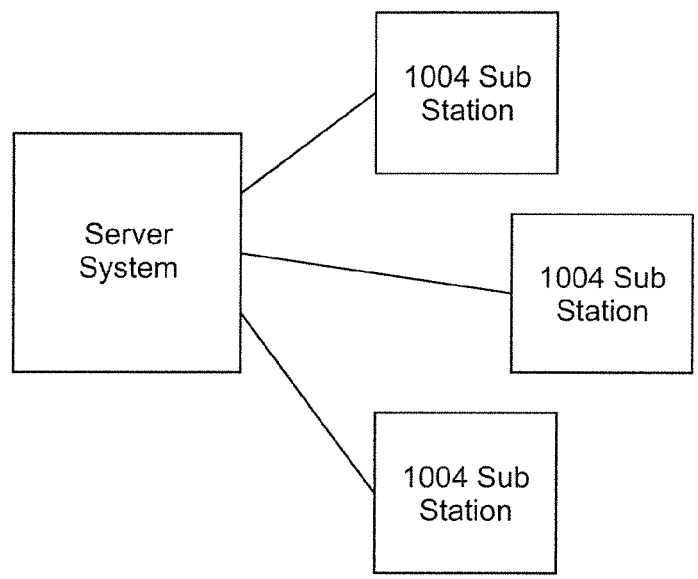
FIG. 126 is a schematic view of a distributed master slave network.

The network is build as a distributed master slave network with the server as master. Reference is made to FIG. 126.

Server-DISCOS Configuration

Today SMS messaging is chosen as communication medium, why the Communication Unit is equipped with a GSM Modem.

The Communication Unit is transparent for both the DISCOS and the server system, why this document only regard this as a medium and initialization and other considerations is done elsewhere.

DISCOS-CAN Configuration

The DISCOS CAN network consist of a primary Master, 0 to 2 secondary masters, 0-8 OPTI units pr. Master and a Communication Unit.

Figure 127:
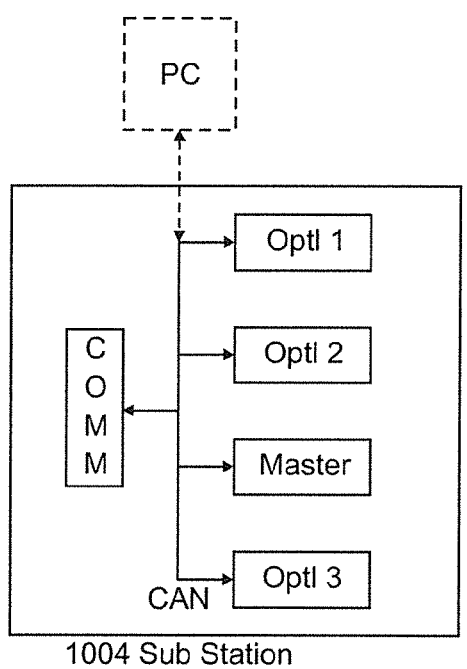
FIG. 127 is a schematic view of a CAN network.

During installation, debugging and boot loading a PC will be connected to the DISCOS network. Reference is made to FIG. 127.

The figure at right gives an overview over a typical DISCOS configuration in a substation.

Network Addresses

The network is addressed with the actual Station ID combined with the bay the actual unit monitors.

The server keeps track of the mobile phone number for the different stations as well and the CAN ID for all the units installed in the stations.

Station ID, mobile phone number, Bay ID's for the monitored bays and the CAN ID's are automatically registered at the server during installation.

Figure 128:
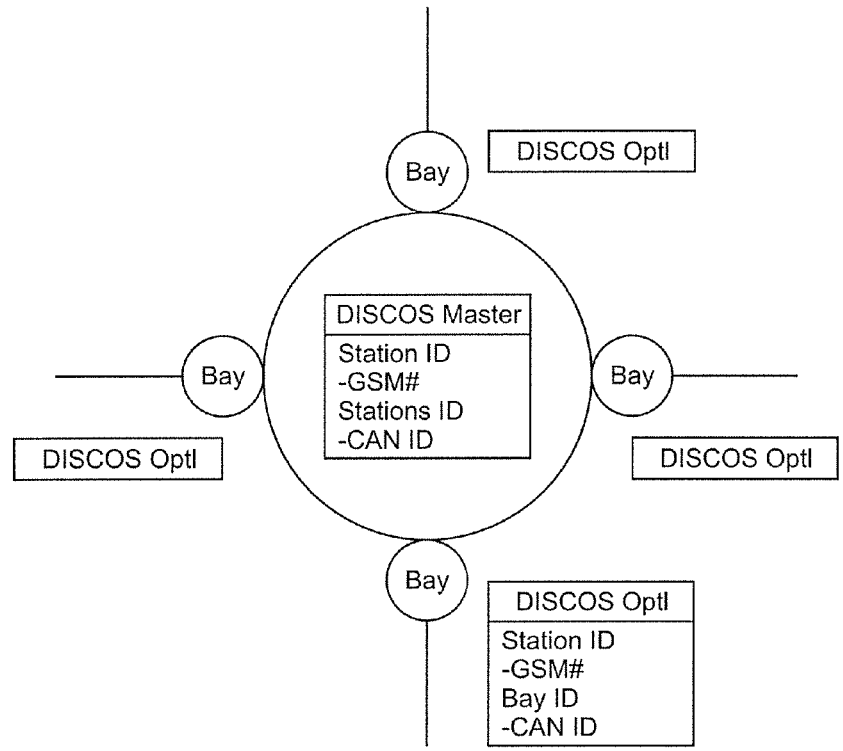
FIG. 128 is a schematic view of a sub-station.

The picture to the left shows a sub-station equipped with 4 DISCOS OptI and a DISCOS Master. The Communication Unit is not on the picture due to the fact that it is transparent to the server. Reference is made to FIG. 128.

Broadcasting on the DISCOS Bus

Broadcasting for a full Sub Station—all connected DISCOS Units on a Communication Unit—is done setting the CAN-id to zero. If a broadcast message is received from the server the BAY ID field isn't checked in the message and all connected units will response as if it was an ordinary request.

Layer Description

The protocol for the DISCOS Project implements the Physical Layer, the Data Link Layer and the Application Layer. Other layers of the OSI model are not regarded as necessary for this application.

Implementation in the server end is not covered in this document, while the implementation depends on size and type of the server system.

Server Communication

Physical Layer The physical layer carrying the communication between the server and the DISCOS Systems is based on SMS messaging in the first generation of the DISCOS System.

Data Link Layer

The Data Link layer handles all acknowledging between the server and the DISCOS system.

All packages from the DISCOS System to the server need to be acknowledged by the server. If acknowledge hasn't been received in 2 minutes the package is transmitted once again. This is repeated 3 times before the package is flushed. The sending unit is responsible for retransmission and keeping track on the different acknowledges.

All server requests initiates a response from the requested unit, why an acknowledge is not necessary. The server also retransmits packages on no response 3 times with 2 minutes interval.

Application Layer

The Application layer handles the protocol conversion from server messages to CAN packages and vice versa. This is done due to the fact that a CAN package only carries 8 bytes of data.

All server messages are repacked in the Communication Unit and in the receiving unit. This is described further in the DISCOS CAN Protocol description.

The application layer handles the address checking and generation when sending and receiving server messages.

Due to security reasons the Communication Unit flushes messages from other phone numbers than the server system. Equally, all messages from the DISCOS System are send to a specific phone number.

It is possible to change the approved phone numbers via the TTY interface, through a GPRS channel and in some constellations through the CAN network.

DISCOS-CAN Communication

Physical Layer

The CAN 2.0b is used as the basic platform for the physical layer. Communication speed is set to 125 kbps.

Network Layer

The Network layer on the CAN bus follows the CAN standard. This layer takes care of the error handling in case of faulty packages and will also handle bus conflicts. The message frame is described by the CAN 2.0b standard. Extended data frames are used.

Application Layer

The Application layer implements all communication handling on data packet level. This includes command handling. The application layer uses the ID and the Data part of the CAN 2.0b extended frame. Information about the 2.0b extended frame can be found at http://www.kvaser.com/can/protocol/canprot1.htm Server Commands All messages between the server and the DISCOS system are transferred as raw binary data or ASCII characters. All numbers are presented little endian except timestamps, which are presented big endian.

Generally speaking a server message should not be deleted before an acknowledgement or a response has been received. If this ack or response has not been received within 2 min. the server message is retransmitted. An alarm-message has priority over a response-message, therefore if an alarm occurs and response on a request is to be sent the response is deleted and the alarm transmitted instead. There is no message-queue, if a new request-message is received before the previous one is handled the new request is not processed.

After the detailed protocol description a scenario description is worked out. This is done to describe the intentions behind the different commands/sequences.

Table of Commands

| Msg. no. | Description | Datafield |
|---|---|---|
| serv1 | Get Bay status | <MSGIN> <EQTY> <STID> <CANID> <BAYID> 01h <MSG#> <SC> |
| serv2 | Bay status | <MSGIN> <EQTY> <STID> <CANID> <BAYID> 02h <MSG#> <TS> <IL1> <IL2> <IL3> <UL1> <UL2> <UL3> <P> <Q> <ILP1> <ILP2> <ILP3> <RKIL1> <RKIL2> <RKIL3> <JI> <IH> <L> <OP> <USL1> <USL2> <USL3> <ROUT1> <BIN1> <BIN2> <SC> |
| serv3 | Get Unit status | <MSGIN> <EQTY> <STID> <CANID> <BAYID> 03h <MSG#> <TS> <SC> |
| serv4 | Unit status | <MSGIN> <EQTY> <STID> <CANID> <BAYID> 04h <MSG#> <PVER> <FVER> <TS> <U_STAT> <SYS_STAT> <SC> |
| serv5 | Set output #x on Unit #y | <MSGIN> <EQTY> <STID> <CANID> <BAYID> 05h <MSG#> <ROUT#> <SC> |
| serv6 | Output #x on Unit #y is active/inactive | <MSGIN> <EQTY> <STID> <CANID> <BAYID> 06h <MSG#> <ROUT#> <SC> |
| serv7 | Get status for aux. inputs and outputs on Unit #y | <MSGIN> <EQTY> <STID> <CANID> <BAYID> 07h <MSG#> <SC> |
| serv8 | Status on aux. inputs and outputs on Unit #y | <MSGIN> <EQTY> <STID> <CANID> <BAYID> 08h <MSG#> <BIN1> <BIN2> <ANIN1> <ANIN2> <ROUT1> <ROUT2> <SC> |
| serv9 | Initialization message from server | <MSGIN> <EQTY> <STID> <CANID> <BAYID> 09h <MSG#> <U_TYPE> <U_STAT> <BIN1> <BIN2> <ANIN1> <ANIN2> <ROUT1> <ROUT2> <SC> |
| serv10 | Identification message from Unit | <MSGIN> <EQTY> <STID> <CANID> <BAYID> 0Ah <MSG#> <SC> |
| serv11 | Acknowledge on packet | <MSGIN> <EQTY> <STID> <CANID> <BAYID> 0Bh <MSG#> <ACKMSG#> <SC> |
| serv12 | Configuration message | <MSGIN> <EQTY> <STID> <CANID> <BAYID> 0Ch <MSG#> <CONPAR> <SC> |
| serv13 | Configuration response | <MSGIN> <EQTY> <STID> <CANID> <BAYID> 0Dh <MSG#> <CONPAR> <SC> |
| serv14 | Communication Error | <MSGIN> <DUMMY> <CANID> <SC> |
| serv15 | Unit Mode Request | <MSGIN> <EQTY> <STID> <CANID> <BAYID> 0Fh <MSG#> <U_STAT> <SC> |
| serv16 | Unit Mode Status | <MSGIN> <EQTY> <STID> <CANID> <BAYID> 10h <MSG#> <U_STAT> <SC> |
| Serv17 | Get Bay power | <MSGIN> <EQTY> <STID> <CANID> <BAYID> 11h <MSG#> <SC> |
| Serv18 | Bay power | <MSGIN> <EQTY> <STID> <CANID> <BAYID> 12h <MSG#> <PQMAX> <PQMAX> <PQMAX> <PQMAX> <PQMAX> <PQMAX> <PQMAX> <SC> |

Field Description

| Field | Len (byte) | Description | Notation |
|---|---|---|---|
| MSGIN | 1 | Message Indication.<br>- encoding:<br>? > Request which requires response.<br>! > Alarm message.<br>. > ACK on message without response<br>: > Response on message | ASCII |
| EQTY | 6 | Equipment Type. Search string to server to make it possible to distinguish between different system types.<br>Example:<br>- NESA DISCOS 10/04 Station Surveillance > 741001 > 373431303031h | ASCII |
| STID | 5 | Station identification specifying in which transformer station the unit is located. | ASCII |
| CANID | 1 | CAN-address in the actual DISCOS network/transformer-station | Binary |
| BAYID | 5 | Bay identification for Optl Units or transformer identification for Master Units | ASCII |

-continued

| Field | Len (byte) | Description | Notation |
|---|---|---|---|
| MSG# | 2 | All message sequences are numbered. The message number (MSG#) is generated by the initiating part - either server or unit.<br>The MSG# is the same for all messages in the actual message sequence.<br>The MSG# rolls over to zero at 1.000.<br>- Range: 0-1.000<br>- Presentation: little endian<br>Example:<br>- Message number 447 > 1BFh | Binary |
| ACKMSG# | 2 | Number on the message which is ACK'ed - same number as MSG#. | |
| SC | 1 | Sum check. Sum of total message including SC must equal zero | Binary |
| TS | 5 | Timestamp on the following format YYMMDDHHMM<br>Example:<br>- kl. 21.27 d. 21/10-2003 > 030A15151Bh | Binary |
| IL1<br>IL2<br>IL3 | 2 | Average RMS current value. Averaged over 2 sec.<br>- Range: 0-25 kA<br>- Resolution: 1 A<br>- Presentation: unsigned 16 bit<br>    Amp with 0 decimal places<br>    little endian<br>    FFFFh represents no measurement<br>Example:<br>- 280A > 0118h | Binary |
| UL1<br>UL2<br>UL3 | 1 | Average RMS voltage value.<br>- Range: 0-12 kV for feeder bay<br>    0-250 V for transformer bay<br>- Resolution: 0.05 kV for feeder bay<br>    1 V for transformer bay<br>- Presentation: unsigned 8 bit<br>    0.05 kV with 2 decimal place for feeder bay<br>    Volt w/0 decimal places for transformer.<br>    FFh represents no measurement<br>Example:<br>- 12.4 kV in Feeder bay > F8h<br>- 230 V in Transformer bay > E6h | Binary |
| P, Q | 2 | Active and reactive power.<br>- Range: −/+320000 kVA/kvar for feeder bay<br>    −/+3200000 VA/kvar for transformer bay<br>- Resolution: 10 kVA/kvar for feeder bay<br>    100 VA/kvar for transformer bay<br>- Presentation: signed 16 bit<br>    10 kVA/kvar for feeder bay<br>    100 VA/kvar for transformer bay<br>    little endian<br>    7FFFh represents no measurement<br>Example for feeder bay:<br>- 175.140 kVA > 446Ah<br>Example for transformer bay:<br>- 684400 VA > 1ABCh | Binary |
| ILP1<br>ILP2<br>ILP3 | 2 | Actual RMS peak current value. Averaged over 40 msec.<br>- Range: 0-25 kA<br>- Resolution: 1 A<br>- Presentation: unsigned 16 bit<br>    Amp with 0 decimal places<br>    little endian<br>    FFFFh represents no measurement<br>Example:<br>- 10.800 A > 2A30h | Binary |
| RKIL1<br>RKIL2<br>RKIL3 | 1 | Direction for peak current.<br>- encoding: - > No alarm<br>    F > Forward, current flow against line<br>    B > Backward, current flow against station<br>    I > Direction unknown. | ASCII |
| JI | 1 | Earth fault indication.<br>- Encoding: - > No alarm<br>    A > Earth fault present | ASCII |

-continued

| Field | Len (byte) | Description | | Notation |
|---|---|---|---|---|
| IH | 2 | Harmonic current level.<br>- Encoding: First byte is the error factor defined by short measurement divided by long measurement. Second byte is not used at the moment and will be set to 00h. FFh at second byte represents no measurement.<br>- Range: 0.0-25.5<br>- Resolution: 0.1<br>- Presentation: unsigned 8 bit with 1 decimal place.<br>Example:<br>- a factor of 1.6 > 1000h | | Binary |
| L | 2 | Minimum reactance calculated if more than one RKIx indication is Forward.<br>- Encoding: FFFFh if les than 2 RKIx indicates Forward.<br>- Range: 10 Ohm<br>- Resolution: 0.01 Ohm<br>- Presentation: unsigned 16 bit Ohm with 2 decimal places little endian FFFFh represents no measurement<br>Example:<br>- 1.83 Ohm > 00B7h | | Binary |
| OP | 1 | Open Phase alarm is reported when asymmetry in the 10 kV currents is detected.<br>- encoding: - > No alarm<br>O > Open Phase Alarm | | ASCII |
| USL1<br>USL2<br>USL3 | 1 | Supervision of voltage levels on 0.4 kV side of transformer.<br>- encoding: - > No alarm<br>H > Too High Voltage<br>L > Too Low Voltage<br>N > No Voltage | | ASCII |
| BIN1<br>BIN2 | 10 | Status of binary input:<br>- encoding: <input><status><alarm><br>-- input Presentation of functionality 8 ASCII characters.<br>-- status A > Input Active<br>I > Input Inactive<br>- > Undefined<br>-- alarm - > No Alarm<br>A > Alarm | | ASCII |
| ANIN1<br>ANIN2 | 11 | Status of analog input:<br>- encoding: <input><value><alarm><br>-- input Presentation of functionality 8 ASCII characters<br>-- value Binary value from AD-converter unsigned 16 bit no measurement unit FFFFh represents no measurement little endian<br>-- alarm - (ASCII) > No alarm<br>A (ASCII) > Alarm | | ASCII & binary |
| CONPAR | 3 | Configuration packet. Change of specific parameters listed in the datasheet for the actual product.<br>- encoding: <pointer> <value><br>-- pointer Pointer to memory location unsigned 16 bit little endian<br>-- value New data value unsigned 8 bit<br>Allocation table is present in the datasheet for the actual product. | | Binary |

-continued

| Field | Len (byte) | Description | | Notation |
|---|---|---|---|---|
| U_TYPE | 2 | Unit type to be registered at server.<br>- encoding: <unit type> <configuration><br>-- unit type M - DISCOS Master<br>O - DISCOS Opti<br>C - DISCOS Cover<br>-- configuration Master configuration<br>0 - DISCOS Master (primary)<br>1 - DISCOS Master (secondary)<br>Opti configuration<br>0 - DISCOS Opti (Line bay)<br>1 - DISCOS Opti (Transformer bay)<br>Cover configuration<br>TBD | | ASCII & Binary |
| U_STAT | 1 | Status of the unit.<br>- encoding: - - Request of actual status<br>A - Active<br>S - Sevice<br>D - Defect<br>P - Passive | | ASCII |
| DUMMY | 11 | Dummy bytes inserted to keep right position for CAN ID according to standard messages.<br>Communication Unit can not be configured on site, why EQTY and STID is unknown to the unit and phonenumber the only identification of the actual station. | | na |
| SYS_STAT | | Status of the actual unit. The parameter array is specified in the actual datasheet.<br>- encoding: unit dependent parameter array<br>array[<parameter> <value> <status>]<br>-- paramter 8 ASCII characters<br>-- value unsigned 16 bit<br>-- status - > Normal operation<br>S > Service needed<br>D > Defect | | |
| ROUT1<br>ROUT2 | 9 | Activation of/status of relay output.<br>- encoding: <relay><state><br>-- relay Presentation of functionality<br>8 ASCII characters<br>-- state A > Output Active<br>I > Output Inactive<br>- > Undefined | | ASCII |
| PVER, FVER | 4 | Protocol and Firmware version information.<br>- encoding 4 ASCII characters.<br>Example:<br>- "0102" > version 01.02 | | ASCII |
| PQMAX | 9 | Daily power maximum<br>- encoding: <SmaxTS> <pmax> <qmax><br>-- SmaxTS Timestamp for the value set. For details on format see <TS><br>-- pmax Active power, see <P> for format.<br>-- qmax Reactive power, see <Q> for format. | | Binary |

Scenario Description
Server to DISCOS Scenarios

| Server action | SMS msg#-dir. | Communication Unit action | CAN msg#-dir. | DISCOS unit action (Unit: OptI, Master, . . . ) |
|---|---|---|---|---|
| BAY STATUS REQUEST | | | | |
| Get Bay status, Unit #y | serv1 -> | SMS to CAN conv. | EXT_MSG -> | Unit #y returns Bay |
| Status is interfaced for SCADA system. | serv2 <- | CAN to SMS conv. | EXT_MSG <- | status data for server system. |
| Acknowledge on serv2 message | serv11 -> | SMS to CAN conv. | EXT_MSG -> | Removal of message from buffer |
| UNIT STATUS REQUEST | | | | |
| Get unit status, Unit #y | serv3 -> | SMS to CAN conv. | EXT_MSG -> | Unit #y returns unit |
| Status is interfaced for SCADA system. | serv4 <- | CAN to SMS conv. | EXT_MSG <- | status for server system. |
| Acknowledge on serv4 message | serv11 -> | SMS to CAN conv. | EXT_MSG -> | Removal of message from buffer |

-continued

| Server action | SMS msg#-dir. | Communication Unit action | CAN msg#-dir. | DISCOS unit action (Unit: OptI, Master, . . . ) |
|---|---|---|---|---|
| RELAY ACTIVATION REQUEST | | | | |
| Set output #x on Unit #y active/inactive Status is interfaced for SCADA system. Acknowledge on serv6 message | serv5 -> serv6 <- serv11 -> | SMS to CAN conv. CAN to SMS conv. SMS to CAN conv. | EXT_MSG -> EXT_MSG <- EXT_MSG -> | Output #x at Unit #y is operated - Result is returned to server. Removal of message from buffer |
| BINARY/ANALOG STATUS REQUEST | | | | |
| Get status for binary & analog inputs, Unit #y Status is interfaced for SCADA system. Acknowledge on serv8 message | serv7 -> serv8 <- serv11 -> | SMS to CAN conv. CAN to SMS conv. SMS to CAN conv. | EXT_MSG -> EXT_MSG <- EXT_MSG -> | Unit #y returns status for binary and analog inputs for server system. Removal of message from buffer |
| CONFIGURATION REQUEST | | | | |
| Set configuration value in DISCOS Unit Status is interfaced for SCADA system Acknowledge on serv13 message | serv12 -> serv13 <- serv11 -> | SMS to CAN conv. CAN to SMS conv. SMS to CAN conv. | EXT_MSG -> EXT_MSG <- EXT_MSG -> | Value changed according to message. New status is send to server. Removal of message from buffer |
| MODE CHANGE (MATCH/UNMATCH) | | | | |
| Match or Unmatch situation or request for actual status. Status is interfaced for server system | serv15 -> Serv16 <- | SMS to CAN conv. CAN to SMS conv. | EXT_MSG -> EXT_MSG <- | Mode is set according to requested data. New status send to server. |
| BAY POWER REQUEST | | | | |
| Get Bay power, Unit #y Status is interfaced for SCADA system. Acknowledge on serv18 message | Serv17 -> Serv18 <- serv11 -> | SMS to CAN conv. CAN to SMS conv. SMS to CAN conv. | EXT_MSG -> EXT_MSG <- EXT_MSG -> | Unit #y returns Bay power status data for server system. Removal of message from buffer |

DISCOS to Server Scenarios

| DISCOS unit action (Unit: OptI, Master, . . . ) | CAN msg#-dir. | Communication Unit action | SMS msg#-dir. | Server Action |
|---|---|---|---|---|
| BAY ALARM MESSAGE | | | | |
| Bay information is send on the following alarms: • Short-circuit indication • Earth fault • Phase fault • High & Low voltage fault | EXT_MSG -> | CAN to SMS conv. | serv2 -> | Alarm is interfaced for SCADA System |
| Removal of message from buffer | EXT_MSG <- | SMS to CAN conv. | serv11 <- | Acknowledge on serv2 message |
| UNIT ALARM MESSAGE | | | | |
| Unit status is send on the following alarms: • Supply fault • | EXT_MSG -> | CAN to SMS conv. | serv4 -> | Alarm is interfaced for SCADA System |
| Removal of message from buffer | EXT_MSG <- | SMS to CAN conv. | serv11 <- | Acknowledge on serv4 message |

-continued

| DISCOS unit action (Unit: OptI, Master, ...) | CAN msg#-dir. | Communication Unit action | SMS msg#-dir. | Server Action |
|---|---|---|---|---|
| BINARY AND ANALOG INPUT ALARM MESSAGE | | | | |
| Alarms for binary and analog inputs is send when an alarm situation has been present for more than the set timeout period. | EXT_MSG -> | CAN to SMS conv. | serv8 -> | Alarm is interfaced for SCADA System |
| Removal of message from buffer | EXT_MSG <- | SMS to CAN conv. | serv11 <- | Acknowledge on serv8 message |
| MODE CHANGE | | | | |
| Service, defect or repair situation at DISCOS Unit | EXT_MSG -> | CAN to SMS conv. | serv16 -> | Mode change is registered in server end. |
| Removal of message from buffer | EXT_MSG <- | SMS to CAN conv. | serv11 <- | Acknowledge on serv16 message |
| COMMUNICATION ERROR | | | | |
| | 3 failing messages in 10 min. | SMS generation | servl4 -> | Alarm is interfaced for SCADA System |
| | | Removal of message from buffer | serv10 <- | Acknowledge is send for Communication Unit |

Examples on Handling of Errors During SMS Communication

| Server action | SMS msg#-dir. | Communication Unit action | CAN msg#-dir. | DISCOS unit action (Unit: OptI, Master, ...) |
|---|---|---|---|---|
| Multiple BAY STATUS REQUEST | | | | |
| Get Bay status, Unit #y | serv1 -> | SMS to CAN conv. | EXT_MSG -> | Unit #y returns Bay |
| Get Bay status, Unit #y | serv1 -> | SMS to CAN conv. | EXT_MSG -> | Unit #y drops request, because only one sms is handled at a time. |
| Status is interfaced for SCADA system. | serv2 <- | CAN to SMS conv. | EXT_MSG <- | Status data for server system (response on 1st request). |
| Acknowledge on serv2 message | serv11 -> | SMS to CAN conv. | EXT_MSG -> | Removal of message from buffer |
| BAY STATUS Respond lost | | | | |
| Get unit status, Unit #y | serv1 -> | SMS to CAN conv. | EXT_MSG -> | Unit #y returns unit |
| Status is lost | serv2 <- | CAN to SMS conv. | EXT_MSG <- | status for server system. |
| Status is interfaced for SCADA system. | serv2 <- | CAN to SMS conv. | EXT_MSG <- | After 2 min. and still no ack, the status-sms is retransmitted. |
| Acknowledge on serv2 message | serv11 -> | SMS to CAN conv. | EXT_MSG -> | Removal of message from buffer |
| Ack lost | | | | |
| Get Bay status, Unit #y | serv1 -> | SMS to CAN conv. | EXT_MSG -> | Unit #y returns Bay |
| Status is interfaced for SCADA system. | serv2 <- | CAN to SMS conv. | EXT_MSG <- | status for server system. |
| Acknowledge on serv2 message | serv11 -> | SMS to CAN conv. | EXT_MSG -> | Ack is lost |
| Status is interfaced for SCADA system. | serv2 <- | CAN to SMS conv. | EXT_MSG <- | After 2 min. and still no ack, the status-sms is retransmitted. |
| Acknowledge on serv2 message | serv11 -> | SMS to CAN conv. | EXT_MSG -> | Removal of message from buffer |

-continued

| Server action | SMS msg#-dir. | Communication Unit action | CAN msg#-dir. | DISCOS unit action (Unit: OptI, Master, . . . ) |
|---|---|---|---|---|
| BAY STATUS | | | | |
| Get Bay status, Unit #y | serv1 -> | SMS to CAN conv. | EXT_MSG -> | Unit #y returns Bay |
| Status is interfaced for SCADA system. | serv2 <- | CAN to SMS conv. | EXT_MSG <- | Alarm occurs in unit #y and the response is droped and alarm-sms is transmitted instead |
| Acknowledge on serv8 message | serv11 -> | SMS to CAN conv. | EXT_MSG -> | Removal of message from buffer |
| 2 min. after the 1st Get Bay status, the request is retransmitted | serv1 -> | SMS to CAN conv. | EXT_MSG -> | Unit #y returns Bay |
| Status is interfaced for SCADA system. | serv2 <- | CAN to SMS conv. | EXT_MSG <- | status for server system. |
| Acknowledge on serv2 message | serv11 -> | SMS to CAN conv. | EXT_MSG -> | Removal of message from buffer |

Change of Unit Status on Server (e.g. Registration)

A DISCOS Unit has 4 different functional levels (Active, Passive, Service and Defect). These levels indicate the status of the actual unit and keep the Units aligned with the registration on the Server System. The different levels are used as follows:

Passive
  A DISCOS Unit is passive as long as a registration process (Matching) hasn't been performed against the server. Or if a mode change message (SERV15) from the server has been received. A unit is only passive during installation or reconfiguration of the installation. No measuring is done while the DISCOS Unit is passive. Passive Units sends a weekly alive message (serv4) to the server. All DISCOS Units are born passive.

Active
  The DISCOS Unit is matched and works normally.

Service
  The DISCOS Unit works but a service threshold is exceeded why the Unit requires service. The Service level can only be changed locally by a service technician. Normal operation is still maintained.

Defect
  The DISCOS Unit is defect. No measuring is done while the Unit is defect. The Defect level can only be changed locally by a service technician.

Figure 129:
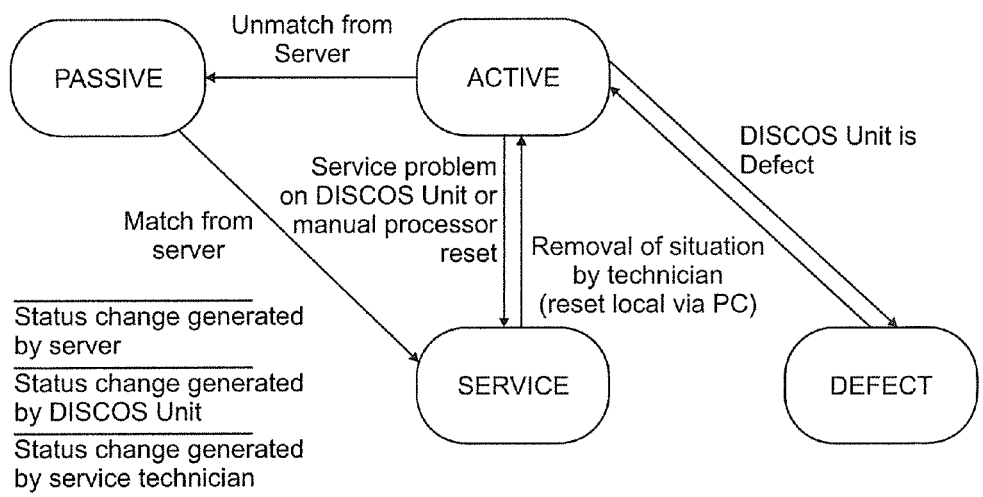
FIG. 129 is a schematic view of an activity graph, FIG. 130, illustrating MV voltage and current phasors during MV short-circuit; single line diagram
Figure 130:
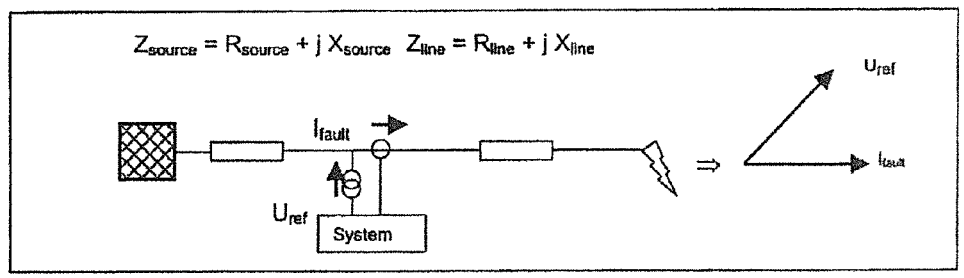

Levels are changed according to the shown activities in the graph in FIG. 129.

Installing a DISCOS Unit requires that the presentation of the Unit on the Server is correct. The Server information and the Unit setup is synchronized through the Matching process.

Matching

Matching of the Server information and the DISCOS Unit setup is done as follows.

| Server | DISCOS Unit / PC | Description |
|---|---|---|
| | <- serv10 | Identification message from DISCMAN regarding the actual DISCOS Unit. |
| serv11 -> | | Acknowledge on serv10 message from DISCMAN. |
| serv9 -> | | Initialization message from Server. Holds all fieldnames and settings. Message is handled by DISCMAN and not by the actual unit. |
| | <- serv11 | Acknowledge on successful setup of the DISCOS Unit send by DISCMAN. |
| serv15 -> | | Server requests DISCOS Unit to enter Service Mode. |
| | <- serv16 | DISCOS Unit responds with actual mode, which now is Service mode. When the Service Technician finishes the installation process, he asks the Unit to enter Active mode. |

DISCMAN is a PC based configuration software tool, which is connected to the DISCOS bus during installation and service.

1. Example Of Serv2

The example here below shows a response on a "get bay status" from a feeder bay, with an old over current alarm indication.

All data in the following example is represented on hexadecimal format.

213734313030312031363333707203337363402BF01030
A1B1737800258024E026867687A036F02BCO2C404780
54246462D00FFF7002D2D2D2D464C445F3337363441
52454C41594F504E412D52454C4159434C4F492D1Eh

Colors are only used as field separators.

| Datafield | Value | Translation | Comment |
|---|---|---|---|
| MSGIN | "!" | ! | Indication of message from DISCOS System to server. |
| EQTY | 373431303031h | 741001 | - 741: NESA Company number<br>- 001: DISCOS 1004 Surveillance system |
| STID | 2031363337h | "1637" | Station number 1637. |

| Datafield | Value | Translation | Comment |
|---|---|---|---|
| CANID | 07h | CAN Address 7 | CAN address of sending unit in station 1637. |
| BAYID | 2033373634h | "3764" | Identifier for monitored Bay in station 1637. |
| MSG type | 02h | serv02 | Bay Status message |
| MSG# | BF01h | 447 | Message number 447 |
| TS | 030A1B1737h | 03.10.27 - 22.55 | Actual alarm was detected 22.55 - 27/10-03. |
| IL1 | 8002h | 640 A | Average Current in L1. |
| IL2 | 5802h | 600 A | Average Current in L2. |
| IL3 | 4E02h | 590 A | Average Current in L3. |
| UL1 | 68h | 10.4 kV | Average Voltage in L1. |
| UL2 | 67h | 10.3 kV | Average Voltage in L2. |
| UL3 | 68h | 10.4 kV | Average Voltage in L3. |
| P | 7A03h | 8900 kVA | Average active power in bay. |
| Q | 6F02h | 6230 kvar | Average reactive power in bay. |
| ILP1 | BC02h | 700 A | Peak current at last alarm in L1. |
| ILP2 | C404h | 1220 A | Peak current at last alarm in L2. |
| ILP3 | 7805h | 1400 A | Peak current at last alarm in L3. |
| RKIL1 | 42h | B | Direction of power at Peak current moment. |
| RKIL2 | 46h | F | Direction of power at Peak current moment. |
| RKIL3 | 46h | F | Direction of power at Peak current moment. |
| JI | 2Dh | — | No Earth Fault detected. |
| IH | 00FFh | — | No measurement |
| L | F700h | 2.47 Ohm | Reactance from DISCOS System to fault. |
| OP | 2Dh | — | No Open Phase detected. |
| USL1 | 2Dh | — | Voltage faults Only detected at Master Units. |
| USL2 | 2Dh | — | Voltage faults Only detected at Master Units. |
| USL3 | 2Dh | — | Voltage faults Only detected at Master Units. |
| ROUT1 | 464C445F3337363441h | FLD_3764A | Name of ROUT1: FLD_3764 Status of ROUT1: Active |
| BIN1 | 52454C41594F504E412Dh | RELAYOPNA | Name of BIN1: RELAYOPN Status of BIN1: Active Alarmstatus: - No Alarm |
| BIN2 | 52454C4159434C4F492Dh | RELAYCLOI- | Name of BIN1: RELAYCLO Status of BIN1: Inactive Alarmstatus: - No Alarm |
| SC | 1Eh | 1Eh | Value which result in total sum of all bytes gives zero. |

DISCOS CAN Protocol Description

The DISCOS CAN is based on extended CAN Messaging. A message consists of a 29 bit ID field, an 8 byte data field and framing.

The command structure uses the ID field and the data field. The network layer handles all framing.

| 29 bit ID | 8 byte data |
|---|---|

The message ID consists of a 11 bit part and a 18 bit part which will be divided into 5 parts.

| 11 bit ID | | | 18 bit ID | |
|---|---|---|---|---|
| Type (4 bit) | Recipient (7 bit) | CMD (8 bit) | Sender (7 bit) | ExR-bits (3 bit) |

Type

Defines the type of message and sets the priority. The lower the number the higher the priority.
0001: External Alarm message
0011: Unit ID configuration messages
0101: Internal Alarm message
0111: Bootloading message
1000: Normal operation message
1001: Calibration message
1010: Data messages
1011: Debug message Recipient
  The ID of the receiving unit.
  0: Broadcast to all units
  1: PC
  2: reserved for future use
  3: Communication Unit
  4-126: Other units
  127: Non-configured unit Command
  The commands are described in the CAN Commands section later on.

Sender
  1: PC
  2: reserved for future use
  3: Communication Unit
  4-126: Other units xER Bits Special function bits with the following encoding:

Bit x:

Reserved for future use.

Bit E:

End Of Text (ETX) bit. It is used to signal that this packet is the last packet in the series. An example could be transmitting a server message. This involves a number of CAN messages before the full server message has been transmitted to the Communication Unit. In the last package the ETX bit will be set and the Communication Unit automatically transmits the server message.

If the full message isn't received in 5 seconds the packet is regarded as corrupted and therefore flushed. Retransmissions for server messages are handled hereafter.

-0-: Message is a part of a series of messages and not the last.
-1-: Message is either a single message or the last in a series.

Bit R:

--0: Message is not a Remote Request.
--1: Message is a Remote Request. Recipient must answer with the appropriate data.

3. The PC receives the message containing the serial number. The PC will then send a new message. This message will contain the responding unit's unique serial number and the new ID in the data field.
4. The unit with the serial number in the data field will change its ID to the ID received in the data field These four steps will be iterated as long as a unit responds to the message from the PC in step 1.

During normal use ID conflicts are only checked at the server end. This is done comparing the messages from the units against the server database.

Sending or Receiving a Server Message

Sending and receiving a server message requires a number of CAN packages per server message, while a CAN message only includes 8 bytes of data.

All server messages have high priority, why their message type is External Alarm.

The Communication Unit reloads the packages from CAN Network to server and vice versa. The Communication Unit does not check the received data for formatting or checksum errors, this is done at the server or the actual DISCOS Unit.

In the example here below the same server message is send both ways in the system.

| Data at DISCOS Unit | Dir. | CAN Packages | ETX | Server message |
|---|---|---|---|---|
| AAAAAA | -> | AAAAAA | 0 | AAAAAABBBBBCDDDDD |
| BBBBB | | BBBBB | 0 | DDD |
| C | | C | 0 | |
| DDDDDDDD | | DDDDDDDD | 1 | |
| - A indicates Equipment Type (EQTY) | | | | |
| - B indicates Stations ID (STID) | | | | |
| - C indicates CAN ID (CANID) | | | | |
| - D indicates random data values. | | | | |
| AAAAAA | <- | AAAAAABB | 0 | AAAAAABBBBBCDDDDD |
| BBBBB | | BBBCDDDD | 0 | DDD |
| C | | DDDD | 1 | |
| DDDDDDDD | | | | |
| - A indicates Equipment Type (EQTY) | | | | |
| - B indicates Stations ID (STID) | | | | |
| - C indicates CAN ID (CANID) | | | | |
| - D indicates random data values. | | | | |

Table of Commands

The table of commands is described in the DISCOS_Protocol.xls.

Here below is a couple of scenarios described to show the intention with some of the commands.

Assigning an ID to a New Unit

All new units that will be connected to the bus have ID 127. Once a new unit is connected, it must be configured and hereafter registered on the server. This is done using the configuration program DISCMAN. DISCMAN assigns a new ID to the unit. This ID must be unique on the bus. An alert is given to the operator from DISCMAN if an ID conflict is discovered.

The reassignment of an ID will take the following steps:
1. PC sends a message on the bus, requesting if any units have ID 127.
2. If a unit has ID 127, it will respond with a message. This message will contain the unit's unique serial number in the 18-bit ID field. If more units have ID 127, the unit with the lowest serial number will win the arbitration.

The following is a section of the table of commands which relates to server messaging.

Type: 0001
Recipient: iiiiiii
Sender: iiiiiii

| Name | CMD | xER | Data | Len | Values/ Range | Comment |
|---|---|---|---|---|---|---|
| EXT_MSG | 00001000 | 000 | SSSSSS SS | 1-8 | | Extern Server Message |
| EXT_MSG | 00001000 | 010 | SSSSSS SS | 0-8 | | Extern Server Message with ETX set |

Legend:
Byte Size:
S: Message
Bit size:
i

Package Timing:

When sending a server message the first CAN message in the full package must be delayed with 250 ms times the CAN ID of the sending unit. This is done to prevent buffer overflows on broadcasts and multiple alarm situations. A delay between each CAN message of minimum 30 ms is also required.

Error Handling:

All messages from DISCOS Unit to server need a acknowledge, why the transmitting unit always will retransmit the message after the timeout period. If 3 messages is send without ETX bit in 10 minutes, the Communication Unit automatically generates a serv14 message (see section with server commands for further description).

Messages between server and DISCOS Units always need a reply, why the sender always will retransmit the message after the timeout period.

Event Priority:

Alarms are always prioritized in relation to requests. If an alarm event occurs while responding on a request, the request message is send incomplete. The actual DISCOS Unit forces the message to be transmitted incomplete sending a empty package with the ETX bit set to the communication unit. The server is responsible of retransmitting the request on timeout. If an alarm occurs during handling of an previous alarm the last alarm is neglected.

Updating the Clock

The system clock need to be synchronized frequently. The primary DISCOS Master is responsible for requests for clock synchronization (NOP_SYNC_CLK) once every day. All units requests for clock synchronization on power up. On power up all unit initialize the clock to 00.00 9/9-99. Every unit must request for clock synchronization 15 minutes after power up. The primary DISCOS Master must request for clock synchronization after 10 minutes.

The clock in the Communication Unit is initialized to 00.00 1/1-70 on power up. After power up the Communication Unit synchronizes the clock with the network clock and broadcasts the clock on the DISCOS network (NOP_SET_CLK).

The following is a section of the table of commands which relates to clock synchronization.

Type: 1000
Recipient: iiiiiii
Sender: 0/iiiiiii

| Name | CMD | xER Data | Len | Values/Range |
|---|---|---|---|---|
| NOP_SET_CLK | 00000101 | 010 YMDHm | 5 | Y: Year - range: 0-99<br>M: Month - range: 1-12<br>D: Day - range: 1-31<br>H: Hour - range: 0-23<br>m: Minute - range: 0-59 |
| NOP_GET_CLK | 00000110 | 011 YMDHm | 5 | Y: Year - range: 0-99<br>M: Month - range: 1-12<br>D: Day - range: 1-31<br>H: Hour - range: 0-23<br>m: Minute - range: 0-59 |
| NOP_SYNC_CLK | 00000111 | 011 | 0 | |

Legend:
Byte Size:
Y: Year
M: Month
D: Day
H: Hour
m: Minute
Bit Size:
i: ID of the unit that is receiving or sending the message As described the fiber optic Faraday Effect sensor creates only a point measurement, when placing the sensor on a conductor. This means that the shape of the B-field, the distance from the inductor and magnetic fields from nearby inductors has an influence on the B-field passing though the sensor glassrod. If calibration the on-site is done on only one inductor the sensor compensates afterwards for the different B-field shape and distance from the inductor and influence from other inductors, if they are en balance. If they are in unbalancing the signal archived by the sensor can change due to the fact that the current are stabile in the inductor. To compensate the mutual inductance the calibration must be performed at all three phases at the same time. When comparing the signal measured on all the Faraday Effect sensors and all three third party measurement systems it is possible to determine a 3×3 matrix with compensations constants. This invention gives the possibility to mount a simple point sensor and still compensate the signal from mutual inductance form other inductors. This is only valid if the inductors are used in the calibration and they are fixed mechanically.

The current and phase angle from the three inductors measured by a calibration system can be described as followed.

$$I_A \angle \theta_A = (x_A, y_A) |I_x| = \sqrt{x_x^2 + y_x^2}$$

$$I_B \angle \theta_B = (x_B, y_B)$$

$$I_C \angle \theta_C = (x_C, y_C)$$

The magnetic B-field from the three inductors can be described as followed $$B_A \angle \theta_{BA}$$
$$B_B \angle \theta_{BB}$$
$$B_C \angle \theta_{BC}$$

The current in one of the three inductors can be described with a real and imaginary value as shown below.

$$x_A = \overset{A_1}{K_{AA} * (B_A * \cos \theta_{BA})} + \overset{B_1}{K_{AB} * (B_B * \cos \theta_{BB})} + \overset{C_1}{K_{AC} * (B_C * \cos \theta_{BC})}$$

$$y_A = \overset{D_1}{K_{AA} * (B_A * \sin \theta_{BA})} + \overset{E_1}{K_{AB} * (B_B * \sin \theta_{BB})} + \overset{F_1}{K_{AC} * (B_C * \sin \theta_{BC})}$$

If the constants is known it is possible with the above shown equation to calculate the current running in the specific inductor. The constants can be determined in the 3×3 matrix shown below during the calibration.

$$\begin{matrix} x_A \\ x_B \\ x_C \end{matrix} = \begin{matrix} A_1 & B_1 & C_1 \\ A_1 & B_1 & C_1 \\ A_1 & B_1 & C_1 \end{matrix} * \begin{matrix} K_{AA} \\ K_{AB} \\ K_{AC} \end{matrix}$$

$$\begin{matrix} y_A \\ y_B \\ y_C \end{matrix} = \begin{matrix} D_1 & E_1 & F_1 \\ D_1 & E_1 & F_1 \\ D_1 & E_1 & F_1 \end{matrix} * \begin{matrix} K_{AA} \\ K_{AB} \\ K_{AC} \end{matrix}$$

The equation is solved as 3 equations with three unknown variables. This invention give the advantage to measure the current in unbalanced lines, during shortcircuit situation on one of the lines.

Points Characterizing the Invention

The present invention may be characterized by the following points:

1. An electric current measurement device, comprising:
    a housing defining a first open end and a second open end opposite said first open end,
    a first sealing means having an aperture, said first sealing means having an overall geometrical configuration corresponding to the overall geometrical configuration of said first open end of said housing, said first sealing means further comprising an aperture adapted for receiving a first optical fiber,
    a first fixture means for fixating said first optical fiber,
    a first optical lens having a reception part adapted for receiving said first fixture means for mounting said first optical fiber in optical continuation with said first optical lens, said first optical lens mounted in said housing,
    a first polarization filter mounted in said housing in optical continuation with said first optical lens,
    a glass rod received in and encapsulated within said housing in optical continuation with said first polarization filter, said glass rod being constructed from a material having magneto-optical properties,
    a second polarization filter mounted in said housing in optical continuation with said glass rod,
    a second optical lens mounted in said housing in optical continuation with said second polarization filter, said second optical lens adapted for receiving a second fixture means,
    a second fixture means for fixating a second optical fiber, said second fixture means received in said second optical lens,
    a second sealing means for sealing said second end of said housing, said second sealing means having an aperture for receiving a second optical fiber, said second sealing means mounted in said second end of said housing end, and
    a first and second lid adapted for fixation to said first and second end, respectively, of said housing, said first and second lid including an aperture for receiving said first and second optical fiber respectively.

2. An electric current measurement device according to point 1 wherein:
    said first and said second polarization filters are mounted in substantially parallel relation,
    polarization planes of said first polarization filter and said second polarization filter are rotated 45°, respectively.

3. An electric current measurement device according to any of the preceding points,
    said glass rod being made from SF6.

4. An electric current measurement device according to any of the preceding points,
    said housing being made from a material exhibiting optical non-transparency within the range at least 400 nm to 1000 nm.

5. An electric current measurement device according to any of the preceding points,
    said housing being made from Ulterm, alternatively Peek.

6. An electric current measurement device according to any of the preceding points, said current measurement device further comprising:
    a groove in said housing, said groove formed in said housing and having a width corresponding to the length of said glass rod mounted in said housing, alternatively, said groove being adapted for receiving an electrical conductor.

7. An electric current measurement device according to any of the preceding points, said current measurement device further comprising:
    at least one wing extending from said housing, said wing enabling said housing to be mounted on a oblong electrical conductor.

8. A system for measuring high voltage current an electrical conductor, said system comprising:
    a light source, said light source being an LED based light source, alternatively an incandescent light source,
    a first optical conduit being a first optical fiber, said first optical conduit conducting light emitted from said light source,
    an optical electric current measurement device comprising:
    a housing defining a first open end and a second open end opposite said first open end,
    a first sealing means having an aperture, said first sealing means having an overall geometrical configuration corresponding to the overall geometrical configuration of said first open end of said housing, said first sealing means further comprising an aperture adapted for receiving said first optical fiber,
    a first fixture means for fixating said first optical fiber,
    a first optical lens having a reception part adapted for receiving said first fixture means for mounting said first optical fiber in optical continuation with said first optical lens, said first optical lens mounted in said housing,
    a first polarization filter mounted in said housing in optical continuation with said first optical lens,
    a glass rod received in and encapsulated within said housing in optical continuation with said first polarization filter, said glass rod being constructed from a material having magneto-optical properties,
    a second polarization filter mounted in said housing in optical continuation with said glass rod,
    a second optical lens mounted in said housing in optical continuation with said second polarization filter, said second optical lens adapted for receiving a second fixture means,
    a second fixture means for fixating a second optical fiber, said second fixture means received in said second optical lens,
    a second sealing means for sealing said second end of said housing, said second sealing means having an aperture for receiving a second optical fiber, said second sealing means mounted in said second end of said housing end, and a first and second lid adapted for fixation to said first and second end, respectively, of said housing, said first and second lid including an aperture for receiving said first and second optical fiber respectively, said optical electric current measurement device receiving said light from said first optical conduit,
    a second optical conduit being said second optical fiber, said second optical conduit receiving said light emitted from said optical electric current measurement device,
    a detection means for detecting said light emitted from said second optical conduit and converting said received light to an electrical signal,
    a processing means for processing said electrical signal from said detection means so as to determine said high voltage current in said electrical conductor,
    a current measurement system for performing calibration measurements for said system, and
    a first communications means.

9. A system for measuring high voltage current in electrical conductors according to point 8, said system further comprising:
a computer connected to a second communication means, said computer located in a central location, and
said computer including a interface for communicating status of a system for measuring high voltage current in electrical conductors to an operator.

10. A system for measuring high voltage current in electrical conductors according to point 8, wherein:
said first and second communication means being a communications network, such as the Internet, a local area network, a wireless local area network, a wide area network, a global area network or a publicly switch telephone network, alternatively said first and said second communication means constituted by a fixed wireless network.

11. A method of measuring high voltage current in electrical conductors, said method comprising:
providing a light source, said light source being an LED based light source, alternatively an incandescent light source,
providing a first optical conduit being a first optical fiber, said first optical conduit conducting light emitted from said light source,
providing an optical electric current measurement device comprising:
a housing defining a first open end and a second open end opposite said first open end,
a first sealing means having an aperture, said first sealing means having an overall geometrical configuration corresponding to the overall geometrical configuration of said first open end of said housing, said first sealing means further comprising an aperture adapted for receiving said first optical fiber,
a first fixture means for fixating said first optical fiber,
a first optical lens having a reception part adapted for receiving said first fixture means for mounting said first optical fiber in optical continuation with said first optical lens, said first optical lens mounted in said housing,
a first polarization filter mounted in said housing in optical continuation with said first optical lens,
a glass rod received in and encapsulated within said housing in optical continuation with said first polarization filter, said glass rod being constructed from a material having magneto-optical properties,
a second polarization filter mounted in said housing in optical continuation with said glass rod,
a second optical lens mounted in said housing in optical continuation with said second polarization filter, said second optical lens adapted for receiving a second fixture means,
a second fixture means for fixating a second optical fiber, said second fixture means received in said second optical lens,
a second sealing means for sealing said second end of said housing, said second sealing means having an aperture for receiving a second optical fiber, said second sealing means mounted in said second end of said housing end, and
a first and second lid adapted for fixation to said first and second end, respectively, of said housing, said first and second lid including an aperture for receiving said first and second optical fiber respectively,
said optical electric current measurement device receiving said light from said first optical conduit,
a second optical conduit being said second optical fiber, said second optical conduit receiving said light emitted from said optical electric current measurement device,
providing a detection means for detecting said light emitted from said second optical conduit and converting said received light to an electrical signal,
providing a processing means for processing said electrical signal from said detection means,
providing a current measurement system for performing calibration measurements for said system, and
providing a first communications means.

12. A method according to point 11, said method further comprising:
proving a computer connected to a second communication means, said computer located in a central location, and
said computer including a interface for communicating status of a system for measuring high voltage current in electrical conductors to an operator.

13. A method according to point 11, wherein:
said first and second communication means being a communications network, such as the Internet, a local area network, a wireless local area network, a wide area network, a global area network or a publicly switch telephone network, alternatively said first and said second communication means constituted by a fixed wireless network.

14. A method of calibrating a system for measuring high voltage current in electrical conductors, said method comprising:
providing an electrical conductor carrying high voltage current,
providing a light source,
providing a first optical conduit defining a first and a second opposite end, said light source connected to said first end of said first optical conduit, said light source emitting light into said first optical conduit,
providing a Faraday current measurement device defining a first and a second opposite end, said first end of said Faraday current measurement device connected to said second end of said first optical conduit, said Faraday current measurement device receiving said light from said first optical conduit,
providing a second optical conduit, defining a first and a second opposite end, said first end connected to said second end of said Faraday current measurement device,
providing an optical detection means for converting said light to an electrical signal, said optical detection means connected to said second end of said second optical conduit,
providing a current measurement system performing a measurement of the current in said electrical conductor,
performing said measurement of said electrical current in said electrical conductor, said system for measuring high voltage current in electrical conductors calculating a calibration constant, removing said current measurement system.

15. A method according to point 14, said method further comprising:
said system for measuring high voltage current in electrical conductors periodically, alternatively aperiodically, recalculating said calibration constant by measuring the AC and DC components of said electrical signal.

16. A method according to any of the points 14 or 15, said method further comprising the steps of initially determining the DC component of said optical signal, then periodically determining the DC component of said optical signal, determining the actual AC component by multiplying the measured AC component with the ratio of said initially determined DC component and said periodically determined DC component.

17. A method according to any of the points 14 or 15, wherein said Faraday current measurement device is a device according to any of the points 1 to 7.

What is claimed is:

1. A method of communicating between a master unit and a plurality of monitoring units monitoring an electrical power supply grid, said master unit comprising a communication unit connected to a wired or wireless network for communicating with said plurality of monitoring units, each of said monitoring units comprising a transmitter and receiver having a wired or wireless connection to said network for transmitting and receiving data messages to and from said master unit, each of said monitoring units comprising a memory unit configured for storing one message, said method comprising:

transmitting a message from said master unit to at least one of said monitoring units;
   receiving said message by said at least one of said monitoring units; and
   if said memory unit of said at least one of said monitoring units is empty, storing said received message in said memory unit, and if said memory unit already contains a previously-received other message, discarding said received message.

2. The method according to claim 1, wherein said method further comprises:

sending a response from the at least one of said monitoring units to said master unit to acknowledge receipt of said received message.

3. The method according to claim 2, wherein said master unit monitors if said response is received within a specific period of time.

4. The method according to claim 3, wherein, if no response is received within said specific period of time, said master unit retransmits said message.

5. The method according to claim 3, wherein said response sent by said monitoring unit is selected from the group consisting of at least one of voltage levels, phase information, fault status, fault settings, and fault indications.

6. The method according to claim 1, wherein said network is selected from the group consisting of at least one of a GSM network, a 3G network, WLAN network, and a PSTN network.

7. The method according to claim 1, wherein said message is in a format selected from the group consisting of at least one of a short-message-service format, a text format, and a binary format.

8. A method of configuring with a master unit a plurality of monitoring units monitoring an electrical power supply grid, said master unit comprising a communication unit connected to a wired or wireless network for communicating with said plurality of monitoring units for providing the opportunity of remote configuration, each of said monitoring units comprising a transmitter and receiver having a wired or wireless connection to said network for transmitting and receiving data messages to and from said master unit, each of said monitoring units comprising a memory unit configured for storing a message, said method comprising:

transmitting a message from said master unit to at least one of said monitoring units;
   receiving said message by at least one of said monitoring units; and
   if said memory unit of said at least one of said monitoring units already contains a previously-received other message that has been marked as processed by said monitoring unit, then (a) storing said received message in said memory unit, or if said memory unit of said at least one of said monitoring units contains a previously-received other message that has not been marked as processed by said monitoring unit, then (b) discarding said received message.

* * * * *